(12) United States Patent
Seo et al.

(10) Patent No.: US 9,577,222 B2
(45) Date of Patent: Feb. 21, 2017

(54) LIGHT-EMITTING DEVICE HAVING MULTI-THICKNESS TRANSPARENT CONDUCTIVE LAYERS

(71) Applicant: Semiconductor Energy Laboratory Co., Ltd., Kanagawa-ken (JP)

(72) Inventors: Satoshi Seo, Kanagawa (JP); Ryohei Yamaoka, Kanagawa (JP); Shogo Uesaka, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 14/869,234

(22) Filed: Sep. 29, 2015

(65) Prior Publication Data
US 2016/0093678 A1 Mar. 31, 2016

(30) Foreign Application Priority Data

Sep. 30, 2014 (JP) ................... 2014-200297
Sep. 30, 2014 (JP) ................... 2014-200298

(51) Int. Cl.
*H01L 51/52* (2006.01)
*H01L 51/00* (2006.01)
(Continued)

(52) U.S. Cl.
CPC ......... *H01L 51/5265* (2013.01); *H01L 27/323* (2013.01); *H01L 27/3211* (2013.01);
(Continued)

(58) Field of Classification Search
CPC ............. H01L 27/3211; H01L 51/5215; H01L 51/5221; H01L 51/5088; H01L 51/5068; H01L 51/5092; H01L 51/5084; H01L 2251/558; H01L 2251/5376; H01L 51/5265

See application file for complete search history.

(56) References Cited

U.S. PATENT DOCUMENTS

| 6,281,634 B1 | 8/2001 | Yokoyama |
| 6,429,599 B1 | 8/2002 | Yokoyama |

(Continued)

FOREIGN PATENT DOCUMENTS

| JP | 2004-006362 A | 1/2004 |
| JP | 2007-053090 A | 3/2007 |
| JP | 2010-541180 | 12/2010 |

OTHER PUBLICATIONS

Lee, M.-T. et al. "One FMM Solution for Achieving Active-matrix OLED with 413ppi Real Pixel Density" SID 2014 Digest, 2014, pp. 573-575.

Primary Examiner — Ida M Soward
(74) Attorney, Agent, or Firm — Husch Blackwell LLP

(57) ABSTRACT

To provide a novel light-emitting device with high productivity, the light-emitting device includes a first light-emitting element, a second light-emitting element, and a third light-emitting element. In the first light-emitting element, a first lower electrode, a first transparent conductive layer, a first light-emitting layer, a second light-emitting layer, and an upper electrode are stacked in this order. In the second light-emitting element, a second lower electrode, a second transparent conductive layer, the first light-emitting layer, the second light-emitting layer, and the upper electrode are stacked in this order. In the third light-emitting element, a third lower electrode, a third transparent conductive layer, the second light-emitting layer, and the upper electrode are stacked in this order. The first transparent conductive layer includes a first region. The second transparent conductive layer includes a second region as thick as the third transparent conductive layer. The first region is thicker than the second region.

16 Claims, 66 Drawing Sheets

(51) Int. Cl.
*H01L 27/32* (2006.01)
*H01L 51/50* (2006.01)

(52) U.S. Cl.
CPC ........ *H01L 27/3216* (2013.01); *H01L 51/504* (2013.01); *H01L 51/5068* (2013.01); *H01L 51/5084* (2013.01); *H01L 51/5088* (2013.01); *H01L 51/5092* (2013.01); *H01L 51/5215* (2013.01); *H01L 51/5221* (2013.01); *H01L 2251/5376* (2013.01); *H01L 2251/558* (2013.01)

(56) References Cited

U.S. PATENT DOCUMENTS

| | | | |
|---|---|---|---|
| 6,433,486 B1 | 8/2002 | Yokoyama | |
| 6,690,118 B2 | 2/2004 | Yokoyama | |
| 6,995,517 B2 | 2/2006 | Yokoyama | |
| 7,061,176 B2* | 6/2006 | Kobayashi | H01L 51/5012 313/503 |
| 7,315,131 B2 | 1/2008 | Yokoyama | |
| 7,339,559 B2 | 3/2008 | Yokoyama | |
| 7,741,770 B2 | 6/2010 | Cok et al. | |
| 8,294,143 B2* | 10/2012 | Imai | H01L 27/322 257/40 |
| 8,922,112 B2* | 12/2014 | Kobayashi | H01L 51/5265 313/504 |
| 8,957,442 B2* | 2/2015 | Seo | H01L 27/3209 257/40 |
| 9,000,458 B2* | 4/2015 | Seo | H01L 51/5044 257/89 |
| 9,006,755 B2* | 4/2015 | Seo | H01L 51/504 257/88 |
| 9,111,882 B1* | 8/2015 | Chen | H01L 27/322 |
| 9,153,627 B2* | 10/2015 | Ohsawa | H01L 27/3206 |
| 2005/0088085 A1 | 4/2005 | Nishikawa et al. | |
| 2007/0015429 A1* | 1/2007 | Maeda | H01L 51/5265 445/24 |
| 2007/0035243 A1 | 2/2007 | Lee | |
| 2007/0102737 A1 | 5/2007 | Kashiwabara et al. | |
| 2008/0231177 A1* | 9/2008 | Nomura | C09K 11/06 313/504 |
| 2010/0231484 A1 | 9/2010 | Cok et al. | |
| 2011/0073885 A1* | 3/2011 | Kim | H01L 27/3211 257/89 |
| 2011/0241000 A1* | 10/2011 | Choi | H01L 51/5218 257/59 |
| 2012/0205634 A1* | 8/2012 | Ikeda | H01L 27/3204 257/40 |
| 2012/0305898 A1* | 12/2012 | Okamoto | H01L 51/5016 257/40 |
| 2013/0153876 A1* | 6/2013 | Minami | G09G 3/3233 257/40 |
| 2013/0264549 A1 | 10/2013 | Yamazaki et al. | |
| 2013/0265320 A1 | 10/2013 | Yamazaki et al. | |
| 2014/0117339 A1 | 5/2014 | Seo | |
| 2014/0134771 A1 | 5/2014 | Noda et al. | |
| 2014/0175470 A1* | 6/2014 | Yokoyama | H01L 51/5056 257/89 |
| 2014/0225102 A1 | 8/2014 | Ikeda et al. | |
| 2014/0284566 A1* | 9/2014 | Yoo | H01L 51/5012 257/40 |
| 2014/0284575 A1 | 9/2014 | Sugisawa et al. | |
| 2014/0284576 A1 | 9/2014 | Sugisawa et al. | |
| 2015/0295017 A1* | 10/2015 | Kashiwabara | H01L 27/3211 257/40 |
| 2015/0311250 A1 | 10/2015 | Seo et al. | |

\* cited by examiner

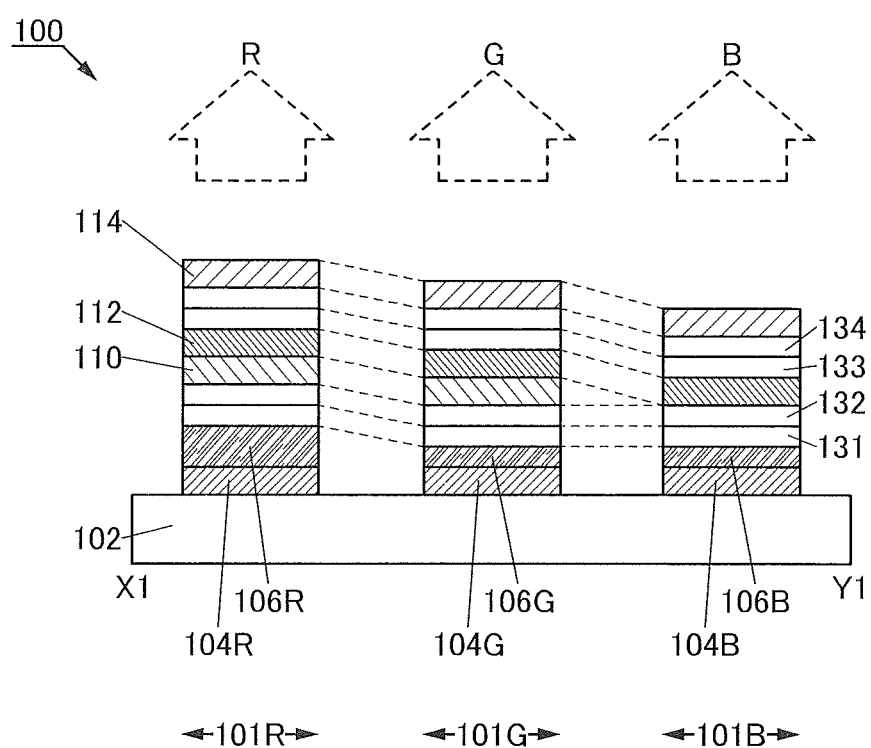

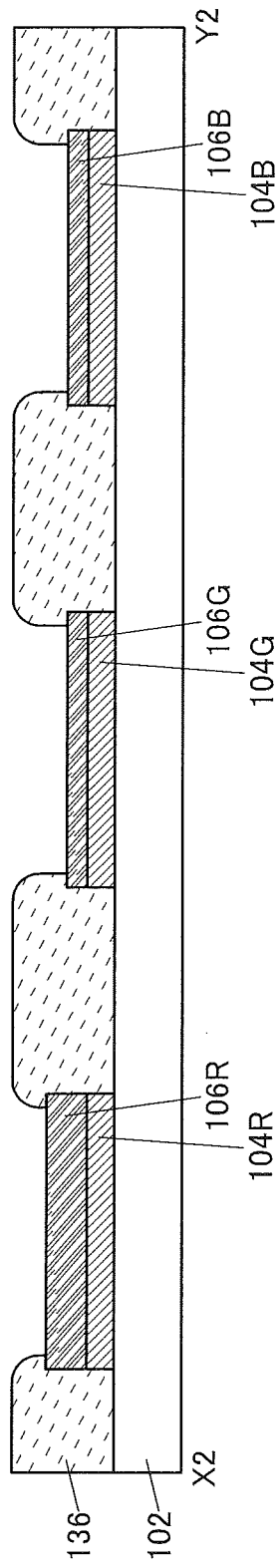
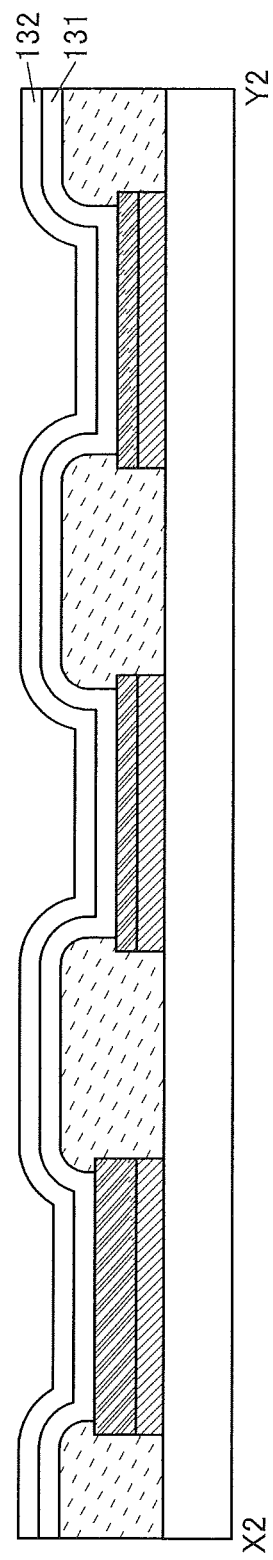

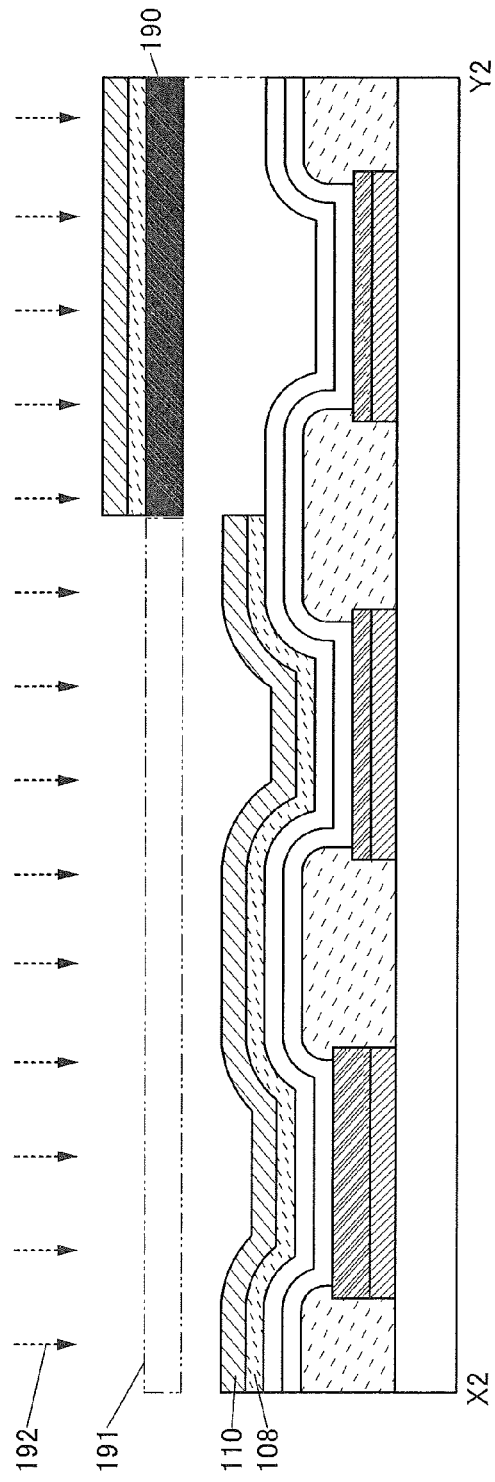
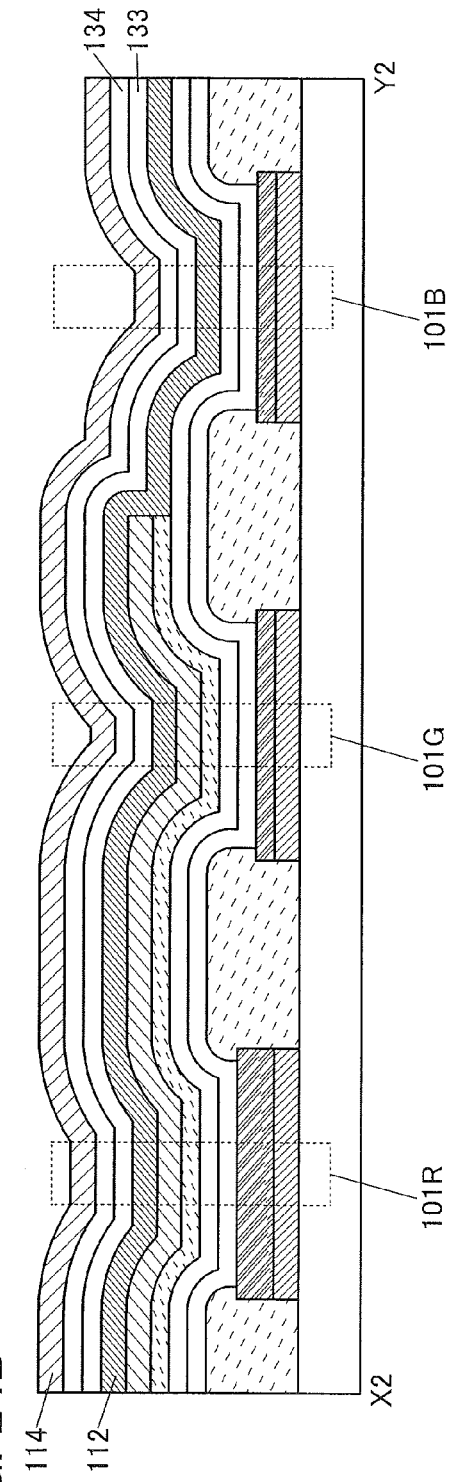
FIG. 24A
FIG. 24B

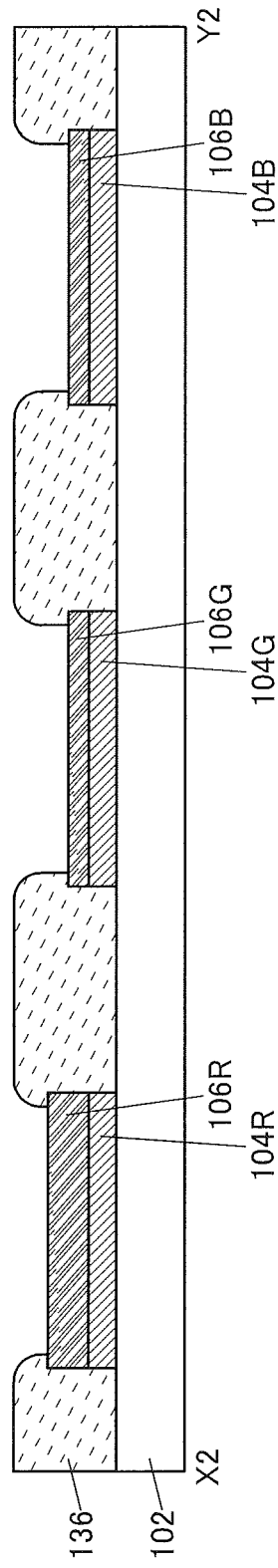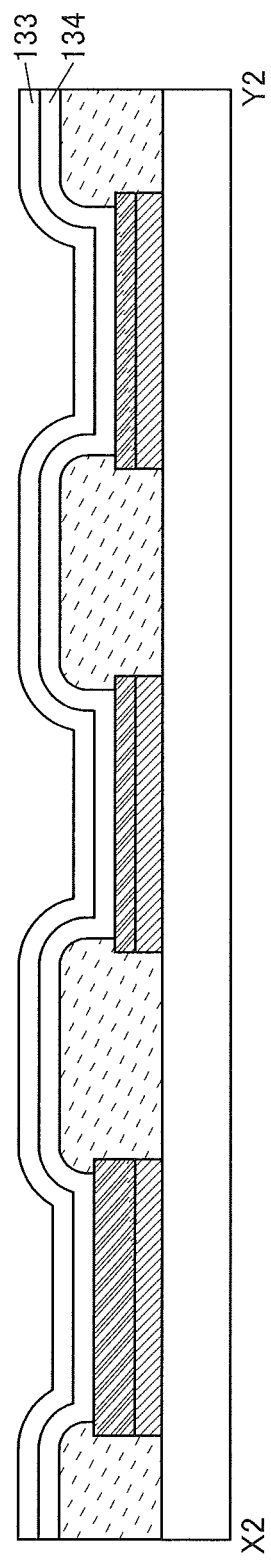

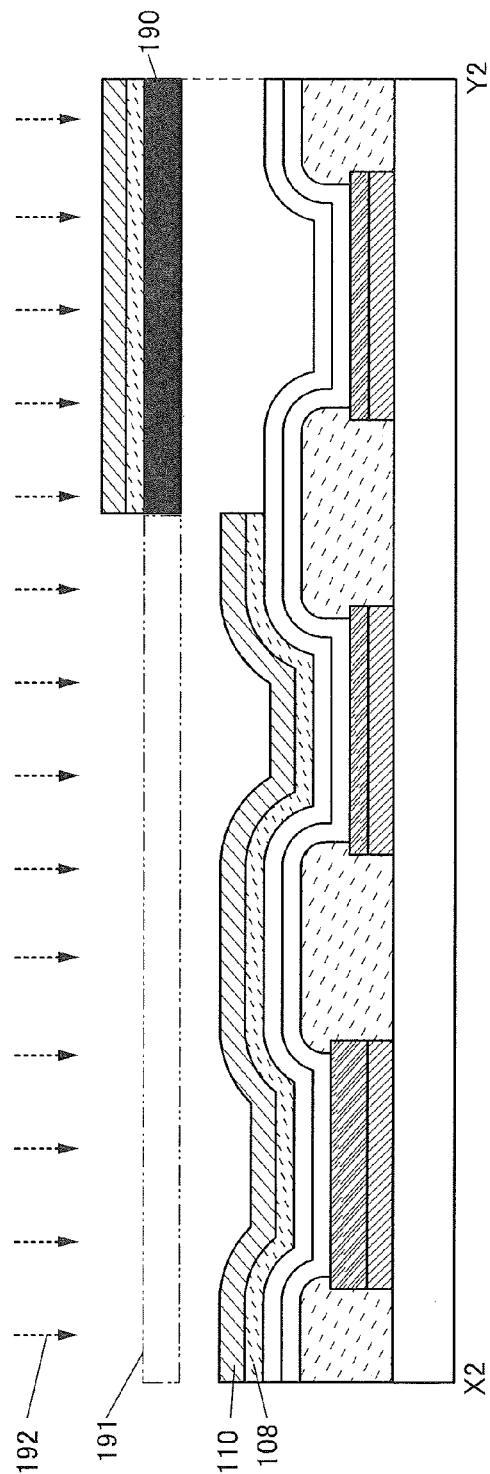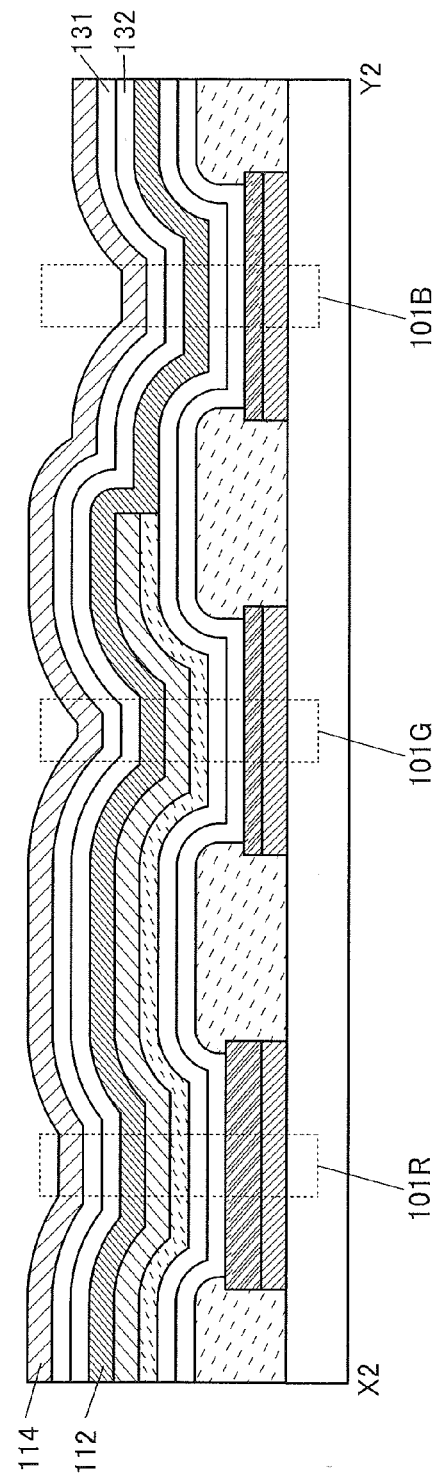

9100

9200

9101

9201

9102

9201

9201

LIGHT-EMITTING DEVICE HAVING MULTI-THICKNESS TRANSPARENT CONDUCTIVE LAYERS

BACKGROUND OF THE INVENTION

1. Field of the Invention

One embodiment of the present invention relates to a light-emitting device, an electronic device, and a lighting device which include a light-emitting element in which a light-emitting layer capable of emitting light by application of an electric field is provided between a pair of electrodes.

Note that one embodiment of the present invention is not limited to the above-described technical field. The technical field of one embodiment of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a memory device, a method for driving any of them, and a method for manufacturing any of them.

2. Description of the Related Art

In recent years, a light-emitting element including a light-emitting layer containing an organic compound between a pair of electrodes (e.g., an organic EL element) has been actively developed. An electronic device (e.g., a smartphone) equipped with a light-emitting device in which the light-emitting elements are arranged in a matrix is manufactured and commercially available.

In an organic EL element, voltage application between a pair of electrodes, between which a light-emitting layer is interposed, causes recombination of electrons and holes injected from the electrodes, which brings a light-emitting substance (an organic compound) into an excited state, and the return from the excited state to the ground state is accompanied by light emission. Since the spectrum of light emitted from a light-emitting substance is peculiar to the light-emitting substance, use of different types of organic compounds as light-emitting substances makes it possible to provide light-emitting elements which exhibit light of various colors.

In the case of light-emitting devices for displaying images, at least three-color light, i.e., red, green, and blue light is necessary for reproduction of full-color images. Furthermore, to enhance image quality with favorable color reproducibility, various efforts such as use of a microcavity structure and a color filter have been made to improve color purity.

As a way to achieve full-color display, for example, there is a method in which light-emitting layers for different colors are deposited in pixels side by side. The light-emitting layers are evaporated in only predetermined pixels using a shadow mask. In this case, to reduce cost by reducing the number of steps, a structure in which layers except the light-emitting layers, for example, a hole-transport layer, an electron-transport layer, and a cathode are formed to be shared among a plurality of pixels is disclosed (e.g., see Patent Document 1).

REFERENCE

Patent Document

[Patent Document 1] Japanese Published Patent Application No. 2004-006362

SUMMARY OF THE INVENTION

In the structure disclosed in Patent Document 1, light-emitting layers for different colors need to be deposited side by side, so that openings of a shadow mask need to be arranged (aligned) at predetermined positions with high accuracy. For higher definition of the light-emitting device, higher alignment accuracy is required. Thus, a problem of a reduction in yield in manufacturing a light-emitting device arises.

In view of the above-described problems, an object of one embodiment of the present invention is to provide a novel light-emitting device. Another object is to provide a novel light-emitting device with high productivity and low power consumption. Another object is to provide a novel method for manufacturing a light-emitting device.

Note that the description of the above-described objects does not disturb the existence of other objects. In one embodiment of the present invention, there is no need to achieve all of these objects. Other objects are apparent from and can be derived from the description of the specification and the like.

One embodiment of the present invention is a light-emitting device including a first light-emitting element, a second light-emitting element, and a third light-emitting element. The first light-emitting element includes a first lower electrode, a first transparent conductive layer over the first lower electrode, a first light-emitting layer over the first transparent conductive layer, a second light-emitting layer over the first light-emitting layer, and an upper electrode over the second light-emitting layer. The second light-emitting element includes a second lower electrode, a second transparent conductive layer over the second lower electrode, the first light-emitting layer over the second transparent conductive layer, the second light-emitting layer over the first light-emitting layer, and the upper electrode over the second light-emitting layer. The third light-emitting element includes a third lower electrode, a third transparent conductive layer over the third lower electrode, the second light-emitting layer over the third transparent conductive layer, and the upper electrode over the second light-emitting layer. The first transparent conductive layer includes a first region. The second transparent conductive layer includes a second region as thick as the third transparent conductive layer. The first region is thicker than the second region.

Another embodiment of the present invention is a light-emitting device including a first light-emitting element, a second light-emitting element, and a third light-emitting element. The first light-emitting element includes a first lower electrode, a first transparent conductive layer over the first lower electrode, a hole-injection layer over the first transparent conductive layer, a hole-transport layer over the hole-injection layer, a first light-emitting layer over the hole-transport layer, a second light-emitting layer over the first light-emitting layer, an electron-transport layer over the second light-emitting layer, an electron-injection layer over the electron-transport layer, and an upper electrode over the electron-injection layer. The second light-emitting element includes a second lower electrode, a second transparent conductive layer over the second lower electrode, the hole-injection layer over the second transparent conductive layer, the hole-transport layer over the hole-injection layer, the first light-emitting layer over the hole-transport layer, the second light-emitting layer over the first light-emitting layer, the electron-transport layer over the second light-emitting layer, the electron-injection layer over the electron-transport layer, and the upper electrode over the electron-injection layer. The third light-emitting element includes a third lower electrode, a third transparent conductive layer over the third lower electrode, the hole-injection layer over the third transparent conductive layer, the hole-transport layer over the hole-injection layer, the second light-emitting layer over the hole-transport layer, the electron-transport layer over the second light-emitting layer, the electron-injection layer over the electron-transport layer, and the upper electrode over the electron-injection layer. The first transparent conductive layer includes a first region. The second transparent conductive layer includes a second region as thick as the third transparent conductive layer. The first region is thicker than the second region.

Another embodiment of the present invention is a light-emitting device including a first light-emitting element, a second light-emitting element, and a third light-emitting element. The first light-emitting element includes a first lower electrode, a first transparent conductive layer over the first lower electrode, an optical adjustment layer over the first transparent conductive layer, a first light-emitting layer over the optical adjustment layer, a second light-emitting layer over the first light-emitting layer, and an upper electrode over the second light-emitting layer. The second light-emitting element includes a second lower electrode, a second transparent conductive layer over the second lower electrode, the optical adjustment layer over the second transparent conductive layer, the first light-emitting layer over the optical adjustment layer, the second light-emitting layer over the first light-emitting layer, and the upper electrode over the second light-emitting layer. The third light-emitting element includes a third lower electrode, a third transparent conductive layer over the third lower electrode, the second light-emitting layer over the third transparent conductive layer, and the upper electrode over the second light-emitting layer. The first transparent conductive layer includes a first region. The second transparent conductive layer includes a second region as thick as the third transparent conductive layer. The first region is thicker than the second region.

Another embodiment of the present invention is a light-emitting device including a first light-emitting element, a second light-emitting element, and a third light-emitting element. The first light-emitting element includes a first lower electrode, a first transparent conductive layer over the first lower electrode, a hole-injection layer over the first transparent conductive layer, a hole-transport layer over the hole-injection layer, an optical adjustment layer over the hole-transport layer, a first light-emitting layer over the optical adjustment layer, a second light-emitting layer over the first light-emitting layer, an electron-transport layer over the second light-emitting layer, an electron-injection layer over the electron-transport layer, and an upper electrode over the electron-injection layer. The second light-emitting element includes a second lower electrode, a second transparent conductive layer over the second lower electrode, the hole-injection layer over the second transparent conductive layer, the hole-transport layer over the hole-injection layer, the optical adjustment layer over the hole-transport layer, the first light-emitting layer over the optical adjustment layer, the second light-emitting layer over the first light-emitting layer, the electron-transport layer over the second light-emitting layer, the electron-injection layer over the electron-transport layer, and the upper electrode over the electron-injection layer. The third light-emitting element includes a third lower electrode, a third transparent conductive layer over the third lower electrode, the hole-injection layer over the third transparent conductive layer, the hole-transport layer over the hole-injection layer, the second light-emitting layer over the hole-transport layer, the electron-transport layer over the second light-emitting layer, the electron-injection layer over the electron-transport layer, and the upper electrode over the electron-injection layer. The first transparent conductive layer includes a first region. The second transparent conductive layer includes a second region as thick as the third transparent conductive layer. The first region is thicker than the second region.

In each of the above embodiments, a spectrum of light emitted from the first light-emitting element preferably includes at least one peak in a wavelength range in which an emission wavelength is longer than or equal to 600 nm and shorter than or equal to 740 nm, a spectrum of light emitted from the second light-emitting element preferably includes at least one peak in a wavelength range in which an emission wavelength is longer than or equal to 480 nm and shorter than 600 nm, and a spectrum of light emitted from the third light-emitting element preferably includes at least one peak in a wavelength range in which an emission wavelength is longer than or equal to 400 nm and shorter than 480 nm.

In each of the above embodiments, a distance between the first lower electrode and the first light-emitting layer is preferably larger than a distance between the second lower electrode and the first light-emitting layer, and a distance between the second lower electrode and the second light-emitting layer is preferably larger than a distance between the third lower electrode and the second light-emitting layer.

In each of the above embodiments, an optical path length between the first lower electrode and the first light-emitting layer is preferably $3\lambda_R/4$ ($\lambda_R$ represents a wavelength of red light), an optical path length between the second lower electrode and the first light-emitting layer is preferably $3\lambda_G/4$ ($\lambda_G$ represents a wavelength of green light), and an optical path length between the third lower electrode and the second light-emitting layer is preferably $3\lambda_B/4$ ($\lambda_B$ represents a wavelength of blue light).

In each of the above embodiments, the optical adjustment layer preferably has a hole-transport property.

In each of the above embodiments, the first light-emitting layer preferably includes a phosphorescent material, and the second light-emitting layer preferably includes a fluorescent material.

Another embodiment of the present invention is a light-emitting device including a first light-emitting element, a second light-emitting element, and a third light-emitting element. The first light-emitting element includes a first lower electrode, a first transparent conductive layer over the first lower electrode, an electron-injection layer over the first transparent conductive layer, an electron-transport layer over the electron-injection layer, a first light-emitting layer over the electron-transport layer, a second light-emitting layer over the first light-emitting layer, a hole-transport layer over the second light-emitting layer, a hole-injection layer over the hole-transport layer, and an upper electrode over the hole-injection layer. The second light-emitting element includes a second lower electrode, a second transparent conductive layer over the second lower electrode, the electron-injection layer over the second transparent conductive layer, the electron-transport layer over the electron-injection layer, the first light-emitting layer over the electron-transport layer, the second light-emitting layer over the first light-emitting layer, the hole-transport layer over the second light-emitting layer, the hole-injection layer over the hole-transport layer, and the upper electrode over the hole-injection layer. The third light-emitting element includes a third lower electrode, a third transparent conductive layer over the third lower electrode, the electron-injection layer over the third transparent conductive layer, the electron-transport layer over the electron-injection layer, the second light-emitting layer over the electron-transport layer, the hole-transport layer over the second light-emitting layer, the hole-injection layer over the hole-transport layer, and the upper electrode over the hole-injection layer. The first transparent conductive layer includes a first region. The second transparent conductive layer includes a second region as thick as the third transparent conductive layer. The first region is thicker than the second region.

Another embodiment of the present invention is a light-emitting device including a first light-emitting element, a second light-emitting element, and a third light-emitting element. The first light-emitting element includes a first lower electrode, a first transparent conductive layer over the first lower electrode, an electron-injection layer over the first transparent conductive layer, an electron-transport layer over the electron-injection layer, an optical adjustment layer over the electron-transport layer, a first light-emitting layer over the optical adjustment layer, a second light-emitting layer over the first light-emitting layer, a hole-transport layer over the second light-emitting layer, a hole-injection layer over the hole-transport layer, and an upper electrode over the hole-injection layer. The second light-emitting element includes a second lower electrode, a second transparent conductive layer over the second lower electrode, the electron-injection layer over the second transparent conductive layer, the electron-transport layer over the electron-injection layer, the optical adjustment layer over the electron-transport layer, the first light-emitting layer over the optical adjustment layer, the second light-emitting layer over the first light-emitting layer, the hole-transport layer over the second light-emitting layer, the hole-injection layer over the hole-transport layer, and the upper electrode over the hole-injection layer. The third light-emitting element includes a third lower electrode, a third transparent conductive layer over the third lower electrode, the electron-injection layer over the third transparent conductive layer, the electron-transport layer over the electron-injection layer, the second light-emitting layer over the electron-transport layer, the hole-transport layer over the second light-emitting layer, the hole-injection layer over the hole-transport layer, and the upper electrode over the hole-injection layer. The first transparent conductive layer includes a first region. The second transparent conductive layer includes a second region as thick as the third transparent conductive layer. The first region is thicker than the second region.

In each of the above embodiments, a spectrum of light emitted from the first light-emitting element preferably includes at least one peak in a wavelength range in which an emission wavelength is longer than or equal to 600 nm and shorter than or equal to 740 nm, a spectrum of light emitted from the second light-emitting element preferably includes at least one peak in a wavelength range in which an emission wavelength is longer than or equal to 480 nm and shorter than 600 nm, and a spectrum of light emitted from the third light-emitting element preferably includes at least one peak in a wavelength range in which an emission wavelength is longer than or equal to 400 nm and shorter than 480 nm.

In each of the above embodiments, a distance between the first lower electrode and the first light-emitting layer is preferably larger than a distance between the second lower electrode and the first light-emitting layer, and a distance between the second lower electrode and the second light-emitting layer is preferably larger than a distance between the third lower electrode and the second light-emitting layer.

In each of the above embodiments, an optical path length between the first lower electrode and the first light-emitting layer is preferably $3\lambda_R/4$ ($\lambda_R$ represents a wavelength of red light), an optical path length between the second lower electrode and the first light-emitting layer is preferably $3\lambda_G/4$ ($\lambda_G$ represents a wavelength of green light), and an optical path length between the third lower electrode and the second light-emitting layer is preferably $3\lambda_B/4$ ($\lambda_B$ represents a wavelength of blue light).

In each of the above embodiments, the optical adjustment layer preferably has an electron-transport property.

In each of the above embodiments, the first light-emitting layer preferably includes a phosphorescent material, and the second light-emitting layer preferably includes a fluorescent material.

One embodiment of the present invention includes, in its scope, an electronic device including the light-emitting device in each of the above embodiments and having a touch sensor function or a lighting device including the light-emitting device in each of the above embodiments and a housing. Note that a light-emitting device in this specification means an image display device or a light source (including a lighting device). In addition, the light-emitting device includes, in its category, all of the following: a module in which a light-emitting device is connected to a connector such as a flexible printed circuit (FPC) or a tape carrier package (TCP), a module in which a printed wiring board is provided on the tip of a TCP, and a module in which an integrated circuit (IC) is directly mounted on a light-emitting element by a chip on glass (COG) method.

With one embodiment of the present invention, a novel light-emitting device can be provided. With one embodiment of the present invention, a novel light-emitting device with high productivity and low power consumption can be provided. With one embodiment of the present invention, a novel method for manufacturing a light-emitting device can be provided.

Note that the description of these effects does not disturb the existence of other effects. One embodiment of the present invention does not necessarily have all of these effects. Other effects are apparent from and can be derived from the description of the specification, the drawings, the claims, and the like.

BRIEF DESCRIPTION OF THE DRAWINGS

FIG. 2 is a cross-sectional view illustrating a light-emitting device.

FIGS. 23A and 23B are cross-sectional views illustrating a method for manufacturing a light-emitting device.

FIGS. 24A and 24B are cross-sectional views illustrating the method for manufacturing the light-emitting device.

FIGS. 26A and 26B are cross-sectional views illustrating a method for manufacturing a light-emitting device.

FIGS. 27A and 27B are cross-sectional views illustrating the method for manufacturing the light-emitting device.

DETAILED DESCRIPTION OF THE INVENTION

Figure 1A:
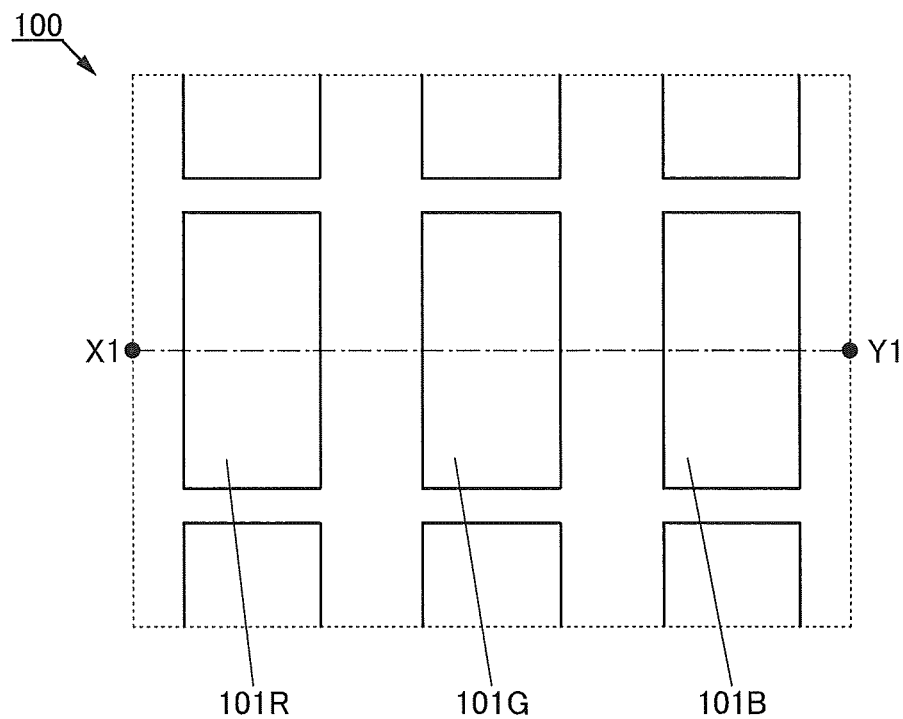
FIGS. 1A and 1B are a plan view and a cross-sectional view, respectively, illustrating a light-emitting device.

Embodiments of the present invention will be described below with reference to the drawings. However, the present invention is not limited to description to be given below, and it is easily understood that modes and details thereof can be variously modified without departing from the purpose and the scope of the present invention. Accordingly, the present invention should not be construed as being limited to the description of the embodiments below.

Note that the position, the size, the range, or the like of each structure shown in drawings and the like is not accurately represented in some cases for simplification. Therefore, the disclosed invention is not necessarily limited to the position, the size, the range, or the like disclosed in the drawings and the like.

Note that the ordinal numbers such as "first", "second", and the like in this specification and the like are used for convenience and do not denote the order of steps or the stacking order of layers. Therefore, for example, description can be made even when "first" is replaced with "second" or "third", as appropriate. In addition, the ordinal numbers in this specification and the like are not necessarily the same as those which specify one embodiment of the present invention.

In describing structures of the invention with reference to the drawings in this specification and the like, common reference numerals are used for the same portions in different drawings.

Embodiment 1

In this embodiment, a light-emitting device of one embodiment of the present invention and a method for manufacturing the light-emitting device will be described below with reference to FIGS. 1A and 1B, FIG. 2, FIGS. 3A and 3B, FIG. 4, FIG. 5, FIG. 6, FIG. 7, FIG. 8, FIGS. 9A to 9C, FIG. 10, FIG. 11, FIG. 12, FIG. 13, FIG. 14, FIG. 15, FIG. 16, FIG. 17, FIG. 18, FIG. 19, FIG. 20, FIG. 21, FIG. 22, FIGS. 23A and 23B, FIGS. 24A and 24B, FIGS. 25A and 25B, FIGS. 26A and 26B, FIGS. 27A and 27B, FIGS. 28A and 28B, FIGS. 29A and 29B, FIGS. 30A and 30B, FIG. 31, FIG. 32, FIG. 33, and FIG. 34.

Structural Example 1 of Light-Emitting Device

Figure 1B:
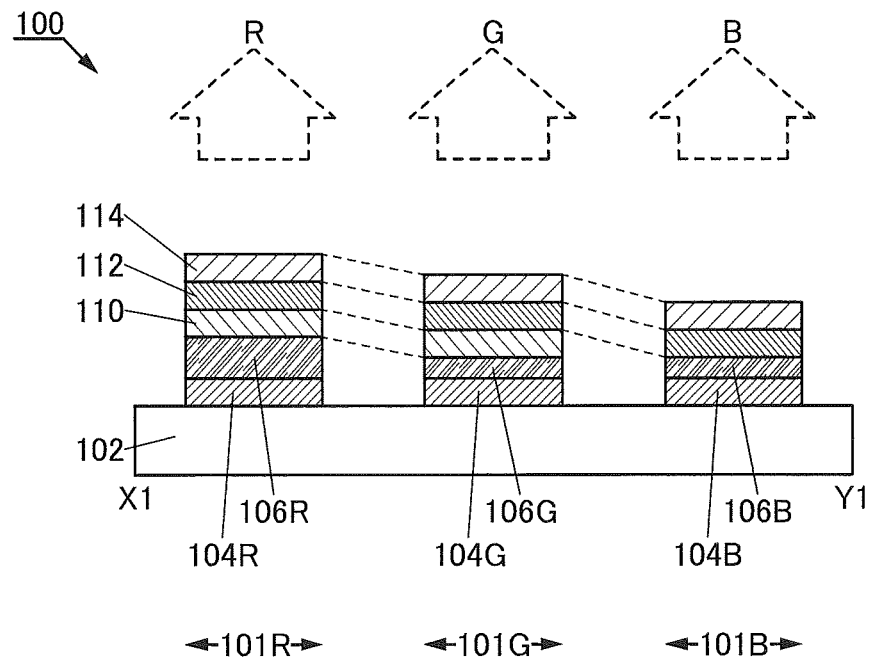

FIG. 1A is a plan view illustrating an example of a light-emitting device of one embodiment of the present invention. FIG. 1B is a cross-sectional view along dashed-dotted line X1-Y1 in FIG. 1A.

A light-emitting device 100 illustrated in FIGS. 1A and 1B includes a first light-emitting element 101R, a second light-emitting element 101G, and a third light-emitting element 101B. The first light-emitting element 101R includes a first lower electrode 104R, a first transparent conductive layer 106R over the first lower electrode 104R, a first light-emitting layer 110 over the first transparent conductive layer 106R, a second light-emitting layer 112 over the first light-emitting layer 110, and an upper electrode 114 over the second light-emitting layer 112. The second light-emitting element 101G includes a second lower electrode 104G, a second transparent conductive layer 106G over the second lower electrode 104G, the first light-emitting layer 110 over the second transparent conductive layer 106G, the second light-emitting layer 112 over the first light-emitting layer 110, and the upper electrode 114 over the second light-emitting layer 112. The third light-emitting element 101B includes a third lower electrode 104B, a third transparent conductive layer 106B over the third lower electrode 104B, the second light-emitting layer 112 over the third transparent conductive layer 106B, and the upper electrode 114 over the second light-emitting layer 112.

Note that in the light-emitting device 100, the lower electrodes (the first lower electrode 104R, the second lower electrode 104G, and the third lower electrode 104B) each function as an anode, and the upper electrode 114 functions as a cathode. The lower electrode has a function of reflecting light. However, the structure of the lower electrode and the upper electrode is not limited thereto and, for example, the lower electrode may function as a cathode and the upper electrode may function as an anode.

The second transparent conductive layer 106G and the third transparent conductive layer 106B are formed with substantially the same thicknesses. For example, in the case where the second transparent conductive layer 106G and the third transparent conductive layer 106B are formed through a step of processing one transparent conductive film, they have substantially the same thicknesses or include regions having substantially the same thicknesses. In this specification and the like, the term "substantially the same thicknesses" includes the case where, between two compared films, the thickness of one film is greater than or equal to −20% and less than or equal to +20% or greater than or equal to −10% and less than or equal to +10% with respect to the thickness of the other film. In addition, the thickness of the first transparent conductive layer 106R is greater than that of each of the second transparent conductive layer 106G and the third transparent conductive layer 106B. In other words, the first transparent conductive layer 106R includes a first region and the second transparent conductive layer 106G includes a second region having the same thickness as the third transparent conductive layer 106B, and the first region is thicker than the second region. With such a structure, a distance between the lower electrode and the light-emitting layer or an optical path length between the lower electrode and the light-emitting layer can be adjusted in each of the light-emitting elements.

Specifically, the distance between the first lower electrode 104R and the first light-emitting layer 110 is larger than the distance between the second lower electrode 104G and the first light-emitting layer 110, and the distance between the second lower electrode 104G and the second light-emitting layer 112 is larger than the distance between the third lower electrode 104B and the second light-emitting layer 112.

In the case where the distances between the lower electrodes and the light-emitting layers have the above-described relations, it is preferable that an optical path length between the first lower electrode 104R and the first light-emitting layer 110 be $3\lambda_R/4$ ($\lambda_R$ represents a wavelength of red light), that an optical path length between the second lower electrode 104G and the first light-emitting layer 110 be $3\lambda_G/4$ ($\lambda_G$ represents a wavelength of green light), and that an optical path length between the third lower electrode 104B and the second light-emitting layer 112 be $3\lambda_B/4$ ($\lambda_B$ represents a wavelength of blue light).

In the light-emitting device 100, the thickness of the second transparent conductive layer 106G is the same as that of the third transparent conductive layer 106B, and the thickness of the first transparent conductive layer 106R is greater than that of each of the second transparent conductive layer 106G and the third transparent conductive layer 106B. The above-described optical path length of the third light-emitting element 101B is possible because the first light-emitting layer 110 is not provided. With the above-described optical path lengths, light in a red wavelength range, light in a green wavelength range, and light in a blue wavelength range can be efficiently extracted from the first light-emitting element 101R, the second light-emitting element 101G, and the third light-emitting element 101B, respectively.

Note that, to be exact, the optical path length between each of the lower electrodes (the first lower electrode 104R and the second lower electrode 104G) and the first light-emitting layer 110 is represented by the product of the refractive index and the thickness between a reflective region in the lower electrode and the first light-emitting layer 110. However, it is difficult to precisely determine the reflection region in the lower electrode or a light-emitting region in the first light-emitting layer 110; therefore, it is presumed that the above-described effect can be sufficiently achieved wherever the reflection region and the light-emitting region may be set in the lower electrode and the first light-emitting layer 110, respectively. Note that the same applies to the optical path length between the third lower electrode 104B and the second light-emitting layer 112.

A spectrum of light emitted from the first light-emitting element 101R includes at least one peak in the red wavelength range, a spectrum of light emitted from the second light-emitting element 101G includes at least one peak in the green wavelength range, and a spectrum of light emitted from the third light-emitting element 101B includes at least one peak in the blue wavelength range. Accordingly, by the first light-emitting element 101R, the second light-emitting element 101G, and the third light-emitting element 101B, full-color display can be performed. Note that in this specification and the like, an emission wavelength in the red wavelength range is longer than or equal to 600 nm and shorter than or equal to 740 nm, an emission wavelength in the green wavelength range is longer than or equal to 480 nm and shorter than 600 nm, and an emission wavelength in the blue wavelength range is longer than or equal to 400 nm and shorter than 480 nm.

In FIG. 1B, light in a red (R) wavelength range, light in a green (G) wavelength range, and light in a blue (B) wavelength range emitted to the outside are schematically shown by arrows (R, G, and B) with broken lines. The same applies to light-emitting devices described later. Thus, the light-emitting device 100 illustrated in FIGS. 1A and 1B is of a top-emission type in which light emitted from light-emitting elements is extracted to the side opposite to the substrate 102 side where the light-emitting elements are formed. However, one embodiment of the present invention is not limited to this type, and may be of a bottom-emission type in which light emitted from light-emitting elements is extracted to the substrate side where the light-emitting elements are formed, or a dual-emission type in which light emitted from light-emitting elements is extracted in both top and bottom directions of the substrate 102 where the light-emitting elements are formed.

Moreover, in the light-emitting device 100 illustrated in FIGS. 1A and 1B, the first light-emitting layer 110 is shared between the first light-emitting element 101R and the second light-emitting element 101G, and the second light-emitting layer 112 is shared between the first light-emitting element 101R, the second light-emitting element 101G, and the third light-emitting element 101B. By sharing the first light-emitting layer 110 or the second light-emitting layer 112 between the light-emitting elements, the productivity in formation of the light-emitting elements can be increased. Specifically, in manufacturing the light-emitting elements of the light-emitting device 100, only one step (the step for depositing the first light-emitting layer 110) is required to form layers in selected pixels, so that the productivity can be increased.

Note that in the first light-emitting element 101R and the second light-emitting element 101G, the second light-emitting layer 112 does not contribute to light emission. For example, for the second light-emitting layer 112, a material with a high electron-transport property and a low hole-transport property or a material having a lower highest occupied molecular orbital (HOMO) level than a material used for the first light-emitting layer 110 is used. In other words, in each of the first light-emitting element 101R and the second light-emitting element 101G, the second light-emitting layer 112 functions as an electron-transport layer.

The first light-emitting layer 110 includes a phosphorescent material. The second light-emitting layer 112 includes a fluorescent material. With such a structure, a novel light-emitting device with high luminous efficiency and high reliability can be provided. For example, the first light-emitting layer 110 can be formed using a phosphorescent material emitting light in a green wavelength range, and the second light-emitting layer 112 can be formed using a fluorescent material emitting light in a blue wavelength range. However, the materials that can be used for the first light-emitting layer 110 and the second light-emitting layer 112 are not limited to the above. For example, a phosphorescent material may be used for the second light-emitting layer 112.

Figure 9A:
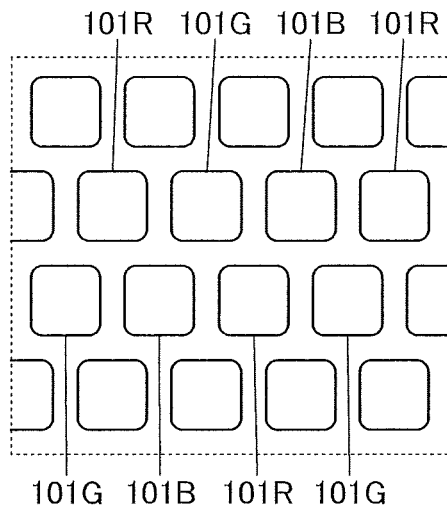
FIGS. 9A to 9C are each a plan view illustrating a light-emitting device.
Figure 9B:
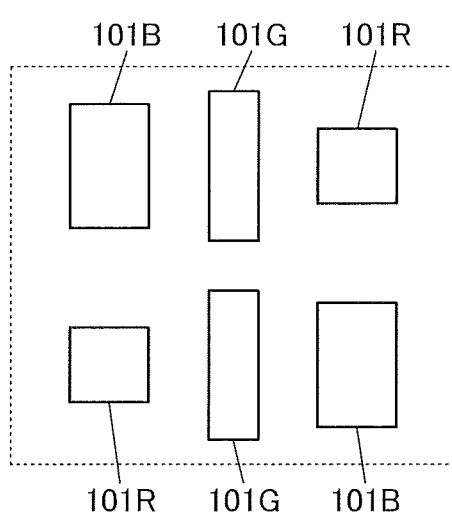
Figure 9C:
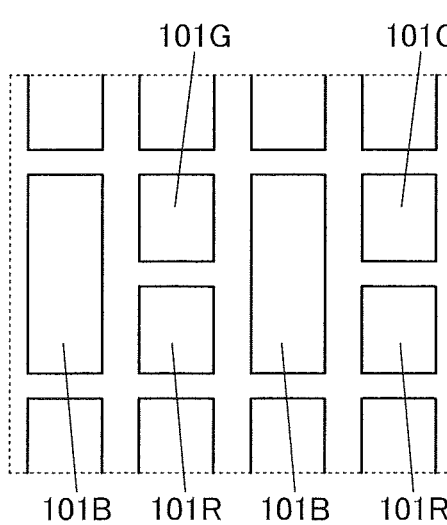

Although the first light-emitting element 101R, the second light-emitting element 101G, and the third light-emitting element 101B are provided in a stripe arrangement in FIG. 1A as an example, they may be provided in any other arrangement. For example, a delta arrangement illustrated in FIG. 9A, a pentile arrangement illustrated in FIG. 9B, or a pixel arrangement illustrated in FIG. 9C may be employed as the arrangement of the light-emitting elements. Note that FIGS. 9A to 9C are plan views each illustrating an example of the light-emitting device.

With the above-described structure, in manufacturing the light-emitting elements, the number of steps for forming layers in selected pixels is small; thus, a light-emitting device with increased productivity can be provided. The light-emitting elements of the light-emitting device have low power consumption because of their high luminous efficiency. Moreover, the light-emitting elements have high reliability. Therefore, a novel light-emitting device with high productivity and low power consumption can be provided.

Next, a different mode of the light-emitting device 100 illustrated in FIGS. 1A and 1B is described with reference to FIG. 2. Note that FIG. 2 is a cross-sectional view along dashed dotted line X1-Y1 in FIG. 1A.

The light-emitting device 100 illustrated in FIG. 2 includes the first light-emitting element 101R, the second light-emitting element 101G, and the third light-emitting element 101B. The first light-emitting element 101R includes the first lower electrode 104R, the first transparent conductive layer 106R over the first lower electrode 104R, a hole-injection layer 131 over the first transparent conductive layer 106R, a hole-transport layer 132 over the hole-injection layer 131, the first light-emitting layer 110 over the hole-transport layer 132, the second light-emitting layer 112 over the first light-emitting layer 110, an electron-transport layer 133 over the second light-emitting layer 112, an electron-injection layer 134 over the electron-transport layer 133, and the upper electrode 114 over the electron-injection layer 134. The second light-emitting element 101G includes the second lower electrode 104G, the second transparent conductive layer 106G over the second lower electrode 104G, the hole-injection layer 131 over the second transparent conductive layer 106G, the hole-transport layer 132 over the hole-injection layer 131, the first light-emitting layer 110 over the hole-transport layer 132, the second light-emitting layer 112 over the first light-emitting layer 110, the electron-transport layer 133 over the second light-emitting layer 112, the electron-injection layer 134 over the electron-transport layer 133, and the upper electrode 114 over the electron-injection layer 134. The third light-emitting element 101B includes the third lower electrode 104B, the third transparent conductive layer 106B over the third lower electrode 104B, the hole-injection layer 131 over the third transparent conductive layer 106B, the hole-transport layer 132 over the hole-injection layer 131, the second light-emitting layer 112 over the hole-transport layer 132, the electron-transport layer 133 over the second light-emitting layer 112, the electron-injection layer 134 over the electron-transport layer 133, and the upper electrode 114 over the electron-injection layer 134.

As in the light-emitting device 100 illustrated in FIG. 2, the hole-injection layer 131 and the hole-transport layer 132 are provided between each of the transparent conductive layers (the first transparent conductive layer 106R, the second transparent conductive layer 106G, and the third transparent conductive layer 106B) and the first light-emitting layer 110 or the second light-emitting layer 112, and the electron-transport layer 133 and the electron-injection layer 134 are provided between the second light-emitting layer 112 and the upper electrode 114. Note that without limitation to the structure illustrated in FIG. 2, the light-emitting device 100 may include at least one selected from the hole-injection layer 131, the hole-transport layer 132, the electron-transport layer 133, and the electron-injection layer 134. Alternatively, although not illustrated in FIG. 2, a functional layer having a function of reducing a carrier injection barrier may be provided.

Here, the second light-emitting layers 112 preferably has an electron-transport property so that carriers are recombined efficiently in the first light-emitting layer 110 in each of the first light-emitting element 101R and the second light-emitting element 101G. In other words, in the case where the second light-emitting layer 112 includes a host material and a guest material (a light-emitting material), it is preferable that the host material have an electron-transport property and that the guest material have a hole-trap property. From the same point of view, it is preferable that the first light-emitting layer 110 have an electron-transport property; however, it is difficult to optimize the optical path length when a recombination region is localized on the hole-transport layer 132 side (this is because the optical thickness of the first light-emitting layer 110 is approximately $\lambda_G$-$\lambda_B$, in which case the optical path length between the lower electrode 104G and the interface between the first light-emitting layer 110 and the hole-transport layer 132 deviates from $3\lambda_G/4$). To optimize this deviation, it is necessary that the first light-emitting layer 110 have not only an electron-transport property but also an appropriate hole-transport property that can prevent passage of holes to the second light-emitting layer 112. That is, it is preferable that the first light-emitting layer 110 have a bipolar property. Accordingly, for example, it is preferable that the first light-emitting layer 110 include at least a hole-transport material, an electron-transport material, and a light-emitting material.

Next, other different modes of the light-emitting device 100 illustrated in FIGS. 1A and 1B are described with reference to FIGS. 3A and 3B. Note that FIGS. 3A and 3B are each a cross-sectional view along dashed dotted line X1-Y1 in FIG. 1A.

Figure 3A:
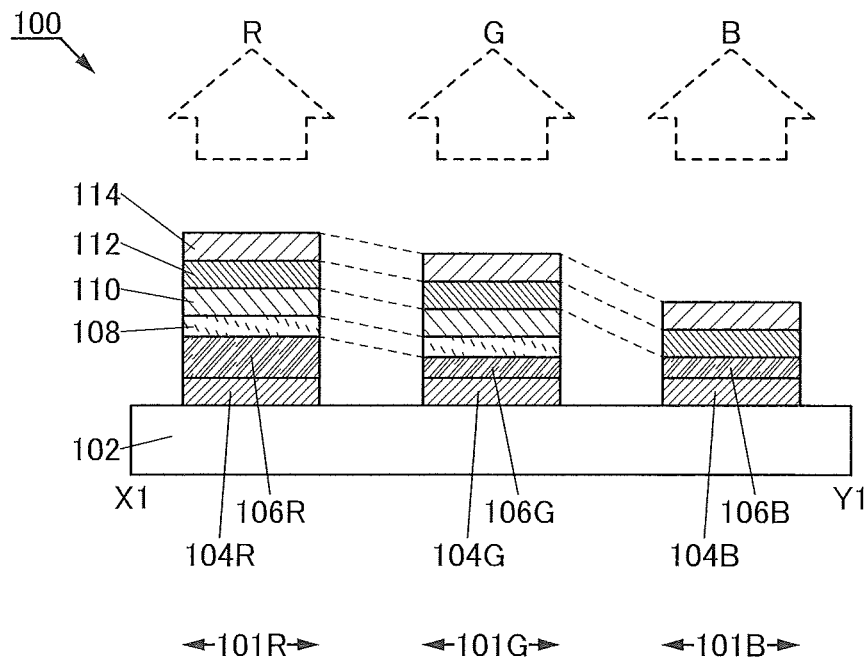
FIGS. 3A and 3B are each a cross-sectional view illustrating a light-emitting device.

In the light-emitting device 100 illustrated in FIG. 3A, an optical adjustment layer 108 is provided in addition to the components of the light-emitting device 100 illustrated in FIG. 1B. Specifically, the first light-emitting element 101R includes the optical adjustment layer 108 between the first transparent conductive layer 106R and the first light-emitting layer 110. The second light-emitting element 101G includes the optical adjustment layer 108 between the second transparent conductive layer 106G and the first light-emitting layer 110.

Figure 3B:
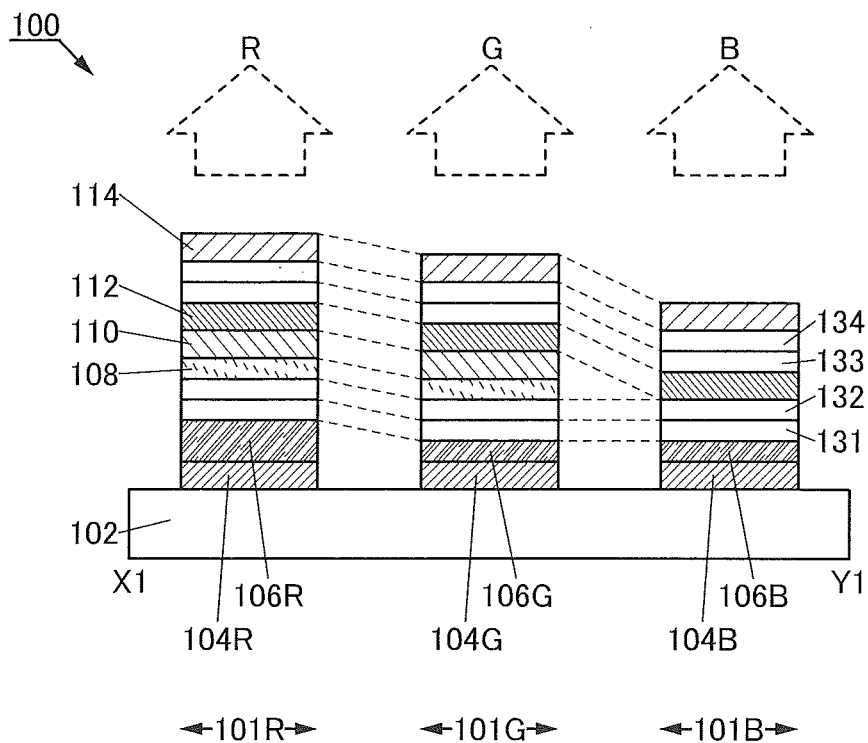

In the light-emitting device 100 illustrated in FIG. 3B, the optical adjustment layer 108 is provided in addition to the components of the light-emitting device 100 illustrated in FIG. 2. Specifically, the first light-emitting element 101R includes the optical adjustment layer 108 between the hole-transport layer 132 and the first light-emitting layer 110. The second light-emitting element 101G includes the optical adjustment layer 108 between the hole-transport layer 132 and the first light-emitting layer 110.

As illustrated in FIG. 3A, with the structure provided with the optical adjustment layer 108, an optical path length between each of the lower electrodes (the first lower electrode 104R and the second lower electrode 104G) and the first light-emitting layer 110 can be adjusted. As illustrated in FIG. 3B, with the structure provided with the optical adjustment layer 108, an optical path length between each of the lower electrodes (the first lower electrode 104R and the second lower electrode 104G) and the upper electrode 114 can be adjusted. It is possible not to provide the optical adjustment layer 108 in the case where the optical path length between the lower electrode and the upper electrode 114 can be adjusted by each of the transparent conductive layers (the first transparent conductive layer 106R, the second transparent conductive layer 106G, and the third transparent conductive layer 106B), the first light-emitting layer 110, and/or the second light-emitting layer 112. However, the optical adjustment layer 108 is preferred to be provided because the optical path length can be adjusted easily.

Furthermore, in manufacturing the light-emitting device 100 illustrated in FIGS. 3A and 3B, only one step is required to form layers in selected pixels when the optical adjustment layer 108 and the first light-emitting layer 110 are formed consecutively. That is, there is no increase in the number of steps for forming layers in selected pixels that is accompanied by addition of the optical adjustment layer 108.

The optical adjustment layer 108 preferably has a hole-transport property. For example, when the optical adjustment layer 108 is formed using a material with a high hole-transport property, holes can be preferably transported to the first light-emitting layer 110; thus, the first light-emitting layer 110 can have high luminous efficiency.

Figure 4:
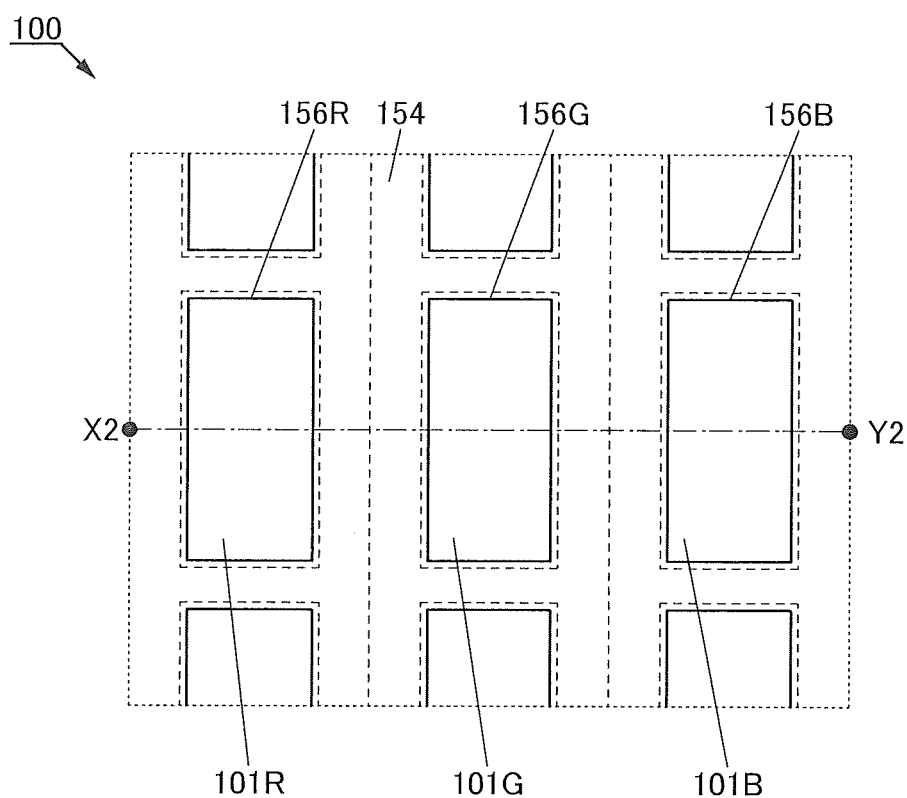
FIG. 4 is a plan view illustrating a light-emitting device.

Next, other different modes of the light-emitting device 100 illustrated in FIGS. 1A and 1B are described with reference to FIG. 4, FIG. 5, FIG. 6, FIG. 7, and FIG. 8. FIG. 4 is a plan view illustrating an example of a light-emitting device of one embodiment of the present invention. Note that FIGS. 5 to 8 are each a cross-sectional view along dashed dotted line X2-Y2 in FIG. 4.

Figure 5:
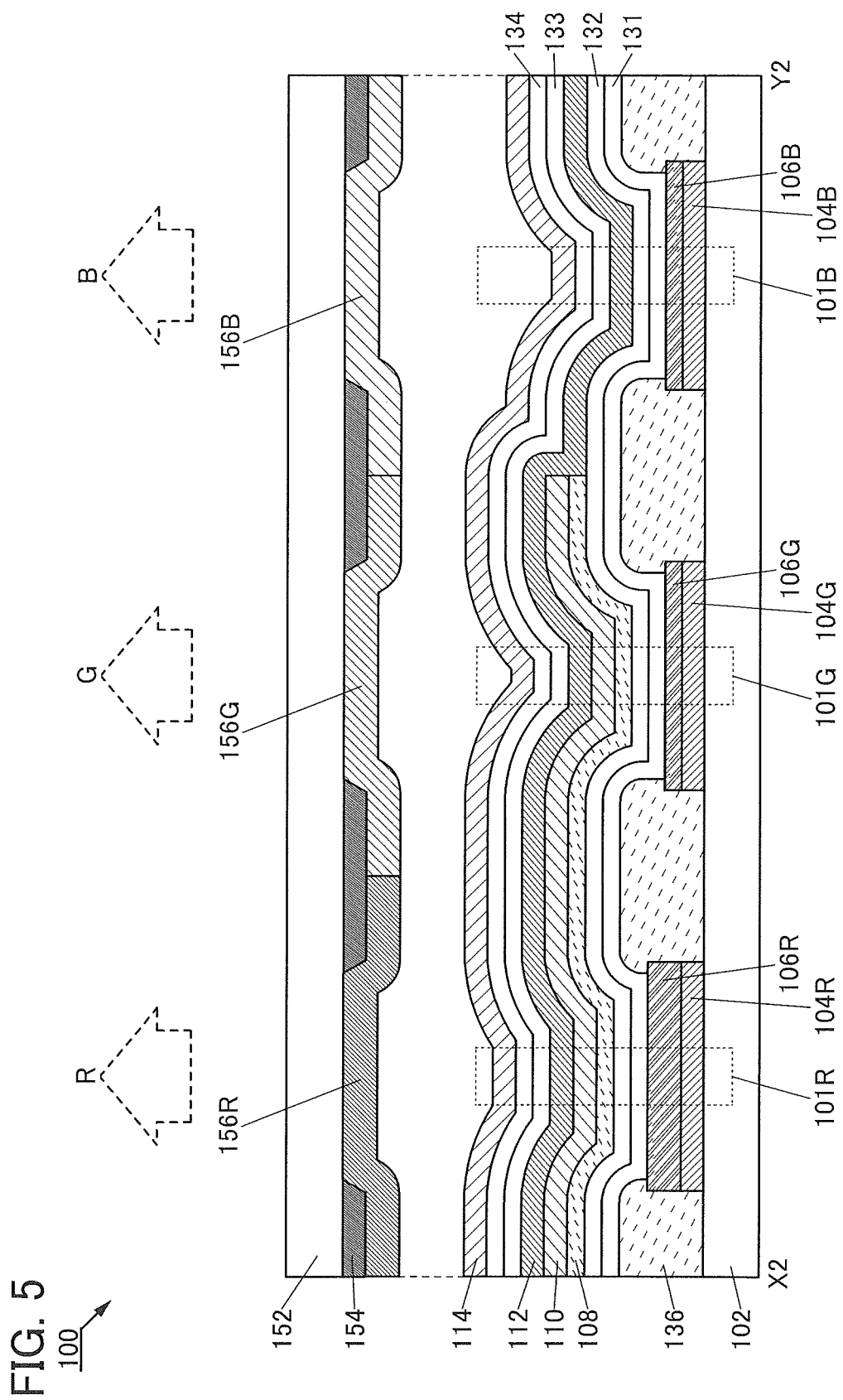
FIG. 5 is a cross-sectional view illustrating a light-emitting device.

The light-emitting device 100 illustrated in FIG. 5 includes a partition 136 and a substrate 152 in addition to the components of the light-emitting device 100 illustrated in FIG. 3B. The partitions 136 are provided at outer portions of the light-emitting elements and have a function of covering the end portions of either or both of the lower electrodes and the transparent conductive layers of the light-emitting elements. The substrate 152 is provided with a light-blocking layer 154, a first optical element 156R, a second optical element 156G, and a third optical element 156B. The light-blocking layer 154 is provided to overlap with the partition 136. The first optical element 156R, the second optical element 156G, and the third optical element 156B are provided to overlap with the first light-emitting element 101R, the second light-emitting element 101G, and the third light-emitting element 101B, respectively.

Figure 6:
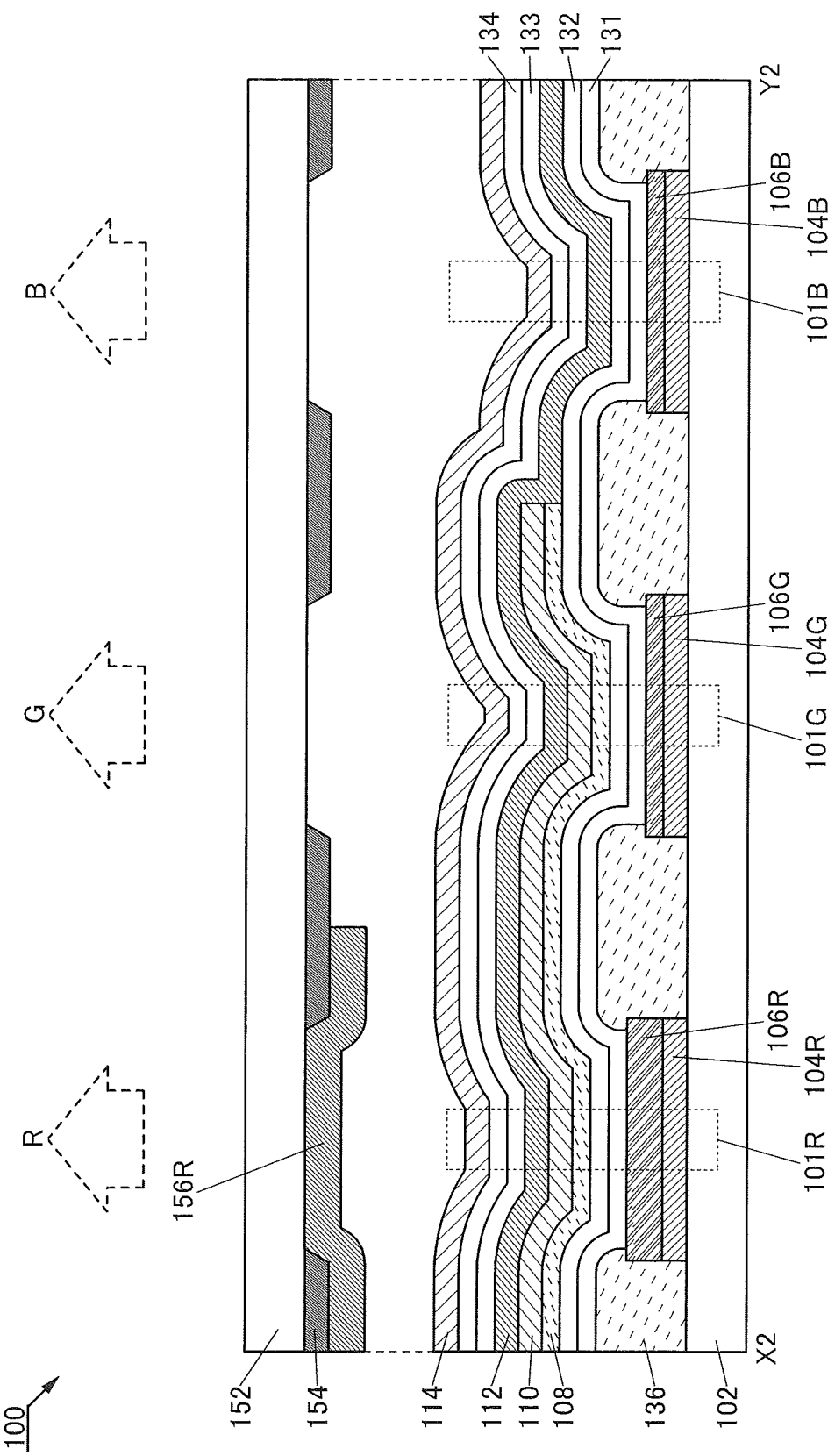
FIG. 6 is a cross-sectional view illustrating a light-emitting device.
Figure 7:
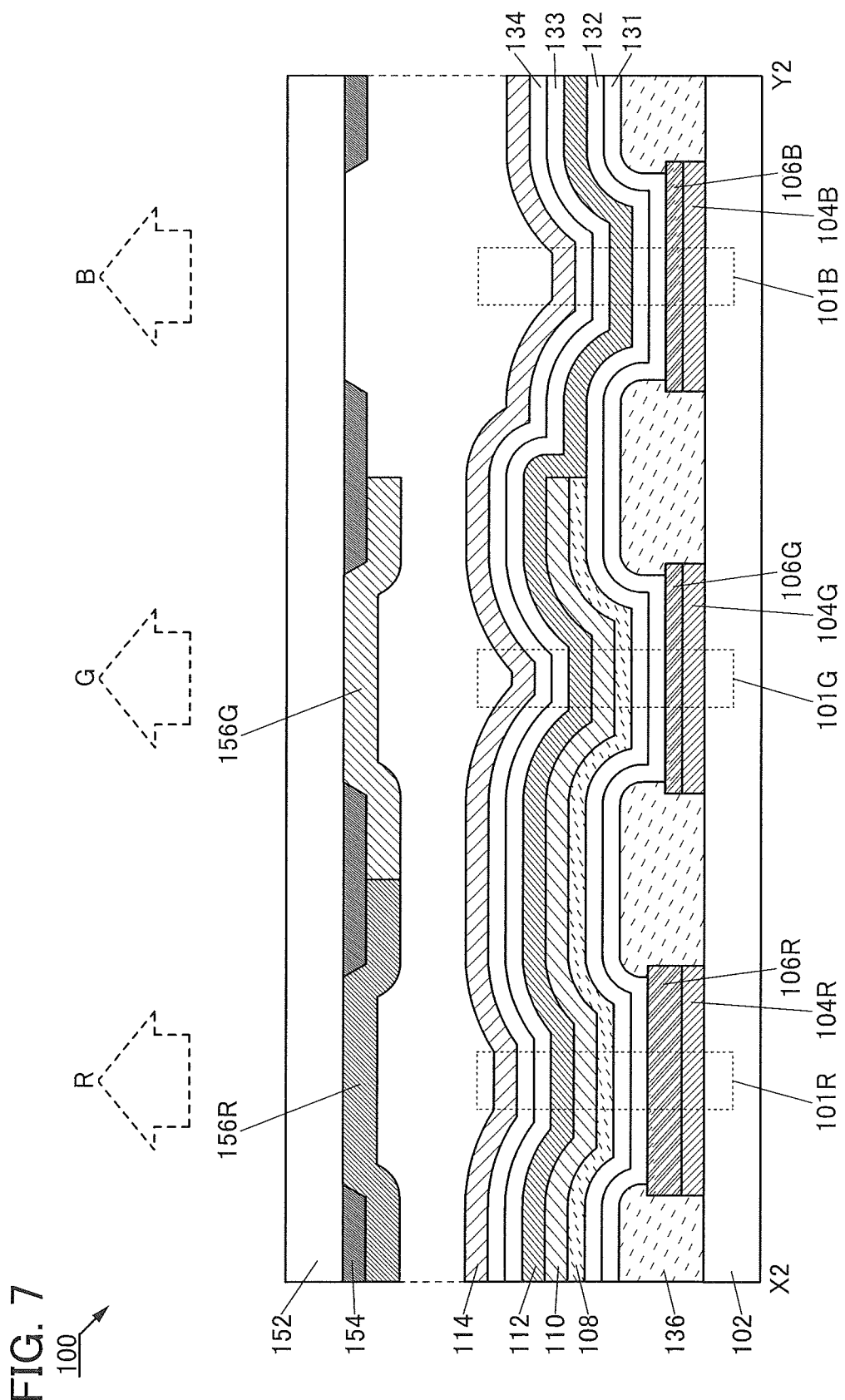
FIG. 7 is a cross-sectional view illustrating a light-emitting device.
Figure 8:
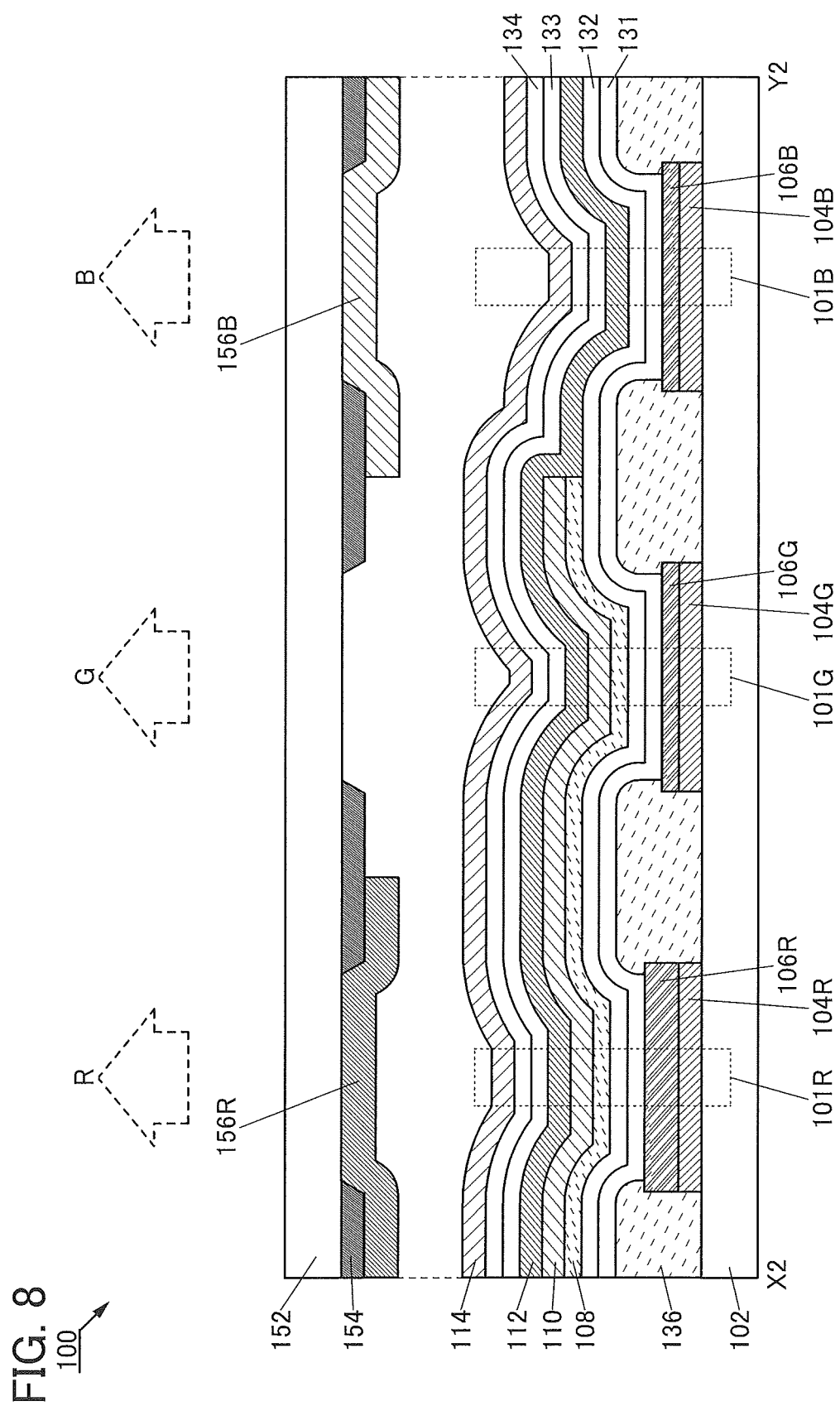
FIG. 8 is a cross-sectional view illustrating a light-emitting device.

In the light-emitting device 100 illustrated in FIG. 6, the second optical element 156G and the third optical element 156B of the light-emitting device 100 illustrated in FIG. 5 are not provided. In the light-emitting device 100 illustrated in FIG. 7, the third optical element 156B of the light-emitting device 100 illustrated in FIG. 5 is not provided. In the light-emitting device 100 illustrated in FIG. 8, the second optical element 156G of the light-emitting device 100 illustrated in FIG. 5 is not provided.

With the use of a phosphorescent material emitting light in a green wavelength range for the first light-emitting layer 110 and a fluorescent material emitting light in a blue wavelength range for the second light-emitting layer 112, it is possible not to provide an optical element in at least one of the regions overlapping with the second light-emitting element 101G and the third light-emitting element 101B. With a structure in which an optical element is not provided in at least one of the regions overlapping with the second light-emitting element 101G and the third light-emitting element 101B, the power consumption of the light-emitting device 100 can be reduced. With a structure in which the third optical element 156G is not provided, power consumption can be reduced more effectively particularly when a fluorescent material emitting light in a blue wavelength range is used for the third light-emitting element 101B. Note that to prevent external light reflection, the structure illustrated in FIG. 5 in which the light-emitting elements are all provided with the optical element is preferred.

Structural Example 2 of Light-Emitting Device

Next, structures different from the above-described light-emitting devices are described with reference to FIGS. 1A and 1B, FIG. 4, FIG. 10, FIG. 11, FIG. 12, FIG. 13, FIG. 14, and FIG. 15.

Figure 10:
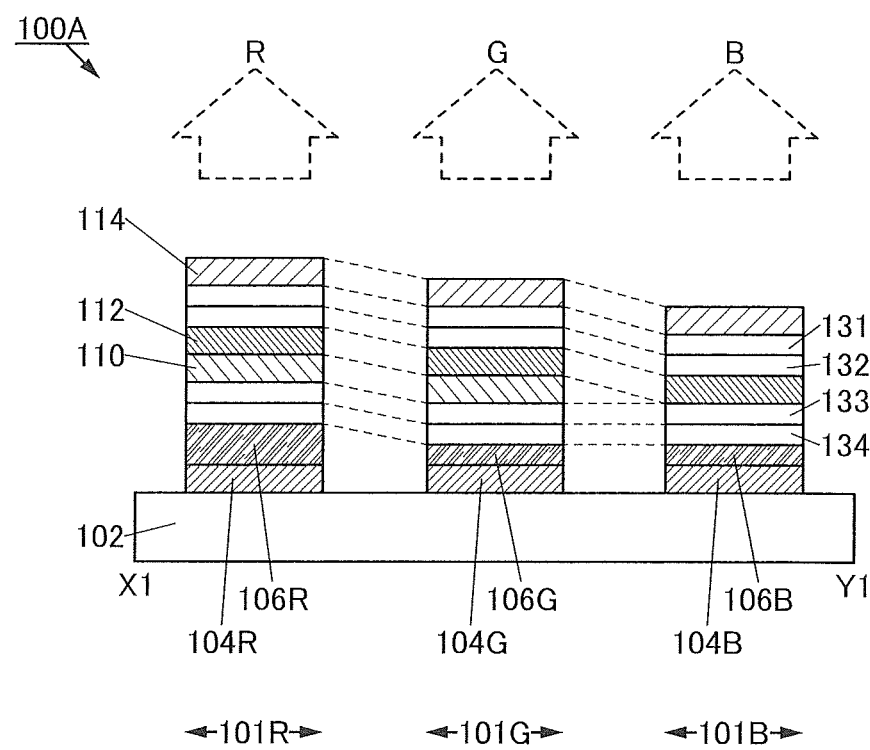
FIG. 10 is a cross-sectional view illustrating a light-emitting device.

FIG. 1A is a plan view illustrating an example of a light-emitting device of one embodiment of the present invention. FIG. 10 is a cross-sectional view along dashed-dotted line X1-Y1 in FIG. 1A.

A light-emitting device 100A includes the first light-emitting element 101R, the second light-emitting element 101G, and the third light-emitting element 101B. The first light-emitting element 101R includes the first lower electrode 104R, the first transparent conductive layer 106R over the first lower electrode 104R, the electron-injection layer 134 over the first transparent conductive layer 106R, the electron-transport layer 133 over the electron-injection layer 134, the first light-emitting layer 110 over the electron-transport layer 133, the second light-emitting layer 112 over the first light-emitting layer 110, the hole-transport layer 132 over the second light-emitting layer 112, the hole-injection layer 131 over the hole-transport layer 132, and the upper electrode 114 over the hole-injection layer 131. The second light-emitting element 101G includes the second lower electrode 104G, the second transparent conductive layer 106G over the second lower electrode 104G, the electron-injection layer 134 over the second transparent conductive layer 106G, the electron-transport layer 133 over the electron-injection layer 134, the first light-emitting layer 110 over the electron-transport layer 133, the second light-emitting layer 112 over the first light-emitting layer 110, the hole-transport layer 132 over the second light-emitting layer 112, the hole-injection layer 131 over the hole-transport layer 132, and the upper electrode 114 over the hole-injection layer 131. The third light-emitting element 101B includes the third lower electrode 104B, the third transparent conductive layer 106B over the third lower electrode 104B, the electron-injection layer 134 over the third transparent conductive layer 106B, the electron-transport layer 133 over the electron-injection layer 134, the second light-emitting layer 112 over the electron-transport layer 133, the hole-transport layer 132 over the second light-emitting layer 112, the hole-injection layer 131 over the hole-transport layer 132, and the upper electrode 114 over the hole-injection layer 131.

Note that in the light-emitting device 100A, the lower electrodes (the first lower electrode 104R, the second lower electrode 104G, and the third lower electrode 104B) each function as a cathode, and the upper electrode 114 functions as an anode. The lower electrode has a function of reflecting light.

The second transparent conductive layer 106G and the third transparent conductive layer 106B are formed with substantially the same thicknesses. For example, in the case where the second transparent conductive layer 106G and the third transparent conductive layer 106B are formed through a step of processing one transparent conductive film, they have substantially the same thicknesses or include regions having substantially the same thicknesses. In this specification and the like, the term "substantially the same thicknesses" includes the case where, between two compared films, the thickness of one film is greater than or equal to −20% and less than or equal to +20% or greater than or equal to −10% and less than or equal to +10% of the thickness of the other film. In addition, the thickness of the first transparent conductive layer 106R is greater than that of each of the second transparent conductive layer 106G and the third transparent conductive layer 106B. In other words, the first transparent conductive layer 106R includes a first region and the second transparent conductive layer 106G includes a second region having the same thickness as the third transparent conductive layer 106B, and the first region is thicker than the second region. With such a structure, a distance between the lower electrode and the light-emitting layer or an optical path length between the lower electrode and the light-emitting layer can be adjusted in each of the light-emitting elements.

Specifically, the distance between the first lower electrode 104R and the first light-emitting layer 110 is larger than the distance between the second lower electrode 104G and the first light-emitting layer 110, and the distance between the second lower electrode 104G and the second light-emitting layer 112 is larger than the distance between the third lower electrode 104B and the second light-emitting layer 112.

In the case where the distances between the lower electrodes and the light-emitting layers have the above-described relations, it is preferable that an optical path length between the first lower electrode 104R and the first light-emitting layer 110 be $3\lambda_R/4$ ($\lambda_R$ represents a wavelength of red light), that an optical path length between the second lower electrode 104G and the first light-emitting layer 110 be $3\lambda_G/4$ ($\lambda_G$ represents a wavelength of green light), and that an optical path length between the third lower electrode 104B and the second light-emitting layer 112 be $3\lambda_B/4$ ($\lambda_B$ represents a wavelength of blue light).

In the light-emitting device 100A, the thickness of the second transparent conductive layer 106G is the same as that of the third transparent conductive layer 106B, and the thickness of the first transparent conductive layer 106R is greater than that of each of the second transparent conductive layer 106G and the third transparent conductive layer 106B. The above-described optical path length of the third light-emitting element 101B is possible because the first light-emitting layer 110 is not provided. With the above-described optical path lengths, light in a red wavelength range, light in a green wavelength range, and light in a blue wavelength range can be efficiently extracted from the first light-emitting element 101R, the second light-emitting element 101G, and the third light-emitting element 101B, respectively.

Note that, to be exact, the optical path length between each of the lower electrodes (the first lower electrode 104R and the second lower electrode 104G) and the first light-emitting layer 110 is represented by the product of the refractive index and the thickness between a reflective region in the lower electrode and the first light-emitting layer 110. However, it is difficult to precisely determine the reflection region in the lower electrode or a light-emitting region in the first light-emitting layer 110; therefore, it is presumed that the above-described effect can be sufficiently achieved wherever the reflection region and the light-emitting region may be set in the lower electrode and the first light-emitting layer 110, respectively. Note that the same applies to the optical path length between the third lower electrode 104B and the second light-emitting layer 112.

A spectrum of light emitted from the first light-emitting element 101R includes at least one peak in the red wavelength range, a spectrum of light emitted from the second light-emitting element 101G includes at least one peak in the green wavelength range, and a spectrum of light emitted from the third light-emitting element 101B includes at least one peak in the blue wavelength range. Accordingly, by the first light-emitting element 101R, the second light-emitting element 101G, and the third light-emitting element 101B, full-color display can be performed. Note that in this specification and the like, an emission wavelength in the red wavelength range is longer than or equal to 600 nm and shorter than or equal to 740 nm, an emission wavelength in the green wavelength range is longer than or equal to 480 nm and shorter than 600 nm, and an emission wavelength in the blue wavelength range is longer than or equal to 400 nm and shorter than 480 nm.

In FIG. 10, light in a red (R) wavelength range, light in a green (G) wavelength range, and light in a blue (B) wavelength range emitted to the outside are schematically shown by arrows (R, G, and B) with broken lines. The same applies to light-emitting devices described later. Thus, the light-emitting device 100 illustrated in FIGS. 1A and 1B and the light-emitting device 100A illustrated in FIG. 10 are each of a top-emission type in which light emitted from light-emitting elements is extracted to the side opposite to the substrate 102 side where the light-emitting elements are formed. However, one embodiment of the present invention is not limited to this type, and may be of a bottom-emission type in which light emitted from light-emitting elements is extracted to the substrate side where the light-emitting elements are formed, or a dual-emission type in which light emitted from light-emitting elements is extracted in both top and bottom directions of the substrate 102 where the light-emitting elements are formed.

Moreover, in the light-emitting device 100A, the first light-emitting layer 110 is shared between the first light-emitting element 101R and the second light-emitting element 101G, and the second light-emitting layer 112 is shared between the first light-emitting element 101R, the second light-emitting element 101G, and the third light-emitting element 101B. By sharing the first light-emitting layer 110 or the second light-emitting layer 112 between the light-emitting elements, the productivity in formation of the light-emitting elements can be increased. Specifically, in manufacturing the light-emitting elements of the light-emitting device 100A, only one step (the step for depositing the first light-emitting layer 110) is required to form layers in selected pixels, so that the productivity can be increased.

Note that in the first light-emitting element 101R and the second light-emitting element 101G, the second light-emitting layer 112 does not contribute to light emission. For example, for the second light-emitting layer 112, a material with a high hole-transport property and a low electron-transport property or a material having a higher HOMO level than a material used for the first light-emitting layer 110 is used. In other words, in each of the first light-emitting element 101R and the second light-emitting element 101G, the second light-emitting layer 112 functions as a hole-transport layer. Thus, the second light-emitting layer 112 preferably has a hole-transport property. In other words, in the case where the second light-emitting layer 112 includes a host material and a guest material (light-emitting materials), it is preferable that the host material have a hole-transport property and that the guest material have an electron-trap property. From the same point of view, it is preferable that the first light-emitting layer 110 have a hole-transport property; however, it is difficult to optimize the optical path length when a recombination region is localized on the electron-transport layer 133 side (this is because the optical thickness of the first light-emitting layer 110 is approximately $\lambda_G - \lambda_B$, in which case the optical path length between the lower electrode 104G and the interface between the first light-emitting layer 110 and the electron-transport layer 133 deviates from $3\lambda_G/4$). To optimize this deviation, it is necessary that the first light-emitting layer 110 have not only a hole-transport property but also an appropriate electron-transport property that can prevent passage of electrons to the second light-emitting layer 112. That is, it is preferable that the first light-emitting layer 110 have a bipolar property. Accordingly, for example, the first light-emitting layer 110 preferably includes at least a hole-transport material, an electron-transport material, and a light-emitting material.

The first light-emitting layer 110 includes a phosphorescent material. The second light-emitting layer 112 includes a fluorescent material. With such a structure, a novel light-emitting device with high luminous efficiency and high reliability can be provided. For example, the first light-emitting layer 110 can be formed using a phosphorescent material emitting light in a green wavelength range, and the second light-emitting layer 112 can be formed using a fluorescent material emitting light in a blue wavelength range. However, the materials that can be used for the first light-emitting layer 110 and the second light-emitting layer 112 are not limited to the above. For example, a phosphorescent material may be used for the second light-emitting layer 112.

With the above-described structure, in manufacturing the light-emitting elements, the number of steps for forming layers in selected pixels is small; thus, a light-emitting device with increased productivity can be provided. The light-emitting elements of the light-emitting device have low power consumption because of their high luminous efficiency. Moreover, the light-emitting elements have high reliability. Therefore, a novel light-emitting device with high productivity and low power consumption can be provided.

Next, a different mode of the light-emitting device 100A illustrated in FIG. 10 is described with reference to FIG. 11. Note that FIG. 11 is a cross-sectional view along dashed dotted line X1-Y1 in FIG. 1A.

Figure 11:
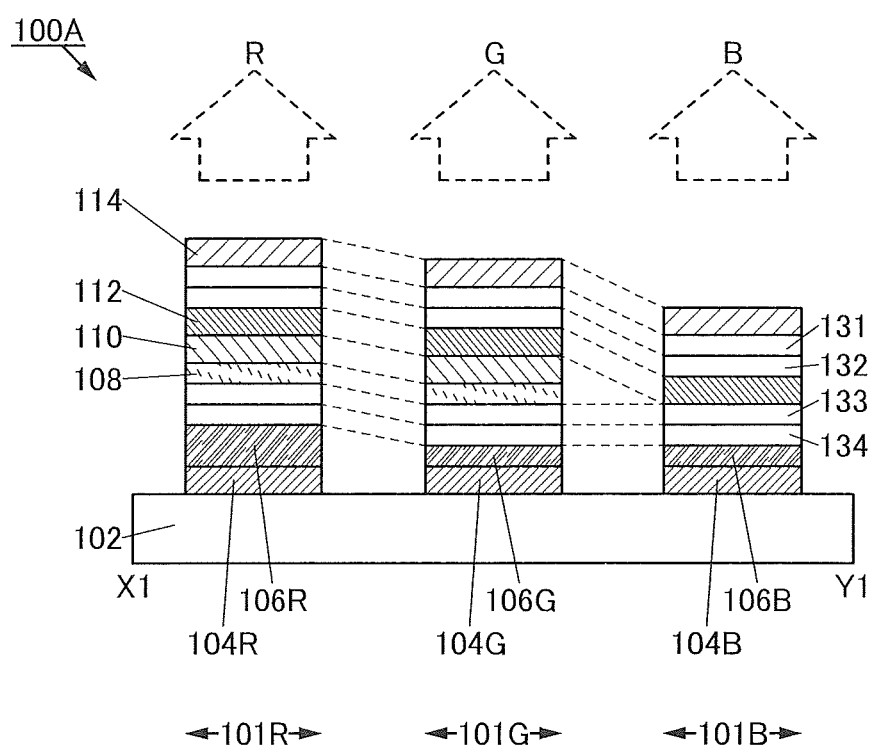
FIG. 11 is a cross-sectional view illustrating a light-emitting device.

In the light-emitting device 100A illustrated in FIG. 11, the optical adjustment layer 108 is provided in addition to the components of the light-emitting device 100A illustrated in FIG. 10. Specifically, the first light-emitting element 101R includes the optical adjustment layer 108 between the electron-transport layer 133 and the first light-emitting layer 110. The second light-emitting element 101G includes the optical adjustment layer 108 between the electron-transport layer 133 and the first light-emitting layer 110.

As illustrated in FIG. 11, with the structure provided with the optical adjustment layer 108, an optical path length between each of the lower electrodes (the first lower electrode 104R and the second lower electrode 104G) and the first light-emitting layer 110 can be adjusted. It is possible not to provide the optical adjustment layer 108 in the case where the optical path length between the lower electrode and the upper electrode 114 can be adjusted by each of the transparent conductive layers (the first transparent conductive layer 106R, the second transparent conductive layer 106G, and the third transparent conductive layer 106B), the first light-emitting layer 110, and/or the second light-emitting layer 112. However, the optical adjustment layer 108 is preferred to be provided because the optical path length can be adjusted easily.

Furthermore, in manufacturing the light-emitting device 100A illustrated in FIG. 11, only one step is required to form layers in selected pixels when the optical adjustment layer 108 and the first light-emitting layer 110 are formed consecutively. That is, there is no increase in the number of steps for forming layers in selected pixels that is accompanied by addition of the optical adjustment layer 108.

The optical adjustment layer 108 of the light-emitting device 100A illustrated in FIG. 11 preferably has an electron-transport property. For example, when the optical adjustment layer 108 is formed using a material with a high electron-transport property, electrons can be preferably transported to the first light-emitting layer 110; thus, the first light-emitting layer 110 can have high luminous efficiency.

Next, other different modes of the light-emitting device 100A illustrated in FIG. 10 are described with reference to FIG. 4, FIG. 12, FIG. 13, FIG. 14, and FIG. 15. Note that FIGS. 12 to 15 are each a cross-sectional view along dashed dotted line X2-Y2 in FIG. 4. Note that FIG. 4 is a plan view of the light-emitting device 100 but may also be used as a plan view of the light-emitting device 100A.

Figure 12:
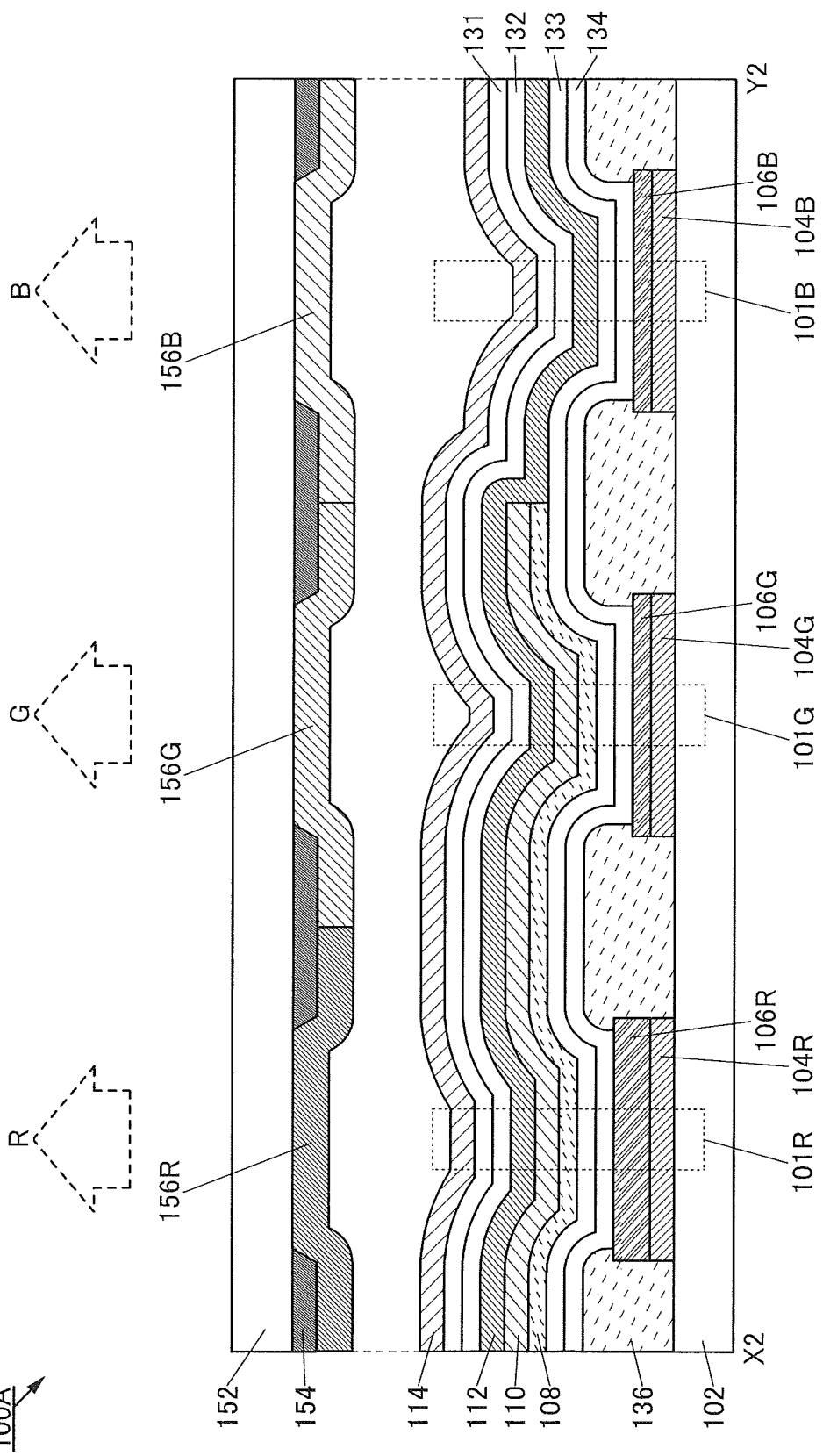
FIG. 12 is a cross-sectional view illustrating a light-emitting device.

The light-emitting device 100A illustrated in FIG. 12 includes the partition 136 and the substrate 152 in addition to the components of the light-emitting device 100A illustrated in FIG. 11. The partitions 136 are provided at outer portions of the light-emitting elements and have a function of covering the end portions of either or both of the lower electrodes and the transparent conductive layers of the light-emitting elements. The substrate 152 is provided with the light-blocking layer 154, the first optical element 156R, the second optical element 156G, and the third optical element 156B. The light-blocking layer 154 is provided to overlap with the partition 136. The first optical element 156R, the second optical element 156G, and the third optical element 156B are provided to overlap with the first light-emitting element 101R, the second light-emitting element 101G, and the third light-emitting element 101B, respectively.

Figure 13:
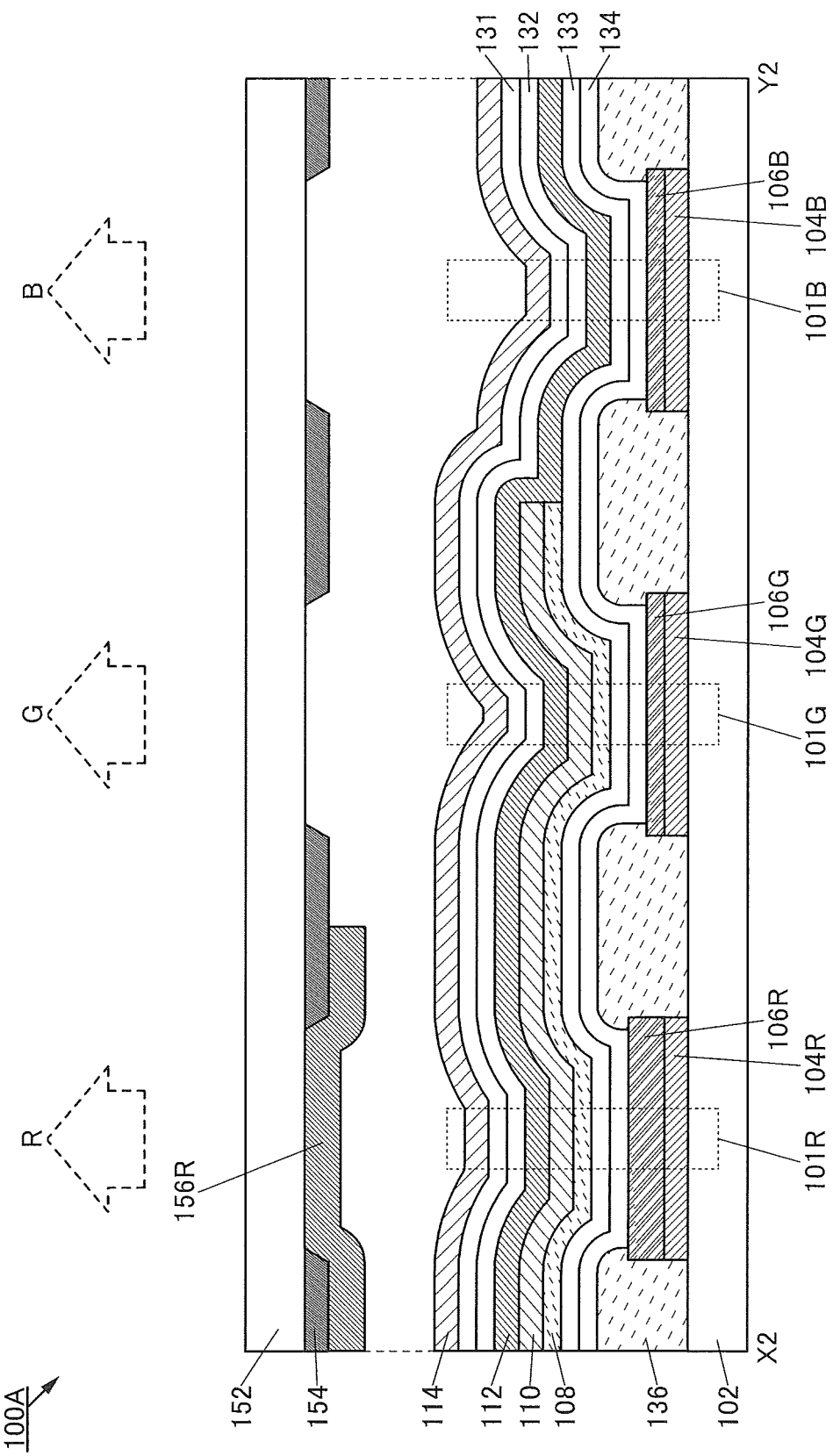
FIG. 13 is a cross-sectional view illustrating a light-emitting device.
Figure 14:
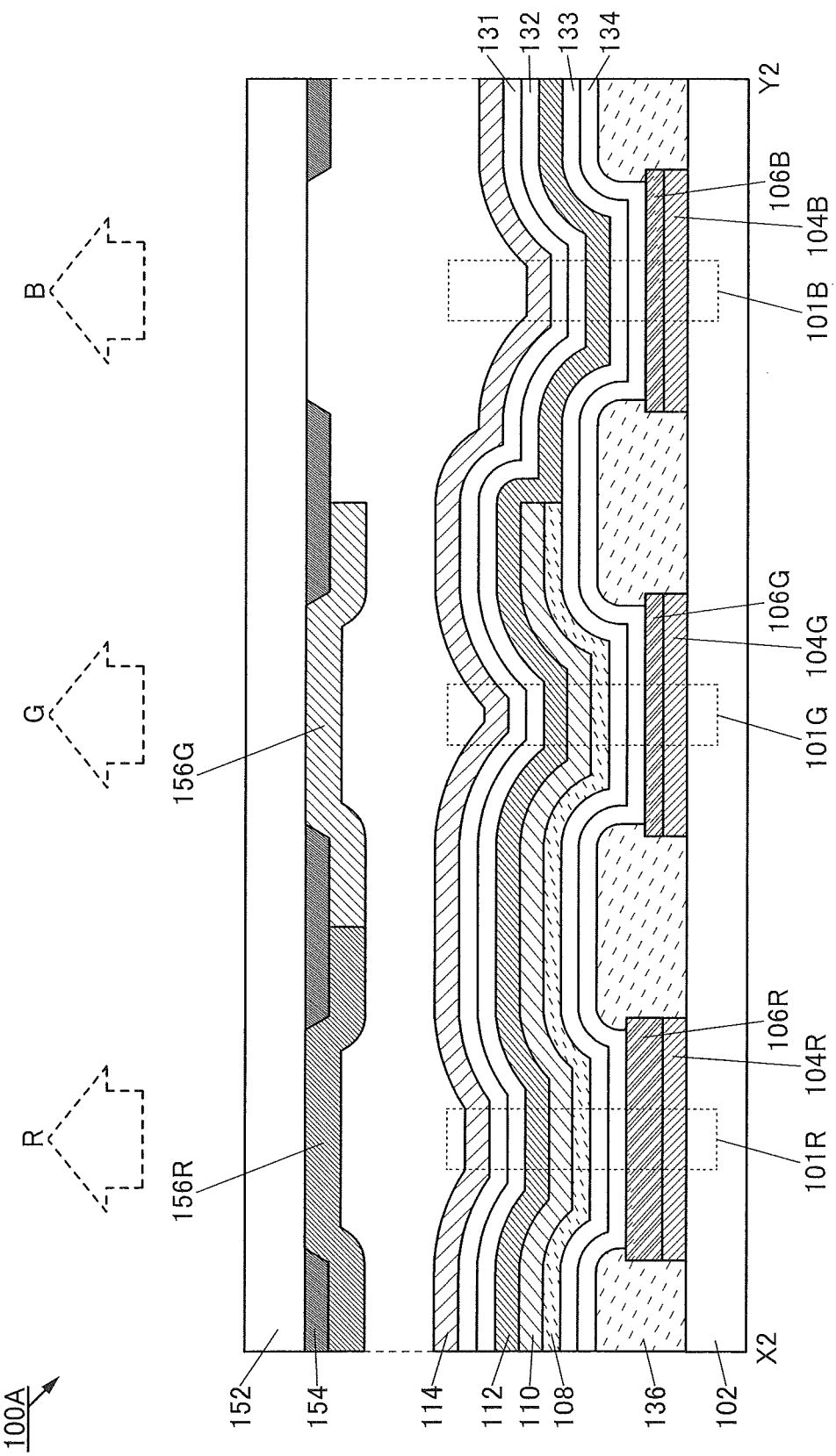
FIG. 14 is a cross-sectional view illustrating a light-emitting device.
Figure 15:
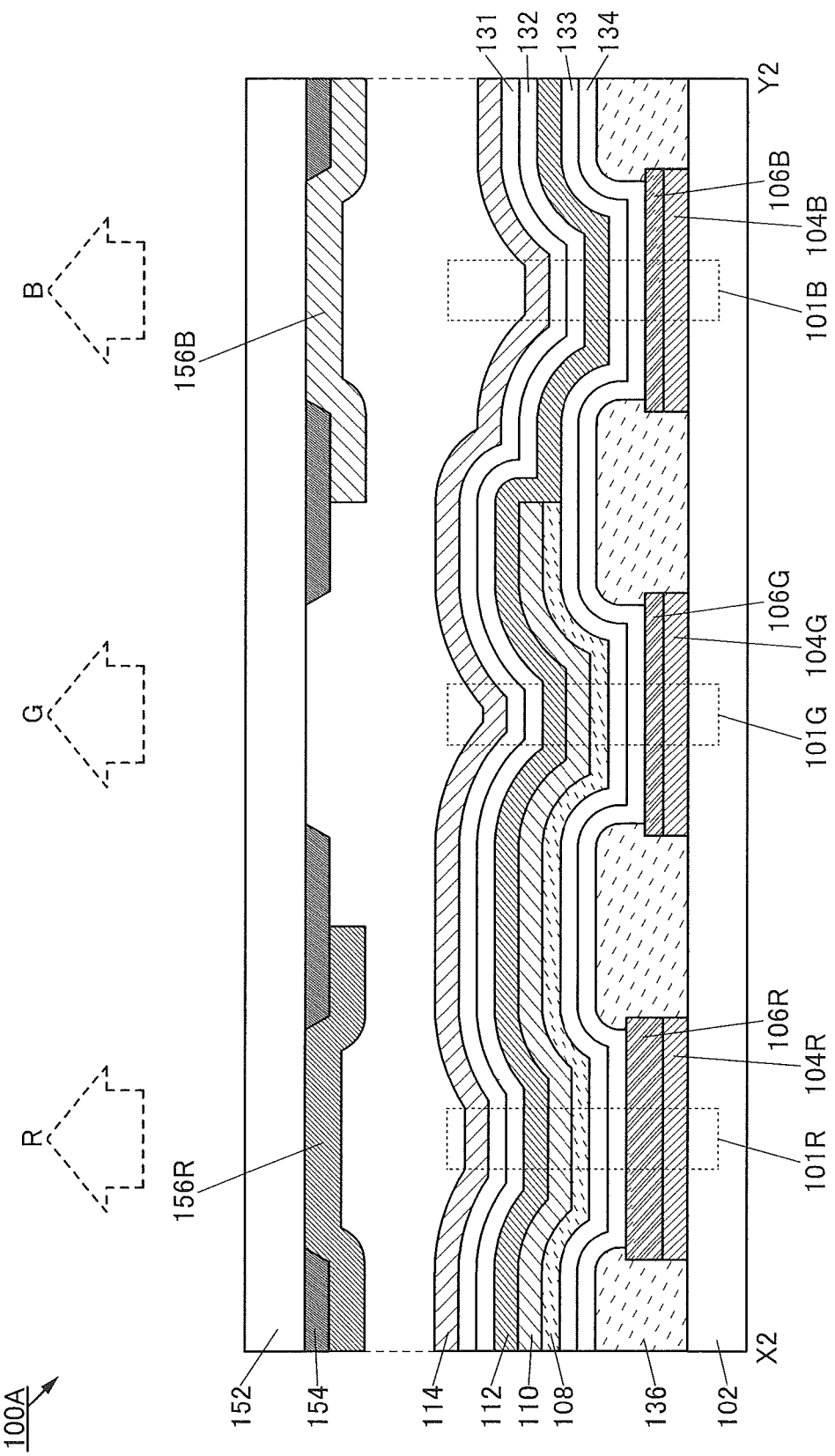
FIG. 15 is a cross-sectional view illustrating a light-emitting device.

In the light-emitting device 100A illustrated in FIG. 13, the second optical element 156G and the third optical element 156B of the light-emitting device 100A illustrated in FIG. 12 are not provided. In the light-emitting device 100A illustrated in FIG. 14, the third optical element 156B of the light-emitting device 100A illustrated in FIG. 12 is not provided. In the light-emitting device 100A illustrated in FIG. 15, the second optical element 156G of the light-emitting device 100A illustrated in FIG. 12 is not provided.

With the use of a phosphorescent material emitting light in a green wavelength range for the first light-emitting layer 110 and a fluorescent material emitting light in a blue wavelength range for the second light-emitting layer 112, it is possible not to provide an optical element in at least one of the regions overlapping with the second light-emitting element 101G and the third light-emitting element 101B. With a structure in which an optical element is not provided in at least one of the regions overlapping with the second light-emitting element 101G and the third light-emitting element 101B, the power consumption of the light-emitting device 100A can be reduced. With a structure in which the third optical element 156G is not provided, power consumption can be reduced more effectively particularly when a fluorescent material emitting light in a blue wavelength range is used for the third light-emitting element 101B. Note that to prevent external light reflection, the structure illustrated in FIG. 12 in which the light-emitting elements are all provided with the optical element is preferred.

Structural Example 3 of Light-Emitting Device

Next, structures different from the above-described light-emitting devices are described with reference to FIG. 16, FIG. 17, FIG. 18, FIG. 19, and FIG. 20.

Figure 16:
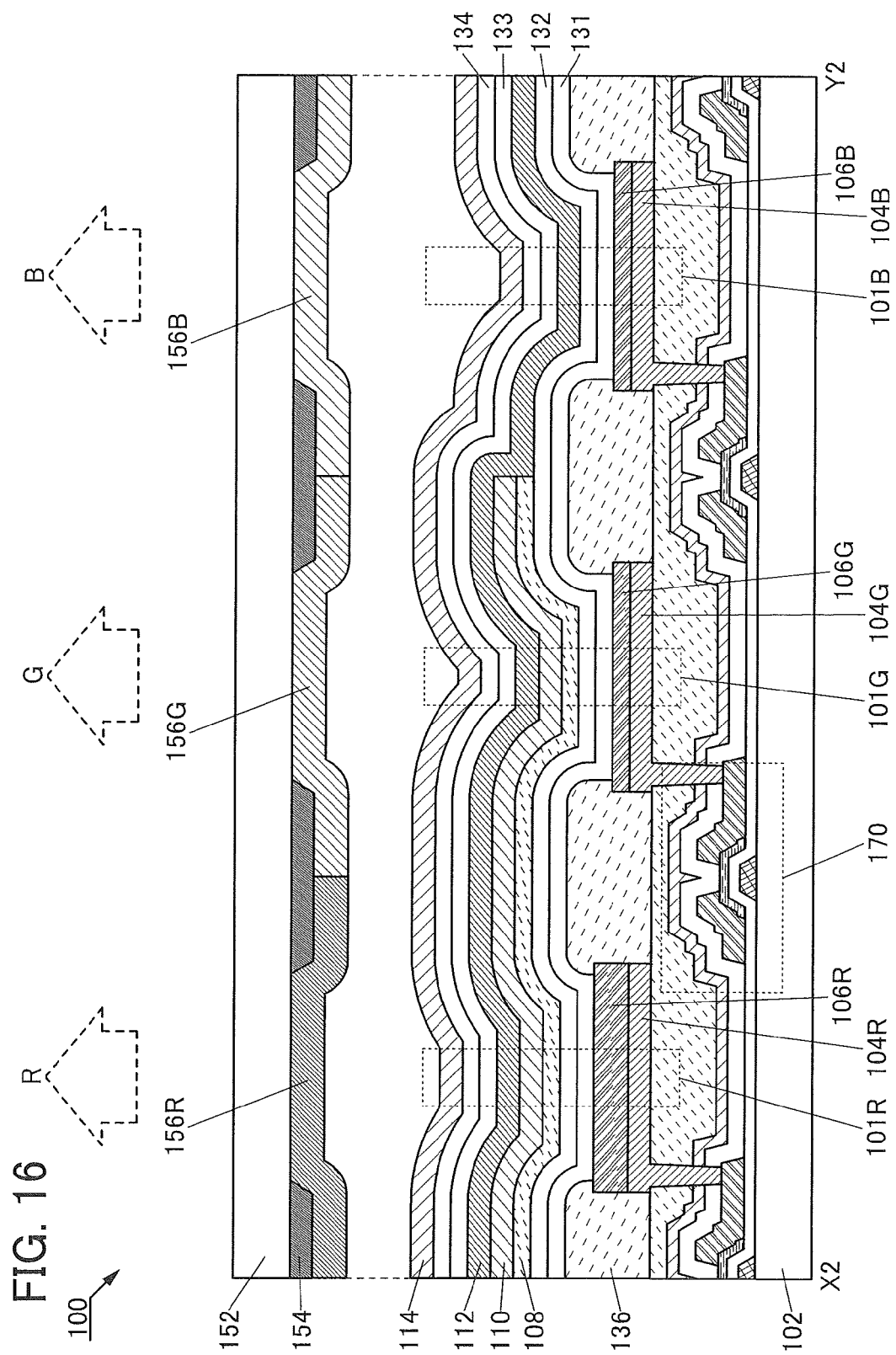
FIG. 16 is a cross-sectional view illustrating a light-emitting device.
Figure 18:
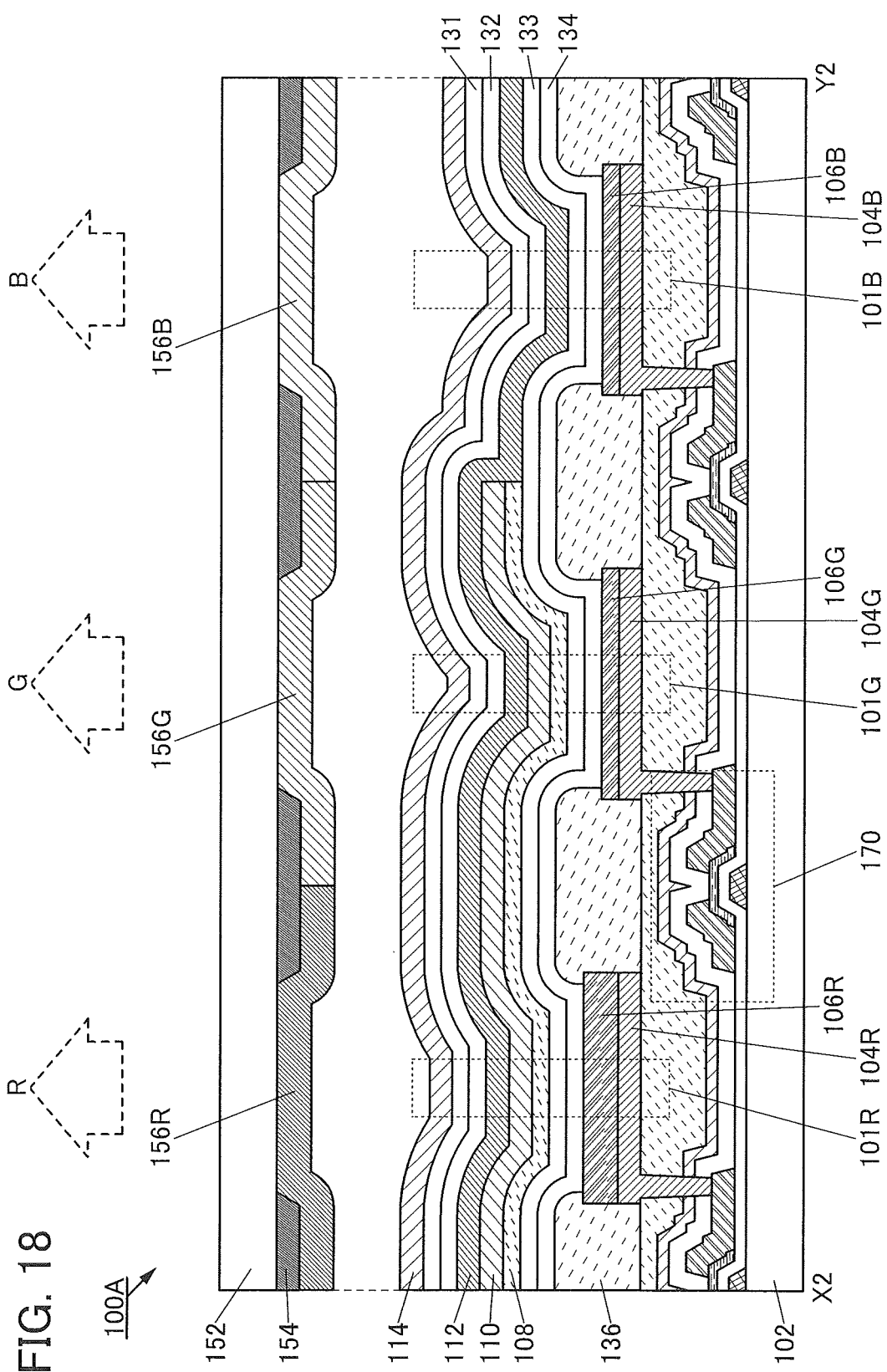
FIG. 18 is a cross-sectional view illustrating a light-emitting device.

FIG. 16 and FIG. 18 are cross-sectional views of structures in which transistors are connected to the aforementioned light-emitting device 100 and light-emitting device 100A, respectively. In the light-emitting device 100 illustrated in FIG. 16, the lower electrodes of the light-emitting elements are each electrically connected to a transistor 170. In the light-emitting device 100A illustrated in FIG. 18, the lower electrodes of the light-emitting elements are each electrically connected to the transistor 170.

Figure 17:
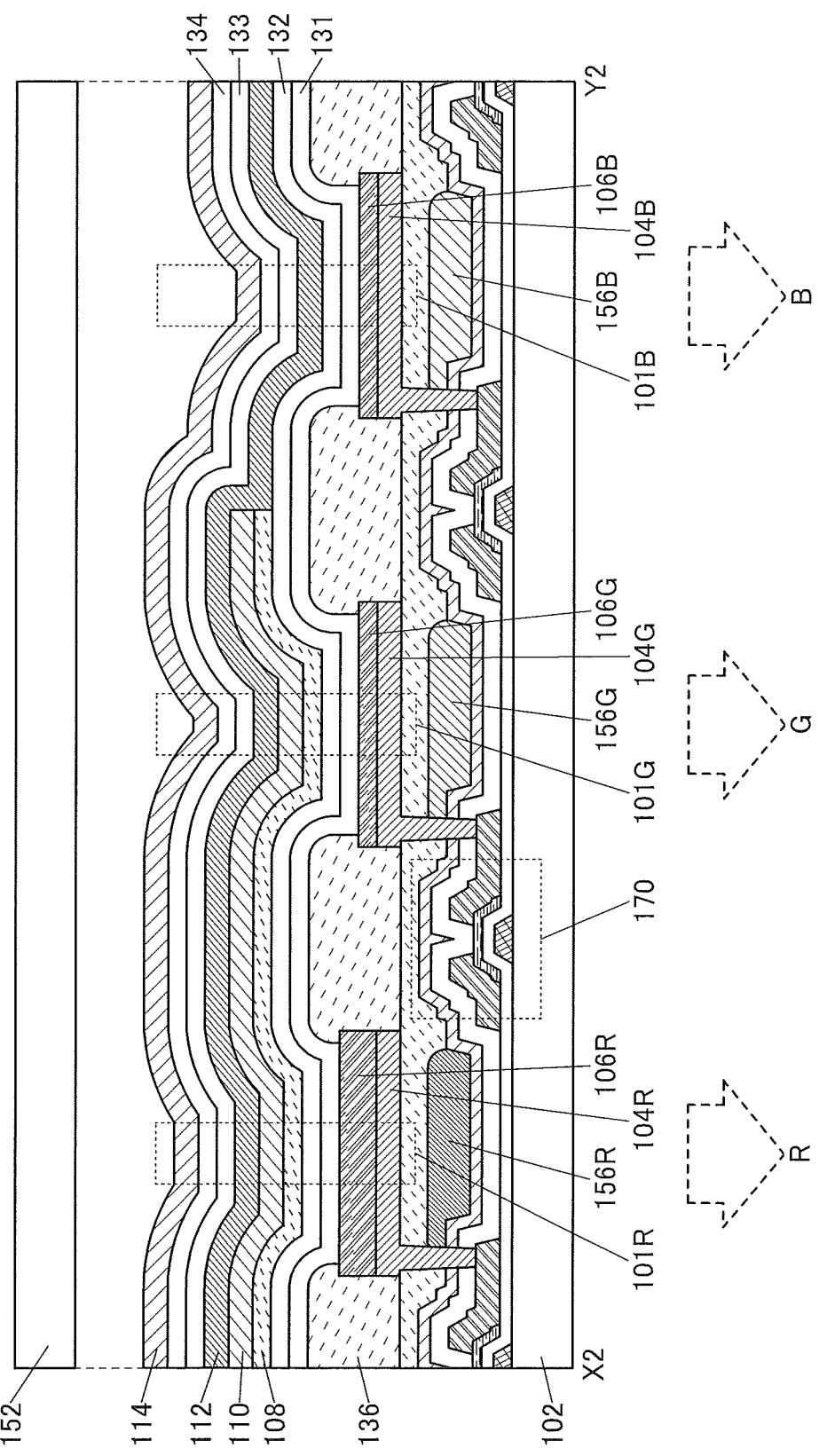
FIG. 17 is a cross-sectional view illustrating a light-emitting device.

The light-emitting device 100 in which each of the optical elements (the first optical element 156R, the second optical element 156G, and the third optical element 156B) is provided between the transistor 170 and the lower electrode of the light-emitting device 100 illustrated in FIG. 16 is illustrated in FIG. 17. Furthermore, the light-emitting device 100A in which each of the optical elements (the first optical element 156R, the second optical element 156G, and the third optical element 156B) is provided between the transistor 170 and the lower electrode of the light-emitting device 100A illustrated in FIG. 18 is illustrated in FIG. 19.

Figure 19:
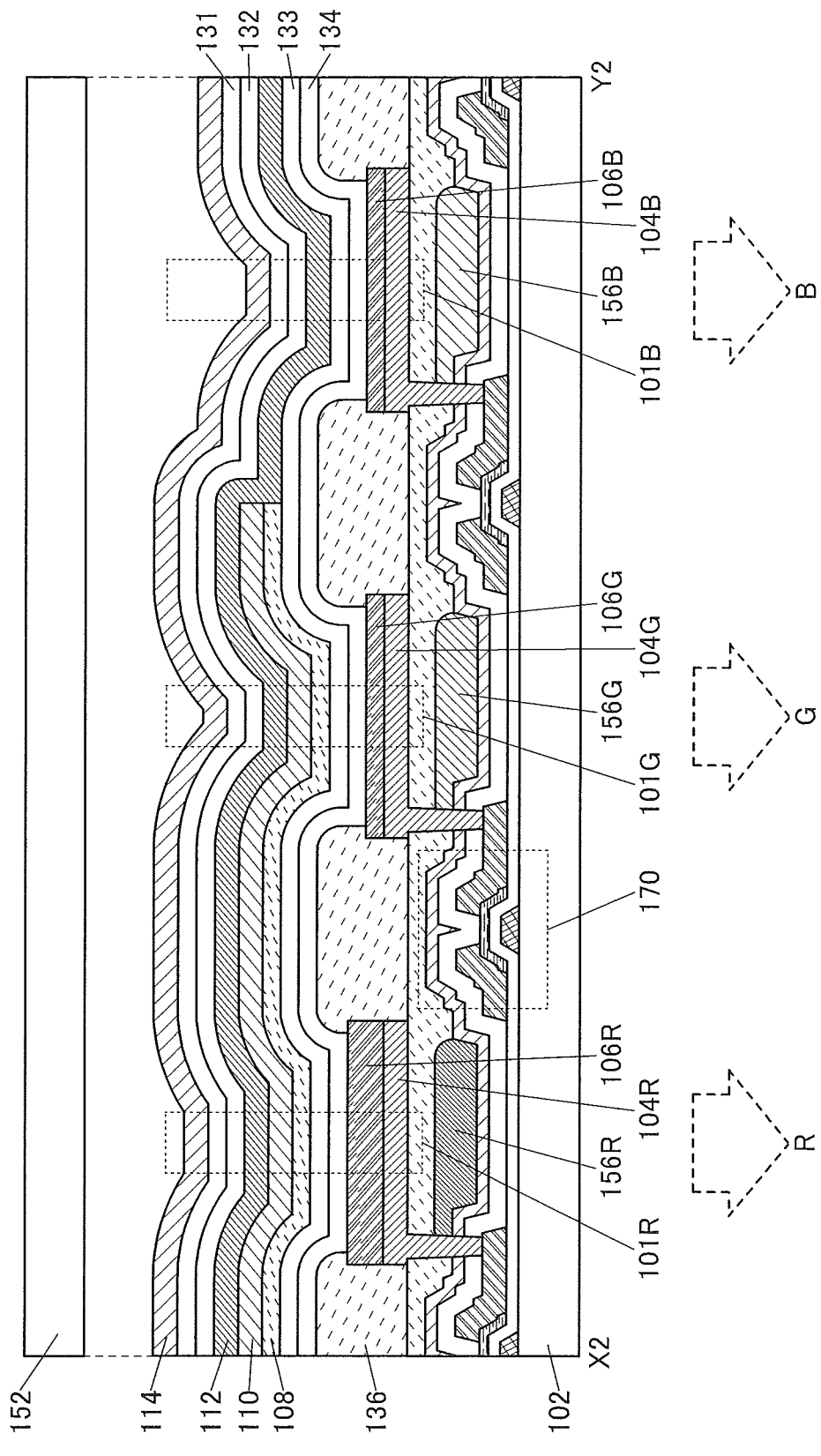
FIG. 19 is a cross-sectional view illustrating a light-emitting device.

In the light-emitting device 100 illustrated in FIG. 17 or the light-emitting device 100A illustrated in FIG. 19, light extracted from the lower electrodes is emitted to the substrate 102 side through the optical elements (the first optical element 156R, the second optical element 156G, and the third optical element 156B). Note that the structure illustrated in FIG. 17 or FIG. 19, in which the optical element or the like is not provided on the substrate 152 side, is preferable because manufacturing cost can be reduced.

Figure 20:
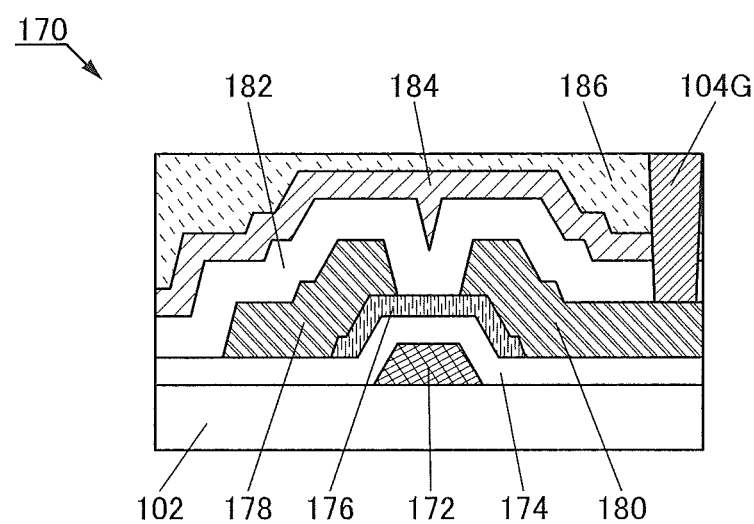
FIG. 20 is a cross-sectional view illustrating a transistor.

Note that the transistor 170 illustrated in FIGS. 16 to 19 is described in detail with reference to FIG. 20. FIG. 20 is a cross-sectional view of the transistor 170.

The transistor 170 includes a gate electrode 172 over the substrate 102, a gate insulating layer 174 over the substrate 102 and the gate electrode 172, a semiconductor layer 176 over the gate insulating layer 174, a source electrode 178 over the gate insulating layer 174 and the semiconductor layer 176, and a drain electrode 180 over the gate insulating layer 174 and the semiconductor layer 176. An insulating layer 182 is provided over the transistor 170, an insulating layer 184 is provided over the insulating layer 182, and an insulating layer 186 is provided over the insulating layer 184.

The insulating layer 182 is in contact with the semiconductor layer 176. The insulating layer 182 can be formed using an oxide insulating material, for example. The insulating layer 184 has a function of suppressing entry of impurities into the transistor 170. The insulating layer 184 can be formed using a nitride insulating material, for example. The insulating layer 186 has a function of planarizing unevenness and the like due to the transistor 170 and the like. The insulating layer 186 can be formed using an organic resin insulating material, for example.

An opening is formed in the insulating layer 182, the insulating layer 184, and the insulating layer 186. The drain electrode 180 of the transistor 170 and the lower electrode (here, a first lower electrode 104G) are electrically connected to each other through the opening. Current or voltage flowing through the lower electrode can be controlled by driving the transistor 170.

Here, each component of the aforementioned light-emitting device 100 and light-emitting device 100A is described below in detail.

[Substrate]

The substrate 102 is used as a support of the light-emitting elements. The substrate 152 is used as a support of the optical elements. For the substrate 102 and 152, glass, quartz, plastic, or the like can be used, for example. Alternatively, flexible substrates can be used. The flexible substrate is a substrate that can be bent, for example, a plastic substrate made of a polycarbonate, a polyarylate, or a polyethersulfone, and the like. A film (made of polypropylene, a polyester, poly(vinyl fluoride), poly(vinyl chloride), or the like), an inorganic vapor-deposited film, or the like can be used. Another material may be used as long as the substrate functions as a support in a manufacturing process of the light-emitting elements or the optical element.

The light-emitting elements and the optical element can be formed using a variety of substrates, for example. The type of substrate is not limited to a particular type. As the substrate, a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, a base material film, or the like can be used, for example. Examples of the glass substrate include a barium borosilicate glass substrate, an aluminoborosilicate glass substrate, a soda lime glass substrate, and the like. Examples of the flexible substrate, the attachment film, the base film, and the like are substrates of plastics typified by polyethylene terephthalate (PET), polyethylene naphthalate (PEN), polyether sulfone (PES), and polytetrafluoroethylene (PTFE). Another example is a resin such as acrylic. Other examples are polypropylene, polyester, polyvinyl fluoride, polyvinyl chloride, and the like. Other examples are polyamide, polyimide, aramid, epoxy, an inorganic film formed by evaporation, paper, and the like.

Alternatively, a flexible substrate may be used as the substrate, and the light-emitting elements and the optical element may be provided directly on the flexible substrate. Alternatively, a separation layer may be provided between the substrate and the light-emitting element. Alternatively, a separation layer may be provided between the substrate and the optical element. The separation layer can be used when part or the whole of the light-emitting elements and the optical element formed over the separation layer is completed, separated from the substrate, and transferred to another substrate. In such a case, the light-emitting elements and the optical element can be transferred to a substrate having low heat resistance or a flexible substrate as well. For the above-described separation layer, a stack including inorganic films, which are a tungsten film and a silicon oxide film, or an organic resin film of polyimide or the like formed over a substrate can be used, for example.

In other words, after the light-emitting elements and the optical element is formed using a substrate, the light-emitting elements and the optical element may be transferred to another substrate. Examples of a substrate to which the light-emitting elements and the optical element are transferred include, in addition to the above-described substrates, a paper substrate, a cellophane substrate, an aramid film substrate, a polyimide substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, and a rubber substrate. By using such a substrate, a light-emitting element and optical element with high durability, a light-emitting element and optical element with high heat resistance, a lightweight light-emitting element and optical element, or a thin light-emitting element and optical element can be obtained.

[Lower Electrode]

The lower electrodes (the first lower electrode 104R, the second lower electrode 104G, and the third lower electrode 104B) each function as an anode or a cathode of each light-emitting element. Note that each lower electrode is preferably formed using a reflective conductive material. As the conductive material, a conductive material having a visible-light reflectance higher than or equal to 40% and lower than or equal to 100%, preferably higher than or equal to 70% and lower than or equal to 100%, and a resistivity lower than or equal to $1 \times 10^{-2}$ Ωcm can be used. Specifically, as the lower electrode, silver, aluminum, an alloy containing silver or aluminum, or the like can be used. As the alloy containing aluminum, an alloy containing aluminum, nickel, and lanthanum can be used, for example. As the alloy containing silver, an alloy containing silver, palladium, and copper can be used, for example. The lower electrode can be formed by a sputtering method, an evaporation method, a printing method, a coating method, or the like.

[Transparent Conductive Layer]

The transparent conductive layers (the first transparent conductive layer 106R, the second transparent conductive layer 106G, and the third transparent conductive layer 106B) each function as part of the lower electrode of each light-emitting element, or the anode or the cathode of each light-emitting element. Furthermore, the transparent conductive layer is used to adjust the optical path length between the lower electrode and the upper electrode in accordance with the desired light wavelength so as to produce resonance of the desired light emitted from the light-emitting layer and increase the intensity of the light of the wavelength. For example, the thickness of the transparent conductive layer is adjusted so that the optical path length between the electrodes can be $m\lambda/2$ (m is a natural number), where $\lambda$ is the wavelength of desired light.

As the transparent conductive layers (the first transparent conductive layer 106R, the second transparent conductive layer 106G, and the third transparent conductive layer 106B), for example, indium oxide-tin oxide (indium tin oxide (hereinafter referred to as ITO)), indium oxide-tin oxide containing silicon or silicon oxide, indium oxide-zinc oxide (indium zinc oxide), indium oxide containing tungsten oxide and zinc oxide, or the like can be used. In particular, a material with a high work function (4.0 eV or more) is preferably used as the transparent conductive layer. The transparent conductive layer can be formed by a sputtering method, an evaporation method, a printing method, a coating method, or the like.

[Upper Electrode]

The upper electrode 114 functions as an anode or a cathode in each of the light-emitting elements. The upper electrode 114 is preferably formed using a reflective conductive material and a light-transmitting conductive material. As the conductive material, a conductive material having a visible-light reflectance higher than or equal to 20% and lower than or equal to 80%, preferably higher than or equal to 40% and lower than or equal to 70%, and a resistivity lower than or equal to $1\times10^{-2}$ $\Omega$cm can be used. The upper electrode 114 can be formed using one or more kinds of conductive metals, alloys, conductive compounds, and the like. In particular, it is preferable to use a material with a small work function (3.8 eV or less). For example, aluminum, silver, an element belonging to Group 1 or 2 of the periodic table (e.g., an alkali metal such as lithium or cesium, an alkaline earth metal such as calcium or strontium, or magnesium), an alloy containing any of these elements (e.g., Mg—Ag or Al—Li), a rare earth metal such as europium or ytterbium, an alloy containing any of these rare earth metals, or the like can be used. The upper electrode 114 can be formed by a sputtering method, an evaporation method, a printing method, a coating method, or the like.

Figure 21:
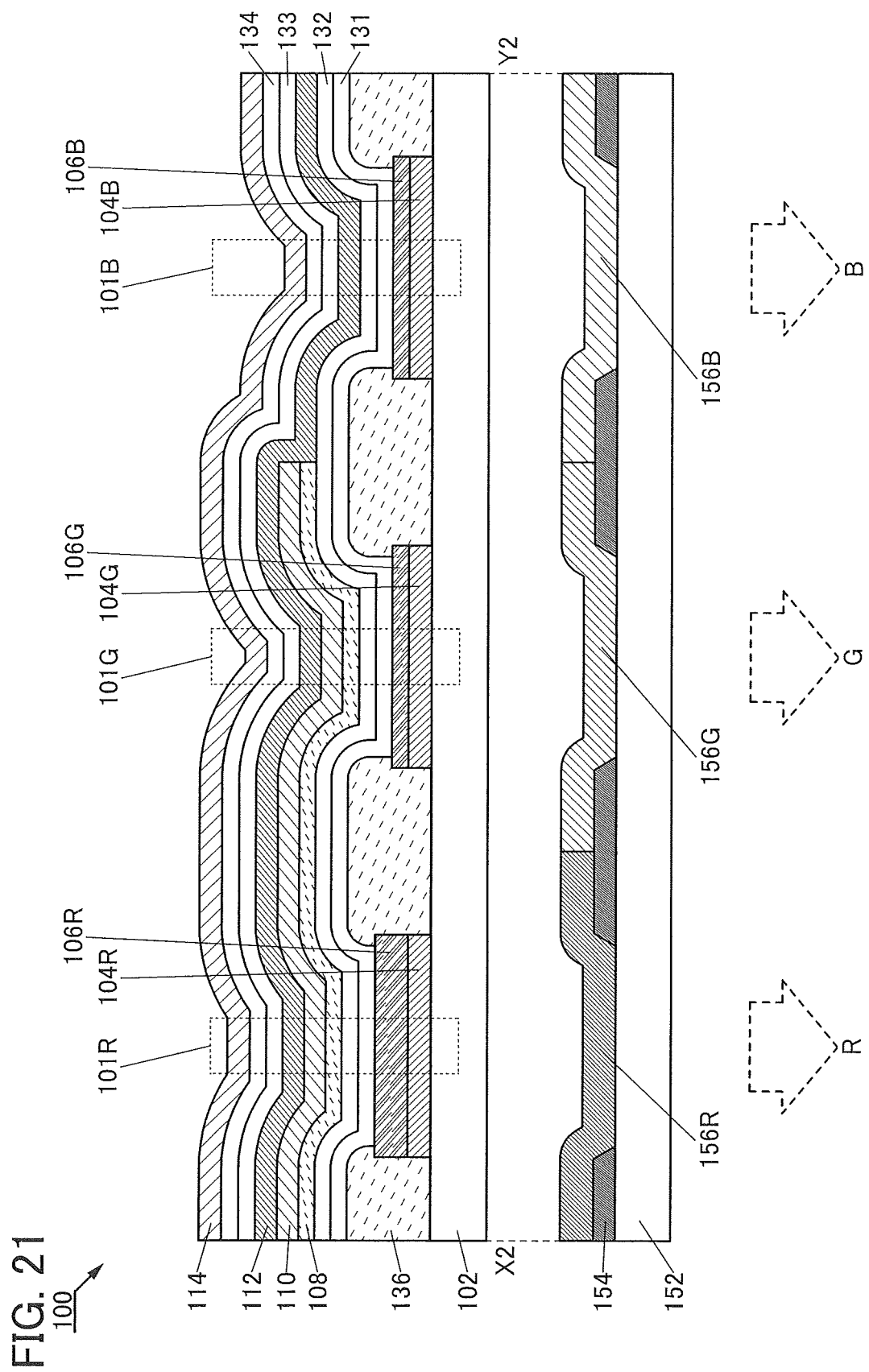
FIG. 21 is a cross-sectional view illustrating a light-emitting device.
Figure 22:
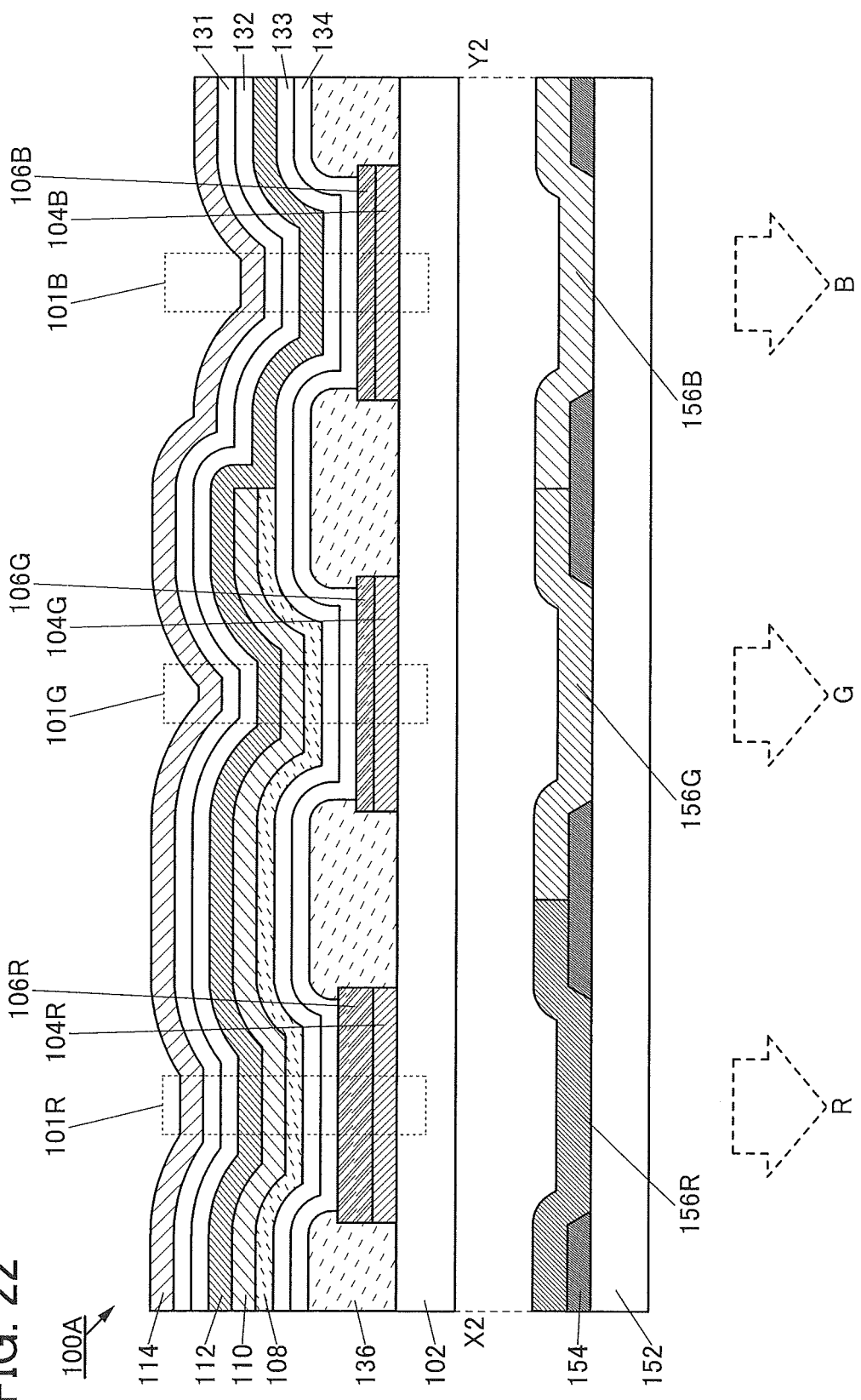
FIG. 22 is a cross-sectional view illustrating a light-emitting device.

In addition, a bottom-emission light-emitting device can be obtained by interchanging the materials used for the lower electrode and the upper electrode with each other. In the case of the bottom-emission light-emitting device, the lower electrode is formed using a reflective conductive material and a light-transmitting conductive material, and the upper electrode is formed using a reflective conductive material. FIG. 21 and FIG. 22 illustrate examples of the bottom-emission light-emitting device. FIG. 21 is a cross-sectional view in the case where the light-emitting device 100 illustrated in FIG. 5 is a bottom-emission light-emitting device. FIG. 22 is a cross-sectional view in the case where the light-emitting device 100A illustrated in FIG. 12 is a bottom-emission light-emitting device. In the bottom-emission light-emitting device, the substrate 152 provided with the first optical element 156R, the second optical element 156G, and the third optical element 156B is arranged on the side where light is emitted from the light-emitting elements, as illustrated in FIG. 21 and FIG. 22.

[Partition Wall]

The partition 136 has an insulating property and is formed using an inorganic or organic material. Examples of the inorganic material include a silicon oxide film, a silicon oxynitride film, a silicon nitride oxide film, a silicon nitride film, an aluminum oxide film, and an aluminum nitride film. Examples of the organic material include photosensitive resin materials such as an acrylic resin and a polyimide resin.

[Light-Emitting Layer]

The first light-emitting layer 110 includes a phosphorescent material having a spectrum peak in the range higher than or equal to 480 nm and lower than or equal to 600 nm, and the second light-emitting layer 112 includes a fluorescent material having a spectrum peak in the range higher than or equal to 400 nm and lower than 480 nm. The first light-emitting layer 110 includes either or both of an electron-transport material and a hole-transport material in addition to the phosphorescent material. The second light-emitting layer 112 includes either or both of an electron-transport material and a hole-transport material in addition to the fluorescent material.

As the phosphorescent material, a light-emitting substance that converts triplet excitation energy into light emission can be used. As the fluorescent material, a light-emitting substance that converts singlet excitation energy into light emission can be used. Examples of the light-emitting substances are described below.

In the case where a phosphorescent material is used for the first light-emitting layer 110, examples of the light-emitting substance having an emission peak at 480 nm to 600 nm include organometallic iridium complexes having pyrimidine skeletons, such as tris(4-methyl-6-phenylpyrimidinato)iridium(III) (abbreviation: Ir(mppm)$_3$), tris(4-t-butyl-6-phenylpyrimidinato)iridium(III) (abbreviation: Ir(tBuppm)$_3$), (acetylacetonato)bis(6-methyl-4-phenylpyrimidinato)iridium(III) (abbreviation: Ir(mppm)$_2$(acac)), (acetylacetonato)bis(6-tert-butyl-4-phenylpyrimidinato)iridium(III) (abbreviation: Ir(tBuppm)$_2$(acac)), (acetylacetonato)bis[4-(2-norbornyl)-6-phenylpyrimidinato]iridium(III) (endo- and exo-mixture) (abbreviation: Ir(nbppm)$_2$(acac)), (acetylacetonato)bis[5-methyl-6-(2-methylphenyl)-4-phenylpyrimidinato]iridium(III) (abbreviation: Ir(tBuppm)$_2$(acac)), and (acetylacetonato)bis(4,6-diphenylpyrimidinato)iridium(III) (abbreviation: Ir(dppm)$_2$(acac)); organometallic iridium complexes having pyrazine skeletons, such as (acetylacetonato)bis(3,5-dimethyl-2-phenylpyrazinato)iridium(M) (abbreviation: Ir(mppr-Me)$_2$(acac)) and (acetylacetonato)bis(5-isopropyl-3-methyl-2-phenylpyrazinato)iridium(III) (abbreviation: Ir(mppr-iPr)$_2$(acac)); organometallic iridium complexes having pyridine skeletons, such as tris(2-phenylpyridinato-N,C$^{2'}$)iridium(III) (abbreviation: Ir(ppy)$_3$), bis(2-phenylpyridinato-N,C$^{2'}$)iridium(III) acetylacetonate (abbreviation: Ir(ppy)$_2$acac), bis(benzo[h]quinolinato)iridium(III) acetylacetonate (abbreviation: Ir(bzq)$_2$(acac)), tris(benzo[h]quinolinato)iridium(III) (abbreviation: Ir(bzq)$_3$), tris(2-phenylquinolinato-N,C$^{2'}$)iridium(III) (abbreviation: Ir(pq)$_3$), and bis(2-phenylquinolinato-N,C$^{2'}$)iridium(III) acetylacetonate (abbreviation: Ir(pq)$_2$(acac)); and a rare earth metal complex such as tris(acetylacetonato)(monophenanthroline)terbium(III) (abbreviation: Tb(acac)$_3$(Phen)). Among the materials given above, the organometallic iridium complex having a pyrimidine skeleton has distinctively high reliability and emission efficiency and is thus especially preferable.

In the case where a fluorescent material is used for the second light-emitting layer 112, examples of the light-emitting substance having an emission peak at 400 nm to 480 nm include N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation:

2YGAPPA), N,9-diphenyl-N-[4-(10-phenyl-9-anthryl)phenyl]-9H-carbazol-3-amine (abbreviation: PCAPA), 4-(10-phenyl-9-anthryl)-4'-(9-phenyl-9H-carbazol-3-yl)triphenylamine (abbreviation: PCBAPA), 4-[4-(10-phenyl-9-anthryl)phenyl]-4'-(9-phenyl-9H-carbazol-3-yl) triphenylamine (abbreviation: PCBAPBA), perylene, 2,5,8,11-tetra(tert-butyl)perylene (abbreviation: TBP), N,N'-bis [4-(9-phenyl-9H-fluoren-9-yl)phenyl]-N,N'-diphenylpyrene-1,6-diamine (abbreviation: 1,6FLPAPrn), N,N'-bis(3-methylphenyl)-N,N'-bis[3-(9-phenyl-9H-fluoren-9-yl)phenyl]pyrene-1,6-dia mine (abbreviation: 1,6mMemFLPAPrn), and the like.

Alternatively, a phosphorescent material may be used for the second light-emitting layer 112. In the case where a phosphorescent material is used for the second light-emitting layer 112, examples of the light-emitting substance having an emission peak at 480 nm to 600 nm include bis[2-(4',6'-difluorophenyl)pyridinato-N,$C^{2'}$]iridium(III) tetrakis(1-pyrazolyl)borate (abbreviation: FIr6), bis[2-(4',6'-difluorophenyl)pyridinato-N,$C^{2'}$]iridium(III) picolinate (abbreviation: FIrpic), tris{2-[5-(2-methylphenyl)-4-(2,6-dimethylphenyl)-4H-1,2,4-triazol-3-yl-κN2]phenyl-κC}iridium(III) (abbreviation: Ir(mpptz-dmp)$_3$), tris[3-(5-biphenyl)-5-isopropyl-4-phenyl-4H-1,2,4-triazolato]iridium (III) (abbreviation: [Ir(iPr5btz)$_3$], tris[3-methyl-1-(2-methylphenyl)-5-phenyl-1H-1,2,4-triazolato]iridium(III) (abbreviation: Ir(Mptz1-mp)$_3$), tris(1-methyl-5-phenyl-3-propyl-1H-1,2,4-triazolato)iridium(III) (abbreviation: Ir(Prptz1-Me)$_3$), fac-tris[1-(2,6-diisopropylphenyl)-2-phenyl-1H-imidazole]iridium(III) (abbreviation: Ir(iPrpmi)$_3$), tris[3-(2,6-dimethylphenyl)-7-methylimidazo[1,2-f]phenanthridinato]iridium(III) (abbreviation: Ir(dmpimpt-Me)$_3$), and the like.

As the electron-transport material used for the first light-emitting layer 110 and the second light-emitting layer 112, a π-electron deficient heteroaromatic compound such as a nitrogen-containing heteroaromatic compound is preferable. As the electron-transport material, a π-electron deficient heteroaromatic compound, a metal complex, or the like can be used. Specific examples include a metal complex such as bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl) phenolato]zinc(II) (abbreviation: ZnPBO), and bis[2-(2-benzothiazolyl)phenolato]zinc(II) (abbreviation: ZnBTZ); a heterocyclic compound having a polyazole skeleton such as 2-(4-biphenylyl)-5-(4-tert-butylphenyl)-1,3,4-oxadiazole (abbreviation: PBD), 3-(4-biphenylyl)-4-phenyl-5-(4-tert-butylphenyl)-1,2,4-triazole (abbreviation: TAZ), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl) phenyl]-9H-carbazole (abbreviation: CO11), 2,2',2"-(1,3,5-benzenetriyl)tris(1-phenyl-1H-benzimidazole) (abbreviation: TPBI), and 2-[3-(dibenzothiophen-4-yl)phenyl]-1-phenyl-1H-benzimidazole (abbreviation: mDBTBIm-II); a heterocyclic compound having a diazine skeleton such as 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl) biphenyl-3-yl]dibenzo[f,h]quinoxaline (abbreviation: 2mCzBPDBq), 4,6-bis[3-(phenanthren-9-yl)phenyl]pyrimidine (abbreviation: 4,6mPnP2Pm), and 4,6-bis[3-(4-dibenzothienyl)phenyl]pyrimidine (abbreviation: 4,6mDBTP2Pm-II); a heterocyclic compound having a triazine skeleton such as 2-{4-[3-(N-phenyl-9H-carbazol-3-yl)-9H-carbazol-9-yl]phenyl}-4,6-diphenyl-1,3,5-tria zine (abbreviation: PCCzPTzn); and a heterocyclic compound having a pyridine skeleton such as 3,5-bis[3-(9H-carbazol-9-yl)phenyl]pyridine (abbreviation: 35DCzPPy) and 1,3,5-tri[3-(3-pyridyl)phenyl]benzene (abbreviation: TmPyPB). Among the above-described materials, heterocyclic compounds having diazine skeletons and triazine skeletons and heterocyclic compounds having pyridine skeletons have high reliability and are thus preferable. Heterocyclic compounds having diazine (pyrimidine or pyrazine) skeletons and triazine skeletons have a high electron-transport property and contribute to a decrease in drive voltage.

As the hole-transport material used for the first light-emitting layer 110 and the second light-emitting layer 112, a π-electron deficient heteroaromatic compound or an aromatic amine compound is preferable. A π-electron deficient heteroaromatic compound, an aromatic amine compound, or the like can be preferably used. Specific examples include a compound having an aromatic amine skeleton such as 2-[N-(9-phenylcarbazol-3-yl)-N-phenylamino]spiro-9,9'-bifluorene (abbreviation: PCASF), 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-(9-phenyl-9H-carbazol-3-yl)triphenylamine (abbreviation: PCBA1BP), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), 9,9-dimethyl-N-phenyl-N-[4-(9-phenyl-9H-carbazol-3-yl)phenyl]fluoren-2-amine (abbreviation: PCBAF), N-phenyl-N-[4-(9-phenyl-9H-carbazol-3-yl)phenyl]spiro-9,9'-bifluoren-2-amine (abbreviation: PCBASF), and N-(1,1'-biphenyl-4-yl)-N-[4-(9-phenyl-9H-carbazol-3-yl)phenyl]-9,9-dimethyl-9H-fluor en-2-amine (abbreviation: PCBBiF); a compound having a carbazole skeleton such as 1,3-bis(N-carbazolyl)benzene (abbreviation: mCP), 4,4'-di(N-carbazolyl)biphenyl (abbreviation: CBP), and 3,6-bis(3,5-diphenylphenyl)-9-phenylcarbazole (abbreviation: CzTP), or 9-phenyl-9H-3-(9-phenyl-9H-carbazol-3-yl)carbazole (abbreviation: PCCP); a compound having a thiophene skeleton such as 4,4',4"-(benzene-1,3,5-triyl)tri(dibenzothiophene) (abbreviation: DBT3P-II), 2,8-diphenyl-4-[4-(9-phenyl-9H-fluoren-9-yl) phenyl]dibenzothiophene (abbreviation: DBTFLP-III), and 4-[4-(9-phenyl-9H-fluoren-9-yl)phenyl]-6-phenyldibenzothiophene (abbreviation: DBTFLP-IV); and a compound having a furan skeleton such as 4,4',4"-(benzene-1,3,5-triyl) tri(dibenzofuran) (abbreviation: DBF3P-II) and 4-{3-[3-(9-phenyl-9H-fluoren-9-yl)phenyl]phenyl}dibenzofuran (abbreviation: mmDBFFLBi-II). Among the above-described materials, compounds having aromatic amine skeletons and compounds having carbazole skeletons are preferable because these compounds are highly reliable and have high hole-transport properties to contribute to a reduction in drive voltage.

Furthermore, as the hole-transport material used for the first light-emitting layer 110 and the second light-emitting layer 112, a high molecular compound such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl) methacryla mide](abbreviation: PTPDMA), or poly[N,N'- bis(4-butylphenyl)-N,N'-bis(phenyl)benzidine] (abbreviation: Poly-TPD) can also be used.

[Hole-Injection Layer and Hole-Transport Layer]

The hole-injection layer 131 is a layer that injects holes into the first light-emitting layer 110 and the second light-emitting layer 112 through the hole-transport layer 132 with a high hole-transport property and includes a hole-transport material and an acceptor material. When a hole-transport material and an acceptor material are included, electrons are extracted from the hole-transport material by the acceptor material to generate holes, and the holes are injected into the first light-emitting layer 110 and the second light-emitting layer 112 through the hole-transport layer 132. Note that the hole-transport layer 132 is formed using a hole-transport material.

As a hole-transport material used for the hole-injection layer 131 and the hole-transport layer 132, a material similar to the aforementioned hole-transport material used for the first light-emitting layer 110 and the second light-emitting layer 112 can be used.

Examples of the acceptor material used for the hole-injection layer 131 include oxide of a metal belonging to any of Group 4 to Group 8 of the periodic table. Specifically, molybdenum oxide is particularly preferable.

The hole-injection layer 131 and the hole-transport layer 132 may be formed using a material different between light-emitting elements or with a different thickness in some cases.

[Electron-Transport Layer]

As an electron-transport material used for the electron-transport layer 133, a material similar to the aforementioned electron-transport material used for the first light-emitting layer 110 and the second light-emitting layer 112 can be used.

[Electron-Injection Layer]

The electron-injection layer 134 is a layer including a substance with a high electron-injection property. For the electron-injection layer 134, an alkali metal, an alkaline earth metal, or a compound thereof, such as lithium fluoride (LiF), cesium fluoride (CsF), calcium fluoride ($CaF_2$), or lithium oxide ($LiO_x$), can be used. Alternatively, a rare earth metal compound like erbium fluoride ($ErF_3$) can be used. Electrode may also be used for the electron-injection layer 134. Examples of the electrode include a substance in which electrons are added at high concentration to calcium oxide-aluminum oxide and the like.

Alternatively, the electron-injection layer 134 may be formed using a composite material in which an organic compound and an electron donor (donor) are mixed. The composite material is superior in an electron-injection property and an electron-transport property, because electrons are generated in the organic compound by the electron donor. The organic compound here is preferably a material excellent in transporting the generated electrons; specifically, for example, the substances for forming the electron-transport layer 133 (e.g., a metal complex or a heteroaromatic compound) can be used. As the electron donor, a substance showing an electron-donating property with respect to the organic compound is used. Specifically, an alkali metal, an alkaline earth metal, and a rare earth metal are preferable, and lithium, cesium, magnesium, calcium, erbium, ytterbium, and the like are given. Furthermore, an alkali metal oxide or an alkaline earth metal oxide is preferable, and for example, lithium oxide, calcium oxide, barium oxide, and the like can be given. Alternatively, Lewis base such as magnesium oxide can also be used. An organic compound such as tetrathiafulvalene (abbreviation: TTF) can also be used.

The electron-injection layer 134 and the electron-transport layer 133 may be formed using a material different between light-emitting elements or with a different thickness in some cases.

[Optical Adjustment Layer]

The optical adjustment layer 108 is a layer having a function of adjusting the optical path length between the lower electrode and the light-emitting layer. For the optical adjustment layer 108, for example, a hole-transport material or an electron-transport material is used. As the hole-transport material, a material similar to the aforementioned hole-transport material used for the first light-emitting layer 110 and the second light-emitting layer 112 can be used. As the electron-transport material, a material similar to the aforementioned electron-transport material used for the first light-emitting layer 110 and the second light-emitting layer 112 can be used.

[Light-Blocking Layer]

The light-blocking layer 154 has a function of reducing the reflection of external light. The light-blocking layer 154 has a function of preventing mixture of light emitted from an adjacent light-emitting element. As the light-blocking layer 154, a metal, a resin containing black pigment, carbon black, a metal oxide, a composite oxide containing a solid solution of a plurality of metal oxides, or the like can be used.

[Light-Emitting Element]

The first optical element 156R, the second optical element 156G, and the third optical element 156B selectively transmit light with a particular color out of incident light. For example, a color filter, a band pass filter, a multilayer filter, or the like can be used. Color conversion elements can be used as the optical elements. A color conversion element is an optical element that converts incident light into light having a longer wavelength than the incident light. As the color conversion elements, quantum-dot elements are preferably used. The usage of the quantum-dot type can increase color reproducibility of the light-emitting device.

The first optical element 156R transmits light in a red wavelength range out of light emitted from the first light-emitting element 101R. The second optical element 156G transmits light in a green wavelength range out of light emitted from the second light-emitting element 101G. In addition, the third optical element 156B transmits light in a blue wavelength range out of light emitted from the third light-emitting element 101B.

Note that an optical element different from the above-described optical elements may be provided so as to overlap with the first light-emitting element 101R, the second light-emitting element 101G, and the third light-emitting element 101B. As another optical element, for example, a circularly polarizing plate, an anti-reflective film, and the like can be given. A circularly polarizing plate provided on the side where light emitted from the light-emitting element of the light-emitting device is extracted can prevent a phenomenon in which light entering from the outside of the light-emitting device is reflected inside the light-emitting device and returned to the outside. An anti-reflective film can weaken external light reflected by a surface of the light-emitting device. Accordingly, light emitted from the light-emitting device can be observed clearly.

<Manufacturing Method 1 of Light-Emitting Device>

Next, a manufacturing method of a light-emitting device of one embodiment of the present invention is described below with reference to FIGS. 23A and 23B, FIGS. 24A and 24B, and FIGS. 25A and 25B. Here, a manufacturing method of the light-emitting device 100 illustrated in FIG. 5 is described.

FIGS. 23A and 23B, FIGS. 24A and 24B, and FIGS. 25A and 25B are cross-sectional views for illustrating the manufacturing method of the light-emitting device of one embodiment of the present invention.

The manufacturing method of the light-emitting device 100 described below includes first to seventh steps.

[First Step]

The first step is a step for forming the lower electrodes (the first lower electrode 104R, the second lower electrode 104G, and the third lower electrode 104B) of the light-emitting elements, the transparent conductive layers (the first transparent conductive layer 106R, the second transparent conductive layer 106G, and the third transparent conductive layer 106B) of the light-emitting elements, and the partition 136 covering end portions of the lower electrode and the transparent conductive layer of each light-emitting element (see FIG. 23A).

In the first step, since there is no possibility of damaging a light-emitting layer containing an organic compound, a variety of micromachining technologies can be employed. In this embodiment, a reflective conductive film is formed by a sputtering method, subjected to patterning by a photolithography technique, and then processed into an island shape by a dry etching method to form the first lower electrode 104R, the second lower electrode 104G, and the third lower electrode 104B.

Next, a light-transmitting conductive film is formed over the first lower electrode 104R, subjected to patterning by a photolithography technique, and then processed into an island shape by a wet etching method to form the first transparent conductive layer 106R. After that, a light-transmitting conductive film is formed over the second lower electrode 104G and the third lower electrode 104B, subjected to patterning by a photolithography technique, and then processed into island shapes by a wet etching method to form the second transparent conductive layer 106G and the third transparent conductive layer 106B.

Then, the partition 136 is formed to cover end portions of the island-shaped lower electrode and the island-shaped transparent conductive layer. The partition 136 includes an opening overlapping with the lower electrode. The transparent conductive layer exposed by the opening functions as the lower electrode of the light-emitting element.

In the first step, an alloy film of silver, palladium, and copper is used as the reflective conductive film, an ITO film is used as the light-transmitting conductive film, and an acrylic resin is used as the partition 136.

Note that transistors may be formed over the substrate 102 before the first step. The transistors may be electrically connected to the lower electrodes (the first lower electrode 104R, the second lower electrode 104G, and the third lower electrode 104B).

[Second Step]

The second step is a step for forming the hole-injection layer 131 and the hole-transport layer 132 over the transparent conductive layers (the first transparent conductive layer 106R, the second transparent conductive layer 106G, and the third transparent conductive layer 106B) and the partitions 136 (see FIG. 23B).

In the second step, the hole-injection layer 131 and the hole-transport layer 132 are formed by evaporation of an organic compound. Note that the hole-injection layer 131 and the hole-transport layer 132 can be shared between the light-emitting elements. Therefore, a light-emitting element with low manufacturing cost and high productivity can be obtained.

[Third Step]

The third step is a step for forming the optical adjustment layer 108 and the first light-emitting layer 110 with a shadow mask 190 (see FIG. 24A).

In the third step, the shadow mask 190 having an opening 191 is provided so as to overlap the third transparent conductive layer 106B, and the optical adjustment layer 108 and the first light-emitting layer 110 are formed by evaporation of an organic compound 192 through the shadow mask 190.

In the third step, the substrate 102 is introduced into an evaporation apparatus, and the shadow mask 190 is provided on the evaporation source (not illustrated) side. Next, alignment for providing the opening 191 of the shadow mask 190 in a desired position is performed. Note that the shadow mask 190 is a shielding plate provided with the opening 191 and formed of foil of a metal or the like with a thickness greater than or equal to several tens of micrometers or a plate of a metal or the like with a thickness greater than or equal to several hundreds of micrometers.

The optical adjustment layer 108 is formed using a hole-transport material. Any of the aforementioned organic compounds can be used as the hole-transport material.

The first light-emitting layer 110 includes a light-emitting material having a spectrum peak in the range of higher than or equal to 480 nm and lower than 600 nm. As the light-emitting material, a phosphorescent organic compound emitting light in a green wavelength range can be used. The phosphorescent organic compound may be evaporated alone or the phosphorescent organic compound mixed with another material may be evaporated. For example, the phosphorescent organic compound may be used as a guest material, and the guest material may be dispersed into a host material having higher excitation energy than the guest material and evaporated.

For example, only one step is required to form layers in selected pixels when the optical adjustment layer 108 and the first light-emitting layer 110 are consecutively evaporated. Note that in some cases, the optical adjustment layer 108 and the first light-emitting layer 110 may be evaporated each in different steps.

[Fourth Step]

The fourth step is a step for forming the second light-emitting layer 112, the electron-transport layer 133, the electron-injection layer 134, and the upper electrode 114 over the hole-transport layer 132 and the first light-emitting layer 110 (see FIG. 24B).

The second light-emitting layer 112 includes a light-emitting material having a spectrum peak in the range of higher than or equal to 400 nm and lower than 480 nm. As the light-emitting material, a fluorescent organic compound emitting light in a blue wavelength range can be used. The fluorescent organic compound may be evaporated alone or the fluorescent organic compound mixed with another material may be evaporated. For example, the fluorescent organic compound may be used as a guest material, and the guest material may be dispersed into a host material having higher excitation energy than the guest material and evaporated.

In the fourth step, the second light-emitting layer 112, the electron-transport layer 133, the electron-injection layer 134, and the upper electrode 114 are formed by evaporation of an organic compound. Note that the second light-emitting layer 112, the electron-transport layer 133, the electron-injection layer 134, and the upper electrode 114 can be shared between the light-emitting elements. Therefore, a light-emitting element with low manufacturing cost and high productivity can be obtained.

Through the above-described steps, the first light-emitting element 101R, the second light-emitting element 101G, and the third light-emitting element 101B are formed over the substrate 102.

[Fifth Step]

Figure 25A:
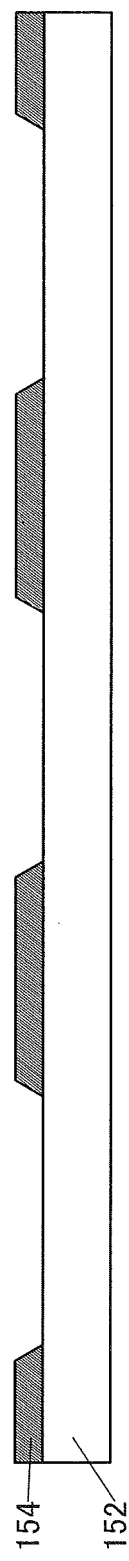
FIGS. 25A and 25B are cross-sectional views illustrating the method for manufacturing the light-emitting device.

The fifth step is a step for forming the light-blocking layer 154 over the substrate 152 (see FIG. 25A).

In the fifth step, as the light-blocking layer 154, an organic resin film containing black pigment is formed in a desired region.

[Sixth Step]

Figure 25B:
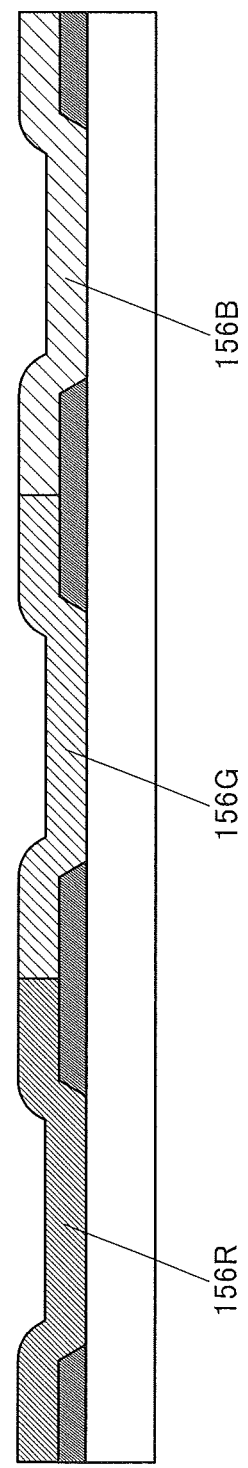

The sixth step is a step for forming the first optical element 156R, the second optical element 156G, and the third optical element 156B over the substrate 152 and the light-blocking layer 154 (see FIG. 25B).

In the sixth step, as the first optical element 156R, an organic resin film containing red pigment is formed in a desired region. As the second optical element 156G, an organic resin film containing green pigment is formed in a desired region. As the third optical element 156B, an organic resin film containing blue pigment is formed in a desired region.

[Seventh Step]

The seventh step is a step for attaching the first light-emitting element 101R, the second light-emitting element 101G, and the third light-emitting element 101B formed over the substrate 102 to the light-blocking layer 154, the first optical element 156R, the second optical element 156G, and the third optical element 156B formed over the substrate 152 and performing sealing with a sealant (not illustrated).

Through the above-described steps, the light-emitting device 100 illustrated in FIG. 5 can be formed. In this embodiment, in manufacturing the light-emitting elements, only one step (the step for depositing the optical adjustment layer 108 and the first light-emitting layer 110) is required to form layers in selected pixels; thus, a manufacturing method of a light-emitting device with high productivity can be provided. Consequently, a manufacturing method of a novel light-emitting device in which a decrease in aperture ratio accompanied by fabrication of a high-definition device is suppressed can be provided. Furthermore, a novel light-emitting device which can be produced easily can be provided.

<Manufacturing Method 2 of Light-Emitting Device>

Next, a manufacturing method of a light-emitting device of one embodiment of the present invention is described below with reference to FIGS. 26A and 26B, FIGS. 27A and 27B, and FIGS. 28A and 28B. Here, a manufacturing method of the light-emitting device 100A illustrated in FIG. 12 is described.

FIGS. 26A and 26B, FIGS. 27A and 27B, and FIGS. 28A and 28B are cross-sectional views for illustrating the manufacturing method of the light-emitting device of one embodiment of the present invention.

The manufacturing method of the light-emitting device 100A described below includes first to seventh steps.

[First Step]

The first step is a step for forming the lower electrodes (the first lower electrode 104R, the second lower electrode 104G, and the third lower electrode 104B) of the light-emitting elements, the transparent conductive layers (the first transparent conductive layer 106R, the second transparent conductive layer 106G, and the third transparent conductive layer 106B) of the light-emitting elements, and the partition 136 covering end portions of the lower electrode and the transparent conductive layer of each light-emitting element (see FIG. 26A).

In the first step, since there is no possibility of damaging a light-emitting layer containing an organic compound, a variety of micromachining technologies can be employed. In this embodiment, a reflective conductive film is formed by a sputtering method, subjected to patterning by a photolithography technique, and then processed into an island shape by a dry etching method to form the first lower electrode 104R, the second lower electrode 104G, and the third lower electrode 104B.

Next, a light-transmitting conductive film is formed over the first lower electrode 104R, subjected to patterning by a photolithography technique, and then processed into an island shape by a wet etching method to form the first transparent conductive layer 106R. After that, a light-transmitting conductive film is formed over the second lower electrode 104G and the third lower electrode 104B, subjected to patterning by a photolithography technique, and then processed into island shapes by a wet etching method to form the second transparent conductive layer 106G and the third transparent conductive layer 106B.

Then, the partition 136 is formed to cover end portions of the island-shaped lower electrode and the island-shaped transparent conductive layer. The partition 136 includes an opening overlapping with the lower electrode. The transparent conductive layer exposed by the opening functions as the lower electrode of the light-emitting element.

In the first step, an alloy film of silver, palladium, and copper is used as the reflective conductive film, an ITO film is used as the light-transmitting conductive film, and an acrylic resin is used as the partition 136.

Note that transistors may be formed over the substrate 102 before the first step. The transistors may be electrically connected to the lower electrodes (the first lower electrode 104R, the second lower electrode 104G, and the third lower electrode 104B).

[Second Step]

The second step is a step for forming the electron-injection layer 134 and the electron-transport layer 133 over the transparent conductive layers (the first transparent conductive layer 106R, the second transparent conductive layer 106G, and the third transparent conductive layer 106B) and the partitions 136 (see FIG. 26B).

In the second step, the electron-injection layer 134 and the electron-transport layer 133 are formed by evaporation of an organic compound. Note that the electron-injection layer 134 and the electron-transport layer 133 can be shared between the light-emitting elements. Therefore, a light-emitting element with low manufacturing cost and high productivity can be obtained.

[Third Step]

The third step is a step for forming the optical adjustment layer 108 and the first light-emitting layer 110 with the shadow mask 190 (see FIG. 27A).

In the third step, the shadow mask 190 having the opening 191 is provided so as to overlap the third transparent conductive layer 106B, and the optical adjustment layer 108 and the first light-emitting layer 110 are formed by evaporation of the organic compound 192 through the shadow mask 190.

In the third step, the substrate 102 is introduced into an evaporation apparatus, and the shadow mask 190 is provided on the evaporation source (not illustrated) side. Next, alignment for providing the opening 191 of the shadow mask 190 in a desired position is performed. Note that the shadow mask 190 is a shielding plate provided with the opening 191 and formed of foil of a metal or the like with a thickness greater than or equal to several tens of micrometers or a plate of a metal or the like with a thickness greater than or equal to several hundreds of micrometers.

The optical adjustment layer 108 is formed using an electron-transport material. Any of the aforementioned organic compounds can be used as the electron-transport material.

The first light-emitting layer 110 includes a light-emitting material having a spectrum peak in the range of higher than or equal to 480 nm and lower than 600 nm. As the light-emitting material, a phosphorescent organic compound emitting light in a green wavelength range can be used. The phosphorescent organic compound may be evaporated alone or the phosphorescent organic compound mixed with another material may be evaporated. For example, the phosphorescent organic compound may be used as a guest material, and the guest material may be dispersed into a host material having higher excitation energy than the guest material and evaporated.

For example, only one step is required to form layers in selected pixels when the optical adjustment layer 108 and the first light-emitting layer 110 are consecutively evaporated. Note that in some cases, the optical adjustment layer 108 and the first light-emitting layer 110 may be evaporated each in different steps.

[Fourth Step]

The fourth step is a step for forming the second light-emitting layer 112, the hole-transport layer 132, the electron-injection layer 131, and the upper electrode 114 over the electron-transport layer 133 and the first light-emitting layer 110 (see FIG. 27B).

The second light-emitting layer 112 includes a light-emitting material having a spectrum peak in the range of higher than or equal to 400 nm and lower than 480 nm. As the light-emitting material, a fluorescent organic compound emitting light in a blue wavelength range can be used. The fluorescent organic compound may be evaporated alone or the fluorescent organic compound mixed with another material may be evaporated. For example, the fluorescent organic compound may be used as a guest material, and the guest material may be dispersed into a host material having higher excitation energy than the guest material and evaporated.

In the fourth step, the second light-emitting layer 112, the hole-transport layer 132, the hole-injection layer 131, and the upper electrode 114 are formed by evaporation of an organic compound. Note that the second light-emitting layer 112, the hole-transport layer 132, the hole-injection layer 131, and the upper electrode 114 can be shared between the light-emitting elements. Therefore, a light-emitting element with low manufacturing cost and high productivity can be obtained.

Through the above-described steps, the first light-emitting element 101R, the second light-emitting element 101G, and the third light-emitting element 101B are formed over the substrate 102.

[Fifth Step]

Figure 28A:
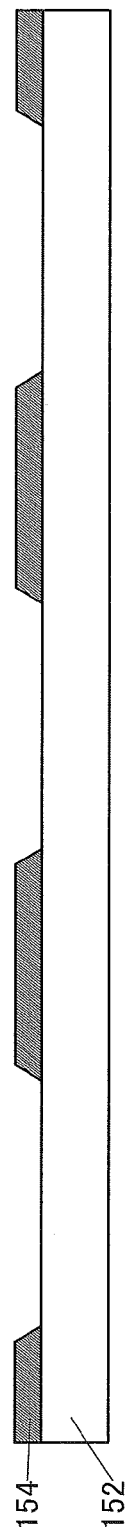
FIGS. 28A and 28B are cross-sectional views illustrating the method for manufacturing the light-emitting device.

The fifth step is a step for forming the light-blocking layer 154 over the substrate 152 (see FIG. 28A).

In the fifth step, as the light-blocking layer 154, an organic resin film containing black pigment is formed in a desired region.

[Sixth Step]

Figure 28B:
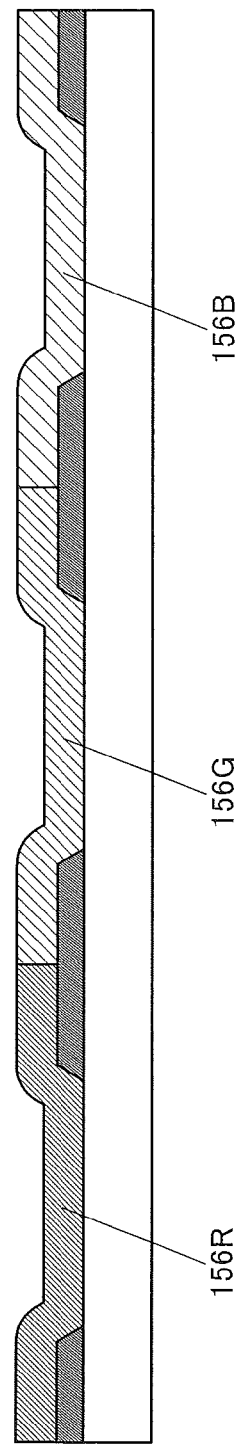

The sixth step is a step for forming the first optical element 156R, the second optical element 156G, and the third optical element 156B over the substrate 152 and the light-blocking layer 154 (see FIG. 28B).

In the sixth step, as the first optical element 156R, an organic resin film containing red pigment is formed in a desired region. As the second optical element 156G, an organic resin film containing green pigment is formed in a desired region. As the third optical element 156B, an organic resin film containing blue pigment is formed in a desired region.

[Seventh Step]

The seventh step is a step for attaching the first light-emitting element 101R, the second light-emitting element 101G, and the third light-emitting element 101B formed over the substrate 102 to the light-blocking layer 154, the first optical element 156R, the second optical element 156G, and the third optical element 156B formed over the substrate 152 and performing sealing with a sealant (not illustrated).

Through the above-described steps, the light-emitting device 100A illustrated in FIG. 12 can be formed. In this embodiment, in manufacturing the light-emitting elements, only one step (the step for depositing the optical adjustment layer 108 and the first light-emitting layer 110) is required to form layers in selected pixels; thus, a manufacturing method of a light-emitting device with high productivity can be provided. Consequently, a manufacturing method of a novel light-emitting device in which a decrease in aperture ratio accompanied by fabrication of a high-definition device is suppressed can be provided. Furthermore, a novel light-emitting device which can be produced easily can be provided.

The structure described in this embodiment can be combined with any of the structures described in the other embodiments and examples as appropriate.

Embodiment 2

In this embodiment, a light-emitting device of one embodiment of the present invention, which is a different mode from the light-emitting device in Embodiment 1, will be described below with reference to FIGS. 29A and 29B, FIGS. 30A and 30B, FIG. 31, FIG. 32, FIG. 33, and FIG. 34. Note that common reference numerals are used for components that have functions similar to functions described in Embodiment 1, and detailed descriptions of the components are omitted in some cases.

Structural Example 4 of Light-Emitting Device

Figure 29A:
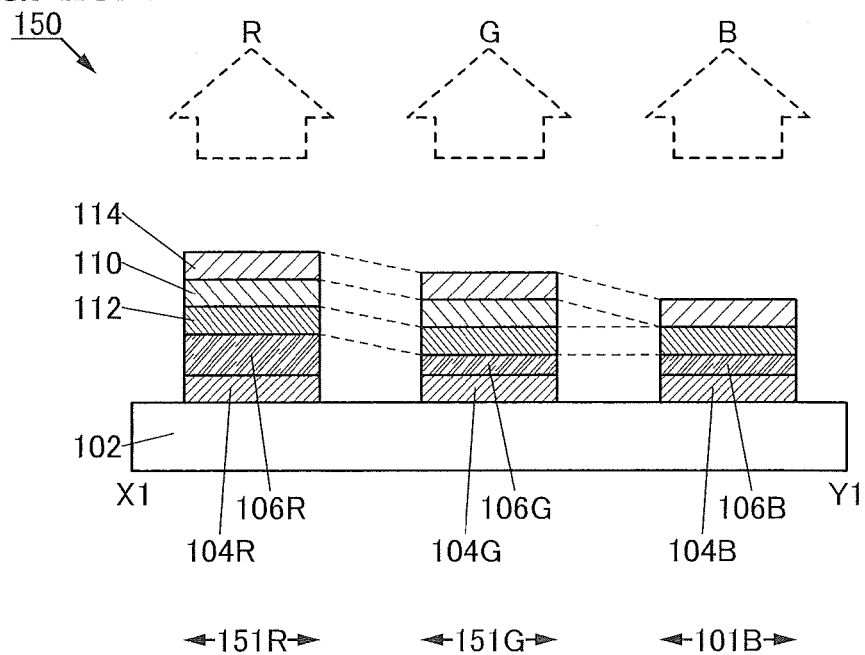
FIGS. 29A and 29B are each a cross-sectional view illustrating a light-emitting device.
Figure 29B:
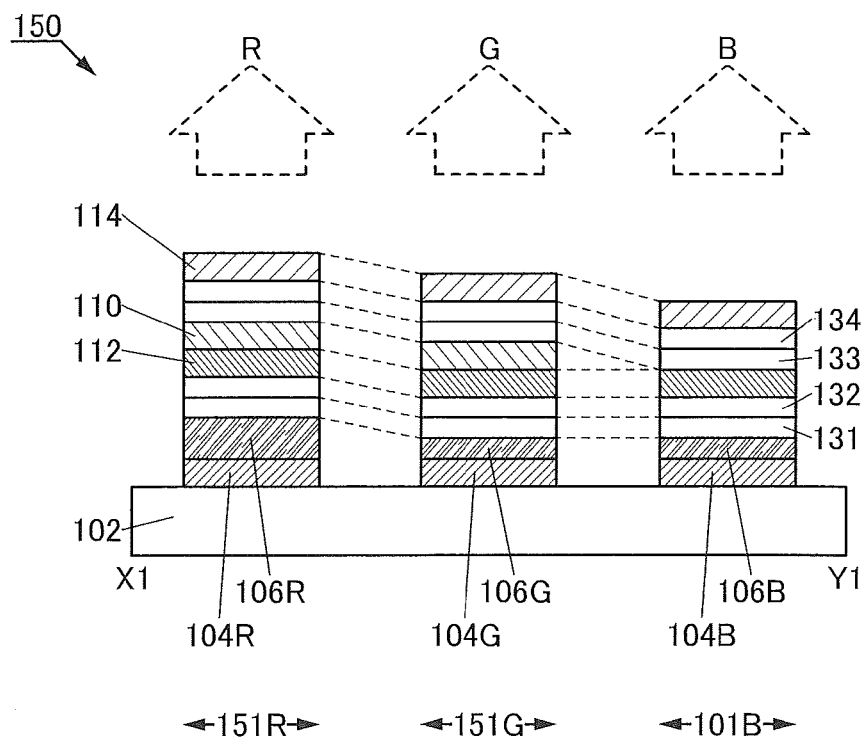
Figure 30A:
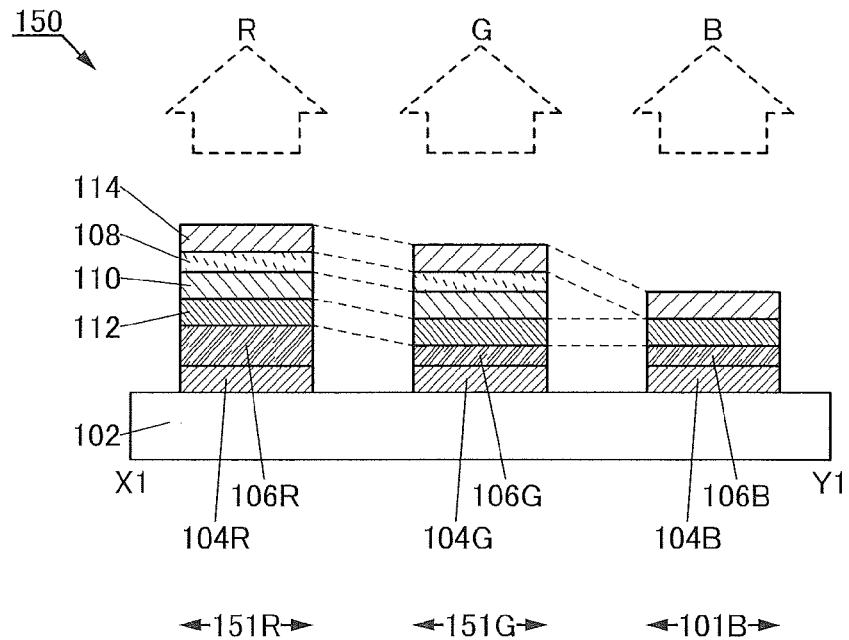
FIGS. 30A and 30B are each a cross-sectional view illustrating a light-emitting device.
Figure 30B:
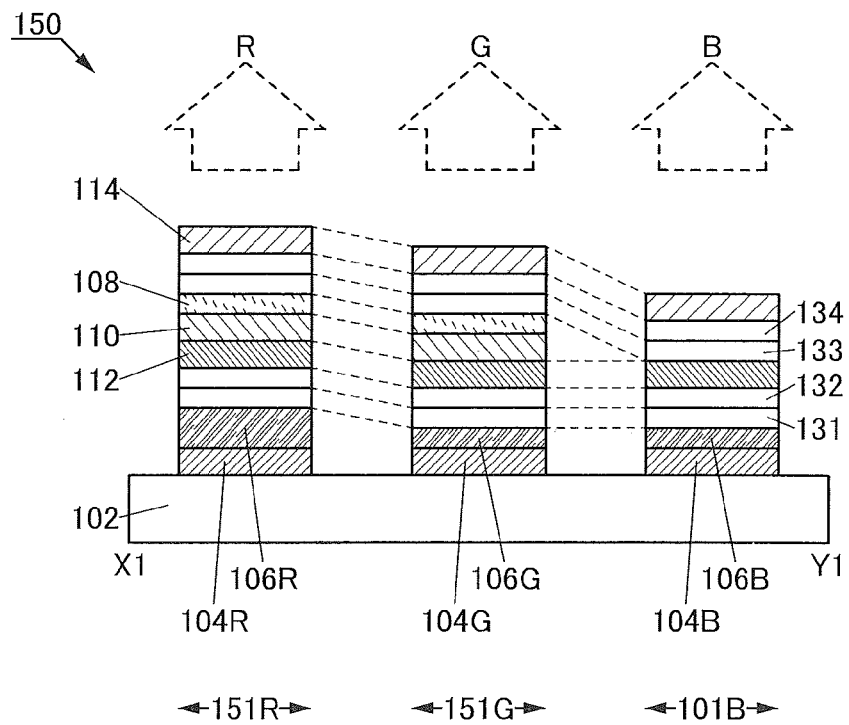
Figure 31:
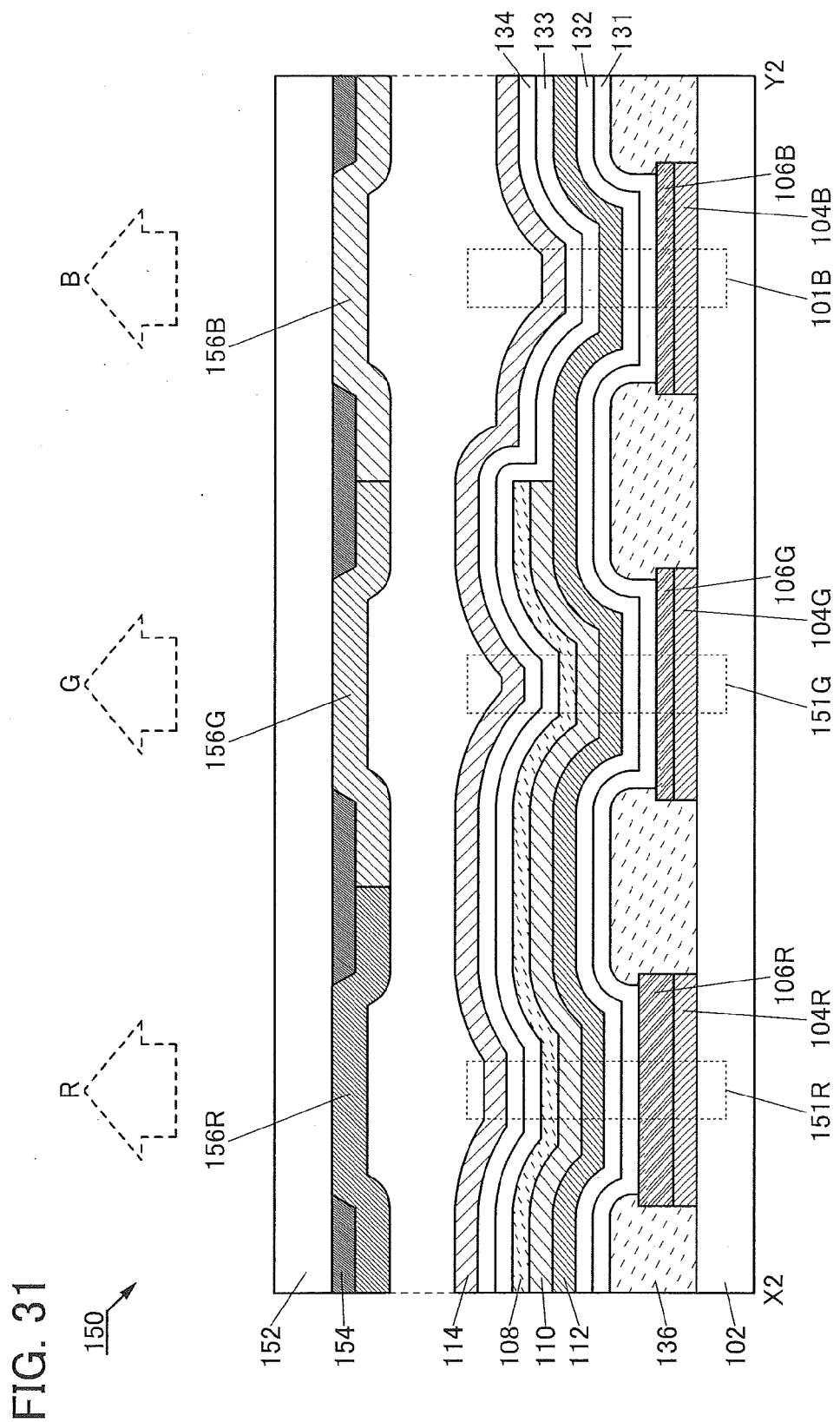
FIG. 31 is a cross-sectional view illustrating a light-emitting device.

FIGS. 29A and 29B, FIGS. 30A and 30B, and FIG. 31 are cross-sectional views each illustrating an example of the light-emitting device of embodiment of the present invention. Plan views of the light-emitting devices of FIGS. 29A and 29B and FIGS. 30A and 30B are not shown here because they are similar to the plan view of the light-emitting device 100 illustrated in FIG. 1A, and a plan view of the light-emitting device of FIG. 31 is not shown here because it is similar to the plan view of the light-emitting device 100 illustrated in FIG. 4.

A light-emitting device 150 illustrated in FIG. 29A includes a first light-emitting element 151B, a second light-emitting element 151G, and the third light-emitting element 101B. The first light-emitting element 151R includes the first lower electrode 104R, the first transparent conductive layer 106R over the first lower electrode 104R, the second light-emitting layer 112 over the first transparent conductive layer 106R, the first light-emitting layer 110 over the second light-emitting layer 112, and the upper electrode 114 over the first light-emitting layer 110. The second light-emitting element 151G includes the second lower electrode 104G, the second transparent conductive layer 106G over the second lower electrode 104G, the second light-emitting layer 112 over the second transparent conductive layer 106G, the first light-emitting layer 110 over the second light-emitting layer 112, and the upper electrode 114 over the first light-emitting layer 110. The third light-emitting element 101B includes the third lower electrode 104B, the third transparent conductive layer 106B over the third lower electrode 104B, the second light-emitting layer 112 over the third transparent conductive layer 106B, and the upper electrode 114 over the second light-emitting layer 112.

The light-emitting device 150 illustrated in FIG. 29B includes the first light-emitting element 151R, the second light-emitting element 151G, and the third light-emitting element 101B. The first light-emitting element 151R includes the first lower electrode 104R, the first transparent conductive layer 106R over the first lower electrode 104R, the hole-injection layer 131 over the first transparent conductive layer 106R, the hole-transport layer 132 over the hole-injection layer 131, the second light-emitting layer 112 over the hole-transport layer 132, the first light-emitting layer 110 over the second light-emitting layer 112, the electron-transport layer 133 over the first light-emitting layer 110, the electron-injection layer 134 over the electron-transport layer 133, and the upper electrode 114 over the electron-injection layer 134. The second light-emitting element 151G includes the second lower electrode 104G, the second transparent conductive layer 106G over the second lower electrode 104G, the hole-injection layer 131 over the second transparent conductive layer 106G, the hole-transport layer 132 over the hole-injection layer 131, the second light-emitting layer 112 over the hole-transport layer 132, the first light-emitting layer 110 over the second light-emitting layer 112, the electron-transport layer 133 over the first light-emitting layer 110, the electron-injection layer 134 over the electron-transport layer 133, and the upper electrode 114 over the electron-injection layer 134. The third light-emitting element 101B includes the third lower electrode 104B, the third transparent conductive layer 106B over the third lower electrode 104B, the hole-injection layer 131 over the third transparent conductive layer 106B, the hole-transport layer 132 over the hole-injection layer 131, the second light-emitting layer 112 over the hole-transport layer 132, the electron-transport layer 133 over the second light-emitting layer 112, the electron-injection layer 134 over the electron-transport layer 133, and the upper electrode 114 over the electron-injection layer 134.

That is, the light-emitting devices 150 illustrated in FIGS. 29A and 29B each include the first light-emitting element 151R instead of the first light-emitting element 101R of the light-emitting device 100 and the second light-emitting element 151G instead of the second light-emitting element 101G of the light-emitting device 100. In the first light-emitting element 151R, the stacking order of the light-emitting layers is different from that in the first light-emitting element 101R. In the second light-emitting element 151G, the stacking order of the light-emitting layers is different from that in the second light-emitting element 101G. Specifically, the first light-emitting layer 110 is provided over the second light-emitting layer 112 in each of the first light-emitting element 151R and the second light-emitting element 151G.

In the light-emitting device 150 illustrated in FIG. 30A, the optical adjustment layer 108 is provided in addition to the components of the light-emitting device 150 illustrated in FIG. 29A. Specifically, the first light-emitting element 151R includes the optical adjustment layer 108 between the first light-emitting layer 110 and the upper electrode 114. The second light-emitting element 151G includes the optical adjustment layer 108 between the first light-emitting layer 110 and the upper electrode 114.

In the light-emitting device 150 illustrated in FIG. 30B, the optical adjustment layer 108 is provided in addition to the components of the light-emitting device 150 illustrated in FIG. 29B. Specifically, the first light-emitting element 151R includes the optical adjustment layer 108 between the first light-emitting layer 110 and the electron-transport layer 133. The second light-emitting element 151G includes the optical adjustment layer 108 between the first light-emitting layer 110 and the electron-transport layer 133.

As illustrated in FIGS. 30A and 30B, with the structure provided with the optical adjustment layer 108, an optical path length between each of the lower electrodes (the first lower electrode 104R and the second lower electrode 104G) and the upper electrode 114 can be adjusted. In each of the light-emitting devices 150 illustrated in FIGS. 30A and 30B, the optical adjustment layer 108 is provided over the first light-emitting layer 110.

The light-emitting device 150 illustrated in FIG. 31 includes the partition 136 and the substrate 152 in addition to the components of the light-emitting device 150 illustrated in FIG. 30B. The partitions 136 are provided at outer portions of the light-emitting elements and have a function of covering the end portions of either or both of the lower electrodes and the transparent conductive layers of the light-emitting elements. The substrate 152 is provided with the light-blocking layer 154, the first optical element 156R, the second optical element 156G, and the third optical element 156B. The light-blocking layer 154 is provided to overlap with the partition 136. The first optical element 156R, the second optical element 156G, and the third optical element 156B are provided to overlap with the first light-emitting element 151R, the second light-emitting element 151G, and the third light-emitting element 101B, respectively.

As described above, the light-emitting device 150 is different from the light-emitting device 100 in the stacking order of the first light-emitting layer 110, the second light-emitting layer 112, and the optical adjustment layer 108. Since the stacking order of the first light-emitting layer 110, the second light-emitting layer 112, and the optical adjustment layer 108 is changed, it is necessary to consider the carrier balance with the materials in the layers. For example, the second light-emitting layer 112 is formed using a material with a hole-transport property higher than that of the material used for the first light-emitting layer 110, and the optical adjustment layer 108 is formed using an electron-transport material.

With the above-described structures, in the first light-emitting element 151R and the second light-emitting element 151G, the second light-emitting layer 112 does not contribute to light emission. For example, for the second light-emitting layer 112, a material with a high hole-transport property and a low electron-transport property or a material having a lower HOMO level than the material used for the first light-emitting layer 110 is used.

The other structures are similar to those of the light-emitting device 100 described in Embodiment 1 and have similar effects. The above-described structures of the light-emitting devices can be combined as appropriate.

Structural Example 5 of Light-Emitting Device

Figure 32:
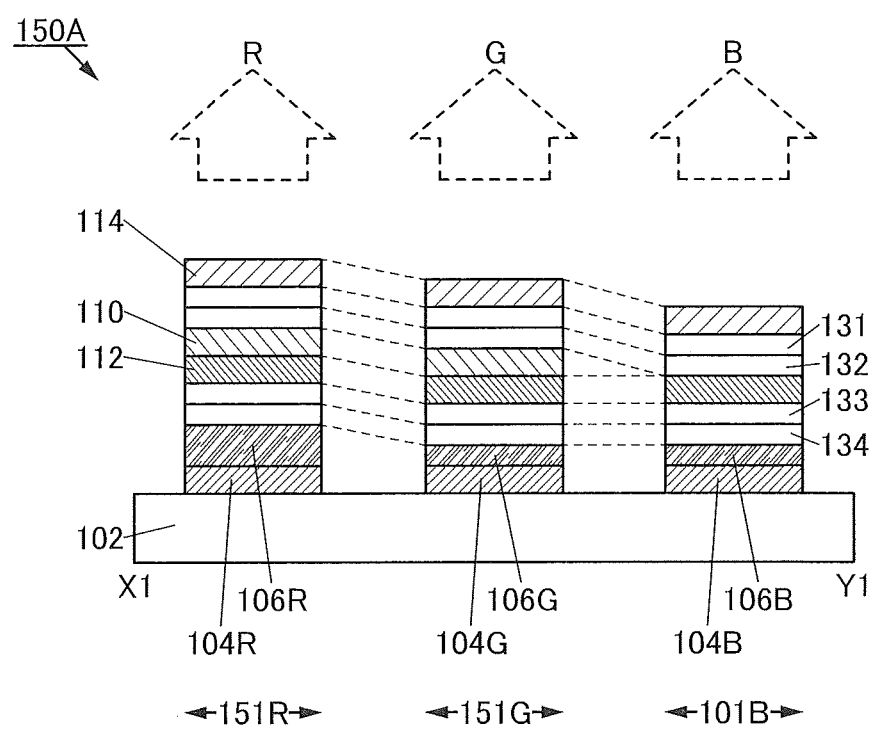
FIG. 32 is a cross-sectional view illustrating a light-emitting device.
Figure 33:
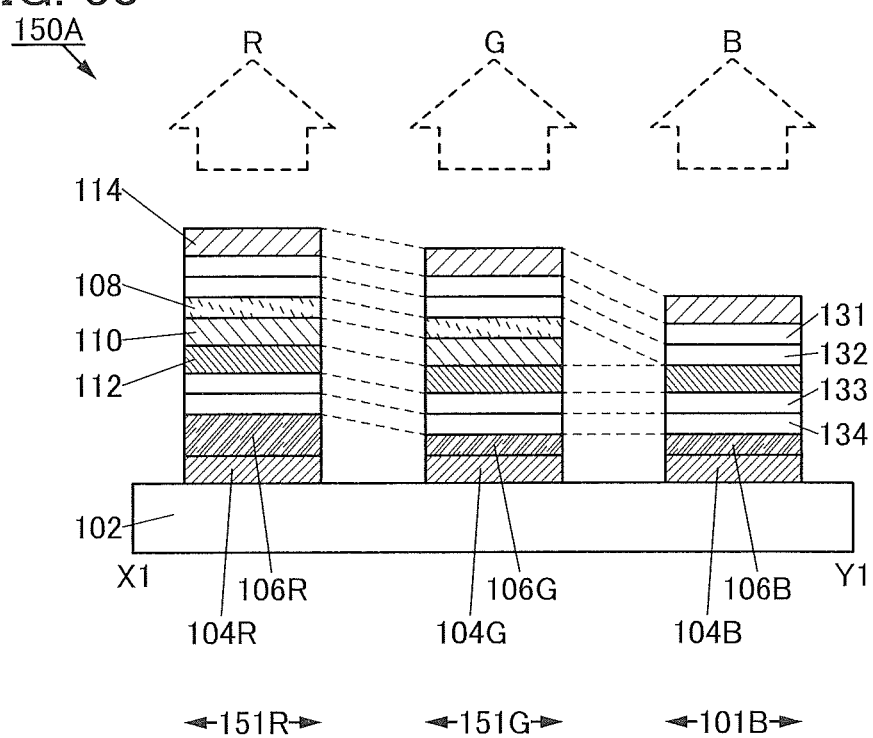
FIG. 33 is a cross-sectional view illustrating a light-emitting device.
Figure 34:
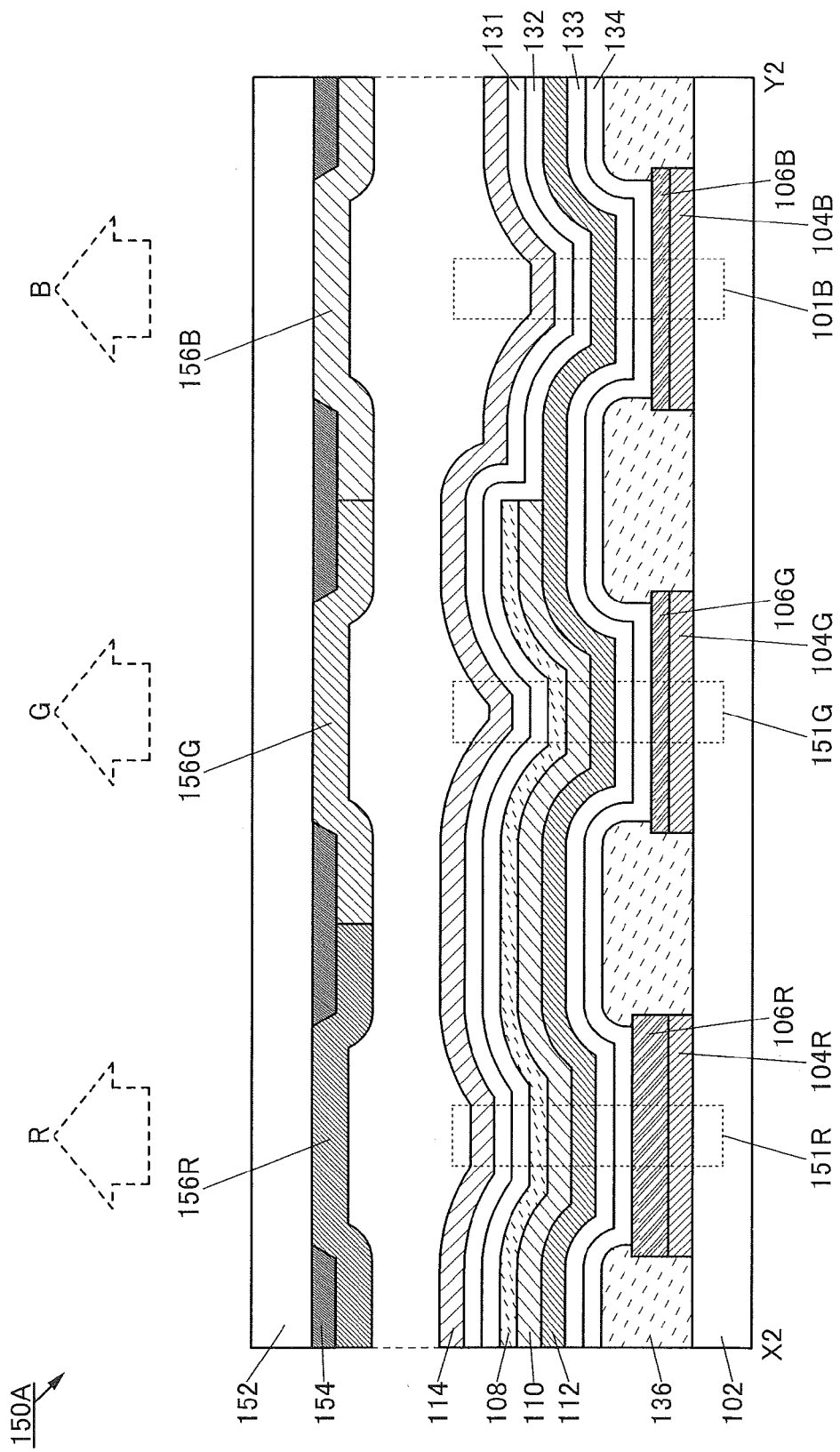
FIG. 34 is a cross-sectional view illustrating a light-emitting device.

FIG. 32, FIG. 33, and FIG. 34 are cross-sectional views each illustrating an example of the light-emitting device of embodiment of the present invention. Plan views of the light-emitting devices of FIG. 32 and FIG. 33 are not shown here because they are similar to the plan view of the light-emitting device 100 illustrated in FIG. 1A, and a plan view of the light-emitting device of FIG. 34 is not shown here because it is similar to the plan view of the light-emitting device 100 illustrated in FIG. 4.

A light-emitting device 150A illustrated in FIG. 32 includes the first light-emitting element 151R, the second light-emitting element 151G, and the third light-emitting element 101B. The first light-emitting element 151R includes the first lower electrode 104R, the first transparent conductive layer 106R over the first lower electrode 104R, the electron-injection layer 134 over the first transparent conductive layer 106R, the electron-transport layer 133 over the electron-injection layer 134, the second light-emitting layer 112 over the electron-transport layer 133, the first light-emitting layer 110 over the second light-emitting layer 112, the hole-transport layer 132 over the first light-emitting layer 110, the hole-injection layer 131 over the hole-transport layer 132, and the upper electrode 114 over the hole-injection layer 131. The second light-emitting element 151G includes the second lower electrode 104G, the second transparent conductive layer 106G over the second lower electrode 104G, the electron-injection layer 134 over the second transparent conductive layer 106G, the electron-transport layer 133 over the electron-injection layer 134, the second light-emitting layer 112 over the electron-transport layer 133, the first light-emitting layer 110 over the second light-emitting layer 112, the hole-transport layer 132 over the first light-emitting layer 110, the hole-injection layer 131 over the hole-transport layer 132, and the upper electrode 114 over the hole-injection layer 131. The third light-emitting element 101B includes the third lower electrode 104B, the third transparent conductive layer 106B over the third lower electrode 104B, the electron-injection layer 134 over the third transparent conductive layer 106B, the electron-transport layer 133 over the electron-injection layer 134, the second light-emitting layer 112 over the electron-transport layer 133, the hole-transport layer 132 over the second light-emitting layer 112, the hole-injection layer 131 over the hole-transport layer 132, and the upper electrode 114 over the hole-injection layer 131.

That is, the light-emitting device 150A illustrated in FIG. 32 includes the first light-emitting element 151R instead of the first light-emitting element 101R of the light-emitting device 100A and the second light-emitting element 151G instead of the second light-emitting element 101G of the light-emitting device 100A. In the first light-emitting element 151R, the stacking order of the light-emitting layers is different from that in the first light-emitting element 101R. In the second light-emitting element 151G, the stacking order of the light-emitting layers is different from that in the second light-emitting element 101G. Specifically, the first light-emitting layer 110 is provided over the second light-emitting layer 112 in each of the first light-emitting element 151R and the second light-emitting element 151G.

In the light-emitting device 150A illustrated in FIG. 33, the optical adjustment layer 108 is provided in addition to the components of the light-emitting device 150A illustrated in FIG. 32. Specifically, the first light-emitting element 151R includes the optical adjustment layer 108 between the first light-emitting layer 110 and the hole-transport layer 132. The second light-emitting element 151G includes the optical adjustment layer 108 between the first light-emitting layer 110 and the hole-transport layer 132.

As illustrated in FIG. 33, with the structure provided with the optical adjustment layer 108, an optical path length between each of the lower electrodes (the first lower electrode 104R and the second lower electrode 104G) and the upper electrode 114 can be adjusted. In the light-emitting device 150A illustrated in FIG. 33, the optical adjustment layer 108 is provided over the first light-emitting layer 110.

The light-emitting device 150A illustrated in FIG. 34 includes the partition 136 and the substrate 152 in addition to the components of the light-emitting device 150A illustrated in FIG. 33. The partitions 136 are provided at outer portions of the light-emitting elements and have a function of covering the end portions of either or both of the lower electrodes and the transparent conductive layers of the light-emitting elements. The substrate 152 is provided with the light-blocking layer 154, the first optical element 156R, the second optical element 156G, and the third optical element 156B. The light-blocking layer 154 is provided to overlap with the partition 136. The first optical element 156R, the second optical element 156G, and the third optical element 156B are provided to overlap with the first light-emitting element 151R, the second light-emitting element 151G, and the third light-emitting element 101B, respectively.

As described above, the light-emitting device 150A is different from the light-emitting device 100 in the stacking order of the first light-emitting layer 110, the second light-emitting layer 112, and the optical adjustment layer 108. Since the stacking order of the first light-emitting layer 110, the second light-emitting layer 112, and the optical adjustment layer 108 is changed, it is necessary to consider the carrier balance with the materials in the layers. For example, the second light-emitting layer 112 is formed using a material with an electron-transport property higher than that of the material used for the first light-emitting layer 110, and the optical adjustment layer 108 is formed using a hole-transport material.

With the above structures, in the first light-emitting element 151R and the second light-emitting element 151G, the second light-emitting layer 112 does not contribute to light emission. For example, for the second light-emitting layer 112, a material with a high electron-transport property and a low hole-transport property or a material having a lower HOMO level than the material used for the first light-emitting layer 110 is used.

The other structures are similar to those of the light-emitting device 100A described in Embodiment 1 and have similar effects. The above-described structures of the light-emitting devices can be combined as appropriate.

The structure described in this embodiment can be combined with any of the structures described in the other embodiments and examples as appropriate.

Embodiment 3

In this embodiment, a display device including a light-emitting device of one embodiment of the present invention will be described with reference to FIGS. 35A and 35B.

Figure 35A:
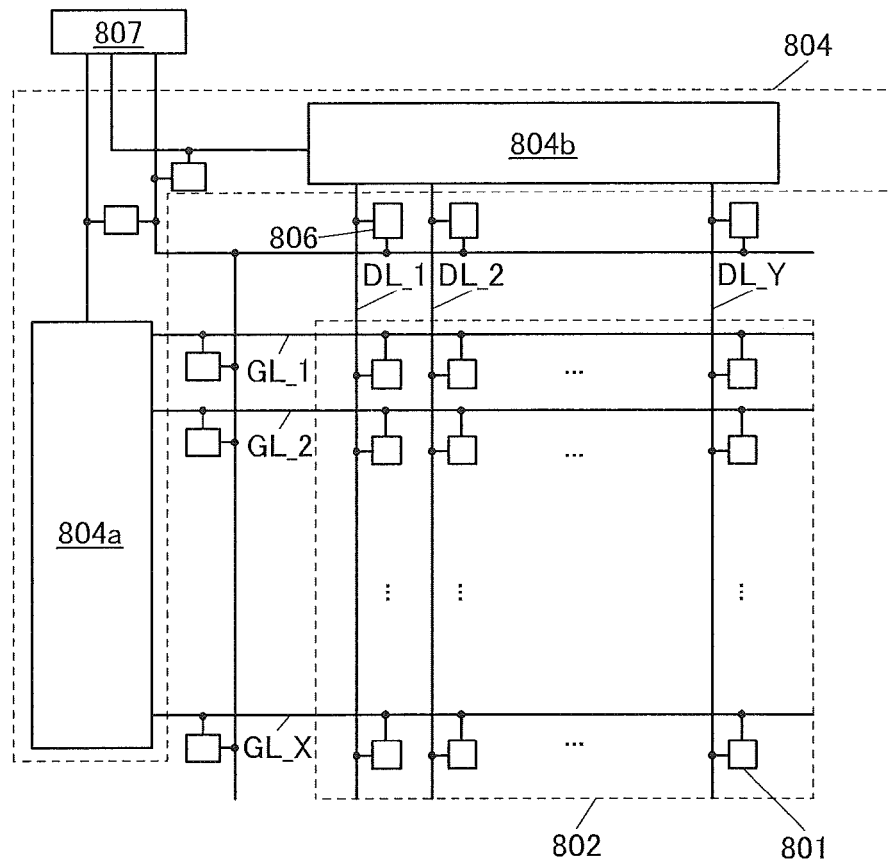
FIGS. 35A and 35B are a block diagram and a circuit diagram illustrating a display device.
Figure 35B:
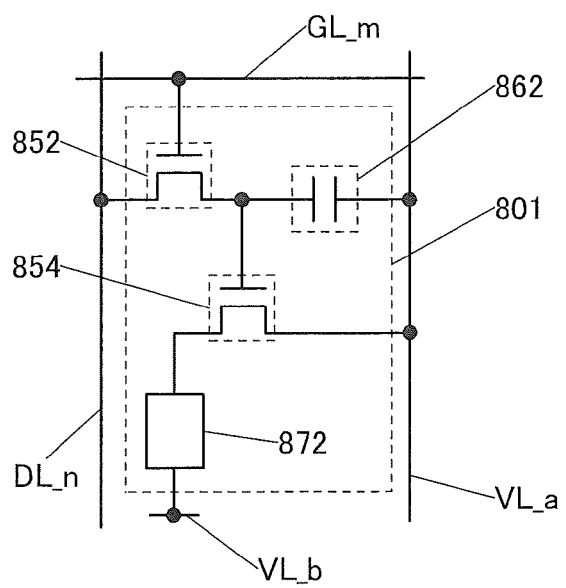

FIG. 35A is a block diagram illustrating the display device of one embodiment of the present invention, and FIG. 35B is a circuit diagram illustrating a pixel circuit of the display device of one embodiment of the present invention.

The display device illustrated in FIG. 35A includes a region including pixels of display elements (the region is hereinafter referred to as a pixel portion 802), a circuit portion provided outside the pixel portion 802 and including circuits for driving the pixels (the portion is hereinafter referred to as a driver circuit portion 804), circuits having a function of protecting elements (the circuits are hereinafter referred to as protection circuits 806), and a terminal portion 807. Note that the protection circuits 806 are not necessarily provided.

Part or the whole of the driver circuit portion 804 is preferably formed over a substrate over which the pixel portion 802 is formed, in which case the number of components and the number of terminals can be reduced. When part or the whole of the driver circuit portion 804 is not formed over the substrate over which the pixel portion 802 is formed, the part or the whole of the driver circuit portion 804 can be mounted by chip-on-glass (COG) or tape automated bonding (TAB).

The pixel portion 802 includes a plurality of circuits for driving display elements arranged in X rows (X is a natural number of 2 or more) and Y columns (Y is a natural number of 2 or more) (such circuits are hereinafter referred to as pixel circuits 801). The driver circuit portion 804 includes driver circuits such as a circuit for supplying a signal (scan signal) to select a pixel (the circuit is hereinafter referred to as a gate driver 804a) and a circuit for supplying a signal (data signal) to drive a display element in a pixel (the circuit is hereinafter referred to as a source driver 804b).

The gate driver 804a includes a shift register or the like. Through the terminal portion 807, the gate driver 804a receives a signal for driving the shift register and outputs a signal. For example, the gate driver 804a receives a start pulse signal, a clock signal, or the like and outputs a pulse signal. The gate driver 804a has a function of controlling the potentials of wirings supplied with scan signals (such wirings are hereinafter referred to as scan lines GL_1 to GL_X). Note that a plurality of gate drivers 804a may be provided to control the scan lines GL_1 to GL_X separately. Alternatively, the gate driver 804a has a function of supplying an initialization signal. Without being limited thereto, the gate driver 804a can supply another signal.

The source driver 804b includes a shift register or the like. The source driver 804b receives a signal (video signal) from which a data signal is derived, as well as a signal for driving the shift register, through the terminal portion 807. The source driver 804b has a function of generating a data signal to be written to the pixel circuit 801 which is based on the video signal. In addition, the source driver 804b has a function of controlling output of a data signal in response to a pulse signal produced by input of a start pulse signal, a clock signal, or the like. Furthermore, the source driver 804b has a function of controlling the potentials of wirings supplied with data signals (such wirings are hereinafter referred to as data lines DL_1 to DL_Y). Alternatively, the source driver 804b has a function of supplying an initialization signal. Without being limited thereto, the source driver 804b can supply another signal.

The source driver 804b includes a plurality of analog switches or the like, for example. The source driver 804b can output, as the data signals, signals obtained by time-dividing the video signal by sequentially turning on the plurality of analog switches. The source driver 804b may include a shift register or the like.

A pulse signal and a data signal are input to each of the plurality of pixel circuits 801 through one of the plurality of scan lines GL supplied with scan signals and one of the plurality of data lines DL supplied with data signals, respectively. Writing and holding of the data signal to and in each of the plurality of pixel circuits 801 are controlled by the gate driver 804a. For example, to the pixel circuit 801 in the m-th row and the n-th column (m is a natural number of less than or equal to X, and n is a natural number of less than or equal to Y), a pulse signal is input from the gate driver 804a through the scan line GL_m, and a data signal is input from the source driver 804b through the data line DL_n in accordance with the potential of the scan line GL_m.

The protection circuit 806 illustrated in FIG. 35A is connected to, for example, the scan line GL between the gate driver 804a and the pixel circuit 801. Alternatively, the protection circuit 806 is connected to the data line DL between the source driver 804b and the pixel circuit 801. Alternatively, the protection circuit 806 can be connected to a wiring between the gate driver 804a and the terminal portion 807. Alternatively, the protection circuit 806 can be connected to a wiring between the source driver 804b and the terminal portion 807. Note that the terminal portion 807 means a portion having terminals for inputting power, control signals, and video signals to the display device from external circuits.

The protection circuit 806 is a circuit that electrically connects a wiring connected to the protection circuit to another wiring when a potential out of a certain range is applied to the wiring connected to the protection circuit.

As illustrated in FIG. 35A, the protection circuits 806 are provided for the pixel portion 802 and the driver circuit portion 804, so that the resistance of the display device to overcurrent generated by electrostatic discharge (ESD) or the like can be improved. Note that the configuration of the protection circuits 806 is not limited to that, and for example, a configuration in which the protection circuits 806 are connected to the gate driver 804a or a configuration in which the protection circuits 806 are connected to the source driver 804b may be employed. Alternatively, the protection circuits 806 may be configured to be connected to the terminal portion 807.

In FIG. 35A, an example in which the driver circuit portion 804 includes the gate driver 804a and the source driver 804b is shown; however, the structure is not limited thereto. For example, only the gate driver 804a may be formed and a separately prepared substrate where a source driver circuit is formed (e.g., a driver circuit substrate formed with a single crystal semiconductor film or a polycrystalline semiconductor film) may be mounted.

Each of the plurality of pixel circuits 801 in FIG. 35A can have a structure illustrated in FIG. 35B, for example.

The pixel circuit 801 illustrated in FIG. 35B includes transistors 852 and 854, a capacitor 862, and a light-emitting element 872.

One of a source electrode and a drain electrode of the transistor 852 is electrically connected to a wiring to which a data signal is supplied (hereinafter referred to as a data line DL_n). A gate electrode of the transistor 852 is electrically connected to a wiring to which a gate signal is supplied (hereinafter referred to as a scan line GL_m).

The transistor 852 has a function of controlling whether to write a data signal by being turned on or off.

One of a pair of electrodes of the capacitor 862 is electrically connected to a wiring to which a potential is supplied (hereinafter referred to as a potential supply line VL_a), and the other is electrically connected to the other of the source electrode and the drain electrode of the transistor 852.

The capacitor 862 functions as a storage capacitor for storing written data.

One of a source electrode and a drain electrode of the transistor 854 is electrically connected to the potential supply line VL_a. Furthermore, a gate electrode of the transistor 854 is electrically connected to the other of the source electrode and the drain electrode of the transistor 852.

One of an anode and a cathode of the light-emitting element 872 is electrically connected to a potential supply line VL_b, and the other is electrically connected to the other of the source electrode and the drain electrode of the transistor 854.

As the light-emitting element 872, any of the light-emitting elements described in Embodiment 1 can be used.

Note that a high power supply potential VDD is supplied to one of the potential supply line VL_a and the potential supply line VL_b, and a low power supply potential VSS is supplied to the other.

In the display device including the pixel circuits 801 in FIG. 35B, the pixel circuits 801 are sequentially selected row by row by the gate driver 804a in FIG. 35A, for example, whereby the transistors 852 are turned on and a data signal is written.

When the transistors 852 are turned off, the pixel circuits 801 in which the data has been written are brought into a holding state. Furthermore, the amount of current flowing between the source electrode and the drain electrode of the transistor 854 is controlled in accordance with the potential of the written data signal. The light-emitting element 872 emits light with a luminance corresponding to the amount of flowing current. This operation is sequentially performed row by row; thus, an image is displayed.

Alternatively, the pixel circuit can have a function of compensating variation in threshold voltages or the like of a transistor. FIGS. 36A and 36B and FIGS. 37A and 37B illustrate examples of the pixel circuit.

Figure 36A:
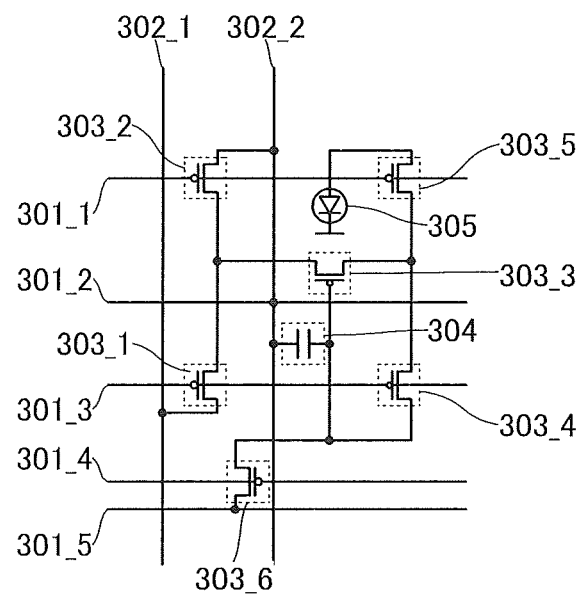
FIGS. 36A and 36B are each a circuit diagram illustrating a pixel circuit of a display device.

The pixel circuit illustrated in FIG. 36A includes six transistors (transistors 303_1 to 303_6), a capacitor 304, and a light-emitting element 305. The pixel circuit illustrated in FIG. 36A is electrically connected to wirings 301_1 to 301_5 and wirings 302_1 and 302_2. Note that as the transistors 303_1 to 303_6, for example, p-channel transistors can be used.

Figure 36B:
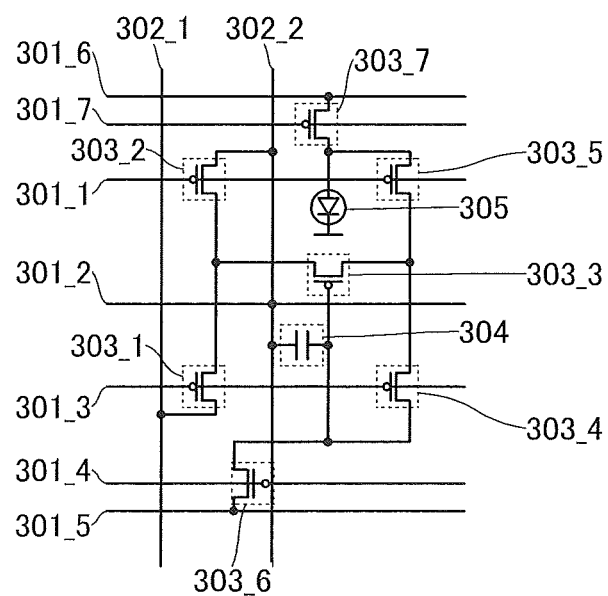

The pixel circuit illustrated in FIG. 36B has a configuration in which a transistor 303_7 is added to the pixel circuit illustrated in FIG. 36A. The pixel circuit illustrated in FIG. 36B is electrically connected to wirings 301_6 and 301_7. The wirings 301_5 and 301_6 may be electrically connected to each other. Note that as the transistor 303_7, for example, a p-channel transistor can be used.

Figure 37A:
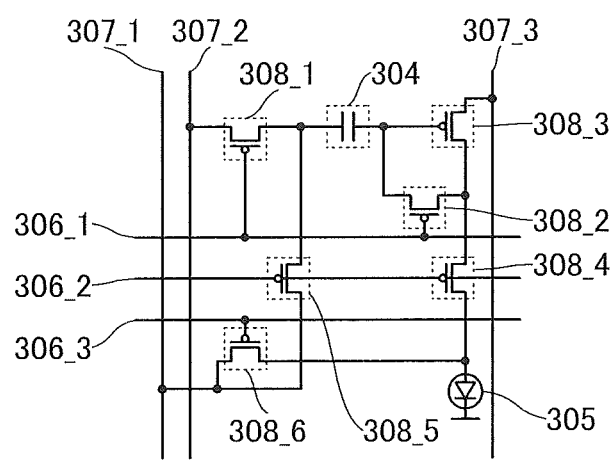
FIGS. 37A and 37B are each a circuit diagram illustrating a pixel circuit of a display device.

The pixel circuit illustrated in FIG. 37A includes six transistors (transistors 308_1 to 308_6), the capacitor 304, and the light-emitting element 305. The pixel circuit illustrated in FIG. 37A is electrically connected to wirings 306_1 to 306_3 and wirings 307_1 to 307_3. The wirings 306_1 and 306_3 may be electrically connected to each other. Note that as the transistors 308_1 to 308_6, for example, p-channel transistors can be used.

Figure 37B:
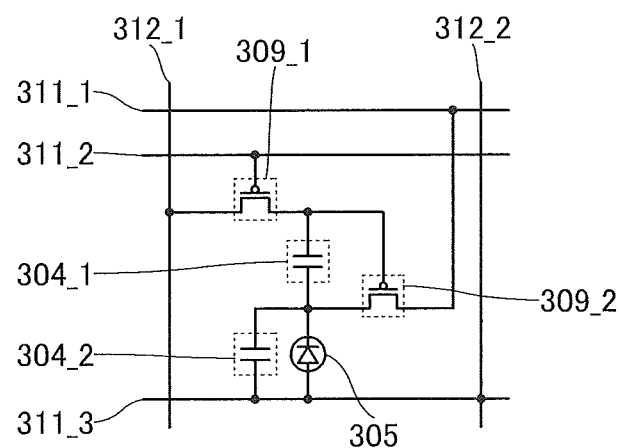

The pixel circuit illustrated in FIG. 37B includes two transistors (transistors 309_1 and 309_2), two capacitors (capacitors 304_1 and 304_2), and the light-emitting element 305. The pixel circuit illustrated in FIG. 37B is electrically connected to wirings 311_1 to 311_3 and wirings 312_1 and 312_2. With the configuration of the pixel circuit illustrated in FIG. 37B, the light-emitting element 305 can be driven by constant voltage constant current (CVCC). Note that as the transistors 309_1 and 309_2, for example, p-channel transistors can be used.

A light-emitting element of one embodiment of the present invention can be used for an active matrix method in which an active element is included in a pixel of a display device or a passive matrix method in which an active element is not included in a pixel of a display device.

In the active matrix method, as an active element (a non-linear element), not only a transistor but also a variety of active elements (non-linear elements) can be used. For example, a metal insulator metal (MIM), a thin film diode (TFD), or the like can also be used. Since these elements can be formed with a smaller number of manufacturing steps, manufacturing cost can be reduced or yield can be improved. Alternatively, since the size of these elements is small, the aperture ratio can be improved, so that power consumption can be reduced or higher luminance can be achieved.

As a method other than the active matrix method, the passive matrix method in which an active element (a non-linear element) is not used can also be used. Since an active element (a non-linear element) is not used, the number of manufacturing steps is small, so that manufacturing cost can be reduced or yield can be improved. Alternatively, since an active element (a non-linear element) is not used, the aperture ratio can be improved, so that power consumption can be reduced or higher luminance can be achieved, for example.

The structure described in this embodiment can be combined with any of the structures described in the other embodiments and examples as appropriate.

Embodiment 4

In this embodiment, a display panel including a light-emitting device of one embodiment of the present invention and an electronic device in which the display panel is provided with an input device will be described with reference to FIGS. 38A and 38B, FIGS. 39A to 39C, FIGS. 40A and 40B, FIGS. 41A and 41B, and FIG. 42.

<Description 1 of Touch Panel>

In this embodiment, a touch panel 2000 including a display panel and an input device will be described as an example of an electronic device. In addition, an example in which a touch sensor is used as an input device will be described. Note that a light-emitting device of one embodiment of the present invention can be used for a pixel of the display panel.

Figure 38A:
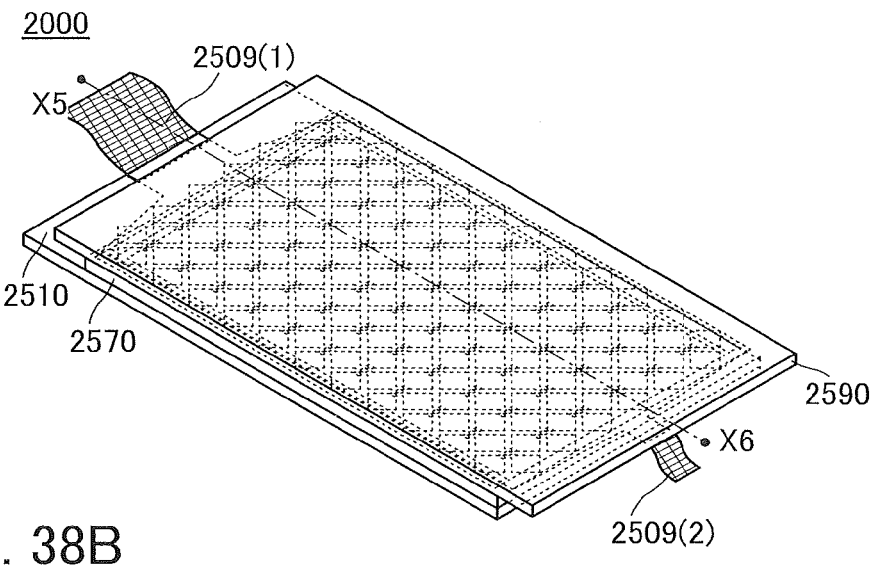
FIGS. 38A and 38B are perspective views of an example of a touch panel.
Figure 38B:
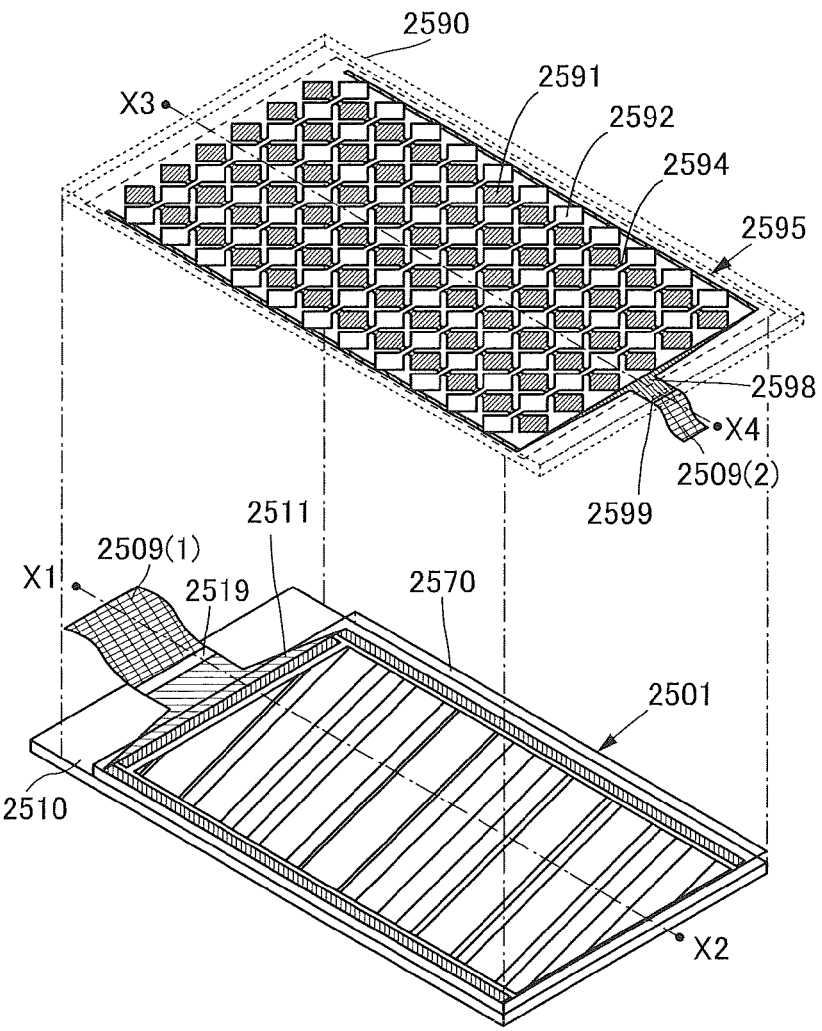

FIGS. 38A and 38B are perspective views of the touch panel 2000. Note that FIGS. 38A and 38B illustrate only main components of the touch panel 2000 for simplicity.

The touch panel 2000 includes a display panel 2501 and a touch sensor 2595 (see FIG. 38B). The touch panel 2000 also includes a substrate 2510, a substrate 2570, and a substrate 2590. The substrate 2510, the substrate 2570, and the substrate 2590 each have flexibility. Note that one or all of the substrates 2510, 2570, and 2590 may be inflexible.

The display panel 2501 includes a plurality of pixels over the substrate 2510 and a plurality of wirings 2511 through which signals are supplied to the pixels. The plurality of wirings 2511 are led to an outer portion of the substrate 2510, and parts of the plurality of wirings 2511 form a terminal 2519. The terminal 2519 is electrically connected to an FPC 2509(1).

The substrate 2590 includes the touch sensor 2595 and a plurality of wirings 2598 electrically connected to the touch sensor 2595. The plurality of wirings 2598 are led to an outer portion of the substrate 2590, and parts of the plurality of wirings 2598 form a terminal. The terminal is electrically connected to an FPC 2509(2). Note that in FIG. 38B, electrodes, wirings, and the like of the touch sensor 2595 provided on the back side of the substrate 2590 (the side facing the substrate 2510) are indicated by solid lines for clarity.

As the touch sensor 2595, a capacitive touch sensor can be used. Examples of the capacitive touch sensor include a surface capacitive touch sensor and a projected capacitive touch sensor.

Examples of the projected capacitive touch sensor are a self capacitive touch sensor and a mutual capacitive touch sensor, which differ mainly in the driving method. The use of a mutual capacitive type is preferable because multiple points can be sensed simultaneously.

Note that the touch sensor 2595 illustrated in FIG. 38B is an example of using a projected capacitive touch sensor.

Note that a variety of sensors that can sense proximity or touch of a sensing target such as a finger can be used as the touch sensor 2595.

The projected capacitive touch sensor 2595 includes electrodes 2591 and electrodes 2592. The electrodes 2591 are electrically connected to any of the plurality of wirings 2598, and the electrodes 2592 are electrically connected to any of the other wirings 2598.

The electrodes 2592 each have a shape of a plurality of quadrangles arranged in one direction with one corner of a quadrangle connected to one corner of another quadrangle as illustrated in FIGS. 38A and 38B.

The electrodes 2591 each have a quadrangular shape and are arranged in a direction intersecting with the direction in which the electrodes 2592 extend.

A wiring 2594 electrically connects two electrodes 2591 between which the electrode 2592 is positioned. The intersecting area of the electrode 2592 and the wiring 2594 is preferably as small as possible. Such a structure allows a reduction in the area of a region where the electrodes are not provided, reducing variation in transmittance. As a result, variation in luminance of light passing through the touch sensor 2595 can be reduced.

Note that the shapes of the electrodes 2591 and the electrodes 2592 are not limited thereto and can be any of a variety of shapes. For example, a structure may be employed in which the plurality of electrodes 2591 are arranged so that gaps between the electrodes 2591 are reduced as much as possible, and the electrodes 2592 are spaced apart from the electrodes 2591 with an insulating layer interposed therebetween to have regions not overlapping with the electrodes 2591. In this case, it is preferable to provide, between two adjacent electrodes 2592, a dummy electrode electrically insulated from these electrodes because the area of regions having different transmittances can be reduced.

Note that for example, a transparent conductive film including indium oxide, tin oxide, zinc oxide, or the like (e.g., a film of ITO) can be given as a material of conductive films used for the electrode 2591, the electrode 2592, and the wiring 2598, i.e., wirings and electrodes in the touch panel. Moreover, for example, a low-resistance material is preferably used as the material of the wiring and the electrode in the touch panel. For example, silver, copper, aluminum, a carbon nanotube, graphene, or a metal halide (such as a silver halide) may be used. Alternatively, a metal nanowire including a plurality of conductors with an extremely small width (e.g., a diameter of several nanometers) may be used. Further alternatively, a net-like metal mesh with a conductor may be used. Examples of such materials include an Ag nanowire, a Cu nanowire, an Al nanowire, an Ag mesh, a Cu mesh, and an Al mesh. For example, in the case of using an Ag nanowire for the wiring and the electrode in the touch panel, a visible light transmittance of 89% or more and a sheet resistance of 40 $\Omega/cm^2$ or more and 100 $\Omega/cm^2$ or less can be achieved. A metal nanowire, a metal mesh, a carbon nanotube, graphene, and the like, which are examples of a material that can be used for the above-described wiring and electrode in the touch panel, have a high visible light transmittance; therefore, they may be used for an electrode of a display element (e.g., a pixel electrode or a common electrode).

<Display Panel>

Figure 39A:
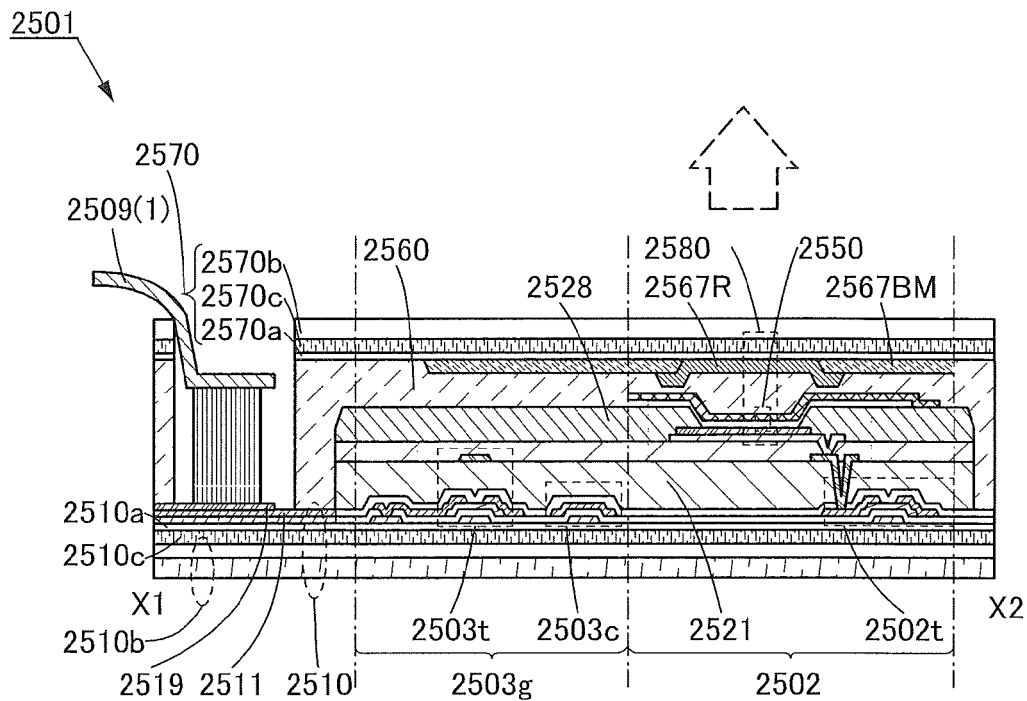
FIGS. 39A to 39C are cross-sectional views of examples of a display panel and a touch sensor.

Next, the display panel 2501 is described in detail with reference to FIG. 39A. FIG. 39A is a cross-sectional view along dashed-dotted line X1-X2 in FIG. 38B.

The display panel 2501 includes a plurality of pixels arranged in a matrix. Each of the pixels includes a display element and a pixel circuit for driving the display element.

For the substrate 2510 and the substrate 2570, for example, a flexible material with a vapor permeability lower than or equal to $10^{-5}$ g/(m$^2$·day), preferably lower than or equal to $1 \times 10^{-6}$ g/(m$^2$·day) can be preferably used. Alternatively, materials whose thermal expansion coefficients are substantially equal to each other are preferably used for the substrate 2510 and the substrate 2570. For example, the coefficients of linear expansion of the materials are preferably lower than or equal to $1 \times 10^{-3}$/K, further preferably lower than or equal to $5 \times 10^{-5}$/K and still further preferably lower than or equal to $1 \times 10^{-5}$/K.

Note that the substrate 2510 is a stacked body including an insulating layer 2510a for preventing impurity diffusion into the light-emitting element, a flexible substrate 2510b, and an adhesive layer 2510c for attaching the insulating layer 2510a and the flexible substrate 2510b to each other. The substrate 2570 is a stacked body including an insulating layer 2570a for preventing impurity diffusion into the light-emitting element, a flexible substrate 2570b, and an adhesive layer 2570c for attaching the insulating layer 2570a and the flexible substrate 2570b to each other.

For the adhesive layer 2510c and the adhesive layer 2570c, for example, materials that include polyester, polyolefin, polyamide (e.g., nylon, aramid), polyimide, polycarbonate, polyurethane, an acrylic resin, an epoxy resin, or a resin having a siloxane bond can be used.

A sealing layer 2560 is provided between the substrate 2510 and the substrate 2570. The sealing layer 2560 preferably has a refractive index higher than that of air. In the case where light is extracted to the sealing layer 2560 side as illustrated in FIG. 39A, the sealing layer 2560 can also serve as an optical layer.

A sealant may be formed in the outer portion of the sealing layer 2560. With the use of the sealant, a light-emitting element 2550 can be provided in a region surrounded by the substrate 2510, the substrate 2570, the sealing layer 2560, and the sealant. Note that an inert gas (such as nitrogen or argon) may be used instead of the sealing layer 2560. A drying agent may be provided in the inert gas so as to adsorb moisture or the like. For example, an epoxy-based resin or a glass frit is preferably used as the sealant. As a material used for the sealant, a material which is impermeable to moisture or oxygen is preferably used.

The display panel 2501 includes a pixel 2502. The pixel 2502 includes a light-emitting module 2580.

The pixel 2502 includes the light-emitting element 2550 and a transistor 2502t that can supply electric power to the light-emitting element 2550. Note that the transistor 2502t functions as part of the pixel circuit. The light-emitting module 2580 includes the light-emitting element 2550 and a coloring layer 2567R.

The light-emitting element 2550 includes a lower electrode, an upper electrode, and an EL layer between the lower electrode and the upper electrode. As the light-emitting element 2550, any of the light-emitting elements described in Embodiments 1 to 3 can be used, for example. Note that although only one light-emitting element 2550 is illustrated in FIG. 39A, it is possible to employ the structure with three kinds of light-emitting elements of a first light-emitting element, a second light-emitting element, and a third light-emitting element as described in Embodiment 1.

In the case where the sealing layer 2560 is provided on the light extraction side, the sealing layer 2560 is in contact with the light-emitting element 2550 and the coloring layer 2567R.

The coloring layer 2567R is provided to overlap with the light-emitting element 2550. Accordingly, part of light emitted from the light-emitting element 2550 passes through the coloring layer 2567R and is emitted to the outside of the light-emitting module 2580 as indicated by an arrow in FIG. 39A.

The display panel 2501 includes a light-blocking layer 2567BM on the light extraction side. The light-blocking layer 2567BM is provided so as to surround the coloring layer 2567R.

The coloring layer 2567R is a coloring layer having a function of transmitting light in a particular wavelength range. For example, a color filter for transmitting light in a red wavelength range, a color filter for transmitting light in a green wavelength range, a color filter for transmitting light in a blue wavelength range, a color filter for transmitting light in a yellow wavelength range, or the like can be used. Each color filter can be formed with any of various materials by a printing method, an inkjet method, an etching method using a photolithography technique, or the like.

An insulating layer 2521 is provided in the display panel 2501. The insulating layer 2521 covers the transistor 2502$t$. Note that the insulating layer 2521 has a function of planarizing unevenness caused by the pixel circuit. The insulating layer 2521 may have a function of suppressing impurity diffusion. This can prevent the reliability of the transistor 2502$t$ or the like from being lowered by impurity diffusion.

The light-emitting element 2550 is formed over the insulating layer 2521. A partition 2528 is provided so as to overlap with an end portion of the lower electrode of the light-emitting element 2550. Note that a spacer for controlling the distance between the substrate 2510 and the substrate 2570 may be formed over the partition 2528.

A scan line driver circuit 2503$g$ includes a transistor 2503$t$ and a capacitor 2503$c$. Note that the driver circuit can be formed in the same process and over the same substrate as those of the pixel circuits.

The wirings 2511 through which signals can be supplied are provided over the substrate 2510. The terminal 2519 is provided over the wiring 2511. The FPC 2509(1) is electrically connected to the terminal 2519. The FPC 2509(1) has a function of supplying a video signal, a clock signal, a start signal, a reset signal, or the like. Note that the FPC 2509(1) may be provided with a printed wiring board (PWB).

Figure 39B:
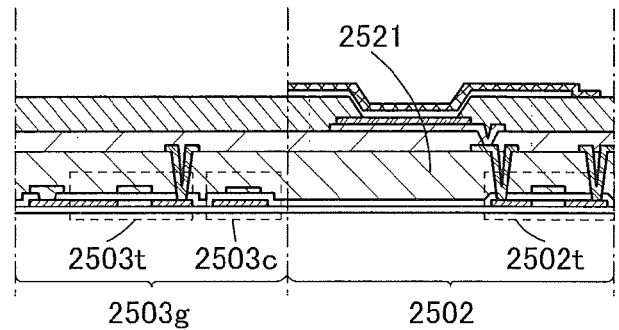

In the display panel 2501, transistors with any of a variety of structures can be used. FIG. 39A illustrates an example of using bottom-gate transistors; however, the present invention is not limited to this example, and top-gate transistors may be used in the display panel 2501 as illustrated in FIG. 39B.

In addition, there is no particular limitation on the polarity of the transistor 2502$t$ and the transistor 2503$t$. For these transistors, n-channel and p-channel transistors may be used, or either n-channel transistors or p-channel transistors may be used, for example. Furthermore, there is no particular limitation on the crystallinity of a semiconductor film used for the transistors 2502$t$ and 2503$t$. For example, an amorphous semiconductor film or a crystalline semiconductor film may be used. Examples of semiconductor materials include Group 13 semiconductors (e.g., a semiconductor including gallium), Group 14 semiconductors (e.g., a semiconductor including silicon), compound semiconductors (including oxide semiconductors), organic semiconductors, and the like. It is preferable to use an oxide semiconductor that has an energy gap of 2 eV or more, preferably 2.5 eV or more and further preferably 3 eV or more, for one of the transistors 2502$t$ and 2503$t$ or both, in which case the off-state current of the transistors can be reduced. Examples of the oxide semiconductors include an In—Ga oxide, an In-M-Zn oxide (M represents Al, Ga, Y, Zr, La, Ce, Sn, or Nd), and the like.

<Touch Sensor>

Figure 39C:
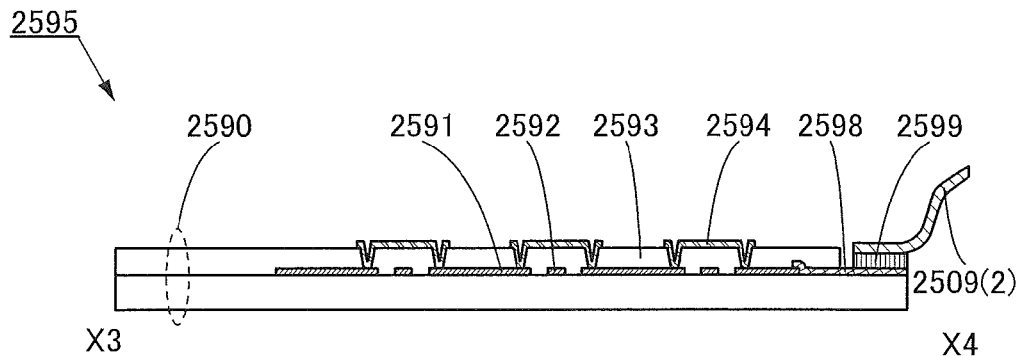

Next, the touch sensor 2595 is described in detail with reference to FIG. 39C. FIG. 39C is a cross-sectional view along dashed-dotted line X3-X4 in FIG. 38B.

The touch sensor 2595 includes the electrodes 2591 and the electrodes 2592 provided in a staggered arrangement on the substrate 2590, an insulating layer 2593 covering the electrodes 2591 and the electrodes 2592, and the wiring 2594 that electrically connects the adjacent electrodes 2591 to each other.

The electrodes 2591 and the electrodes 2592 are formed using a light-transmitting conductive material. As a light-transmitting conductive material, a conductive oxide such as indium oxide, indium tin oxide, indium zinc oxide, zinc oxide, or zinc oxide to which gallium is added can be used. Note that a film including graphene may be used as well. The film including graphene can be formed, for example, by reducing a film containing graphene oxide. As a reducing method, a method with application of heat or the like can be employed.

The electrodes 2591 and the electrodes 2592 may be formed by, for example, depositing a light-transmitting conductive material on the substrate 2590 by a sputtering method and then removing an unnecessary portion by any of various pattern forming techniques such as photolithography.

Examples of a material for the insulating layer 2593 are a resin such as an acrylic resin or an epoxy resin, a resin having a siloxane bond, and an inorganic insulating material such as silicon oxide, silicon oxynitride, or aluminum oxide.

Openings reaching the electrodes 2591 are formed in the insulating layer 2593, and the wiring 2594 electrically connects the adjacent electrodes 2591. A light-transmitting conductive material can be preferably used as the wiring 2594 because the aperture ratio of the touch panel can be increased. Moreover, a material with higher conductivity than the conductivities of the electrodes 2591 and 2592 can be preferably used for the wiring 2594 because electric resistance can be reduced.

One electrode 2592 extends in one direction, and a plurality of electrodes 2592 are provided in the form of stripes. The wiring 2594 intersects with the electrode 2592.

Adjacent electrodes 2591 are provided with one electrode 2592 provided therebetween. The wiring 2594 electrically connects the adjacent electrodes 2591.

Note that the plurality of electrodes 2591 are not necessarily arranged in the direction orthogonal to one electrode 2592 and may be arranged to intersect with one electrode 2592 at an angle of more than 0 degrees and less than 90 degrees.

The wiring 2598 is electrically connected to any of the electrodes 2591 and 2592. Part of the wiring 2598 functions as a terminal. For the wiring 2598, a metal material such as aluminum, gold, platinum, silver, nickel, titanium, tungsten, chromium, molybdenum, iron, cobalt, copper, or palladium or an alloy material containing any of these metal materials can be used.

Note that an insulating layer that covers the insulating layer 2593 and the wiring 2594 may be provided to protect the touch sensor 2595.

A connection layer 2599 electrically connects the wiring 2598 to the FPC 2509(2).

As the connection layer 2599, any of various anisotropic conductive films (ACF), anisotropic conductive pastes (ACP), or the like can be used.

<Description 2 of Touch Panel>

Figure 40A:
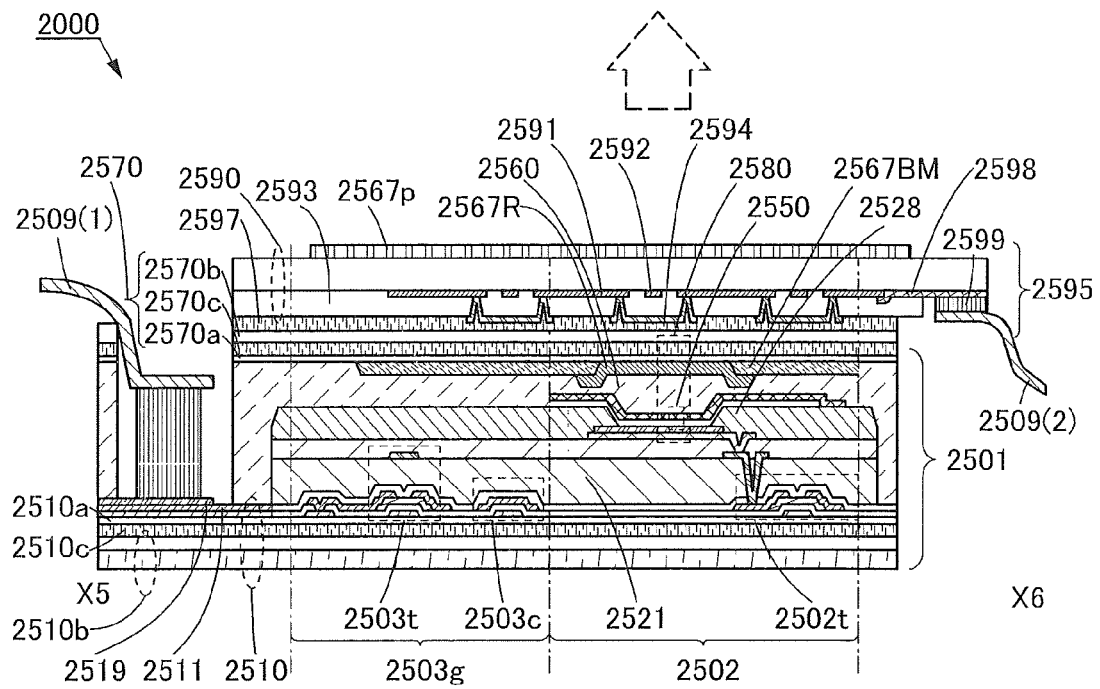
FIGS. 40A and 40B are each a cross-sectional view of an example of a touch panel.

Next, the touch panel 2000 is described in detail with reference to FIG. 40A. FIG. 40A is a cross-sectional view along dashed-dotted line X5-X6 in FIG. 38A.

In the touch panel 2000 illustrated in FIG. 40A, the display panel 2501 described with reference to FIG. 39A and the touch sensor 2595 described with reference to FIG. 39C are attached to each other.

The touch panel 2000 illustrated in FIG. 40A includes an adhesive layer 2597 and an anti-reflective layer 2567p in addition to the components described with reference to FIGS. 39A and 39C.

The adhesive layer 2597 is provided in contact with the wiring 2594. Note that the adhesive layer 2597 attaches the substrate 2590 to the substrate 2570 so that the touch sensor 2595 overlaps with the display panel 2501. The adhesive layer 2597 preferably has a light-transmitting property. A heat curable resin or an ultraviolet curable resin can be used for the adhesive layer 2597. For example, an acrylic resin, an urethane-based resin, an epoxy-based resin, or a siloxane-based resin can be used.

The anti-reflective layer 2567p is provided to overlap with pixels. As the anti-reflective layer 2567p, a circularly polarizing plate can be used, for example.

Next, a touch panel having a structure different from that illustrated in FIG. 40A is described with reference to FIG. 40B.

Figure 40B:
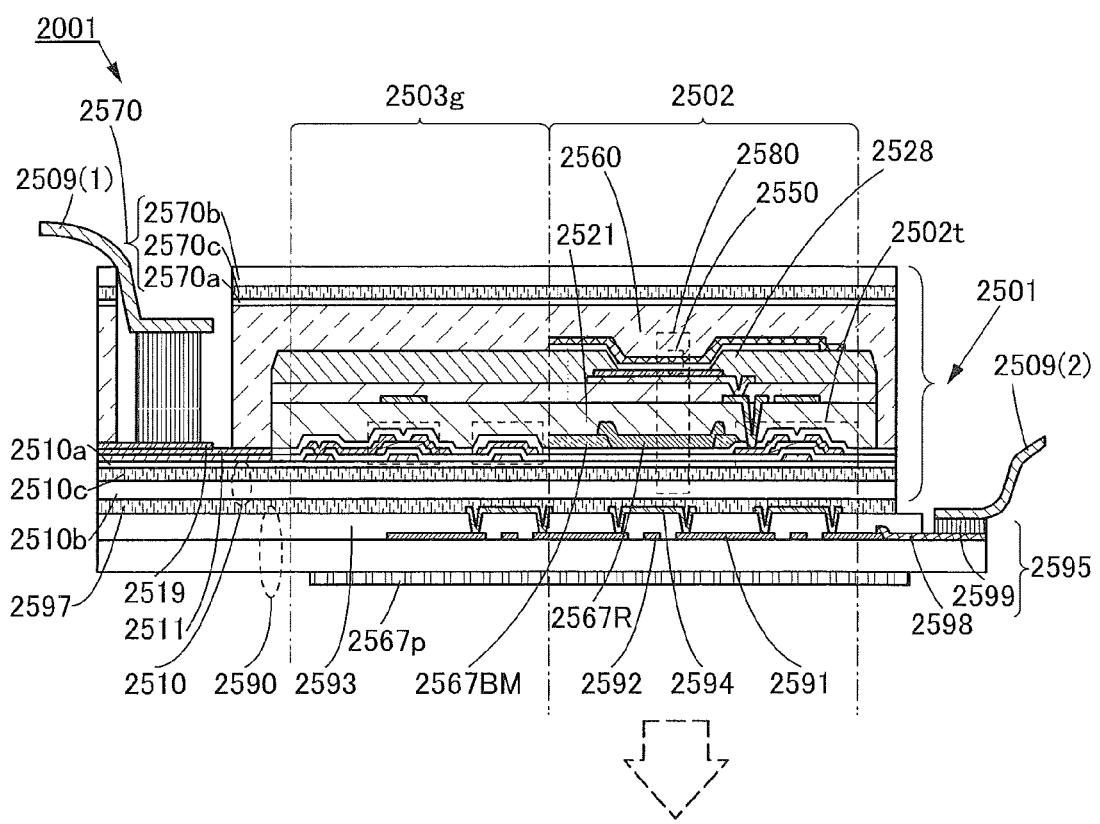

FIG. 40B is a cross-sectional view of a touch panel 2001. The touch panel 2001 illustrated in FIG. 40B differs from the touch panel 2000 illustrated in FIG. 40A in the position of the touch sensor 2595 relative to the display panel 2501. Different parts are described in detail below, and the above description of the touch panel 2000 is referred to for the other similar parts.

The coloring layer 2567R is provided to overlap with the light-emitting element 2550. The light-emitting element 2550 illustrated in FIG. 40B emits light to the side where the transistor 2502t is provided. Accordingly, part of light emitted from the light-emitting element 2550 passes through the coloring layer 2567R and is emitted to the outside of the light-emitting module 2580 as indicated by an arrow in FIG. 40B.

The touch sensor 2595 is provided on the substrate 2510 side of the display panel 2501.

The adhesive layer 2597 is provided between the substrate 2510 and the substrate 2590 and attaches the touch sensor 2595 to the display panel 2501.

As illustrated in FIG. 40A or 40B, light may be emitted from the light-emitting element to one of upper and lower sides, or both, of the substrate.

<Method for Driving Touch Panel>

Next, an example of a method for driving a touch panel is described with reference to FIGS. 41A and 41B.

Figure 41A:
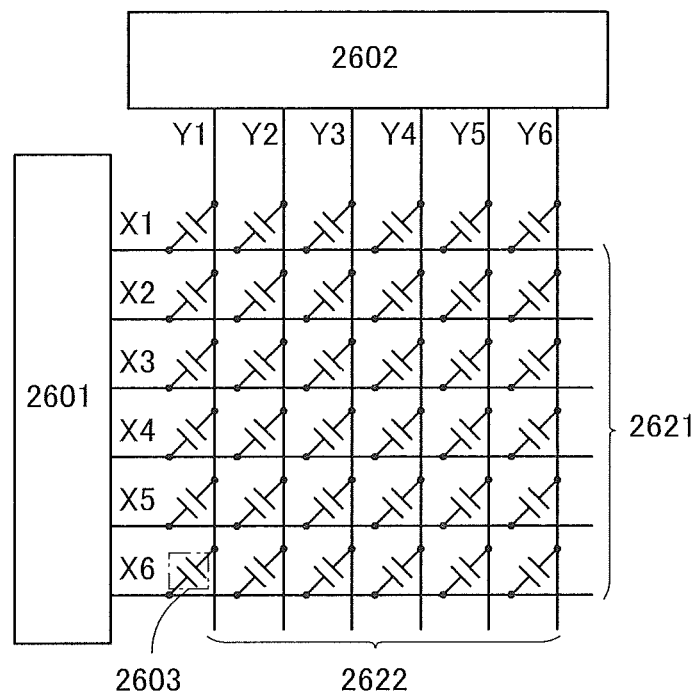
FIGS. 41A and 41B are a block diagram and a timing chart of a touch sensor.

FIG. 41A is a block diagram illustrating the structure of a mutual capacitive touch sensor. FIG. 41A illustrates a pulse voltage output circuit 2601 and a current sensing circuit 2602. Note that in FIG. 41A, six wirings X1 to X6 represent the electrodes 2621 to which a pulse voltage is applied, and six wirings Y1 to Y6 represent the electrodes 2622 that detect changes in current. FIG. 41A also illustrates capacitors 2603 that are each formed in a region where the electrodes 2621 and 2622 overlap with each other. Note that functional replacement between the electrodes 2621 and 2622 is possible.

The pulse voltage output circuit 2601 is a circuit for sequentially applying a pulse voltage to the wirings X1 to X6. By application of a pulse voltage to the wirings X1 to X6, an electric field is generated between the electrodes 2621 and 2622 of the capacitor 2603. When the electric field between the electrodes is shielded, for example, a change occurs in the capacitor 2603 (mutual capacitance). The approach or contact of a sensing target can be sensed by utilizing this change.

The current sensing circuit 2602 is a circuit for detecting changes in current flowing through the wirings Y1 to Y6 that are caused by the change in mutual capacitance in the capacitor 2603. No change in current value is detected in the wirings Y1 to Y6 when there is no approach or contact of a sensing target, whereas a decrease in current value is detected when mutual capacitance is decreased owing to the approach or contact of a sensing target. Note that an integrator circuit or the like is used for detection of current values.

Figure 41B:
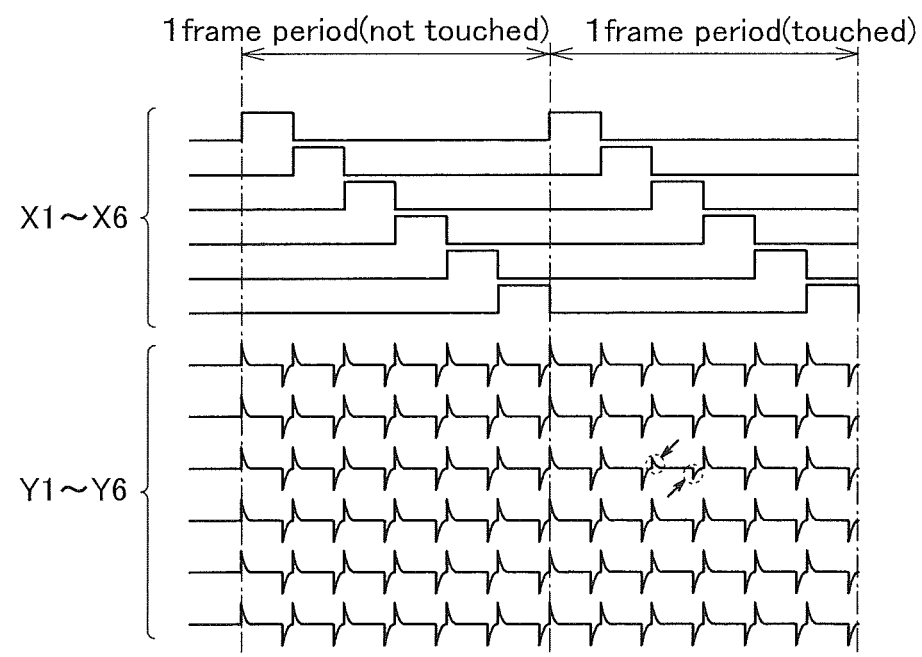

FIG. 41B is a timing chart showing input and output waveforms in the mutual capacitive touch sensor illustrated in FIG. 41A. In FIG. 41B, sensing of a sensing target is performed in all the rows and columns in one frame period. FIG. 41B shows a period when a sensing target is not sensed (not touched) and a period when a sensing target is sensed (touched). Sensed current values of the wirings Y1 to Y6 are shown as the waveforms of voltage values.

A pulse voltage is sequentially applied to the wirings X1 to X6, and the waveforms of the wirings Y1 to Y6 change in accordance with the pulse voltage. When there is no approach or contact of a sensing target, the waveforms of the wirings Y1 to Y6 change in accordance with changes in the voltages of the wirings X1 to X6. The current value is decreased at the point of approach or contact of a sensing target and accordingly the waveform of the voltage level changes.

By detecting a change in mutual capacitance in this manner, proximity or contact of an object can be sensed.

<Sensor Circuit>

Figure 42:
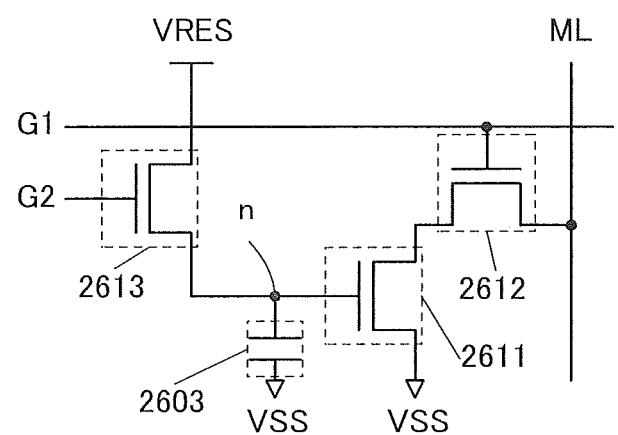
FIG. 42 is a circuit diagram of a touch sensor.

Although FIG. 41A illustrates a passive type touch sensor in which only the capacitor 2603 is provided at the intersection of wirings as a touch sensor, an active type touch sensor including a transistor and a capacitor may be used. FIG. 42 illustrates an example of a sensor circuit included in an active type touch sensor.

The sensor circuit in FIG. 42 includes the capacitor 2603 and transistors 2611, 2612, and 2613.

A signal G2 is input to a gate of the transistor 2613. A voltage VRES is applied to one of a source and a drain of the transistor 2613, and one electrode of the capacitor 2603 and a gate of the transistor 2611 are electrically connected to the other of the source and the drain of the transistor 2613. One of a source and a drain of the transistor 2611 is electrically connected to one of a source and a drain of the transistor 2612, and a voltage VSS is applied to the other of the source and the drain of the transistor 2611. A signal G1 is input to a gate of the transistor 2612, and a wiring ML is electrically connected to the other of the source and the drain of the transistor 2612. The voltage VSS is applied to the other electrode of the capacitor 2603.

Next, the operation of the sensor circuit in FIG. 42 will be described. First, a potential for turning on the transistor 2613 is supplied as the signal G2, and a potential with respect to the voltage VRES is thus applied to the node n connected to the gate of the transistor 2611. Then, a potential for turning off the transistor 2613 is applied as the signal G2, whereby the potential of the node n is maintained.

Then, mutual capacitance of the capacitor 2603 changes owing to the approach or contact of a sensing target such as a finger, and accordingly the potential of the node n is changed from VRES.

In reading operation, a potential for turning on the transistor 2612 is supplied as the signal G1. A current flowing through the transistor 2611, that is, a current flowing through the wiring ML is changed in accordance with the potential of the node n. By sensing this current, the approach or contact of a sensing target can be sensed.

In each of the transistors 2611, 2612, and 2613, an oxide semiconductor layer is preferably used as a semiconductor layer in which a channel region is formed. In particular, such a transistor is preferably used as the transistor 2613 so that the potential of the node n can be held for a long time and the frequency of operation of resupplying VRES to the node n (refresh operation) can be reduced.

The structure described in this embodiment can be combined with any of the structures described in the other embodiments and examples as appropriate.

Embodiment 5

In this embodiment, a display module and electronic devices including a light-emitting element of one embodiment of the present invention will be described with reference to FIG. 43 and FIGS. 44A to 44G.

Figure 43:
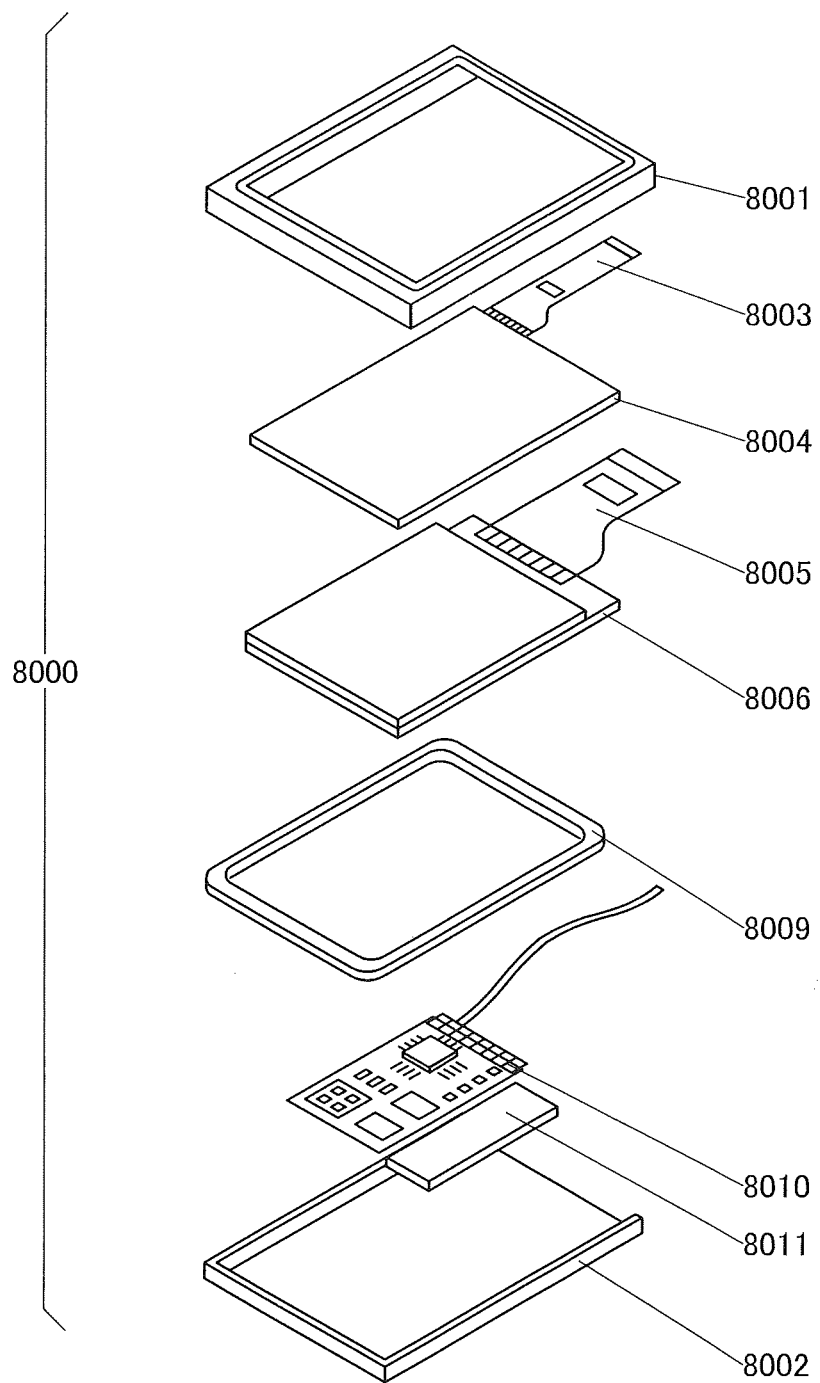
FIG. 43 is a perspective view of a display module.

In a display module 8000 illustrated in FIG. 43, a touch sensor 8004 connected to an FPC 8003, a display panel 8006 connected to an FPC 8005, a frame 8009, a printed board 8010, and a battery 8011 are provided between an upper cover 8001 and a lower cover 8002.

The light-emitting device of one embodiment of the present invention can be used for the display panel 8006, for example.

The shapes and sizes of the upper cover 8001 and the lower cover 8002 can be changed as appropriate in accordance with the sizes of the touch sensor 8004 and the display panel 8006.

The touch sensor 8004 can be a resistive touch sensor or a capacitive touch sensor and may be formed to overlap with the display panel 8006. A counter substrate (sealing substrate) of the display panel 8006 can have a touch sensor function. A photosensor may be provided in each pixel of the display panel 8006 so that an optical touch sensor is obtained.

The frame 8009 protects the display panel 8006 and also serves as an electromagnetic shield for blocking electromagnetic waves generated by the operation of the printed board 8010. The frame 8009 may serve as a radiator plate.

The printed board 8010 has a power supply circuit and a signal processing circuit for outputting a video signal and a clock signal. As a power source for supplying power to the power supply circuit, an external commercial power source or the battery 8011 provided separately may be used. The battery 8011 can be omitted in the case of using a commercial power source.

The display module 8000 can be additionally provided with a member such as a polarizing plate, a retardation plate, or a prism sheet.

FIGS. 44A to 44G illustrate electronic devices. These electronic devices can include a housing 9000, a display portion 9001, a speaker 9003, operation keys 9005, a connection terminal 9006, a sensor 9007, a microphone 9008, and the like.

The electronic devices illustrated in FIGS. 44A to 44G can have a variety of functions, for example, a function of displaying a variety of data (a still image, a moving image, a text image, and the like) on the display portion, a touch sensor function, a function of displaying a calendar, date, time, and the like, a function of controlling a process with a variety of software (programs), a wireless communication function, a function of being connected to a variety of computer networks with a wireless communication function, a function of transmitting and receiving a variety of data with a wireless communication function, a function of reading a program or data stored in a memory medium and displaying the program or data on the display portion, and the like. Note that functions that can be provided for the electronic devices illustrated in FIGS. 44A to 44G are not limited to those described above, and the electronic devices can have a variety of functions. Although not illustrated in FIGS. 44A to 44G, the electronic devices may include a plurality of display portions. The electronic devices may have a camera or the like and a function of taking a still image, a function of taking a moving image, a function of storing the taken image in a memory medium (an external memory medium or a memory medium incorporated in the camera), a function of displaying the taken image on the display portion, or the like.

The electronic devices illustrated in FIGS. 44A to 44G are described in detail below.

Figure 44A:
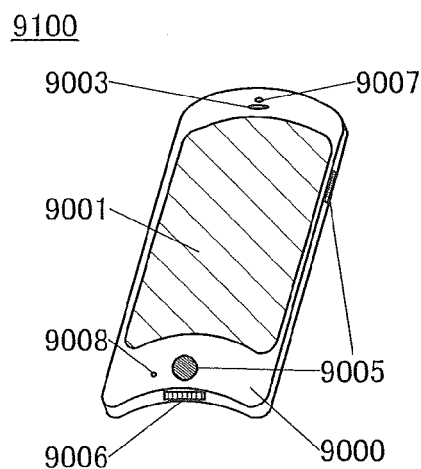
FIGS. 44A to 44G illustrate electronic devices.

FIG. 44A is a perspective view of a portable information terminal 9100. The display portion 9001 of the portable information terminal 9100 is flexible. Therefore, the display portion 9001 can be incorporated along a bent surface of a bent housing 9000. In addition, the display portion 9001 includes a touch sensor, and operation can be performed by touching the screen with a finger, a stylus, or the like. For example, when an icon displayed on the display portion 9001 is touched, an application can be started.

Figure 44D:
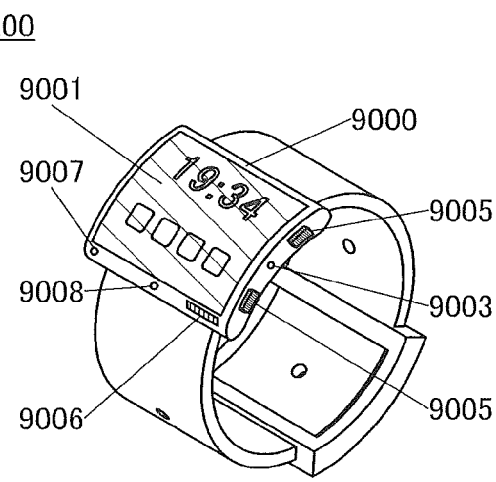
Figure 44B:
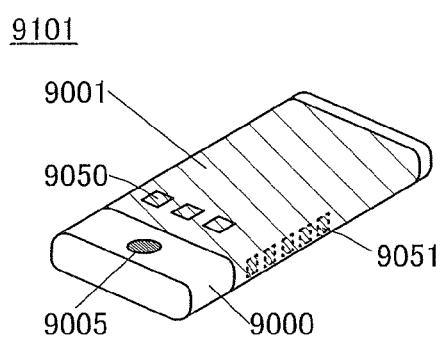

FIG. 44B is a perspective view of a portable information terminal 9101. The portable information terminal 9101 functions as, for example, one or more of a telephone set, a notebook, and an information browsing system. Specifically, the portable information terminal can be used as a smartphone. Note that the speaker 9003, the connection terminal 9006, the sensor 9007, and the like, which are not shown in FIG. 44B, can be positioned in the portable information terminal 9101 as in the portable information terminal 9100 shown in FIG. 44A. The portable information terminal 9101 can display characters and image information on its plurality of surfaces. For example, three operation buttons 9050 (also referred to as operation icons, or simply, icons) can be displayed on one surface of the display portion 9001. Furthermore, information 9051 indicated by dashed rectangles can be displayed on another surface of the display portion 9001. Examples of the information 9051 include display indicating reception of an incoming email, social networking service (SNS) message, call, and the like; the title and sender of an email and SNS message; the date; the time; remaining battery; and the reception strength of an antenna. Instead of the information 9051, the operation buttons 9050 or the like may be displayed on the position where the information 9051 is displayed.

Figure 44E:
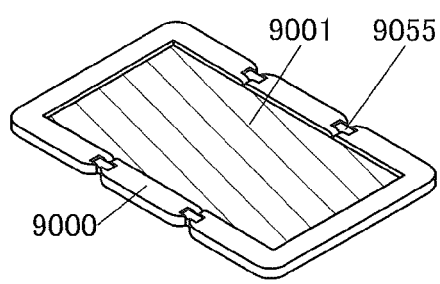
Figure 44C:
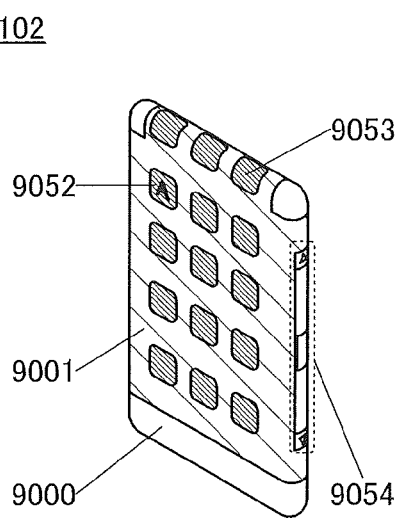

FIG. 44C is a perspective view of a portable information terminal 9102. The portable information terminal 9102 has a function of displaying information on three or more surfaces of the display portion 9001. Here, information 9052, information 9053, and information 9054 are displayed on different surfaces. For example, a user of the portable information terminal 9102 can see the display (here, the information 9053) with the portable information terminal 9102 put in a breast pocket of his/her clothes. Specifically, a caller's phone number, name, or the like of an incoming call is displayed in a position that can be seen from above the portable information terminal 9102. Thus, the user can see the display without taking out the portable information terminal 9102 from the pocket and decide whether to answer the call.

FIG. 44D is a perspective view of a watch-type portable information terminal 9200. The portable information terminal 9200 is capable of executing a variety of applications such as mobile phone calls, e-mailing, viewing and editing texts, music reproduction, Internet communication, and computer games. The display surface of the display portion 9001 is bent, and images can be displayed on the bent display surface. The portable information terminal. 9200 can employ near field communication that is a communication method based on an existing communication standard. In that case, for example, mutual communication between the portable information terminal 9200 and a headset capable of wireless communication can be performed, and thus hands-free calling is possible. The portable information terminal 9200 includes the connection terminal 9006, and data can be directly transmitted to and received from another information terminal via a connector. Power charging through the connection terminal 9006 is possible. Note that the charging operation may be performed by wireless power feeding without using the connection terminal 9006.

Figure 44F:
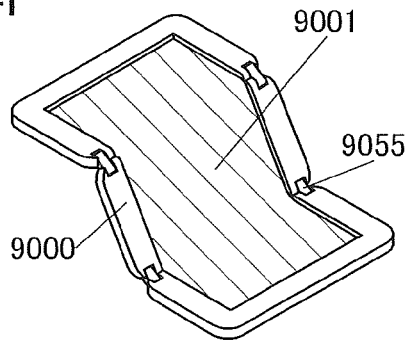
Figure 44G:
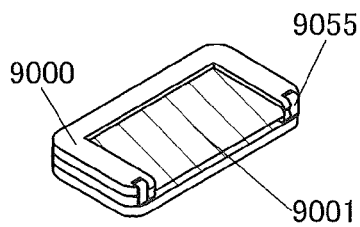

FIGS. 44E, 44F, and 44G are perspective views of a foldable portable information terminal 9201. FIG. 44E is a perspective view illustrating the portable information terminal 9201 that is opened. FIG. 44F is a perspective view illustrating the portable information terminal 9201 that is being opened or being folded. FIG. 44G is a perspective view illustrating the portable information terminal 9201 that is folded. The portable information terminal 9201 is highly portable when folded. When the portable information terminal 9201 is opened, a seamless large display region is highly browsable. The display portion 9001 of the portable information terminal 9201 is supported by three housings 9000 joined together by hinges 9055. By folding the portable information terminal 9201 at a connection portion between two housings 9000 with the hinges 9055, the portable information terminal 9201 can be reversibly changed in shape from an opened state to a folded state. For example, the portable information terminal 9201 can be bent with a radius of curvature of greater than or equal to 1 mm and less than or equal to 150 mm.

The electronic devices described in this embodiment each include the display portion for displaying some sort of data. Note that the light-emitting device of one embodiment of the present invention can also be used for an electronic device which does not have a display portion. The structure in which the display portion of the electronic device described in this embodiment is flexible and display can be performed on the bent display surface or the structure in which the display portion of the electronic device is foldable is described as an example; however, the structure is not limited thereto and a structure in which the display portion of the electronic device is not flexible and display is performed on a plane portion may be employed.

The structure described in this embodiment can be combined with any of the structures described in the other embodiments and examples as appropriate.

Embodiment 6

In this embodiment, the light-emitting device of one embodiment of the present invention will be described with reference to FIGS. 45A to 45C.

Figure 45A:
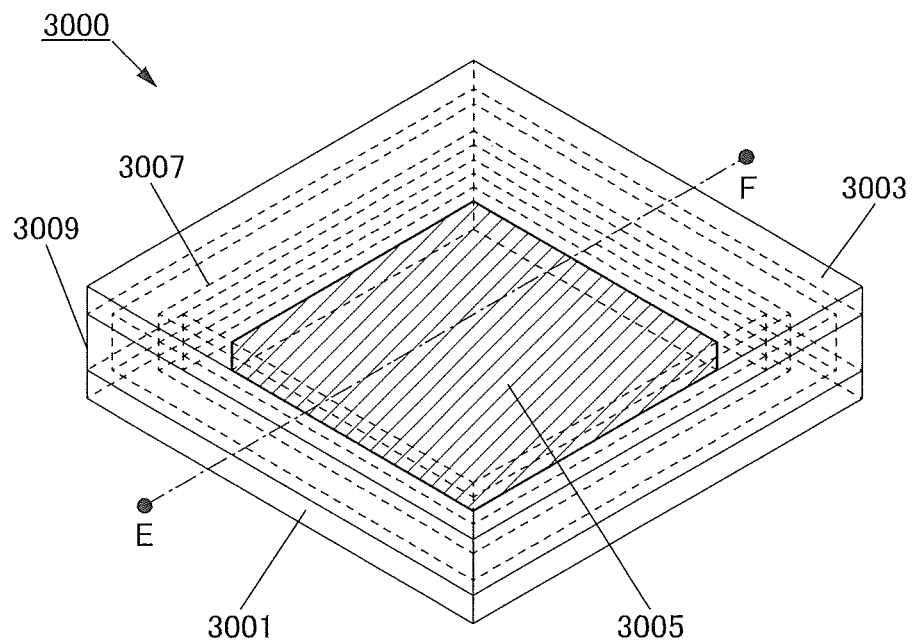
FIGS. 45A to 45C are a perspective view and cross-sectional views illustrating a light-emitting device.
Figure 45B:
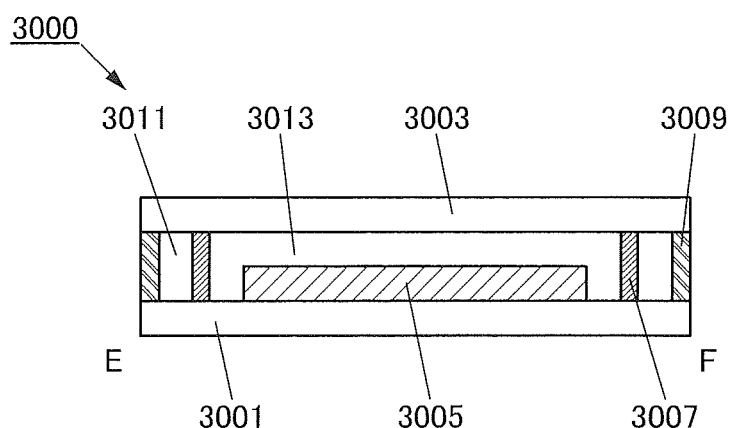

FIG. 45A is a perspective view of a light-emitting device 3000 shown in this embodiment, and FIG. 45B is a cross-sectional view along dashed-dotted line E-F in FIG. 45A. Note that in FIG. 45A, some components are illustrated by broken lines in order to avoid complexity of the drawing.

The light-emitting device 3000 illustrated in FIGS. 45A and 45B includes a substrate 3001, a light-emitting element 3005 over the substrate 3001, a first sealing region 3007 provided around the light-emitting element 3005, and a second sealing region 3009 provided around the first sealing region 3007.

Light is emitted from the light-emitting element 3005 through one or both of the substrate 3001 and a substrate 3003. In FIGS. 45A and 45B, a structure in which light is emitted from the light-emitting element 3005 to the lower side (the substrate 3001 side) is illustrated.

As illustrated in FIGS. 45A and 45B, the light-emitting device 3000 has a double sealing structure in which the light-emitting element 3005 is surrounded by the first sealing region 3007 and the second sealing region 3007. With the double sealing structure, entry of impurities (e.g., water, oxygen, and the like) from the outside into the light-emitting element 3005 can be preferably suppressed. Note that it is not necessary to provide both the first sealing region 3007 and the second sealing region 3009. For example, only the first sealing region 3007 may be provided.

Note that in FIG. 45B, the first sealing region 3007 and the second sealing region 3009 are each provided in contact with the substrate 3001 and the substrate 3003. However, without limitation to such a structure, for example, one or both of the first sealing region 3007 and the second sealing region 3009 may be provided in contact with an insulating film or a conductive film provided on the substrate 3001. Alternatively, one or both of the first sealing region 3007 and the second sealing region 3009 may be provided in contact with an insulating film or a conductive film provided on the substrate 3003.

The substrate 3001 and the substrate 3003 can have structures similar to those of the substrate 102 and the substrate 152 described in Embodiment 1, respectively. The light-emitting element 3005 can have a structure similar to that of any of the first to third light-emitting elements described in Embodiment 1.

For the first sealing region 3007, a material containing glass (e.g., a glass frit, a glass ribbon, and the like) can be used. For the second sealing region 3009, a material containing a resin can be used. With the use of the material containing glass for the first sealing region 3007, productivity and a sealing property can be improved. Moreover, with the use of the material containing a resin for the second sealing region 3009, impact resistance and heat resistance can be improved. However, the materials used for the first sealing region 3007 and the second sealing region 3009 are not limited to such, and the first sealing region 3007 may be formed using the material containing a resin and the second sealing region 3009 may be formed using the material containing glass.

The glass frit may contain, for example, magnesium oxide, calcium oxide, strontium oxide, barium oxide, cesium oxide, sodium oxide, potassium oxide, boron oxide, vanadium oxide, zinc oxide, tellurium oxide, aluminum oxide, silicon dioxide, lead oxide, tin oxide, phosphorus oxide, ruthenium oxide, rhodium oxide, iron oxide, copper oxide, manganese dioxide, molybdenum oxide, niobium oxide, titanium oxide, tungsten oxide, bismuth oxide, zirconium oxide, lithium oxide, antimony oxide, lead borate glass, tin phosphate glass, vanadate glass, or borosilicate glass. The glass fit preferably contains at least one kind of transition metal to absorb infrared light.

As the above glass frits, for example, a frit paste is applied to a substrate and is subjected to heat treatment, laser light irradiation, or the like. The frit paste contains the glass frit and a resin (also referred to as a binder) diluted by an organic solvent. Note that an absorber which absorbs light having the wavelength of laser light may be added to the glass frit. For example, an Nd:YAG laser or a semiconductor laser is preferably used as the laser. The shape of laser light may be circular or quadrangular.

As the above material containing a resin, for example, materials that include polyester, polyolefin, polyamide (e.g., nylon, aramid), polyimide, polycarbonate, polyurethane, an acrylic resin, an epoxy resin, or a resin having a siloxane bond can be used.

Note that in the case where the material containing glass is used for one or both of the first sealing region 3007 and the second sealing region 3009, the material containing glass preferably has a thermal expansion coefficient close to that of the substrate 3001. With the above structure, generation of a crack in the material containing glass or the substrate 3001 due to thermal stress can be suppressed.

For example, the following advantageous effect can be obtained in the case where the material containing glass is used for the first sealing region 3007 and the material containing a resin is used for the second sealing region 3009.

The second sealing region 3009 is provided closer to an outer portion of the light-emitting device 3000 than the first sealing region 3007 is. In the light-emitting device 3000, distortion due to external force or the like increases toward the outer portion. Thus, the outer portion of the light-emitting device 3000 where a larger amount of distortion is generated, that is, the second sealing region 3009 is sealed using the material containing a resin and the first sealing region 3007 provided on an inner side of the second region 3009 is sealed using the material containing glass, whereby the light-emitting device 3000 is less likely to be damaged even when distortion due to external force or the like is generated.

Furthermore, as illustrated in FIG. 45B, a first region 3011 corresponds to the region surrounded by the substrate 3001, the substrate 3003, the first sealing region 3007, and the second sealing region 3009. A second region 3013 corresponds to the region surrounded by the substrate 3001, the substrate 3003, the light-emitting element 3005, and the first sealing region 3007.

The first region 3011 and the second region 3013 are preferably filled with, for example, an inert gas such as a rare gas or a nitrogen gas. Note that for the first region 3011 and the second region 3013, a reduced pressure state is preferred to an atmospheric pressure state.

Figure 45C:
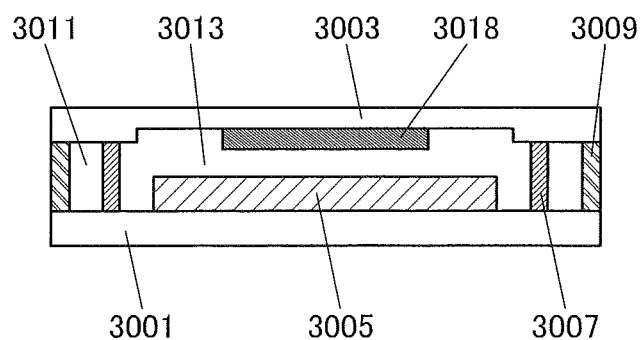

FIG. 45C illustrates a modification example of the structure in FIG. 45B. FIG. 45C is a cross-sectional view illustrating the modification example of the light-emitting device 3000.

FIG. 45C illustrates a structure in which a desiccant 3018 is provided in a recessed portion provided in part of the substrate 3003. The other components are the same as those of the structure illustrated in FIG. 45B.

As the desiccant 3018, a substance which adsorbs moisture and the like by chemical adsorption or a substance which adsorbs moisture and the like by physical adsorption can be used. Examples of the substance that can be used as the desiccant 3018 include alkali metal oxides, alkaline earth metal oxide (e.g., calcium oxide, barium oxide, and the like), sulfate, metal halides, perchlorate, zeolite, silica gel, and the like.

Next, modification examples of the light-emitting device 3000 which is illustrated in FIG. 45B are described with reference to FIGS. 46A to 46D. Note that FIGS. 46A to 46D are cross-sectional views illustrating the modification examples of the light-emitting device 3000 illustrated in FIG. 45B.

Figure 46A:
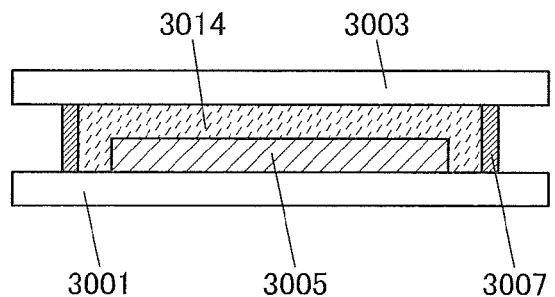
FIGS. 46A to 46D are cross-sectional views illustrating a light-emitting device.

In the light-emitting device illustrated in FIG. 46A, the second sealing region 3009 is not provided but only the first sealing region 3007 is provided. Moreover, in the light-emitting device illustrated in FIG. 46A, a region 3014 is provided instead of the second region 3013 illustrated in FIG. 45B.

For the region 3014, for example, materials that include polyester, polyolefin, polyamide (e.g., nylon, aramid), polyimide, polycarbonate, polyurethane, an acrylic resin, an epoxy resin, or a resin having a siloxane bond can be used.

When the above-described material is used for the region 3014, what is called a solid-sealing light-emitting device can be obtained.

Figure 46B:
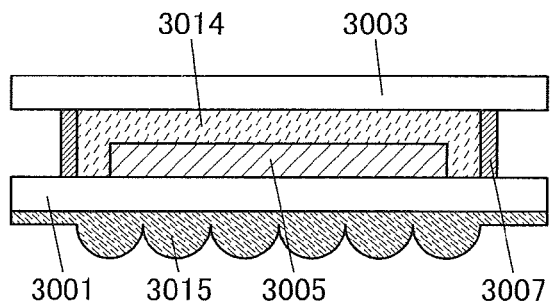

In the light-emitting device illustrated in FIG. 46B, a substrate 3015 is provided on the substrate 3001 side of the light-emitting device illustrated in FIG. 46A.

The substrate 3015 has unevenness as illustrated in FIG. 46B. With a structure in which the substrate 3015 having unevenness is provided on the side through which light emitted from the light-emitting element 3005 is extracted, the efficiency of extraction of light from the light-emitting element 3005 can be improved. Note that instead of the structure having unevenness and illustrated in FIG. 46B, a substrate having a function as a diffusion plate may be provided.

Figure 46C:
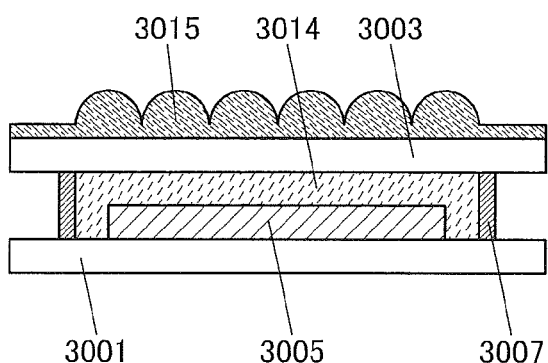

In the light-emitting device illustrated in FIG. 46C, light is extracted through the substrate 3003 side, unlike in the light-emitting device illustrated in FIG. 46A, in which light is extracted through the substrate 3001 side.

The light-emitting device illustrated in FIG. 46C includes the substrate 3015 on the substrate 3003 side. The other components are the same as those of the light-emitting device illustrated in FIG. 46B.

Figure 46D:
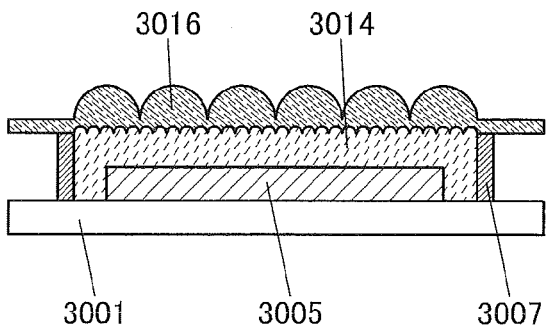

In the light-emitting device illustrated in FIG. 46D, the substrate 3003 and the substrate 3015 included in the light-emitting device illustrated in FIG. 46C are not provided but a substrate 3016 is provided.

The substrate 3016 includes first unevenness positioned closer to the light-emitting element 3005 and second unevenness positioned farther from the light-emitting element 3005. With the structure illustrated in FIG. 46D, the efficiency of extraction of light from the light-emitting element 3005 can be further improved.

Thus, the use of the structure described in this embodiment can obtain a light-emitting device in which deterioration of a light-emitting element due to impurities such as moisture and oxygen is suppressed. Alternatively, with the structure described in this embodiment, a light-emitting device having high light extraction efficiency can be obtained.

The structure described in this embodiment can be combined with any of the structures described in the other embodiments and examples as appropriate.

Embodiment 7

In this embodiment, examples in which the light-emitting device of one embodiment of the present invention is applied to various lighting devices and electronic devices will be described with reference to FIGS. 47A to 47C.

An electronic device or a lighting device that has a light-emitting region with a curved surface can be obtained with the use of the light-emitting device of one embodiment of the present invention which is manufactured over a substrate having flexibility.

Furthermore, a light-emitting device to which one embodiment of the present invention is applied can also be applied to lighting for motor vehicles, examples of which are lighting for a dashboard, a windshield, a ceiling, and the like.

Figure 47A:
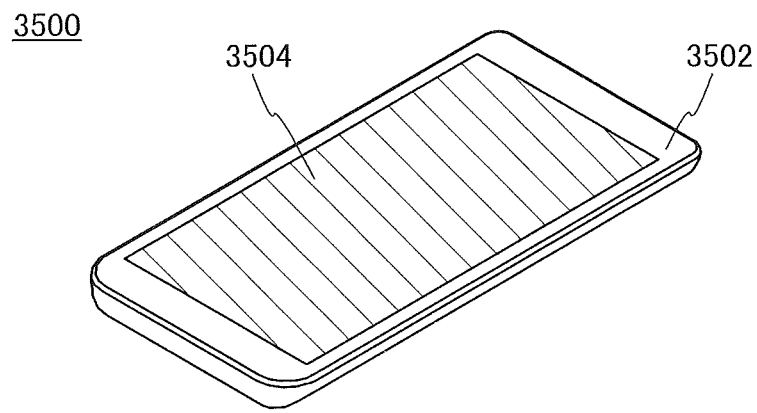
FIGS. 47A to 47C illustrate a lighting device and an electronic device.
Figure 47B:
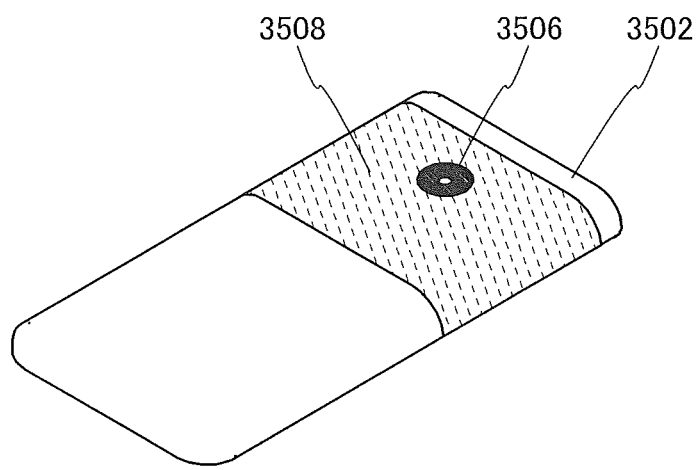

FIG. 47A is a perspective view illustrating one surface of a multifunction terminal 3500, and FIG. 47B is a perspective view illustrating the other surface of the multifunction terminal 3500. In a housing 3502 of the multifunction terminal 3500, a display portion 3504, a camera 3506, lighting 3508, and the like are incorporated. The light-emitting device of one embodiment of the present invention can be used for the lighting 3508.

The lighting 3508 that includes the light-emitting device of one embodiment of the present invention functions as a planar light source. Thus, unlike a point light source typified by an LED, the lighting 3508 can provide light emission with low directivity. When the lighting 3508 and the camera 3506 are used in combination, for example, imaging can be performed by the camera 3506 with the lighting 3508 lighting or flashing. Because the lighting 3508 functions as a planar light source, a photograph as if taken under natural light can be taken.

Note that the multifunction terminal 3500 illustrated in FIGS. 47A and 47B can have a variety of functions as in the electronic devices illustrated in FIGS. 44A to 44G.

The housing 3502 can include a speaker, a sensor (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), a microphone, and the like. When a detection device including a sensor for detecting inclination, such as a gyroscope or an acceleration sensor, is provided inside the multifunction terminal 3500, display on the screen of the display portion 3504 can be automatically switched by determining the orientation of the multifunction terminal 3500 (whether the multifunction terminal is placed horizontally or vertically for a landscape mode or a portrait mode).

The display portion 3504 may function as an image sensor. For example, an image of a palm print, a fingerprint, or the like is taken when the display portion 3504 is touched with the palm or the finger, whereby personal authentication can be performed. Furthermore, by providing a backlight or a sensing light source which emits near-infrared light in the display portion 3504, an image of a finger vein, a palm vein, or the like can be taken. Note that the light-emitting device of one embodiment of the present invention may be used for the display portion 3504.

Figure 47C:
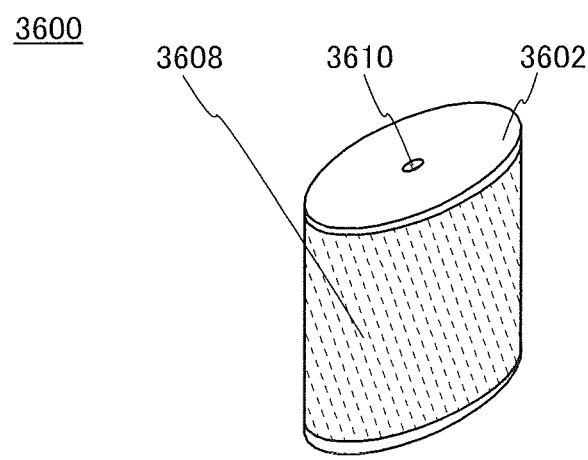

FIG. 47C is a perspective view of a security light 3600. The security light 3600 includes lighting 3608 on the outside of the housing 3602, and a speaker 3610 and the like are incorporated in the housing 3602. The light-emitting device of one embodiment of the present invention can be used for the lighting 3608.

The security light 3600 emits light when the lighting 3608 is gripped or held, for example. An electronic circuit that can control the manner of light emission from the security light 3600 may be provided in the housing 3602. The electronic circuit may be a circuit that enables light emission once or intermittently plural times or may be a circuit that can adjust the amount of emitted light by controlling the current value for light emission. A circuit with which a loud audible alarm is output from the speaker 3610 at the same time as light emission from the lighting 3608 may be incorporated.

The security light 3600 can emit light in various directions; therefore, it is possible to intimidate a thug or the like with light, or light and sound. Moreover, the security light 3600 may include a camera such as a digital still camera to have a photography function.

As described above, lighting devices and electronic devices can be obtained by application of the light-emitting device of one embodiment of the present invention. Note that the light-emitting device can be used for lighting devices and electronic devices in a variety of fields without being limited to the lighting devices and the electronic devices described in this embodiment.

The structure described in this embodiment can be combined with any of the structures described in the other embodiments and examples as appropriate.

Example 1

In Example 1, an example of fabricating a light-emitting element of one embodiment of the present invention will be described. Note that in Example 1, a light-emitting element 1, a light-emitting element 2, and a light-emitting element 3 were fabricated.

Figure 48A:
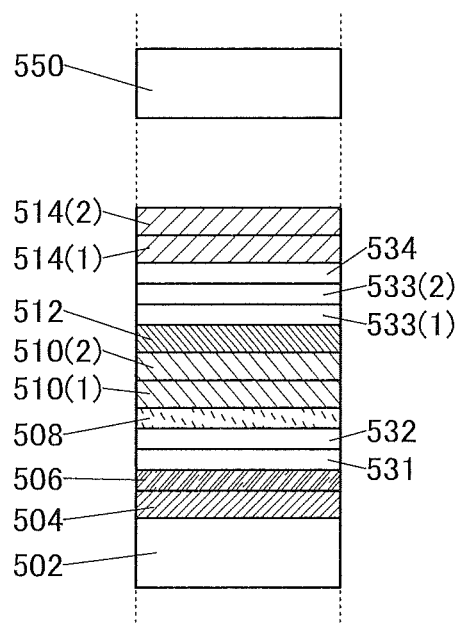
FIGS. 48A to 48D are cross-sectional views each illustrating a light-emitting element in Examples 1 to 3.
Figure 48B:
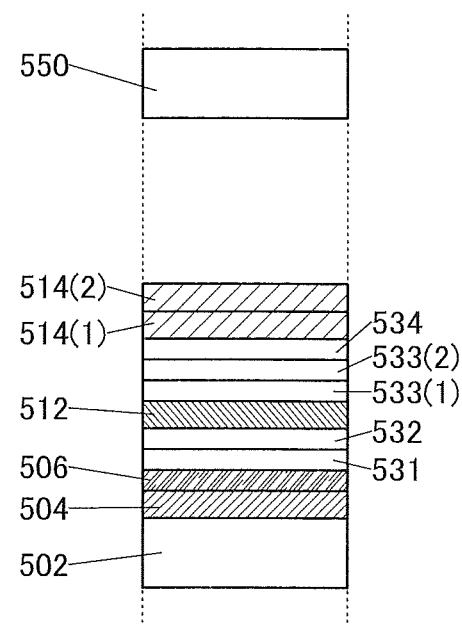

A schematic cross-sectional view of the light-emitting element 1 is in FIG. 48C, a schematic cross-sectional view of the light-emitting element 2 is in FIG. 48A, a schematic cross-sectional view of the light-emitting element 3 is in FIG. 48B, the detailed structures of the light-emitting elements 1 to 3 are shown in Table 1, and structures and abbreviations of the compounds used here are given below.

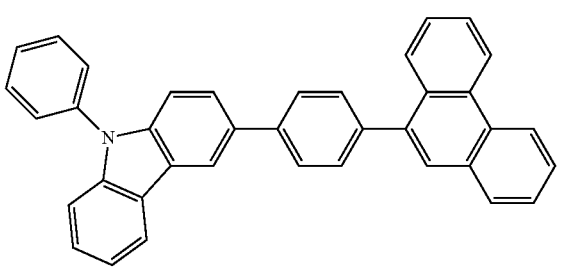

PCPPn

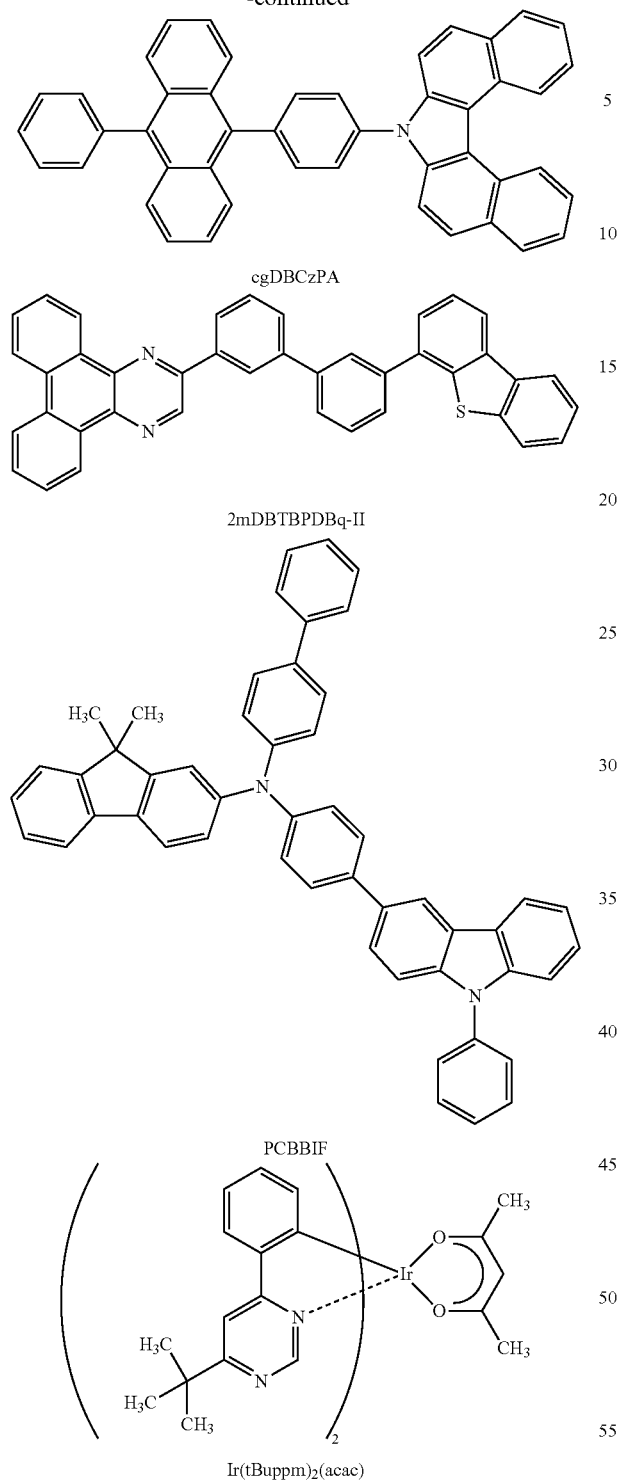
cgDBCzPA
2mDBTBPDBq-II
PCBBIF
Ir(tBuppm)₂(acac)
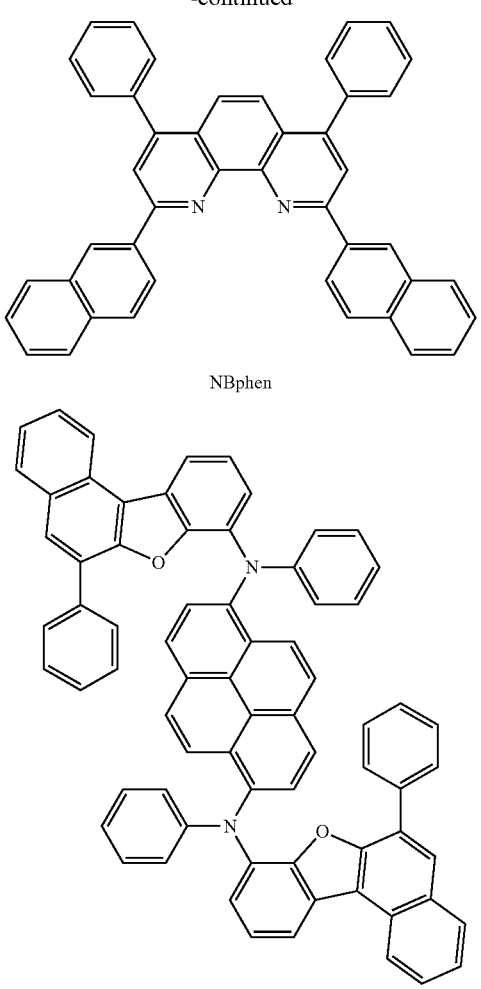
NBphen
1,6BnfAPrn-03
TABLE 1
|  | Layer | Reference numeral | Thickness (nm) | Material | Weight ratio |
|---|---|---|---|---|---|
| Light-emitting element 1 | Coloring layer | 556 | — | Red*[1] | — |
|  | Upper electrode | 514(2) | 70 | ITO | — |
|  |  | 514(1) | 15 | Ag:Mg | 1:0.1*[2] |
|  | Electron-injection layer | 534 | 1 | LiF | — |

TABLE 1-continued

|  | Layer | Reference numeral | Thickness (nm) | Material | Weight ratio |
|---|---|---|---|---|---|
|  | Electron-transport layer | 533(2) | 15 | NBphen | — |
|  |  | 533(1) | 5 | cgDBCzPA | — |
|  | Second light-emitting layer | 512 | 25 | cgDBCzPA:1,6BnfAPrn-03 | 1:0.05 |
|  | First light-emitting layer | 510(2) | 10 | 2mDBTBPDBq-II:Ir(tBuppm)$_2$(acac) | 1:0.06 |
|  |  | 510(1) | 20 | 2mDBTBPDBq-II:PCBBiF:Ir(tBuppm)$_2$(acac) | 0.8:0.2:0.06 |
|  | Optical adjustment layer | 508 | 22.5 | PCPPn | — |
|  | Hole-transport layer | 532 | 22.5 | PCPPn | — |
|  | Hole-injection layer | 531 | 35 | PCPPn:MoO$_x$ | 2:1 |
|  | Transparent conductive layer | 506 | 110 | ITSO | — |
|  | Lower electrode | 504 | 100 | APC | — |
| Light-emitting element 2 | Upper electrode | 514(2) | 70 | ITO | — |
|  |  | 514(1) | 15 | Ag:Mg | 1:0.1*[2)] |
|  | Electron-injection layer | 534 | 1 | LiF | — |
|  | Electron-transport layer | 533(2) | 15 | NBphen | — |
|  |  | 533(1) | 5 | cgDBCzPA | — |
|  | Second light-emitting layer | 512 | 25 | cgDBCzPA:1,6BnfAPrn-03 | 1:0.05 |
|  | First light-emitting layer | 510(2) | 10 | 2mDBTBPDBq-II:Ir(tBuppm)$_2$(acac) | 1:0.06 |
|  |  | 510(1) | 20 | 2mDBTBPDBq-II:PCBBiF:Ir(tBuppm)$_2$(acac) | 0.8:0.2:0.06 |
|  | Optical adjustment layer | 508 | 22.5 | PCPPn | — |
|  | Hole-transport layer | 532 | 22.5 | PCPPn | — |
|  | Hole-injection layer | 531 | 25 | PCPPn:MoO$_x$ | 2:1 |
|  | Transparent conductive layer | 506 | 85 | ITSO | — |
|  | Lower electrode | 504 | 100 | APC | — |
| Light-emitting element 3 | Upper electrode | 514(2) | 70 | ITO | — |
|  |  | 514(1) | 15 | Ag:Mg | 1:0.1*[2)] |
|  | Electron-injection layer | 534 | 1 | LiF | — |
|  | Electron-transport layer | 533(2) | 15 | NBphen | — |
|  |  | 533(1) | 5 | cgDBCzPA | — |
|  | Second light-emitting layer | 512 | 25 | cgDBCzPA:1,6BnfAPrn-03 | 1:0.05 |
|  | First light-emitting layer | — | — | — | — |
|  | Optical adjustment layer | — | — | — | — |
|  | Hole-transport layer | 532 | 22.5 | PCPPn | — |
|  | Hole-injection layer | 531 | 25 | PCPPn:MoO$_x$ | 2:1 |
|  | Transparent conductive layer | 506 | 85 | ITSO | — |
|  | Lower electrode | 504 | 100 | APC | — |

*[1)]color
*[2)]volume ratio

<1-1. Fabrication of Light-Emitting Elements 1 and 2>

First, over a substrate 502, an alloy film of silver (Ag), palladium (Pd), and copper (Cu) (the alloy film is hereinafter referred to as APC) was formed as a lower electrode 504 by a sputtering method. Note that the thickness of the lower electrode 504 was 100 nm and the area of the lower electrode 504 was 4 mm$^2$ (2 mm×2 mm).

Then, over the lower electrode 504, indium tin oxide containing silicon oxide (the film is hereinafter referred to as ITSO) was deposited as a transparent conductive layer 506 by a sputtering method. Note that the thickness of the transparent conductive layer 506 was 110 nm in the light-emitting element 1, and the thickness of the transparent conductive layer 506 was 85 nm in the light-emitting element 2.

Then, as pretreatment of evaporation of an organic compound layer, the transparent conductive layer 506 side of the substrate 502 provided with the lower electrode 504 and the transparent conductive layer 506 was washed with water, baking was performed at 200° C. for one hour, and then UV ozone treatment was performed on a surface of the transparent conductive layer 506 for 370 seconds.

After that, the substrate 502 was transferred into a vacuum evaporation apparatus where the pressure had been reduced to approximately 10$^{-4}$ Pa, and was subjected to vacuum baking at 170° C. for 60 minutes in a heating chamber of the vacuum evaporation apparatus, and then the substrate 502 was cooled down for about 30 minutes.

Then, the substrate 502 was fixed to a holder provided in the vacuum evaporation apparatus so that a surface of the substrate 502 over which the transparent conductive layer 506 was formed faced downward. In Example 1, by a vacuum evaporation method, a hole-injection layer 531, a hole-transport layer 532, an optical adjustment layer 508, a first light-emitting layer 510(1), a first light-emitting layer 510(2), a second light-emitting layer 512, an electron-transport layer 533(1), an electron-transport layer 533(2), an electron-injection layer 534, an upper electrode 514(1), and an upper electrode 514(2) were sequentially formed. The fabrication method is described in detail below.

First, the pressure in the vacuum evaporation apparatus was reduced to $10^{-4}$ Pa. Then, on the transparent conductive layer 506, the hole-injection layer 531 was formed by co-evaporation of 3-[4-(9-phenanthryl)-phenyl]-9-phenyl-9H-carbazole (abbreviation: PCPPn) and molybdenum oxide at a weight ratio of 2:1 (PcPPn:molybdenum oxide). Note that the thickness of the hole-injection layer 531 was 35 nm in the light-emitting element 1, and the thickness of the hole-injection layer 531 was 25 nm in the light-emitting element 2.

Then, the hole-transport layer 532 was formed on the hole-injection layer 531. As the hole-transport layer 532, PCPPn was evaporated. Note that the thickness of the hole-transport layer 532 was 22.5 nm.

Then, the optical adjustment layer 508 was formed on the hole-transport layer 532. As the optical adjustment layer 508, PCPPn was evaporated. Note that the thickness of the optical adjustment layer 508 was 22.5 nm.

Then, the first light-emitting layer 510(1) was formed on the optical adjustment layer 508. The first light-emitting layer 510(1) was formed by co-evaporation of 2-[3'-(dibenzothiophen-4-yl)biphenyl-3-yl]dibenzo[f,h]quinoxaline (abbreviation: 2mDBTBPDBq-II), N-(1,1'-biphenyl-4-yl)-9,9-dimethyl-N-[4-(9-phenyl-9H-carbazol-3-yl)phenyl]-9H-fluor en-2-amine (abbreviation: PCBBiF), and (acetylacetonato)bis(6-tert-butyl-4-phenylpyrimidinato) iridium(III) (abbreviation: Ir(tBuppm)$_2$(acac)) at a weight ratio of 0.8:0.2:0.06 (2mDBTBPDBq-II:PCBBiF:Ir(tBuppm)$_2$(acac)). Note that the thickness of the first light-emitting layer 510(1) was 20 nm Note that 2mDBTBPDBq-II was the host material, PCBBiF was the assist material, and Ir(tBuppm)$_2$(acac) was the phosphorescent material (the guest material) in the first light-emitting layer 510(1).

Then, the first light-emitting layer 510(2) was formed on the first light-emitting layer 510(1). Then, the first light-emitting layer 510(2) was formed by co-evaporation of 2mDBTBPDBq-II and Ir(tBuppm)$_2$(acac) at a weight ratio of 1:0.06 (2mDBTBPDBq-II: Ir(tBuppm)$_2$(acac)). Note that the thickness of the first light-emitting layer 510(2) was 10 nm. Note that 2mDBTBPDBq-II was the host material and Ir(tBuppm)$_2$(acac) was the phosphorescent material (the guest material) in the first light-emitting layer 510(2).

Then, the second light-emitting layer 512 was formed on the first light-emitting layer 510(2). The second light-emitting layer 512 was formed by co-evaporation of 7-[4-(10-phenyl-9-anthryl)phenyl]-7H-dibenzo[c,g]carbazole (abbreviation: cgDBCzPA) and N,N'-(pyrene-1,6-diyl)bis[(6,N-diphenylbenzo[b]naphtho[1,2-d]furan)-8-amine] (abbreviation: 1,6BnfAPm-03) at a weight ratio of 1:0.05 (cgDBCzPA: 1,6BnfAPrn-03). Note that the thickness of the second light-emitting layer 512 was 25 nm. Note that cgDBCzPA was the host material and 1,6BnfAPrn-03 was the fluorescent material (the guest material) in the second light-emitting layer 512.

Then, on the second light-emitting layer 512, the electron-transport layer 533(1) was formed by evaporation of cgDBCzPA to a thickness of 5 nm. Then, on the electron-transport layer 533(1), the electron-transport layer 533(2) was formed by evaporation of 2,9-bis(naphthalen-2-yl)-4,7-diphenyl-1,10-phenanthroline (abbreviation: NBphen) to a thickness of 15 nm. Then, on the electron-transport layer 533(2), the electron-injection layer 534 was formed by evaporation of lithium fluoride (LiF) to a thickness of 1 nm.

Then, on the electron-injection layer 534, the upper electrode 514(1) was formed by co-evaporation of silver (Ag) and magnesium (Mg) at a volume ratio of 1:0.1. Note that the thickness of the upper electrode 514(1) was 15 nm. Then, on the upper electrode 514(1), indium tin oxide (ITO) was deposited as the upper electrode 514(2) by a sputtering method to a thickness of 70 nm.

Next, a sealing substrate 550 was prepared. Note that as illustrated in FIG. 48C and shown in Table 1, the sealing substrate 550 of the light-emitting element 1 is provided with a coloring layer 556. In Example 1, a red (R) color filter was formed as the coloring layer 556 of the light-emitting element 1. Note that the sealing substrate 550 of the light-emitting element 2 is not provided with the coloring layer 556.

Each of the light-emitting elements over the substrate 502 fabricated as described above was sealed by being bonded to the sealing substrate 550 in a glove box in a nitrogen atmosphere so as not to be exposed to the air (specifically, a sealant was applied to surround the element, and irradiation with ultraviolet light having a wavelength of 365 nm at 6 J/cm$^2$ and heat treatment at 80° C. for one hour were performed for sealing).

Through the above process, the light-emitting elements 1 and 2 were fabricated.

<1-2. Fabrication of Light-Emitting Element 3>

First, over the substrate 502, APC was formed as the lower electrode 504 by a sputtering method. Note that the thickness of the lower electrode 504 was 100 nm and the area of the lower electrode 504 was 4 mm$^2$.

Then, over the lower electrode 504, ITSO was deposited as the transparent conductive layer 506 by a sputtering method. Note that the thickness of the transparent conductive layer 506 was 85 nm.

Then, as pretreatment of evaporation of an organic compound layer, the transparent conductive layer 506 side of the substrate 502 provided with the lower electrode 504 and the transparent conductive layer 506 was washed with water, baking was performed at 200° C. for one hour, and then UV ozone treatment was performed on a surface of the transparent conductive layer 506 for 370 seconds.

After that, the substrate 502 was transferred into a vacuum evaporation apparatus where the pressure had been reduced to approximately $10^{-4}$ Pa, and was subjected to vacuum baking at 170° C. for 60 minutes in a heating chamber of the vacuum evaporation apparatus, and then the substrate 502 was cooled down for about 30 minutes.

Then, the substrate 502 was fixed to a holder provided in the vacuum evaporation apparatus so that a surface of the substrate 502 over which the transparent conductive layer 506 was formed faced downward. In Example 1, by a vacuum evaporation method, the hole-injection layer 531, the hole-transport layer 532, the second light-emitting layer 512, the electron-transport layer 533(1), the electron-transport layer 533(2), the electron-injection layer 534, the upper electrode 514(1), and the upper electrode 514(2) were sequentially formed. That is, the optical adjustment layer 508, the first light-emitting layer 510(1), and the first light-emitting layer 510(2) are not formed in the light-emitting element 3, unlike in the light-emitting elements 1 and 2. The fabrication method is described in detail below.

First, the pressure in the vacuum evaporation apparatus was reduced to $10^{-4}$ Pa. Then, on the transparent conductive layer 506, the hole-injection layer 531 was formed by co-evaporation of PCPPn and molybdenum oxide at a weight ratio of 2:1 (PcPPn:molybdenum oxide). Note that the thickness of the hole-injection layer 531 was 25 nm.

Then, the hole-transport layer 532 was formed on the hole-injection layer 531. As the hole-transport layer 532, PCPPn was evaporated. Note that the thickness of the hole-transport layer 532 was 22.5 nm.

Then, the second light-emitting layer 512 was formed on the hole-transport layer 532. The second light-emitting layer 512 was formed by co-evaporation of cgDBCzPA and 1,6BnfAPrn-03 at a weight ratio of 1:0.05 (cgDBCzPA: 1,6BnfAPrn-03). Note that the thickness of the second light-emitting layer 512 was 25 nm.

Then, on the second light-emitting layer 512, the electron-transport layer 533(1) was formed by evaporation of cgDB-CzPA to a thickness of 5 nm. Then, on the electron-transport layer 533(1), the electron-transport layer 533(2) was formed by evaporation of NBphen to a thickness of 15 nm. Then, on the electron-transport layer 533(2), the electron-injection layer 534 was formed by evaporation of LiF to a thickness of 1 nm.

Then, on the electron-injection layer 534, the upper electrode 514(1) was formed by co-evaporation of Ag and Mg at a volume ratio of 1:0.1. Note that the thickness of the upper electrode 514(1) was 15 nm. Then, on the upper electrode 514(1), ITO was deposited as the upper electrode 514(2) by a sputtering method to a thickness of 70 nm.

Next, the sealing substrate 550 was prepared.

The light-emitting element over the substrate 502 fabricated as described above was sealed by being bonded to the sealing substrate 550 in a glove box in a nitrogen atmosphere so as not to be exposed to the air. Note that the sealing method was the same as those of the light-emitting elements 1 and 2.

Through the above process, the light-emitting element 3 was fabricated.

Note that in all the above evaporation steps for the light-emitting elements 1 to 3, a resistive heating method was used as an evaporation method.

<1-3. Characteristics of Light-Emitting Elements 1 to 3>

Figure 49A:
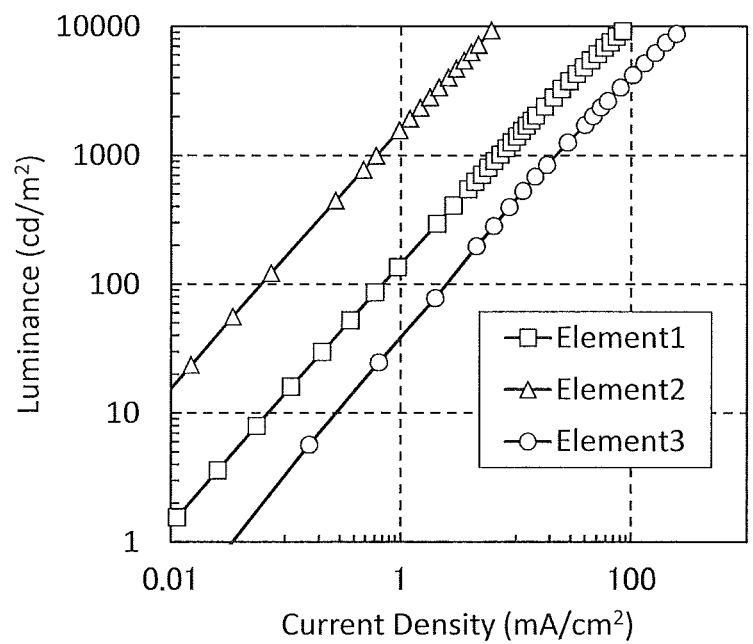
FIGS. 49A and 49B show luminance-current density characteristics and luminance-voltage characteristics, respectively, of light-emitting elements in Example 1.
Figure 49B:
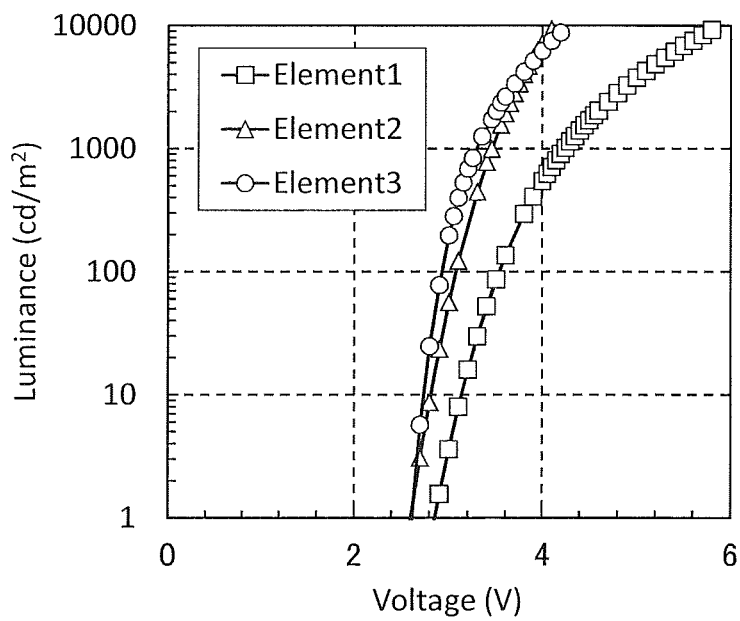
Figure 50A:
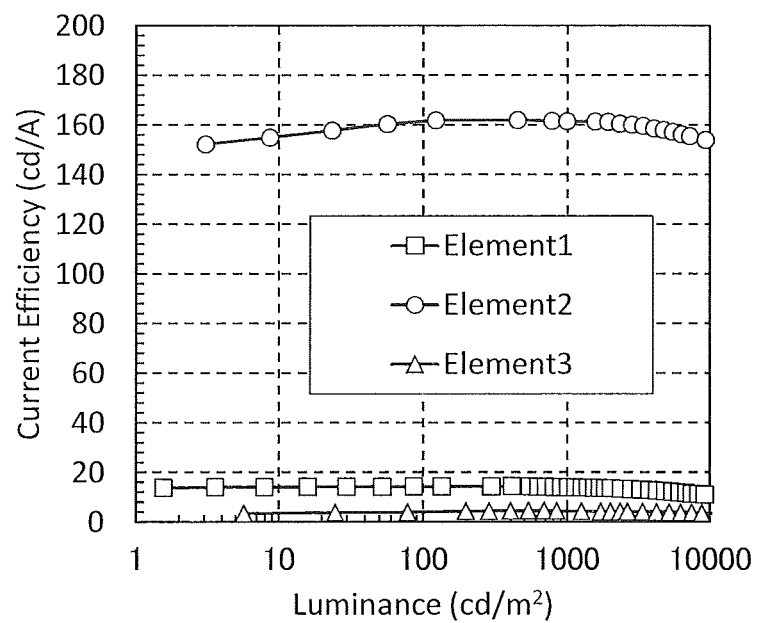
FIGS. 50A and 50B show current efficiency-luminance characteristics and emission spectra, respectively, of light-emitting elements in Example 1.

FIGS. 49A, 49B, and 50A show luminance-current density characteristics, luminance-voltage characteristics, and current efficiency-luminance characteristics, respectively, of the light-emitting elements 1 to 3. Note that the measurements of the light-emitting elements were carried out at room temperature (in an atmosphere kept at 25° C.).

Table 2 shows element characteristics of the light-emitting elements 1 to 3 at around 1000 cd/m².

a peak in the blue wavelength range. Note that as shown in Table 1, in each of the light-emitting elements 1 to 3, the distance between the lower electrode and the light-emitting layer was adjusted. Specifically, the distance between the lower electrode 504 of the light-emitting element 1 and the first light-emitting layer 510(1) of the light-emitting element 1 was 190 nm, the distance between the lower electrode 504 of the light-emitting element 2 and the first light-emitting layer 510(1) of the light-emitting element 2 was 155 nm, and the distance between the lower electrode 504 of the light-emitting element 3 and the second light-emitting layer 512 of the light-emitting element 3 was 132.5 nm.

As shown in Table 2, FIGS. 49A and 49B, and FIGS. 50A and 50B, the light-emitting elements 1 to 3 each have element characteristics having high efficiency and light emission in a desired wavelength range. Moreover, it is found that, in each of the light-emitting elements 1 and 2, the guest material in the second light-emitting layer 512 does not contribute to light emission regardless of the structures provided with the second light-emitting layer 512.

The structure described in Example 1 can be combined with any of the structures described in the other examples and the embodiments as appropriate.

Example 2

In Example 2, an example of fabricating a light-emitting element of one embodiment of the present invention will be described. Note that in Example 2, a light-emitting element 4, a light-emitting element 5, and a light-emitting element 6 were fabricated.

Figure 48C:
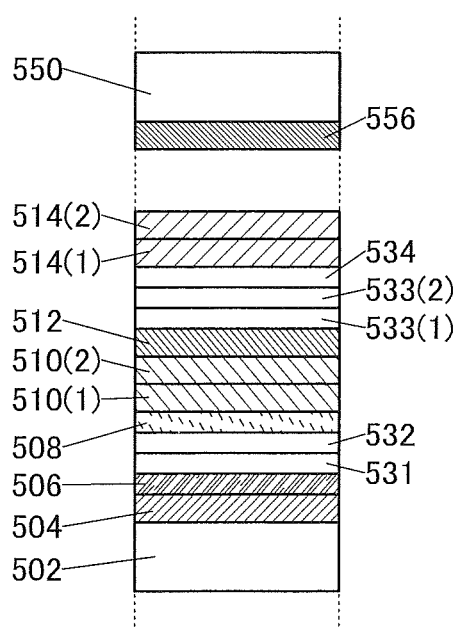
Figure 48D:
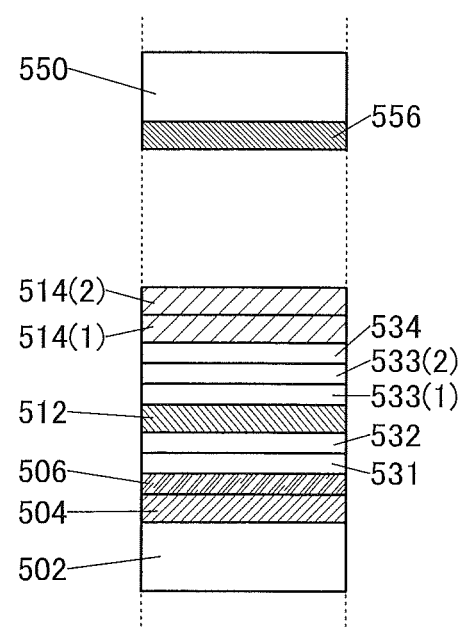

Schematic cross-sectional views of the light-emitting elements 4 and 5 are each in FIG. 48C, a schematic cross-sectional view of the light-emitting element 6 is in FIG. 48D, and the detailed structures of the light-emitting elements 4 to 6 are shown in Table 3. Note that structures and abbreviations of the compounds used here are the same as those in Example 1.

TABLE 2

|  | Voltage (V) | Current (mA) | Current density (mA/cm²) | Chromaticity (x, y) | Luminance (cd/m²) | Current efficiency (cd/A) |
| --- | --- | --- | --- | --- | --- | --- |
| Light-emitting element 1 | 4.3 | 0.29 | 7.2 | (0.66, 0.34) | 1011 | 14.0 |
| Light-emitting element 2 | 3.5 | 0.02 | 0.6 | (0.29, 0.70) | 996 | 161.5 |
| Light-emitting element 3 | 3.3 | 0.92 | 23.1 | (0.14, 0.05) | 1010 | 4.4 |

Figure 50B:
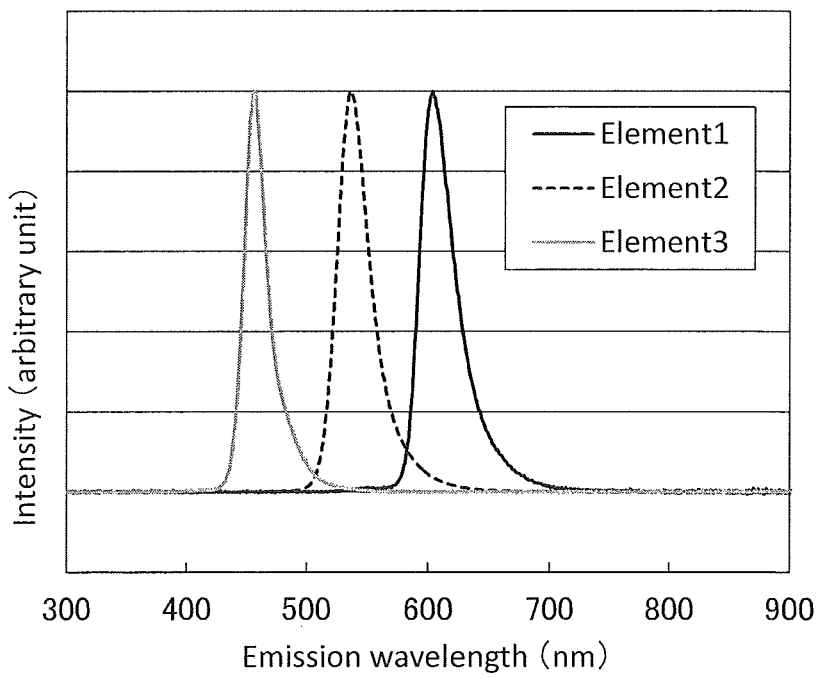

FIG. 50B shows emission spectra when a current at a current density of 2.5 mA/cm² was supplied to the light-emitting elements 1 to 3. As shown in FIG. 50B, an emission spectrum of the light-emitting element 1 has a peak in the red wavelength range, an emission spectrum of the light-emitting element 2 has a peak in the green wavelength range, and an emission spectrum of the light-emitting element 3 has

TABLE 3

| | Layer | Reference numeral | Thickness (nm) | Material | Weight ratio |
|---|---|---|---|---|---|
| Light-emitting element 4 | Coloring layer | 556 | — | Red*[1] | — |
| | Upper electrode | 514(2) | 70 | ITO | — |
| | | 514(1) | 15 | Ag:Mg | 1:0.1*[2] |
| | Electron-injection layer | 534 | 1 | LiF | — |
| | Electron-transport layer | 533(2) | 15 | NBphen | — |
| | | 533(1) | 5 | cgDBCzPA | — |
| | Second light-emitting layer | 512 | 25 | cgDBCzPA:1,6BnfAPrn-03 | 1:0.05 |
| | First light-emitting layer | 510(2) | 15 | 2mDBTBPDBq-II:Ir(tBuppm)$_2$(acac) | 1:0.06 |
| | | 510(1) | 20 | 2mDBTBPDBq-II:PCBBiF:Ir(tBuppm)$_2$(acac) | 0.8:0.2:0.06 |
| | Optical adjustment layer | 508 | 22.5 | PCPPn | — |
| | Hole-transport layer | 532 | 22.5 | PCPPn | — |
| | Hole-injection layer | 531 | 35 | PCPPn:MoO$_x$ | 2:1 |
| | Transparent conductive layer | 506 | 110 | ITSO | — |
| | Lower electrode | 504 | 100 | APC | — |
| Light-emitting element 5 | Coloring layer | 556 | — | Green*[1] | — |
| | Upper electrode | 514(2) | 70 | ITO | — |
| | | 514(1) | 15 | Ag:Mg | 1:0.1*[2] |
| | Electron-injection layer | 534 | 1 | LiF | — |
| | Electron-transport layer | 533(2) | 15 | NBphen | — |
| | | 533(1) | 5 | cgDBCzPA | — |
| | Second light-emitting layer | 512 | 25 | cgDBCzPA:1,6BnfAPrn-03 | 1:0.05 |
| | First light-emitting layer | 510(2) | 15 | 2mDBTBPDBq-II:Ir(tBuppm)$_2$(acac) | 1:0.06 |
| | | 510(1) | 20 | 2mDBTBPDBq-II:PCBBiF:Ir(tBuppm)$_2$(acac) | 0.8:0.2:0.06 |
| | Optical adjustment layer | 508 | 22.5 | PCPPn | — |
| | Hole-transport layer | 532 | 22.5 | PCPPn | — |
| | Hole-injection layer | 531 | 25 | PCPPn:MoO$_x$ | 2:1 |
| | Transparent conductive layer | 506 | 85 | ITSO | — |
| | Lower electrode | 504 | 100 | APC | — |
| Light-emitting element 6 | Coloring layer | 556 | — | Blue*[1] | — |
| | Upper electrode | 514(2) | 70 | ITO | — |
| | | 514(1) | 15 | Ag:Mg | 1:0.1*[2] |
| | Electron-injection layer | 534 | 1 | LiF | — |
| | Electron-transport layer | 533(2) | 15 | NBphen | — |
| | | 533(1) | 5 | cgDBCzPA | — |
| | Second light-emitting layer | 512 | 25 | cgDBCzPA:1,6BnfAPrn-03 | 1:0.05 |
| | First light-emitting layer | — | — | — | — |
| | Optical adjustment layer | — | — | — | — |
| | Hole-transport layer | 532 | 22.5 | PCPPn | — |
| | Hole-injection layer | 531 | 25 | PCPPn:MoO$_x$ | 2:1 |
| | Transparent conductive layer | 506 | 85 | ITSO | — |
| | Lower electrode | 504 | 100 | APC | — |

*[1]color
*[2]volume ratio

<2-1. Fabrication of Light-Emitting Elements 4 to 6>

The light-emitting elements 4 and 5 are different from the light-emitting elements 1 and 2 in Example 1 in the thickness of the first light-emitting layer 510(2). Note that the thickness of the first light-emitting layer 510(2) was 15 nm in each of the light-emitting elements 4 and 5. The light-emitting elements 5 and 6 were different from the light-emitting elements 2 and 3 in Example 1 in the structure of the sealing substrate 550. Specifically, as illustrated in FIGS. 48C and 48D and shown in Table 3, the sealing substrates 550 of the light-emitting elements 5 and 6 are each provided with the coloring layer 556. In Example 2, a green (G) color filter was formed as the coloring layer 556 of the light-emitting element 5, and a blue (B) color filter was formed as the coloring layer 556 of the light-emitting element 6.

Note that the structure of the light-emitting element 4 is different from that of the light-emitting element 1 only in the first light-emitting layer 510(2), the structure of the light-emitting element 5 is different from that of the light-emitting element 2 only in the first light-emitting layer 510(2) and the coloring layer 556, and the structure of the light-emitting element 6 is different from that of the light-emitting element 3 only in the coloring layer 556.

Each of the light-emitting elements over the substrate 502 fabricated as described above was sealed by being bonded to the sealing substrate 550 in a glove box in a nitrogen atmosphere so as not to be exposed to the air. Note that the sealing method was the same as that in Example 1.

Through the above process, the light-emitting elements 4 to 6 were fabricated.

Note that in all the above evaporation steps for the light-emitting elements 4 to 6, a resistive heating method was used as an evaporation method.

<2-2. Characteristics of Light-Emitting Elements 4 to 6>

Figure 51A:
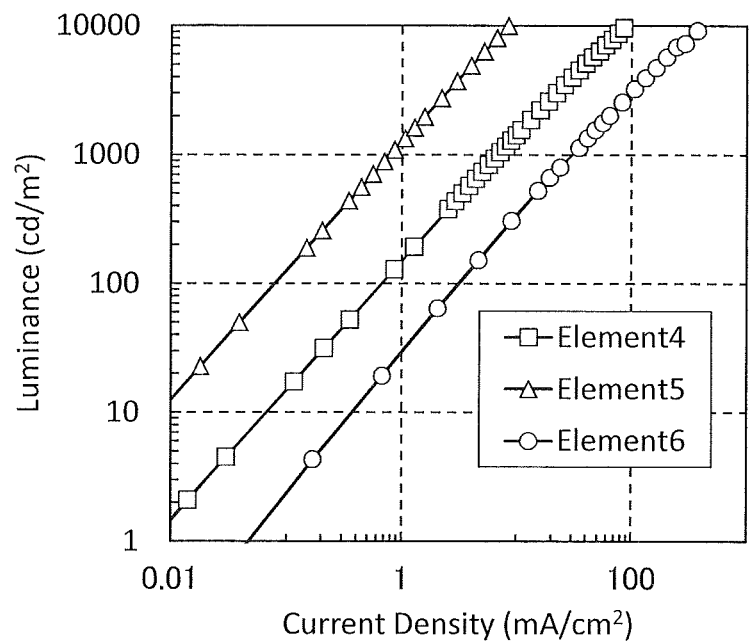
FIGS. 51A and 51B show luminance-current density characteristics and luminance-voltage characteristics, respectively, of light-emitting elements in Example 2.
Figure 51B:
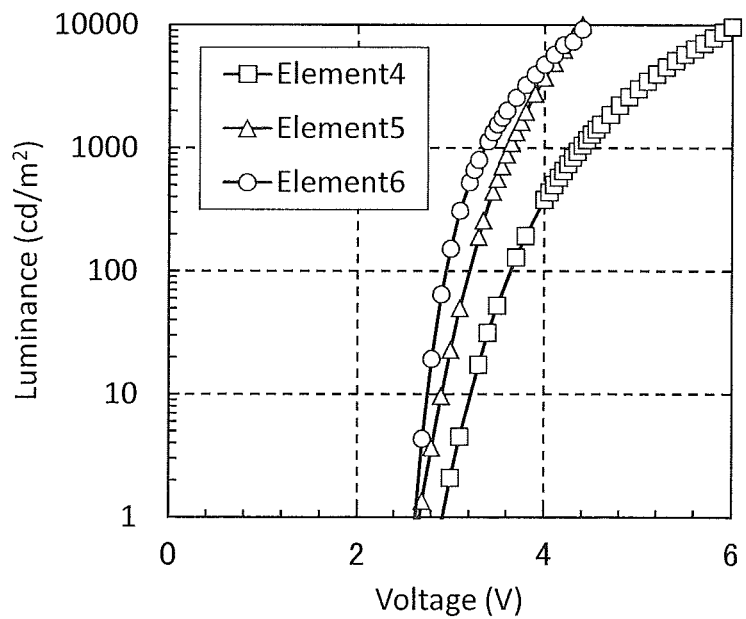
Figure 52A:
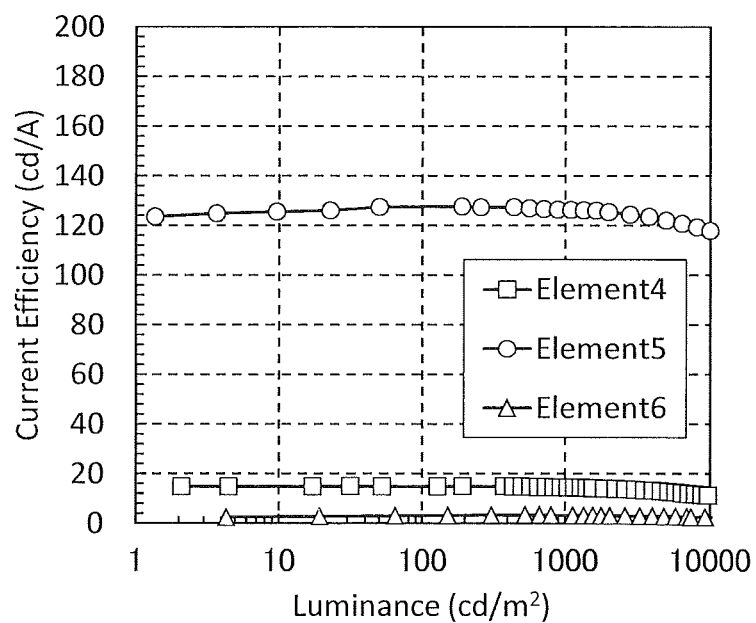
FIGS. 52A and 52B show current efficiency-luminance characteristics and emission spectra, respectively, of light-emitting elements in Example 2.

FIGS. 51A, 51B, and 52A show luminance-current density characteristics, luminance-voltage characteristics, and current efficiency-luminance characteristics, respectively, of the light-emitting elements 4 to 6. Note that the measurements of the light-emitting elements were carried out at room temperature (in an atmosphere kept at 25° C.).

Table 4 shows element characteristics of the light-emitting elements 4 to 6 at around 1000 cd/m².

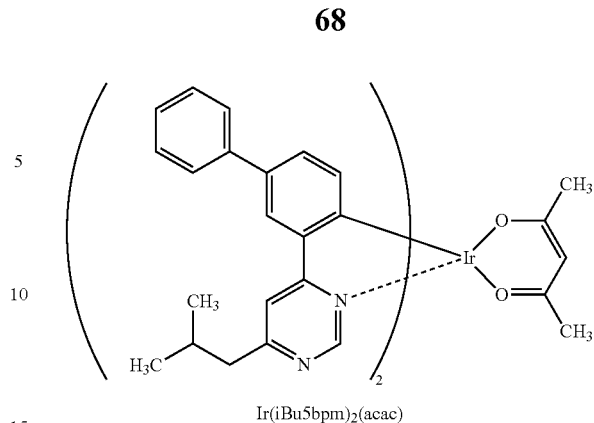

Ir(iBu5bpm)₂(acac)

TABLE 4

| | Voltage (V) | Current (mA) | Current density (mA/cm²) | Chromaticity (x, y) | Luminance (cd/m²) | Current efficiency (cd/A) |
|---|---|---|---|---|---|---|
| Light-emitting element 4 | 4.4 | 0.29 | 7.2 | (0.66, 0.34) | 1044 | 14.5 |
| Light-emitting element 5 | 3.7 | 0.03 | 0.9 | (0.29, 0.70) | 1097 | 126.3 |
| Light-emitting element 6 | 3.4 | 1.17 | 29.3 | (0.14, 0.04) | 926 | 3.2 |

Figure 52B:
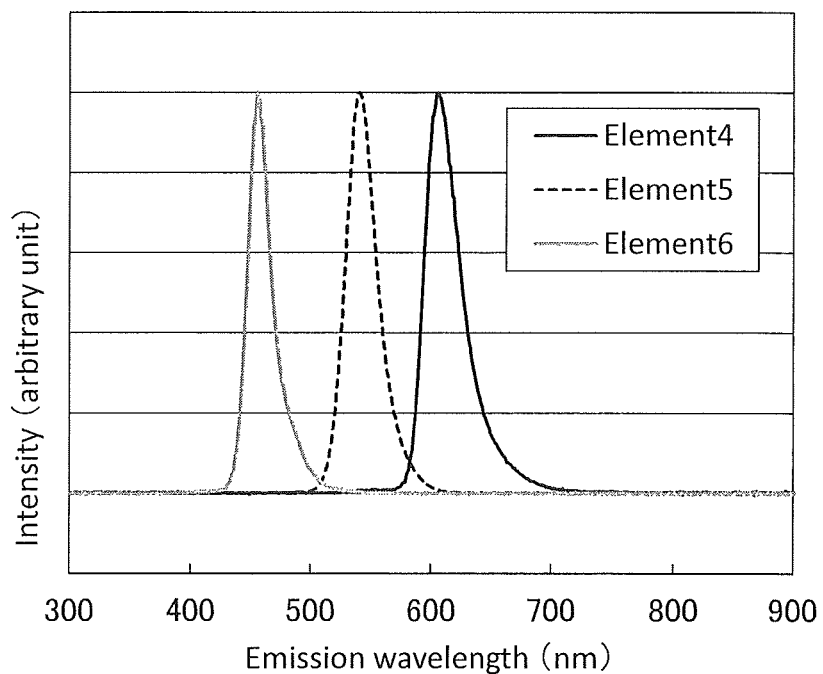

FIG. 52B shows emission spectra when a current at a current density of 2.5 mA/cm² was supplied to the light-emitting elements 4 to 6. As shown in FIG. 52B, an emission spectrum of the light-emitting element 4 has a peak in the red wavelength range, an emission spectrum of the light-emitting element 5 has a peak in the green wavelength range, and an emission spectrum of the light-emitting element 6 has a peak in the blue wavelength range.

As shown in Table 4, FIGS. 51A and 51B, and FIGS. 52A and 52B, the light-emitting elements 4 to 6 each have element characteristics having high efficiency and light emission in a desired wavelength range. Since the light-emitting elements 5 and 6 are each provided with the coloring layer 556, they have higher color purity than the light-emitting elements 2 and 3 in Example 1.

The structure described in Example 2 can be combined with any of the structures described in the other examples and the embodiments as appropriate.

Example 3

In Example 3, an example of fabricating a light-emitting element of one embodiment of the present invention will be described. Note that in Example 3, a light-emitting element 7, a light-emitting element 8, and a light-emitting element 9 were fabricated.

Schematic cross-sectional views of the light-emitting elements 7 and 8 are each in FIG. 48C, a schematic cross-sectional view of the light-emitting element 9 is in FIG. 48D, and the detailed structures of the light-emitting elements 7 to 9 are shown in Table 5. Note that structures and abbreviations of the compounds used here are given below, and compounds other than those given below are the same as those in Example 1 and Example 2.

TABLE 5

| | Layer | Reference numeral | Thickness (nm) | Material | Weight ratio |
|---|---|---|---|---|---|
| Light-emitting element 7 | Coloring layer | 556 | — | Red*[1] | — |
| | Upper electrode | 514(2) | 70 | ITO | — |
| | | 514(1) | 15 | Ag:Mg | 1:0.1*[2] |
| | Electron-injection layer | 534 | 1 | LiF | — |
| | Electron-transport layer | 533(2) | 15 | NBphen | — |
| | | 533(1) | 5 | cgDBCzPA | — |
| | Second light-emitting layer | 512 | 25 | cgDBCzPA:1,6BnfAPrn-03 | 1:0.03 |
| | First light-emitting layer | 510(2) | 15 | 2mDBTBPDBq-II:Ir(iBu5bpm)$_2$(acac) | 1:0.04 |
| | | 510(1) | 20 | 2mDBTBPDBq-II:PCBBiF:Ir(iBu5bpm)$_2$(acac) | 0.8:0.2:0.04 |
| | Optical adjustment layer | 508 | 25 | PCBBiF | — |
| | Hole-transport layer | 532 | 15 | PCPPn | — |
| | Hole-injection layer | 531 | 40 | PCPPn:MoO$_x$ | 2:1 |
| | Transparent conductive layer | 506 | 110 | ITSO | — |
| | Lower electrode | 504 | 100 | APC | — |
| Light-emitting element 8 | Coloring layer | 556 | — | Green*[1] | — |
| | Upper electrode | 514(2) | 70 | ITO | — |
| | | 514(1) | 15 | Ag:Mg | 1:0.1*[2] |
| | Electron-injection layer | 534 | 1 | LiF | — |
| | Electron-transport layer | 533(2) | 15 | NBphen | — |
| | | 533(1) | 5 | cgDBCzPA | — |
| | Second light-emitting layer | 512 | 25 | cgDBCzPA:1,6BnfAPrn-03 | 1:0.03 |
| | First light-emitting layer | 510(2) | 15 | 2mDBTBPDBq-II:Ir(iBu5bpm)$_2$(acac) | 1:0.04 |
| | | 510(1) | 20 | 2mDBTBPDBq-II:PCBBiF:Ir(iBu5bpm)$_2$(acac) | 0.8:0.2:0.04 |
| | Optical adjustment layer | 508 | 25 | PCBBiF | — |
| | Hole-transport layer | 532 | 15 | PCPPn | — |
| | Hole-injection layer | 531 | 30 | PCPPn:MoO$_x$ | 2:1 |
| | Transparent conductive layer | 506 | 85 | ITSO | — |
| | Lower electrode | 504 | 100 | APC | — |
| Light-emitting element 9 | Coloring layer | 556 | — | Blue*[1] | — |
| | Upper electrode | 514(2) | 70 | ITO | — |
| | | 514(1) | 15 | Ag:Mg | 1:0.1*[2] |
| | Electron-injection layer | 534 | 1 | LiF | — |
| | Electron-transport layer | 533(2) | 15 | NBphen | — |
| | | 533(1) | 5 | cgDBCzPA | — |
| | Second light-emitting layer | 512 | 25 | cgDBCzPA:1,6BnfAPrn-03 | 1:0.03 |
| | First light-emitting layer | — | — | — | — |
| | Optical adjustment layer | — | — | — | — |
| | Hole-transport layer | 532 | 15 | PCPPn | — |
| | Hole-injection layer | 531 | 30 | PCPPn:MoO$_x$ | 2:1 |
| | Transparent conductive layer | 506 | 85 | ITSO | — |
| | Lower electrode | 504 | 100 | APC | — |

*[1]color
*[2]volume ratio

<3-1. Fabrication of Light-Emitting Elements 7 and 8>

First, over the substrate 502, APC was formed as the lower electrode 504 by a sputtering method. Note that the thickness of the lower electrode 504 was 100 nm and the area of the lower electrode 504 was 4 mm$^2$ (2 mm×2 mm).

Then, over the lower electrode 504, ITSO was deposited as the transparent conductive layer 506 by a sputtering method. Note that the thickness of the transparent conductive layer 506 was 110 nm in the light-emitting element 7, and the thickness of the transparent conductive layer 506 was 85 nm in the light-emitting element 8.

Then, as pretreatment of evaporation of an organic compound layer, the transparent conductive layer 506 side of the substrate 502 provided with the lower electrode 504 and the transparent conductive layer 506 was washed with water, baking was performed at 200° C. for one hour, and then UV ozone treatment was performed on a surface of the transparent conductive layer 506 for 370 seconds.

After that, the substrate 502 was transferred into a vacuum evaporation apparatus where the pressure had been reduced to approximately 10$^{-4}$ Pa, and was subjected to vacuum baking at 170° C. for 60 minutes in a heating chamber of the vacuum evaporation apparatus, and then the substrate 502 was cooled down for about 30 minutes.

Then, the substrate 502 was fixed to a holder provided in the vacuum evaporation apparatus so that a surface of the substrate 502 over which the transparent conductive layer 506 was formed faced downward. In Example 3, by a vacuum evaporation method, the hole-injection layer 531, the hole-transport layer 532, the optical adjustment layer 508, the first light-emitting layer 510(1), the first light-emitting layer 510(2), the second light-emitting layer 512, the electron-transport layer 533(1), the electron-transport layer 533(2), the electron-injection layer 534, the upper electrode 514(1), and the upper electrode 514(2) were sequentially formed. The fabrication method is described in detail below.

First, the pressure in the vacuum evaporation apparatus was reduced to $10^{-4}$ Pa. Then, on the transparent conductive layer 506, the hole-injection layer 531 was formed by co-evaporation of PCPPn and molybdenum oxide at a weight ratio of 2:1 (PcPPn:molybdenum oxide). Note that the thickness of the hole-injection layer 531 was 40 nm in the light-emitting element 7, and the thickness of the hole-injection layer 531 was 30 nm in the light-emitting element 8.

Then, the hole-transport layer 532 was formed on the hole-injection layer 531. As the hole-transport layer 532, PCPPn was evaporated. Note that the thickness of the hole-transport layer 532 was 15 nm.

Then, the optical adjustment layer 508 was formed on the hole-transport layer 532. As the optical adjustment layer 508, PCBBiF was evaporated. Note that the thickness of the optical adjustment layer 508 was 25 nm.

Then, the first light-emitting layer 510(1) was formed on the optical adjustment layer 508. The first light-emitting layer 510(1) was formed by co-evaporation of 2mDBTBP-DBq-II, PCBBiF, and bis {3-[6-isobutyl-4-pyrimidinyl-κN3]biphenyl-κC4}(2,4-pentanedionato-κ²O,O')iridium(III) (abbreviation: Ir(iBu5bpm)$_2$(acac)) at a weight ratio of 0.8:0.2:0.04 (2mDBTBPDBq-II:PCBBiF: Ir(iBu5bpm)$_2$(acac)). Note that the thickness of the first light-emitting layer 510(1) was 20 nm. Note that 2mDBTBPDBq-II was the host material, PCBBiF was the assist material, and Ir(iBu5bpm)$_2$(acac) was the phosphorescent material (the guest material) in the first light-emitting layer 510(1).

Note that although Ir(iBu5bpm)$_2$(acac) was used as the phosphorescent material in Example 3, a different phosphorescent material may be used without limitation thereto. For example, Ir(mppm)$_2$(acac), Ir(tBuppm)$_2$(acac), or the like can be used. The chemical formulae of Ir(mppm)$_2$(acac) and Ir(tBuppm)$_2$(acac) are shown below.

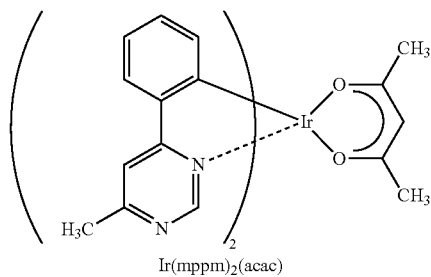

Ir(mppm)$_2$(acac)

-continued

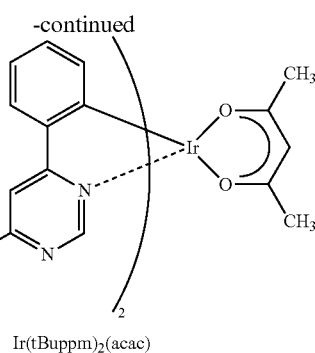

Ir(tBuppm)$_2$(acac)

Ir(mppm)$_2$(acac) includes a phenyl group at the 4-position of a pyrimidine ring coordinated to iridium metal and a methyl group at the 6-position of the pyrimidine ring coordinated to the iridium metal. Ir(tBuppm)$_2$(acac) includes a phenyl group at the 4-position of a pyrimidine ring coordinated to iridium metal and a tert-butyl group at the 6-position of the pyrimidine ring coordinated to the iridium metal. In contrast, Ir(iBu5bpm)$_2$(acac) used in Example 3 includes a biphenyl group at the 4-position of a pyrimidine ring coordinated to iridium metal and an isobutyl group at the 6-position of the pyrimidine ring coordinated to the iridium metal.

Note that Ir(iBu5bpm)$_2$(acac), a novel compound, is preferably used as a phosphorescent material as in the light-emitting elements fabricated in Example 3 because emission efficiency can be in some cases higher than that of a light-emitting element in which, for example, Ir(mppm)$_2$(acac) is used as a phosphorescent material. Ir(iBu5bpm)$_2$(acac) is preferably used because it has the biphenyl group instead of the phenyl group unlike Ir(mppm)$_2$(acac) and Ir(tBuppm)$_2$(acac), and a long lifetime can be achieved in some cases. Furthermore, Ir(iBu5bpm)$_2$(acac) is preferably used as the light-emitting material used in the light-emitting element of one embodiment of the present invention because it has spectrum components of green light and red light.

Then, the first light-emitting layer 510(2) was formed on the first light-emitting layer 510(1). Then, the first light-emitting layer 510(2) was formed by co-evaporation of 2mDBTBPDBq-II and Ir(iBu5bpm)$_2$(acac) at a weight ratio of 1:0.04 (2mDBTBPDBq-II: Ir(iBu5bpm)$_2$(acac)). Note that the thickness of the first light-emitting layer 510(2) was 15 nm. Note that 2mDBTBPDBq-II was the host material and Ir(iBu5bpm)$_2$(acac) was the phosphorescent material (the guest material) in the first light-emitting layer 510(2).

Then, the second light-emitting layer 512 was formed on the first light-emitting layer 510(2). The second light-emitting layer 512 was formed by co-evaporation of cgDBCzPA and 1,6BnfAPrn-03 at a weight ratio of 1:0.03 (cgDBCzPA:1,6BnfAPrn-03). Note that the thickness of the second light-emitting layer 512 was 25 nm. Note that cgDBCzPA was the host material and 1,6BnfAPm-03 was the fluorescent material (the guest material) in the second light-emitting layer 512.

Then, on the second light-emitting layer 512, the electron-transport layer 533(1) was formed by evaporation of cgDB-CzPA to a thickness of 5 nm. Then, on the electron-transport layer 533(1), the electron-transport layer 533(2) was formed by evaporation of NBphen to a thickness of 15 nm. Then, on the electron-transport layer 533(2), the electron-injection layer 534 was formed by evaporation of LiF to a thickness of 1 nm.

Then, on the electron-injection layer 534, the upper electrode 514(1) was formed by co-evaporation of Ag and Mg at a volume ratio of 1:0.1. Note that the thickness of the upper electrode 514(1) was 15 nm. Then, on the upper electrode 514(1), ITO was deposited as the upper electrode 514(2) by a sputtering method to a thickness of 70 nm.

Next, the sealing substrate 550 was prepared. Note that as illustrated in FIG. 48C and shown in Table 4, the sealing substrates 550 of the light-emitting elements 7 and 8 are each provided with the coloring layer 556. In Example 3, a red (R) color filter was formed as the coloring layer 556 of the light-emitting element 7, and a green (G) color filter was formed as the coloring layer 556 of the light-emitting element 8.

Each of the light-emitting elements over the substrate 502 fabricated as described above was sealed by being bonded to the sealing substrate 550 in a glove box in a nitrogen atmosphere so as not to be exposed to the air. Note that the sealing method was the same as that in Example 1.

Through the above process, the light-emitting elements 7 and 8 were fabricated.

<3-2. Fabrication of Light-Emitting Element 9>

First, over the substrate 502, APC was formed as the lower electrode 504 by a sputtering method. Note that the thickness of the lower electrode 504 was 100 nm and the area of the lower electrode 504 was 4 mm$^2$.

Then, over the lower electrode 504, ITSO was deposited as the transparent conductive layer 506 by a sputtering method. Note that the thickness of the transparent conductive layer 506 was 85 nm.

Then, as pretreatment of evaporation of an organic compound layer, the transparent conductive layer 506 side of the substrate 502 provided with the lower electrode 504 and the transparent conductive layer 506 was washed with water, baking was performed at 200° C. for one hour, and then UV ozone treatment was performed on a surface of the transparent conductive layer 506 for 370 seconds.

After that, the substrate 502 was transferred into a vacuum evaporation apparatus where the pressure had been reduced to approximately 10$^{-4}$ Pa, and was subjected to vacuum baking at 170° C. for 60 minutes in a heating chamber of the vacuum evaporation apparatus, and then the substrate 502 was cooled down for about 30 minutes.

Then, the substrate 502 was fixed to a holder provided in the vacuum evaporation apparatus so that a surface of the substrate 502 over which the transparent conductive layer 506 was formed faced downward. In Example 3, by a vacuum evaporation method, the hole-injection layer 531, the hole-transport layer 532, the second light-emitting layer 512, the electron-transport layer 533(1), the electron-transport layer 533(2), the electron-injection layer 534, the upper electrode 514(1), and the upper electrode 514(2) were sequentially formed. That is, the optical adjustment layer 508, the first light-emitting layer 510(1), and the first light-emitting layer 510(2) are not formed in the light-emitting element 9, unlike in the light-emitting elements 7 and 8. The fabrication method is described in detail below.

First, the pressure in the vacuum evaporation apparatus was reduced to 10$^{-4}$ Pa. Then, on the transparent conductive layer 506, the hole-injection layer 531 was forming by co-evaporation of PCPPn and molybdenum oxide at a weight ratio of 2:1 (PcPPn:molybdenum oxide). Note that the thickness of the hole-injection layer 531 was 30 nm.

Then, the hole-transport layer 532 was formed on the hole-injection layer 531. As the hole-transport layer 532, PCPPn was evaporated. Note that the thickness of the hole-transport layer 532 was 15 nm.

Then, the second light-emitting layer 512 was formed on the hole-transport layer 532. The second light-emitting layer 512 was formed by co-evaporation of cgDBCzPA and 1,6BnfAPrn-03 at a weight ratio of 1:0.03 (cgDBCzPA: 1,6BnfAPm-03). Note that the thickness of the second light-emitting layer 512 was 25 nm.

Then, on the second light-emitting layer 512, the electron-transport layer 533(1) was formed by evaporation of cgDBCzPA to a thickness of 5 nm. Then, on the electron-transport layer 533(1), the electron-transport layer 533(2) was formed by evaporation of NBphen to a thickness of 15 nm. Then, on the electron-transport layer 533(2), the electron-injection layer 534 was formed by evaporation of LiF to a thickness of 1 nm.

Then, on the electron-injection layer 534, the upper electrode 514(1) was formed by co-evaporation of Ag and Mg at a volume ratio of 1:0.1. Note that the thickness of the upper electrode 514(1) was 15 nm. Then, on the upper electrode 514(1), ITO was deposited as the upper electrode 514(2) by a sputtering method to a thickness of 70 nm.

Next, the sealing substrate 550 was prepared.

Note that as illustrated in FIG. 48D and shown in Table 5, the sealing substrate 550 of the light-emitting element 9 is provided with the coloring layer 556. In Example 3, a red (R) color filter was formed as the coloring layer 556 of the light-emitting element 9.

The light-emitting element over the substrate 502 fabricated as described above was sealed by being bonded to the sealing substrate 550 in a glove box in a nitrogen atmosphere so as not to be exposed to the air. Note that the sealing method was the same as those of the light-emitting elements 7 and 8.

Through the above process, the light-emitting element 9 was fabricated.

Note that in all the above evaporation steps for the light-emitting elements 7 to 9, a resistive heating method was used as an evaporation method.

<3-3. Characteristics of Light-Emitting Elements 7 to 9>

Figure 53A:
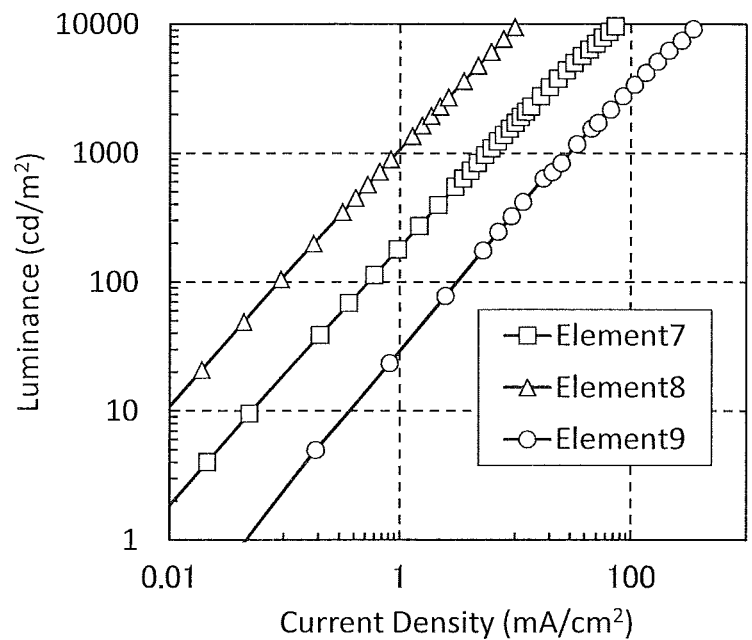
FIGS. 53A and 53B show luminance-current density characteristics and luminance-voltage characteristics, respectively, of light-emitting elements in Example 3.
Figure 53B:
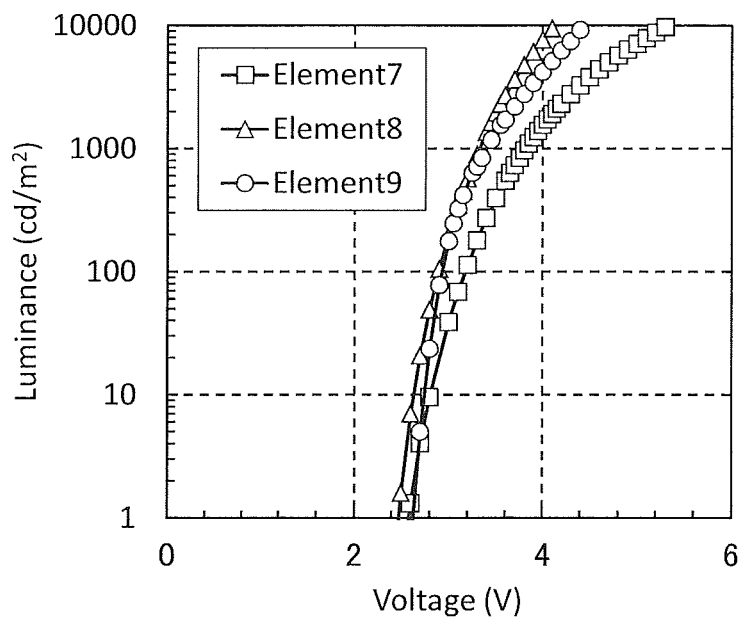
Figure 54A:
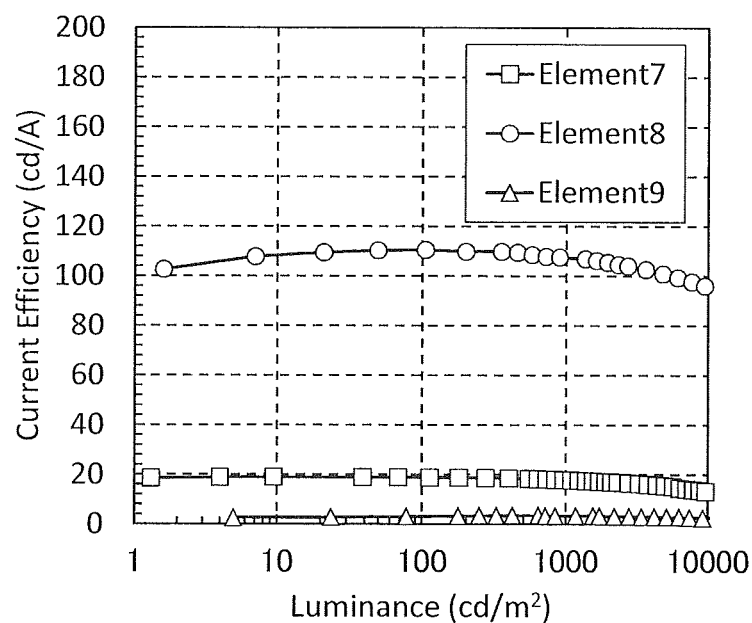
FIGS. 54A and 54B show current efficiency-luminance characteristics and emission spectra, respectively, of light-emitting elements in Example 3.

FIGS. 53A, 53B, and 54A show luminance-current density characteristics, luminance-voltage characteristics, and current efficiency-luminance characteristics, respectively, of the light-emitting elements 7 to 9. Note that the measurements of the light-emitting elements were carried out at room temperature (in an atmosphere kept at 25° C.).

Table 6 shows element characteristics of the light-emitting elements 7 to 9 at around 1000 cd/m$^2$.

TABLE 6

|  | Voltage (V) | Current (mA) | Current density (mA/cm$^2$) | Chromaticity (x, y) | Luminance (cd/m$^2$) | Current efficiency (cd/A) |
| --- | --- | --- | --- | --- | --- | --- |
| Light-emitting element 7 | 3.8 | 0.22 | 5.4 | (0.66, 0.34) | 965 | 17.8 |
| Light-emitting element 8 | 3.3 | 0.03 | 0.8 | (0.31, 0.68) | 898 | 107.6 |
| Light-emitting | 3.4 | 1.18 | 29.5 | (0.14, 0.04) | 967 | 3.3 |

TABLE 6-continued

| | Voltage (V) | Current (mA) | Current density (mA/cm²) | Chromaticity (x, y) | Luminance (cd/m²) | Current efficiency (cd/A) |
|---|---|---|---|---|---|---|
| element 9 | | | | | | |

Figure 54B:
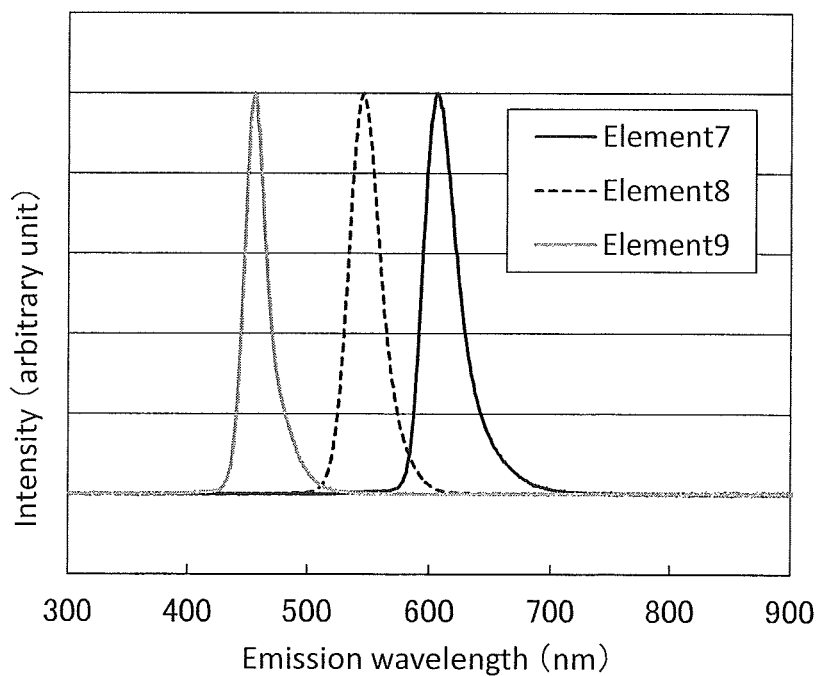

FIG. 54B shows emission spectra when a current at a current density of 2.5 mA/cm² was supplied to the light-emitting elements 7 to 9. As shown in FIG. 54B, an emission spectrum of the light-emitting element 7 has a peak in the red wavelength range, an emission spectrum of the light-emitting element 8 has a peak in the green wavelength range, and an emission spectrum of the light-emitting element 9 has a peak in the blue wavelength range. Note that as shown in Table 5, in each of the light-emitting elements 7 to 9, the distance between the lower electrode and the light-emitting layer was adjusted. Specifically, the distance between the lower electrode 504 of the light-emitting element 7 and the first light-emitting layer 510(1) of the light-emitting element 7 was 190 nm, the distance between the lower electrode 504 of the light-emitting element 8 and the first light-emitting layer 510(1) of the light-emitting element 8 was 155 nm, and the distance between the lower electrode 504 of the light-emitting element 9 and the second light-emitting layer 512 of the light-emitting element 9 was 130 nm.

As shown in Table 6, FIGS. 53A and 53B, and FIGS. 54A and 54B, the light-emitting elements 7 to 9 each have element characteristics having high efficiency and light emission in a desired wavelength range. Moreover, it is found that, in each of the light-emitting elements 7 and 8, the guest material in the second light-emitting layer 512 does not contribute to light emission regardless of the structures provided with the second light-emitting layer 512.

Figure 55:
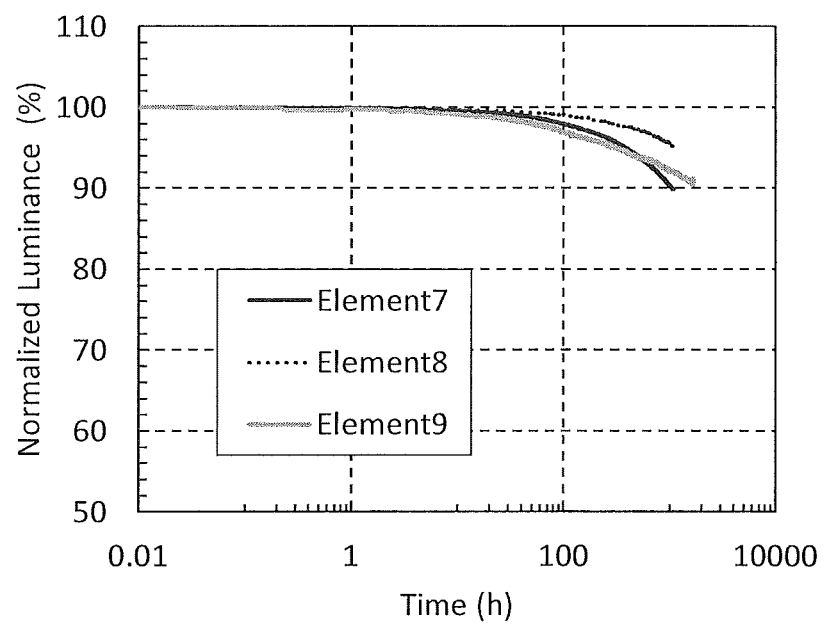
FIG. 55 shows normalized luminance-time characteristics of light-emitting elements in Example 3.

Next, a reliability test was performed on each of the light-emitting elements 7 to 9. FIG. 55 shows results of the reliability tests.

In the reliability test, each of the light-emitting elements 7 to 9 was driven under the conditions where the initial luminance was 5000 cd/m² and the current density was constant. In FIG. 55, The vertical axis represents normalized luminance (%) with the initial luminance of 100%, and the horizontal axis represents driving time (h) of the element. The results in FIG. 55 indicate that the normalized luminance of the light-emitting element 7 after 1074 hours was 89%, the normalized luminance of the light-emitting element 8 after 1074 hours was 95%, and the normalized luminance of the light-emitting element 9 after 1642 hours was 91%.

The results in FIGS. 53A and 53B, FIGS. 54A and 54B, and FIG. 55 indicate that the light-emitting elements 7 to 9, each of which is one embodiment of the present invention, have excellent element characteristics (voltage-luminance characteristics, luminance-current efficiency characteristics, and voltage-current characteristics) and high reliability (normalized luminance-time characteristics).

The structure described in Example 3 can be combined with any of the structures described in the other examples and the embodiments as appropriate.

Reference Example 1

Light-emitting elements (a light-emitting element 10, a light-emitting element 11, and a light-emitting element 12) in modes different from those of the light-emitting elements described in Examples 1 to 3 were fabricated and evaluated below.

Figure 56A:
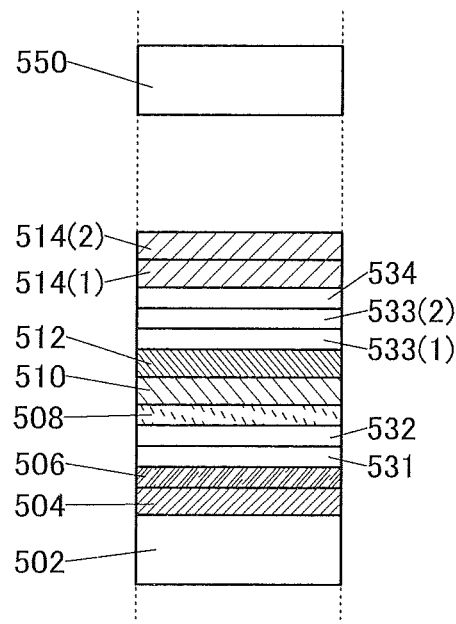
FIGS. 56A to 56D are cross-sectional views each illustrating a light-emitting element in Reference Examples 1 to 3.
Figure 56B:
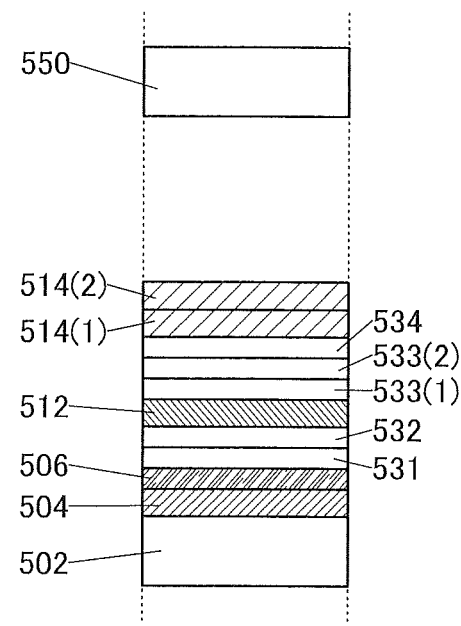
Figure 56C:
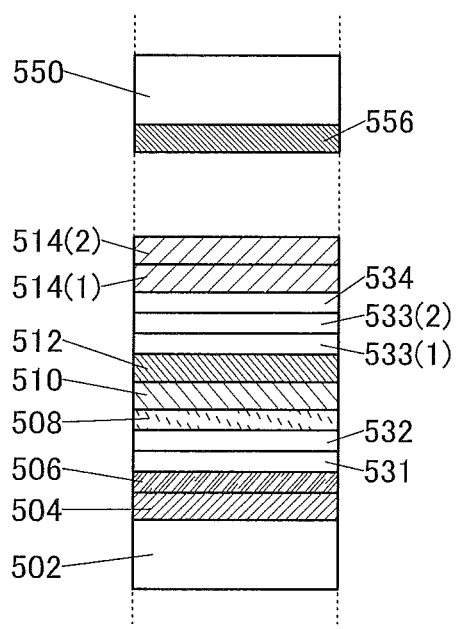

A schematic cross-sectional view of the light-emitting element 10 is in FIG. 56C, a schematic cross-sectional view of the light-emitting element 11 is in FIG. 56A, a schematic cross-sectional view of the light-emitting element 12 is in FIG. 56B, the detailed structures of the light-emitting elements 10 to 12 are shown in Table 7. Note that structures and abbreviations of the compounds used here are given below, and compounds other than those given below are the same as those in Example 1.

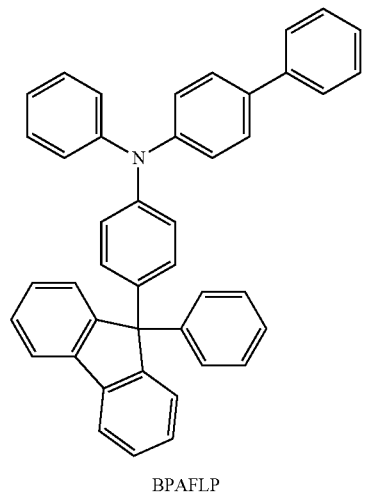 [SMILES: c1ccc(-c2ccc(N(c3ccccc3)c3ccc(C4(c5ccccc5)c5ccccc5-c5ccccc54)cc3)cc2)cc1]

BPAFLP

TABLE 7

| | Layer | Reference numeral | Thickness (nm) | Material | Weight ratio |
|---|---|---|---|---|---|
| Light-emitting element 10 | Coloring layer | 556 | — | Red*[1] | — |
| | Upper electrode | 514(2) | 70 | ITO | — |
| | | 514(1) | 15 | Ag:Mg | 1:0.1*[2] |
| | Electron-injection layer | 534 | 1 | LiF | — |
| | Electron-transport layer | 533(2) | 15 | NBphen | — |
| | | 533(1) | 5 | cgDBCzPA | — |
| | Second light-emitting layer | 512 | 25 | cgDBCzPA:1,6BnfAPrn-03 | 1:0.05 |
| | First light-emitting layer | 510 | 25 | 2mDBTBPDBq-II:PCBBiF:Ir(tBuppm)$_2$(acac) | 0.8:0.2:0.06 |
| | Optical adjustment layer | 508 | 20 | BPAFLP | — |
| | Hole-transport layer | 532 | 15 | PCPPn | — |
| | Hole-injection layer | 531 | 55 | PCPPn:MoO$_x$ | 2:1 |
| | Transparent conductive layer | 506 | 110 | ITSO | — |
| | Lower electrode | 504 | 100 | APC | — |
| Light-emitting element 11 | Upper electrode | 514(2) | 70 | ITO | — |
| | | 514(1) | 15 | Ag:Mg | 1:0.1*[2] |
| | Electron-injection layer | 534 | 1 | LiF | — |
| | Electron-transport layer | 533(2) | 15 | NBphen | — |
| | | 533(1) | 5 | cgDBCzPA | — |
| | Second light-emitting layer | 512 | 25 | cgDBCzPA:1,6BnfAPrn-03 | 1:0.05 |
| | First light-emitting layer | 510 | 25 | 2mDBTBPDBq-II:PCBBiF:Ir(tBuppm)$_2$(acac) | 0.8:0.2:0.06 |
| | Optical adjustment layer | 508 | 20 | BPAFLP | — |
| | Hole-transport layer | 532 | 15 | PCPPn | — |
| | Hole-injection layer | 531 | 45 | PCPPn:MoO$_x$ | 2:1 |
| | Transparent conductive layer | 506 | 85 | ITSO | — |
| | Lower electrode | 504 | 100 | APC | — |
| Light-emitting element 12 | Upper electrode | 514(2) | 70 | ITO | — |
| | | 514(1) | 15 | Ag:Mg | 1:0.1*[2] |
| | Electron-injection layer | 534 | 1 | LiF | — |
| | Electron-transport layer | 533(2) | 15 | NBphen | — |
| | | 533(1) | 5 | cgDBCzPA | — |
| | Second light-emitting layer | 512 | 25 | cgDBCzPA:1,6BnfAPrn-03 | 1:0.05 |
| | First light-emitting layer | — | — | — | — |
| | Optical adjustment layer | — | — | — | — |
| | Hole-transport layer | 532 | 15 | PCPPn | — |
| | Hole-injection layer | 531 | 102.5 | PCPPn:MoO$_x$ | 2:1 |
| | Transparent conductive layer | 506 | 10 | ITSO | — |
| | Lower electrode | 504 | 100 | APC | — |

*[1]color
*[2]volume ratio

<4-1. Fabrication of Light-Emitting Elements 10 and 11>

First, over the substrate 502, APC was formed as the lower electrode 504 by a sputtering method. Note that the thickness of the lower electrode 504 was 100 nm and the area of the lower electrode 504 was 4 mm² (2 mm×2 mm).

Then, over the lower electrode 504, ITSO was deposited as the transparent conductive layer 506 by a sputtering method. Note that the thickness of the transparent conductive layer 506 was 110 nm in the light-emitting element 10, and the thickness of the transparent conductive layer 506 was 85 nm in the light-emitting element 11.

Then, as pretreatment of evaporation of an organic compound layer, the transparent conductive layer 506 side of the substrate 502 provided with the lower electrode 504 and the transparent conductive layer 506 was washed with water, baking was performed at 200° C. for one hour, and then UV ozone treatment was performed on a surface of the transparent conductive layer 506 for 370 seconds.

After that, the substrate 502 was transferred into a vacuum evaporation apparatus where the pressure had been reduced to approximately $10^{-4}$ Pa, and was subjected to vacuum baking at 170° C. for 60 minutes in a heating chamber of the vacuum evaporation apparatus, and then the substrate 502 was cooled down for about 30 minutes.

Then, the substrate 502 was fixed to a holder provided in the vacuum evaporation apparatus so that a surface of the substrate 502 over which the transparent conductive layer 506 was formed faced downward. In Reference Example 1, by a vacuum evaporation method, the hole-injection layer 531, the hole-transport layer 532, the optical adjustment layer 508, the first light-emitting layer 510, the second light-emitting layer 512, the electron-transport layer 533(1), the electron-transport layer 533(2), the electron-injection layer 534, the upper electrode 514(1), and the upper electrode 514(2) were sequentially formed. The fabrication method is described in detail below.

First, the pressure in the vacuum evaporation apparatus was reduced to $10^{-4}$ Pa. Then, on the transparent conductive layer 506, the hole-injection layer 531 was formed by co-evaporation of PCPPn and molybdenum oxide at a weight ratio of 2:1 (PcPPn:molybdenum oxide). Note that the thickness of the hole-injection layer 531 was 55 nm in the light-emitting element 10, and the thickness of the hole-injection layer 531 was 45 nm in the light-emitting element 11.

Then, the hole-transport layer 532 was formed on the hole-injection layer 531. As the hole-transport layer 532, PCPPn was evaporated. Note that the thickness of the hole-transport layer 532 was 15 nm.

Then, the optical adjustment layer 508 was formed on the hole-transport layer 532. As the optical adjustment layer 508, 4-phenyl-4'-(9-phenylfluoren-9-yl)triphenylamin (abbreviation: BPAFLP) was evaporated to a thickness of 20 nm.

Then, the first light-emitting layer 510 was formed on the optical adjustment layer 508. The first light-emitting layer 510 was formed by co-evaporation of 2mDBTBPDBq-II, PCBBiF, and Ir(tBuppm)$_2$(acac) at a weight ratio of 0.8:0.2: 0.06 (2mDBTBPDBq-II:PCBBiF: Ir(tBuppm)$_2$(acac)). Note that the thickness of the first light-emitting layer 510 was 25 nm. Note that 2mDBTBPDBq-II was the host material, PCBBiF was the assist material, and Ir(tBuppm)$_2$(acac) was the phosphorescent material (the guest material) in the first light-emitting layer 510.

Then, the second light-emitting layer 512 was formed on the first light-emitting layer 510. The second light-emitting layer 512 was formed by co-evaporation of cgDBCzPA and 1,6BnfAPm-03 at a weight ratio of 1:0.05 (cgDBCzPA: 1,6BnfAPm-03). Note that the thickness of the second light-emitting layer 512 was 25 mm. Note that cgDBCzPA was the host material and 1,6BnfAPrn-03 was the fluorescent material the guest material) in the second light-emitting layer 512.

Then, on the second light-emitting layer 512, the electron-transport layer 533(1) was formed by evaporation of cgDBCzPA to a thickness of 5 nm. Then, on the electron-transport layer 533(1), the electron-transport layer 533(2) was formed by evaporation of NBphen to a thickness of 15 nm. Then, on the electron-transport layer 533(2), the electron-injection layer 534 was formed by evaporation of LiF to a thickness of 1 nm.

Then, on the electron-injection layer 534, the upper electrode 514(1) was formed by co-evaporation of Ag and Mg at a volume ratio of 1:0.1. Note that the thickness of the upper electrode 514(1) was 15 nm. Then, on the upper electrode 514(1), ITO was deposited as the upper electrode 514(2) by a sputtering method to a thickness of 70 nm.

Next, the sealing substrate 550 was prepared. Note that as illustrated in FIG. 56C and shown in Table 7, the sealing substrate 550 of the light-emitting element 10 is provided with the coloring layer 556. In Reference Example 1, a red (R) color filter was formed as the coloring layer 556.

Each of the light-emitting elements over the substrate 502 fabricated as described above was sealed by being bonded to the sealing substrate 550 in a glove box in a nitrogen atmosphere so as not to be exposed to the air. Note that the sealing method was the same as that in Example 1.

Through the above process, the light-emitting elements 10 and 11 were fabricated.

<4-2. Fabrication of Light-Emitting Element 12>

First, over the substrate 502, APC was formed as the lower electrode 504 by a sputtering method. Note that the thickness of the lower electrode 504 was 100 nm and the area of the lower electrode 504 was 4 mm$^2$ (2 mm×2 mm).

Then, over the lower electrode 504, ITSO was deposited as the transparent conductive layer 506 by a sputtering method. Note that the thickness of the transparent conductive layer 506 was 10 nm.

Then, as pretreatment of evaporation of an organic compound layer, the transparent conductive layer 506 side of the substrate 502 provided with the lower electrode 504 and the transparent conductive layer 506 was washed with water, baking was performed at 200° C. for one hour, and then UV ozone treatment was performed on a surface of the transparent conductive layer 506 for 370 seconds.

After that, the substrate 502 was transferred into a vacuum evaporation apparatus where the pressure had been reduced to approximately $10^{-4}$ Pa, and was subjected to vacuum baking at 170° C. for 60 minutes in a heating chamber of the vacuum evaporation apparatus, and then the substrate 502 was cooled down for about 30 minutes.

Then, the substrate 502 was fixed to a holder provided in the vacuum evaporation apparatus so that a surface of the substrate 502 over which the transparent conductive layer 506 was formed faced downward. In Reference Example 1, by a vacuum evaporation method, the hole-injection layer 531, the hole-transport layer 532, the second light-emitting layer 512, the electron-transport layer 533(1), the electron-transport layer 533(2), the electron-injection layer 534, the upper electrode 514(1), and the upper electrode 514(2) were sequentially formed. That is, the optical adjustment layer 508 and the first light-emitting layer 510 are not formed, unlike in the light-emitting elements 10 and 11. The fabrication method is described in detail below.

First, the pressure in the vacuum evaporation apparatus was reduced to $10^{-4}$ Pa. Then, on the transparent conductive layer 506, the hole-injection layer 531 was formed by co-evaporation of PCPPn and molybdenum oxide at a weight ratio of 2:1 (PcPPn:molybdenum oxide). Note that the thickness of the hole-injection layer 531 was 102.5 nm.

Then, the hole-transport layer 532 was formed on the hole-injection layer 531. As the hole-transport layer 532, PCPPn was evaporated. Note that the thickness of the hole-transport layer 532 was 15 nm.

Then, the second light-emitting layer 512 was formed on the hole-transport layer 532. The second light-emitting layer 512 was formed by co-evaporation of cgDBCzPA and 1,6BnfAPrn-03 at a weight ratio of 1:0.05 (cgDBCzPA: 1,6BnfAPrn-03). Note that the thickness of the second light-emitting layer 512 was 25 nm.

Then, on the second light-emitting layer 512, the electron-transport layer 533(1) was formed by evaporation of cgDBCzPA to a thickness of 5 nm. Then, on the electron-transport layer 533(1), the electron-transport layer 533(2) was formed by evaporation of NBphen to a thickness of 15 nm. Then, on the electron-transport layer 533(2), the electron-injection layer 534 was formed by evaporation of LiF to a thickness of 1 nm.

Then, on the electron-injection layer 534, the upper electrode 514(1) was formed by co-evaporation of Ag and Mg at a volume ratio of 1:0.1. Note that the thickness of the upper electrode 514(1) was 15 nm. Then, on the upper electrode 514(1), ITO was deposited as the upper electrode 514(2) by a sputtering method to a thickness of 70 nm.

Next, the sealing substrate 550 was prepared.

The light-emitting element over the substrate 502 fabricated as described above was sealed by being bonded to the sealing substrate 550 in a glove box in a nitrogen atmosphere so as not to be exposed to the air. Note that the sealing method was the same as that in Example 1.

Through the above process, the light-emitting element 12 was fabricated.

Note that in all the above evaporation steps for the light-emitting elements 10 to 12, a resistive heating method was used as an evaporation method.

<4-3. Characteristics of Light-Emitting Elements 10 to 12>

Figure 57A:
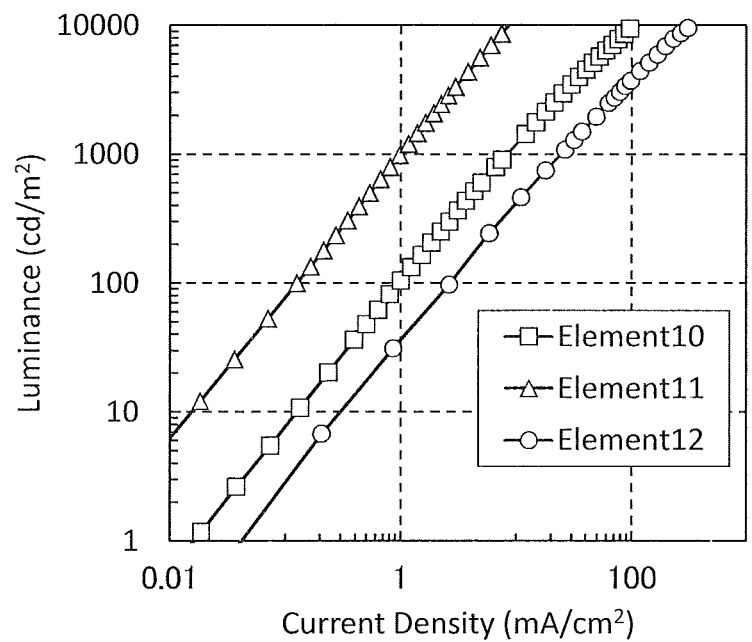
FIGS. 57A and 57B show luminance-current density characteristics and luminance-voltage characteristics, respectively, of light-emitting elements in Reference Example 1.
Figure 57B:
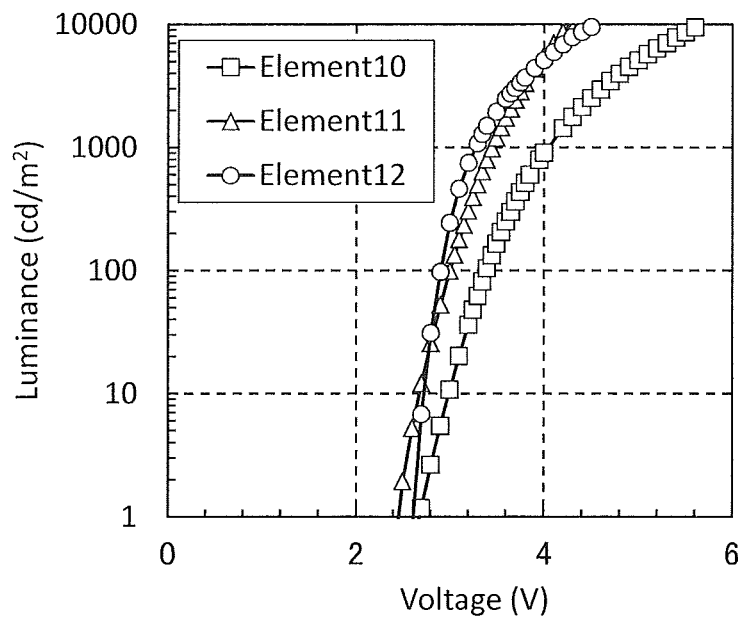
Figure 58A:
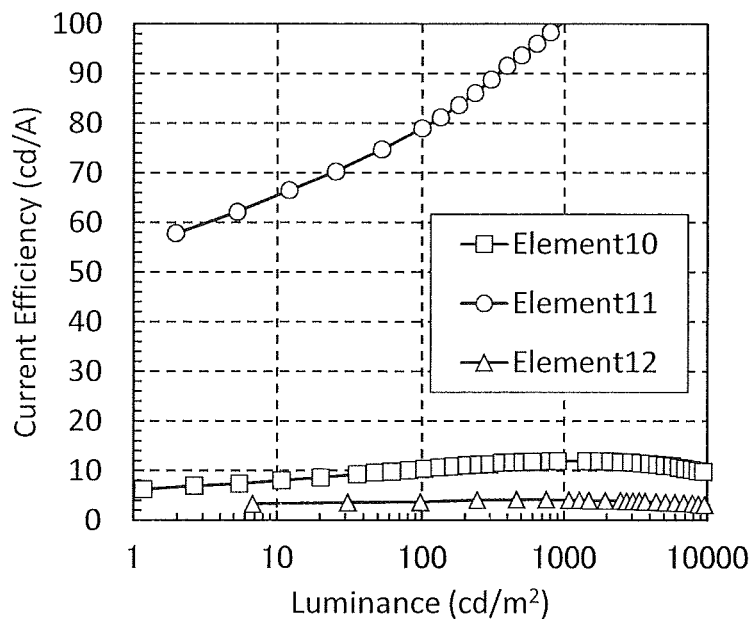
FIGS. 58A and 58B show current efficiency-luminance characteristics and emission spectra, respectively, of light-emitting elements in Reference Example 1.

FIGS. 57A, 57B, and 58A show luminance-current density characteristics, luminance-voltage characteristics, and current efficiency-luminance characteristics, respectively, of the light-emitting elements 10 to 12. Note that the measurements of the light-emitting elements were carried out at room temperature (in an atmosphere kept at 25° C.).

Table 8 shows element characteristics of the light-emitting elements 10 to 12 at around 1000 cd/m$^2$.

TABLE 8

|  | Voltage (V) | Current (mA) | Current density (mA/cm$^2$) | Chromaticity (x, y) | Luminance (cd/m$^2$) | Current efficiency (cd/A) |
| --- | --- | --- | --- | --- | --- | --- |
| Light-emitting element 10 | 4.0 | 0.30 | 7.6 | (0.67, 0.33) | 903 | 11.9 |
| Light-emitting element 11 | 3.5 | 0.04 | 1.0 | (0.28, 0.67) | 984 | 100.6 |
| Light-emitting element 12 | 3.3 | 1.06 | 26.5 | (0.14, 0.05) | 1082 | 4.1 |

Figure 58B:
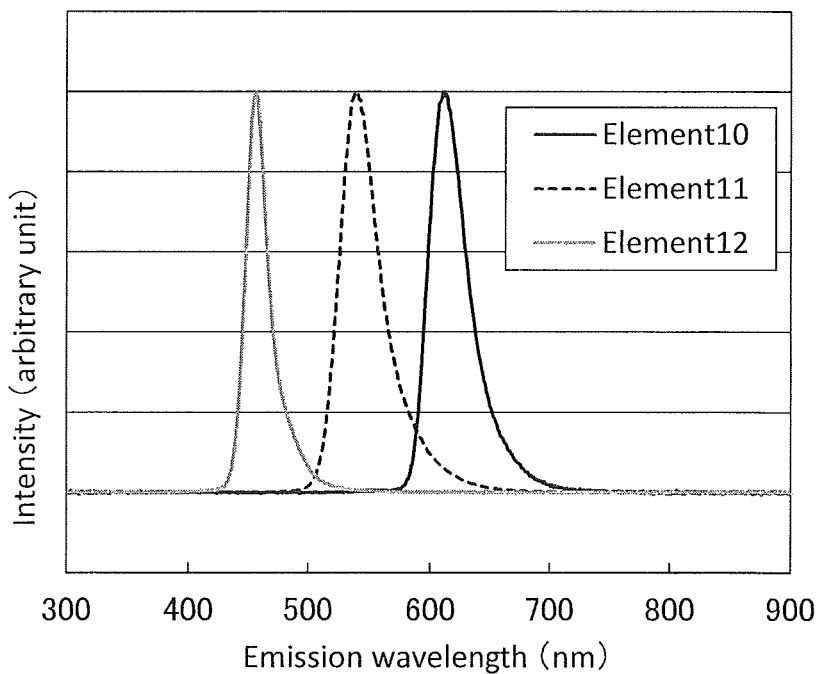

FIG. 58B shows emission spectra when a current at a current density of 2.5 mA/cm$^2$ was supplied to the light-emitting elements 10 to 12. As shown in FIG. 58B, an emission spectrum of the light-emitting element 10 has a peak in the red wavelength range, an emission spectrum of the light-emitting element 11 has a peak in the green wavelength range, and an emission spectrum of the light-emitting element 12 has a peak in the blue wavelength range. Note that as shown in Table 7, in each of the light-emitting elements 10 to 12, the distance between the lower electrode and the light-emitting layer was adjusted. Specifically, the distance between the lower electrode 504 of the light-emitting element 10 and the first light-emitting layer 510 of the light-emitting element 10 was 200 nm, the distance between the lower electrode 504 of the light-emitting element 11 and the first light-emitting layer 510 of the light-emitting element 11 was 165 nm, and the distance between the lower electrode 504 of the light-emitting element 12 and the second light-emitting layer 512 of the light-emitting element 12 was 127.5 nm.

As shown in Table 8, FIGS. 57A and 57B, and FIGS. 58A and 58B, the light-emitting elements 10 to 12 each have element characteristics having high efficiency and light emission in a desired wavelength range. Moreover, it is found that, in each of the light-emitting elements 10 and 11, the guest material in the second light-emitting layer 512 does not contribute to light emission regardless of the structures provided with the second light-emitting layer 512.

Reference Example 2

Light-emitting elements (a light-emitting element 13, a light-emitting element 14, and a light-emitting element 15) in modes different from those of the light-emitting elements described in Examples 1 to 3 and Reference Example 1 were fabricated and evaluated below. Note that the light-emitting element 13 is the same as the light-emitting element 10 described in Reference Example 1. Therefore, the fabrication method of the light-emitting element 13 is not described.

Figure 56D:
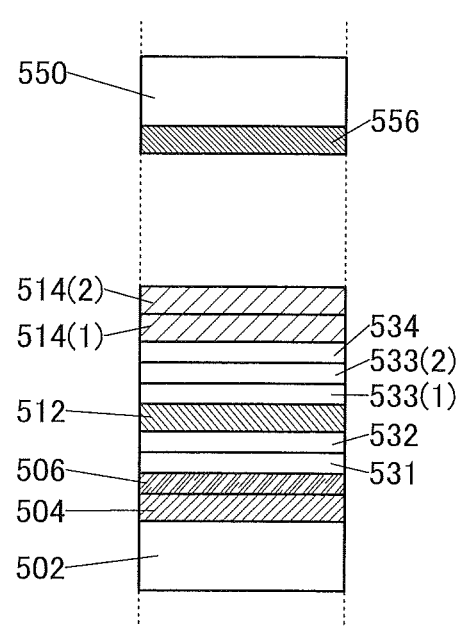

Schematic cross-sectional views of the light-emitting elements 13 and 14 are each in FIG. 56C, a schematic cross-sectional view of the light-emitting element 15 is in FIG. 56D, and the detailed structures of the light-emitting elements 13 to 15 are shown in Table 9. Note that the compounds used here are the same as those used in Reference Example 1.

TABLE 9

| | Layer | Reference numeral | Thickness (nm) | Material | Weight ratio |
|---|---|---|---|---|---|
| Light-emitting element 13 | Coloring layer | 556 | — | Red*[1] | — |
| | Upper electrode | 514(2) | 70 | ITO | — |
| | | 514(1) | 15 | Ag:Mg | 1:0.1*[2] |
| | Electron-injection layer | 534 | 1 | LiF | — |
| | Electron-transport layer | 533(2) | 15 | NBphen | — |
| | | 533(1) | 5 | cgDBCzPA | — |
| | Second light-emitting layer | 512 | 25 | cgDBCzPA:1,6BnfAPrn-03 | 1:0.05 |
| | First light-emitting layer | 510 | 25 | 2mDBTBPDBq-II:PCBBiF:Ir(tBuppm)$_2$(acac) | 0.8:0.2:0.06 |
| | Optical adjustment layer | 508 | 20 | BPAFLP | — |
| | Hole-transport layer | 532 | 15 | PCPPn | — |
| | Hole-injection layer | 531 | 55 | PCPPn:MoO$_x$ | 2:1 |
| | Transparent conductive layer | 506 | 110 | ITSO | — |
| | Lower electrode | 504 | 100 | APC | — |
| Light-emitting element 14 | Coloring layer | 556 | — | Green*[1] | — |
| | Upper electrode | 514(2) | 70 | ITO | — |
| | | 514(1) | 15 | Ag:Mg | 1:0.1*[2] |
| | Electron-injection layer | 534 | 1 | LiF | — |
| | Electron-transport layer | 533(2) | 15 | NBphen | — |
| | | 533(1) | 5 | cgDBCzPA | — |
| | Second light-emitting layer | 512 | 25 | cgDBCzPA:1,6BnfAPrn-03 | 1:0.05 |
| | First light-emitting layer | 510 | 25 | 2mDBTBPDBq-II:PCBBiF:Ir(tBuppm)$_2$(acac) | 0.8:0.2:0.06 |
| | Optical adjustment layer | 508 | 20 | BPAFLP | — |
| | Hole-transport layer | 532 | 15 | PCPPn | — |
| | Hole-injection layer | 531 | 40 | PCPPn:MoO$_x$ | 2:1 |
| | Transparent conductive layer | 506 | 85 | ITSO | — |
| | Lower electrode | 504 | 100 | APC | — |
| Light-emitting element 15 | Coloring layer | 556 | — | Blue*[1] | — |
| | Upper electrode | 514(2) | 70 | ITO | — |
| | Electron-injection layer | 514(1) | 15 | Ag:Mg | 1:0.1*[2] |
| | | 534 | 1 | LiF | — |
| | Electron-transport layer | 533(2) | 15 | NBphen | — |
| | | 533(1) | 5 | cgDBCzPA | — |
| | Second light-emitting layer | 512 | 25 | cgDBCzPA:1,6BnfAPrn-03 | 1:0.05 |
| | First light-emitting layer | — | — | — | — |
| | Optical adjustment layer | — | — | — | — |
| | Hole-transport layer | 532 | 15 | PCPPn | — |
| | Hole-injection layer | 531 | 102.5 | PCPPn:MoO$_x$ | 2:1 |
| | Transparent conductive layer | 506 | 10 | ITSO | — |
| | Lower electrode | 504 | 100 | APC | — |

*[1]color
*[2]volume ratio

<5-1. Fabrication of Light-Emitting Elements 13 and 14>

First, over the substrate 502, APC was formed as the lower electrode 504 by a sputtering method. Note that the thickness of the lower electrode 504 was 100 nm and the area of the lower electrode 504 was 4 mm$^2$ (2 mm×2 mm).

Then, over the lower electrode 504, ITSO was deposited as the transparent conductive layer 506 by a sputtering method. Note that the thickness of the transparent conductive layer 506 was 110 nm in the light-emitting element 13, and the thickness of the transparent conductive layer 506 was 85 nm in the light-emitting element 14.

Then, as pretreatment of evaporation of an organic compound layer, the transparent conductive layer 506 side of the substrate 502 provided with the lower electrode 504 and the transparent conductive layer 506 was washed with water, baking was performed at 200° C. for one hour, and then UV ozone treatment was performed on a surface of the transparent conductive layer 506 for 370 seconds.

After that, the substrate 502 was transferred into a vacuum evaporation apparatus where the pressure had been reduced to approximately 10$^{-4}$ Pa, and was subjected to vacuum baking at 170° C. for 60 minutes in a heating chamber of the vacuum evaporation apparatus, and then the substrate 502 was cooled down for about 30 minutes.

Then, the substrate 502 was fixed to a holder provided in the vacuum evaporation apparatus so that a surface of the substrate 502 over which the transparent conductive layer 506 was formed faced downward. In Reference Example 2, by a vacuum evaporation method, the hole-injection layer 531, the hole-transport layer 532, the optical adjustment layer 508, the first light-emitting layer 510, the second light-emitting layer 512, the electron-transport layer 533(1), the electron-transport layer 533(2), the electron-injection layer 534, the upper electrode 514(1), and the upper electrode 514(2) were sequentially formed. The fabrication method is described in detail below.

First, the pressure in the vacuum evaporation apparatus was reduced to $10^{-4}$ Pa. Then, on the transparent conductive layer 506, the hole-injection layer 531 was formed by co-evaporation of PCPPn and molybdenum oxide at a weight ratio of 2:1 (PcPPn:molybdenum oxide). Note that the thickness of the hole-injection layer 531 was 55 nm in the light-emitting element 13, and the thickness of the hole-injection layer 531 was 40 nm in the light-emitting element 14.

Then, the hole-transport layer 532 was formed on the hole-injection layer 531. As the hole-transport layer 532, PCPPn was evaporated. Note that the thickness of the hole-transport layer 532 was 15 nm.

Then, the optical adjustment layer 508 was formed on the hole-transport layer 532. As the optical adjustment layer 508, BPAFLP was evaporated to a thickness of 20 nm.

Then, the first light-emitting layer 510 was formed on the optical adjustment layer 508. The first light-emitting layer 510 was formed by co-evaporation of 2mDBTBPDBq-II, PCBBiF, and Ir(tBuppm)$_2$(acac) at a weight ratio of 0.8:0.2: 0.06 (2mDBTBPDBq-II:PCBBiF: Ir(tBuppm)$_2$(acac)). Note that the thickness of the first light-emitting layer 510 was 25 nm.

Then, the second light-emitting layer 512 was formed on the first light-emitting layer 510. The second light-emitting layer 512 was formed by co-evaporation of cgDBCzPA and 1,6BnfAPrn-03 at a weight ratio of 1:0.05 (cgDBCzPA: 1,6BnfAPrn-03). Note that the thickness of the second light-emitting layer 512 was 25 nm.

Then, on the second light-emitting layer 512, the electron-transport layer 533(1) was formed by evaporation of cgDBCzPA to a thickness of 5 nm. Then, on the electron-transport layer 533(1), the electron-transport layer 533(2) was formed by evaporation of NBphen to a thickness of 15 nm. Then, on the electron-transport layer 533(2), the electron-injection layer 534 was formed by evaporation of LiF to a thickness of 1 nm.

Then, on the electron-injection layer 534, the upper electrode 514(1) was formed by co-evaporation of Ag and Mg at a volume ratio of 1:0.1. Note that the thickness of the upper electrode 514(1) was 15 nm. Then, on the upper electrode 514(1), ITO was deposited as the upper electrode 514(2) by a sputtering method to a thickness of 70 nm.

Note that as illustrated in FIG. 56C and shown in Table 9, the sealing substrates 550 of the light-emitting elements 13 and 14 are each provided with the coloring layer 556. In Reference Example 2, a red (R) color filter was formed as the coloring layer 556 of the light-emitting element 13, and a green (G) color filter was formed as the coloring layer 556 of the light-emitting element 14.

Each of the light-emitting elements over the substrate 502 fabricated as described above was sealed by being bonded to the sealing substrate 550 in a glove box in a nitrogen atmosphere so as not to be exposed to the air. Note that the sealing method was the same as that in Example 1.

Through the above process, the light-emitting elements 13 and 14 were fabricated.

<5-2. Fabrication of Light-Emitting Element 15>

First, over the substrate 502, APC was formed as the lower electrode 504 by a sputtering method. Note that the thickness of the lower electrode 504 was 100 nm and the area of the lower electrode 504 was 4 mm$^2$ (2 mm×2 mm).

Then, over the lower electrode 504, ITSO was deposited as the transparent conductive layer 506 by a sputtering method. Note that the thickness of the transparent conductive layer 506 was 10 nm.

Then, as pretreatment of evaporation of an organic compound layer, the transparent conductive layer 506 side of the substrate 502 provided with the lower electrode 504 and the transparent conductive layer 506 was washed with water, baking was performed at 200° C. for one hour, and then UV ozone treatment was performed on a surface of the transparent conductive layer 506 for 370 seconds.

After that, the substrate 502 was transferred into a vacuum evaporation apparatus where the pressure had been reduced to approximately $10^{-4}$ Pa, and was subjected to vacuum baking at 170° C. for 60 minutes in a heating chamber of the vacuum evaporation apparatus, and then the substrate 502 was cooled down for about 30 minutes.

Then, the substrate 502 was fixed to a holder provided in the vacuum evaporation apparatus so that a surface of the substrate 502 over which the transparent conductive layer 506 was formed faced downward. In Reference Example 2, by a vacuum evaporation method, the hole-injection layer 531, the hole-transport layer 532, the second light-emitting layer 512, the electron-transport layer 533(1), the electron-transport layer 533(2), the electron-injection layer 534, the upper electrode 514(1), and the upper electrode 514(2) were sequentially formed. That is, the optical adjustment layer 508 and the first light-emitting layer 510 are not formed, unlike in the light-emitting elements 13 and 14. The fabrication method is described in detail below.

First, the pressure in the vacuum evaporation apparatus was reduced to $10^{-4}$ Pa. Then, on the transparent conductive layer 506, the hole-injection layer 531 was formed by co-evaporation of PCPPn and molybdenum oxide at a weight ratio of 2:1 (PcPPn:molybdenum oxide). Note that the thickness of the hole-injection layer 531 was 102.5 nm.

Then, the hole-transport layer 532 was formed on the hole-injection layer 531. As the hole-transport layer 532, PCPPn was evaporated. Note that the thickness of the hole-transport layer 532 was 15 nm.

Then, the second light-emitting layer 512 was formed on the hole-transport layer 532. The second light-emitting layer 512 was formed by co-evaporation of cgDBCzPA and 1,6BnfAPrn-03 at a weight ratio of 1:0.05 (cgDBCzPA: 1,6BnfAPm-03). Note that the thickness of the second light-emitting layer 512 was 25 nm.

Then, on the second light-emitting layer 512, the electron-transport layer 533(1) was formed by evaporation of cgDBCzPA to a thickness of 5 nm. Then, on the electron-transport layer 533(1), the electron-transport layer 533(2) was formed by evaporation of NBphen to a thickness of 15 nm. Then, on the electron-transport layer 533(2), the electron-injection layer 534 was formed by evaporation of LiF to a thickness of 1 nm.

Then, on the electron-injection layer 534, the upper electrode 514(1) was formed by co-evaporation of Ag and Mg at a volume ratio of 1:0.1. Note that the thickness of the upper electrode 514(1) was 15 nm. Then, on the upper electrode 514(1), ITO was deposited as the upper electrode 514(2) by a sputtering method to a thickness of 70 nm.

Note that as illustrated in FIG. 56D and shown in Table 9, the sealing substrate 550 of the light-emitting element 15 is provided with the coloring layer 556. In Reference Example 2, a blue (B) color filter was formed as the coloring layer 556 of the light-emitting element 15.

The light-emitting element over the substrate 502 fabricated as described above was sealed by being bonded to the sealing substrate 550 in a glove box in a nitrogen atmosphere so as not to be exposed to the air. Note that the sealing method was the same as that in Example 1.

Through the above process, the light-emitting element 15 was fabricated.

Note that in all the above evaporation steps for the light-emitting elements 13 to 15, a resistive heating method was used as an evaporation method.

<5-3. Characteristics of Light-Emitting Elements 13 to 15>

Figure 59A:
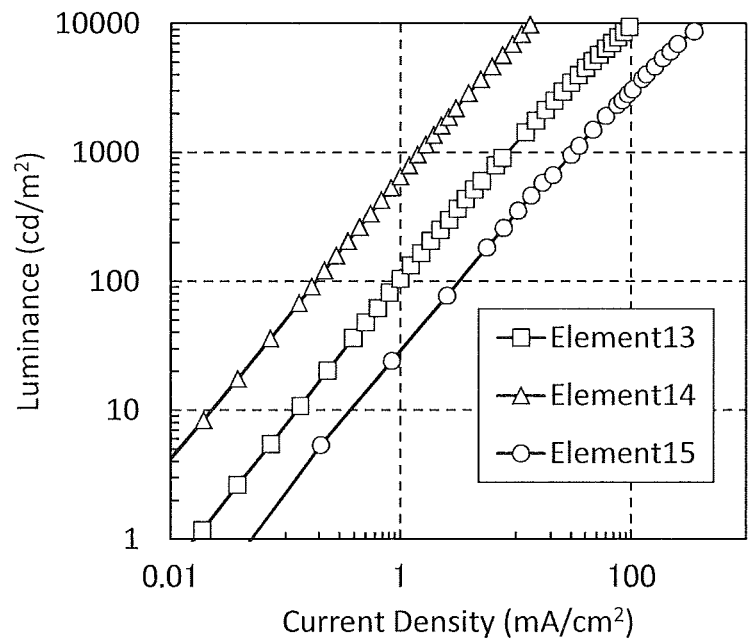
FIGS. 59A and 59B show luminance-current density characteristics and luminance-voltage characteristics, respectively, of light-emitting elements in Reference Example 2.
Figure 59B:
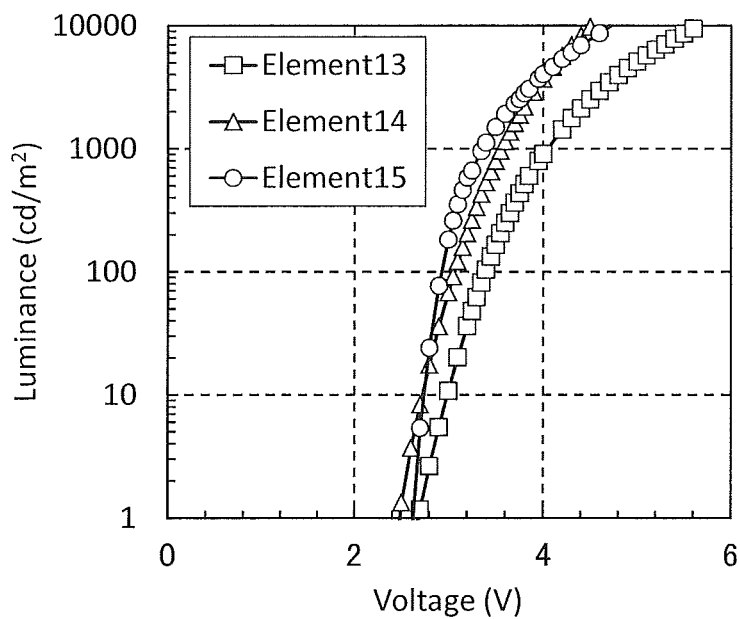
Figure 60A:
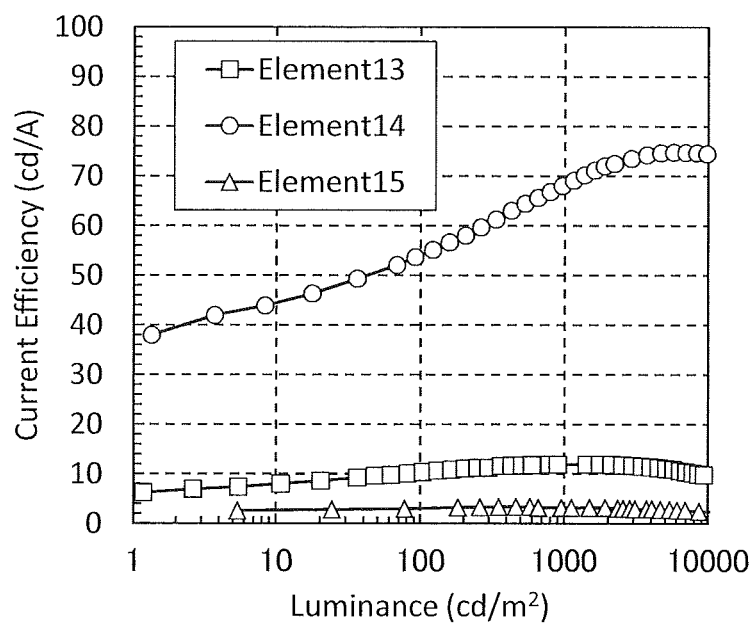
FIGS. 60A and 60B show current efficiency-luminance characteristics and emission spectra, respectively, of light-emitting elements in Reference Example 2.

FIGS. 59A, 59B, and 60A show luminance-current density characteristics, luminance-voltage characteristics, and current efficiency-luminance characteristics, respectively, of the light-emitting elements 13 to 15. Note that the measurements of the light-emitting elements were carried out at room temperature (in an atmosphere kept at 25° C.).

Table 10 shows element characteristics of the light-emitting elements 13 to 15 at around 1000 cd/m$^2$.

TABLE 10

|  | Voltage (V) | Current (mA) | Current density (mA/cm$^2$) | Chromaticity (x, y) | Luminance (cd/m$^2$) | Current efficiency (cd/A) |
| --- | --- | --- | --- | --- | --- | --- |
| Light-emitting element 13 | 4.0 | 0.30 | 7.6 | (0.67, 0.33) | 903 | 11.9 |
| Light-emitting element 14 | 3.6 | 0.06 | 1.4 | (0.28, 0.71) | 965 | 68.0 |
| Light-emitting element 15 | 3.4 | 1.20 | 30.0 | (0.14, 0.05) | 957 | 3.2 |

Figure 60B:
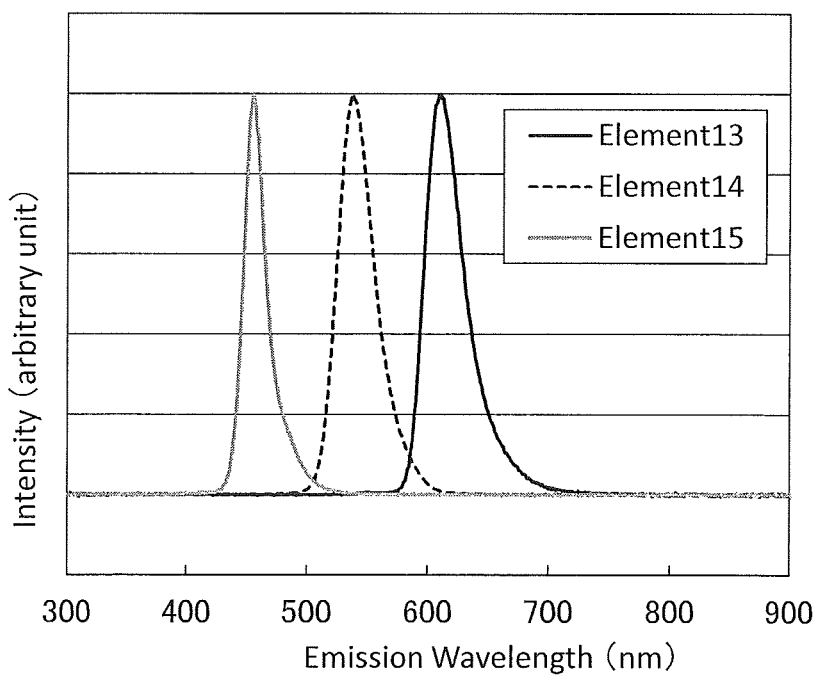

FIG. 60B shows emission spectra when a current at a current density of 2.5 mA/cm$^2$ was supplied to the light-emitting elements 13 to 15. As shown in FIG. 60B, an emission spectrum of the light-emitting element 13 has a peak in the red wavelength range, an emission spectrum of the light-emitting element 14 has a peak in the green wavelength range, and an emission spectrum of the light-emitting element 15 has a peak in the blue wavelength range.

As shown in Table 10, FIGS. 59A and 59B, and FIGS. 60A and 60B, the light-emitting elements 13 to 15 each have element characteristics having high efficiency and light emission in a desired wavelength range. Since the light-emitting elements 14 and 15 are each provided with the coloring layer 556, they have higher color purity than the light-emitting elements 11 and 12 in Reference Example 1.

Reference Example 3

Light-emitting elements (a light-emitting element 16, a light-emitting element 17, and a light-emitting element 18) in modes different from those of the light-emitting elements described in Examples 1 to 3 and Reference Examples 1 and 2 were fabricated and evaluated below.

Schematic cross-sectional views of the light-emitting elements 16 and 17 are each illustrated in FIG. 56C, a schematic cross-sectional view of the light-emitting element 18 is illustrated in FIG. 56D, and the detailed structures of the elements of the light-emitting elements 16 to 18 are shown in Table 11. Note that the compounds used here are the same as those used in Reference Example 1.

TABLE 11

|  | Layer | Reference numeral | Thickness (nm) | Material | Weight ratio |
|---|---|---|---|---|---|
| Light-emitting element 16 | Coloring layer | 556 | — | Red*[1] | — |
|  | Upper electrode | 514(2) | 70 | ITO | — |
|  |  | 514(1) | 15 | Ag:Mg | 1:0.1*[2] |
|  | Electron-injection layer | 534 | 1 | LiF | — |
|  | Electron-transport layer | 533(2) | 15 | NBphen | — |
|  |  | 533(1) | 5 | cgDBCzPA | — |
|  | Second light-emitting layer | 512 | 25 | cgDBCzPA:1,6BnfAPrn-03 | 1:0.02 |
|  | First light-emitting layer | 510(2) | 15 | 2mDBTBPDBq-II:Ir(tBuppm)$_2$(acac) | 1:0.06 |
|  |  | 510(1) | 20 | 2mDBTBPDBq-II:PCBBiF:Ir(tBuppm)$_2$(acac) | 0.8:0.2:0.06 |
|  | Optical adjustment layer | 508 | 25 | PCBBiF | — |
|  | Hole-transport layer | 532 | 15 | PCPPn | — |
|  | Hole-injection layer | 531 | 40 | PCPPn:MoO$_x$ | 2:1 |
|  | Transparent conductive layer | 506 | 110 | ITSO | — |
|  | Lower electrode | 504 | 100 | APC | — |
| Light-emitting element 17 | Coloring layer | 556 | — | Green*[1] | — |
|  | Upper electrode | 514(2) | 70 | ITO | — |
|  |  | 514(1) | 15 | Ag:Mg | 1:0.1*[2] |
|  | Electron-injection layer | 534 | 1 | LiF | — |
|  | Electron-transport layer | 533(2) | 15 | NBphen | — |
|  |  | 533(1) | 5 | cgDBCzPA | — |
|  | Second light-emitting layer | 512 | 25 | cgDBCzPA:1,6BnfAPrn-03 | 1:0.02 |
|  | First light-emitting layer | 510(2) | 15 | 2mDBTBPDBq-II:Ir(tBuppm)$_2$(acac) | 1:0.06 |
|  |  | 510(1) | 20 | 2mDBTBPDBq-II:PCBBiF:Ir(tBuppm)$_2$(acac) | 0.8:0.2:0.06 |
|  | Optical adjustment layer | 508 | 25 | PCBBiF | — |
|  | Hole-transport layer | 532 | 15 | PCPPn | — |
|  | Hole-injection layer | 531 | 32.5 | PCPPn:MoO$_x$ | 2:1 |
|  | Transparent conductive layer | 506 | 85 | ITSO | — |
|  | Lower electrode | 504 | 100 | APC | — |
| Light-emitting element 18 | Coloring layer | 556 | — | Blue*[1] | — |
|  | Upper electrode | 514(2) | 70 | ITO | — |
|  |  | 514(1) | 15 | Ag:Mg | 1:0.1*[2] |
|  | Electron-injection layer | 534 | 1 | LiF | — |
|  | Electron-transport layer | 533(2) | 15 | NBphen | — |
|  |  | 533(1) | 5 | cgDBCzPA | — |
|  | Second light-emitting layer | 512 | 25 | cgDBCzPA:1,6BnfAPrn-03 | 1:0.02 |
|  | First light-emitting layer | — | — | — | — |
|  | Optical adjustment layer | — | — | — | — |
|  | Hole-transport layer | 532 | 15 | PCPPn | — |
|  | Hole-injection layer | 531 | 30 | PCPPn:MoO$_x$ | 2:1 |
|  | Transparent conductive layer | 506 | 85 | ITSO | — |
|  | Lower electrode | 504 | 100 | APC | — |

*[1] color
*[2] volume ratio

<6-1. Fabrication of Light-Emitting Elements 16 and 17>

First, over the substrate 502, APC was formed as the lower electrode 504 by a sputtering method. Note that the thickness of the lower electrode 504 was 100 nm and the area of the lower electrode 504 was 4 mm$^2$ (2 mm×2 mm).

Then, over the lower electrode 504, a film of ITSO was formed as the transparent conductive layer 506 by a sputtering method. Note that the thickness of the transparent conductive layer 506 was 110 nm in the light-emitting element 16, and the thickness of the transparent conductive layer 506 was 85 nm in the light-emitting element 17.

Then, as pretreatment of evaporation of an organic compound layer, the transparent conductive layer 506 side of the substrate 502 provided with the lower electrode 504 and the transparent conductive layer 506 was washed with water, baking was performed at 200° C. for one hour, and then UV ozone treatment was performed on a surface of the transparent conductive layer 506 for 370 seconds.

After that, the substrate 502 was transferred into a vacuum evaporation apparatus where the pressure had been reduced to approximately 10$^{-4}$ Pa, and was subjected to vacuum baking at 170° C. for 60 minutes in a heating chamber of the vacuum evaporation apparatus, and then the substrate 502 was cooled down for about 30 minutes.

Then, the substrate 502 was fixed to a holder provided in the vacuum evaporation apparatus so that a surface of the substrate 502 over which the transparent conductive layer 506 was formed faced downward. In Reference Example 3, by a vacuum evaporation method, the hole-injection layer 531, the hole-transport layer 532, the optical adjustment layer 508, the first light-emitting layer 510, the second light-emitting layer 512, the electron-transport layer 533(1), the electron-transport layer 533(2), the electron-injection layer 534, the upper electrode 514(1), and the upper electrode 514(2) were sequentially formed. The fabrication method is described in detail below.

First, the pressure in the vacuum evaporation apparatus was reduced to $10^{-4}$ Pa. Then, on the transparent conductive layer 506, the hole-injection layer 531 was formed by co-evaporation of PCPPn and molybdenum oxide at a weight ratio of 2:1 (PcPPn:molybdenum oxide). Note that the thickness of the hole-injection layer 531 was 40 nm in the light-emitting element 16, and the thickness of the hole-injection layer 531 was 32.5 nm in the light-emitting element 17.

Then, the hole-transport layer 532 was formed on the hole-injection layer 531. As the hole-transport layer 532, PCPPn was evaporated. Note that the thickness of the hole-transport layer 532 was 15 nm.

Then, the optical adjustment layer 508 was formed on the hole-transport layer 532. As the optical adjustment layer 508, PCBBiF was evaporated to a thickness of 25 nm.

Then, the first light-emitting layer 510(1) was formed on the optical adjustment layer 508. The first light-emitting layer 510(1) was formed by co-evaporation of 2mDBTBP-DBq-II, PCBBiF, and Ir(tBuppm)$_2$(acac) at a weight ratio of 0.8:0.2:0.06 (2mDBTBPDBq-II:PCBBiF: Ir(tBuppm)$_2$(acac)). Note that the thickness of the first light-emitting layer 510(1) was 20 nm.

Then, the first light-emitting layer 510(2) was formed on the first light-emitting layer 510(1). Then, the first light-emitting layer 510(2) was formed by co-evaporation of 2mDBTBPDBq-II and Ir(tBuppm)$_2$(acac) at a weight ratio of 1:0.06 (2mDBTBPDBq-II: Ir(tBuppm)$_2$(acac)). Note that the thickness of the first light-emitting layer 510(2) was 15 nm.

Then, the second light-emitting layer 512 was formed on the first light-emitting layer 510(2). The second light-emitting layer 512 was formed by co-evaporation of cgDBCzPA and 1,6BnfAPrn-03 at a weight ratio of 1:0.02 (cgDBCzPA: 1,6BnfAPrn-03). Note that the thickness of the second light-emitting layer 512 was 25 nm.

Then, on the second light-emitting layer 512, the electron-transport layer 533(1) was formed by evaporation of cgDBCzPA to a thickness of 5 nm. Then, on the electron-transport layer 533(1), the electron-transport layer 533(2) was formed by evaporation of NBphen to a thickness of 15 nm. Then, on the electron-transport layer 533(2), the electron-injection layer 534 was formed by evaporation of LiF to a thickness of 1 nm.

Then, on the electron-injection layer 534, the upper electrode 514(1) was formed by co-evaporation of Ag and Mg at a volume ratio of 1:0.1. Note that the thickness of the upper electrode 514(1) was 15 nm. Then, on the upper electrode 514(1), ITO was deposited as the upper electrode 514(2) by a sputtering method to a thickness of 70 nm.

Note that as illustrated in FIG. 56C and shown in Table 11, the sealing substrate 550 of the light-emitting elements 16 and 17 are each provided with the coloring layer 556. In Reference Example 3, a red (R) color filter was formed as the coloring layer 556 of the light-emitting element 16, and a green (G) color filter was formed as the coloring layer 556 of the light-emitting element 17.

Each of the light-emitting elements over the substrate 502 fabricated as described above was sealed by being bonded to the sealing substrate 550 in a glove box in a nitrogen atmosphere so as not to be exposed to the air. Note that the sealing method was the same as that in Example 1.

Through the above process, the light-emitting elements 16 and 17 were fabricated.

<6-2. Fabrication of Light-Emitting Element 18>

First, over the substrate 502, APC was formed as the lower electrode 504 by a sputtering method. Note that the thickness of the lower electrode 504 was 100 nm and the area of the lower electrode 504 was 4 mm$^2$ (2 mm×2 mm).

Then, over the lower electrode 504, ITSO was deposited as the transparent conductive layer 506 by a sputtering method. Note that the thickness of the transparent conductive layer 506 was 85 nm.

Then, as pretreatment of evaporation of an organic compound layer, the transparent conductive layer 506 side of the substrate 502 provided with the lower electrode 504 and the transparent conductive layer 506 was washed with water, baking was performed at 200° C. for one hour, and then UV ozone treatment was performed on a surface of the transparent conductive layer 506 for 370 seconds.

After that, the substrate 502 was transferred into a vacuum evaporation apparatus where the pressure had been reduced to approximately $10^{-4}$ Pa, and was subjected to vacuum baking at 170° C. for 60 minutes in a heating chamber of the vacuum evaporation apparatus, and then the substrate 502 was cooled down for about 30 minutes.

Then, the substrate 502 was fixed to a holder provided in the vacuum evaporation apparatus so that a surface of the substrate 502 over which the transparent conductive layer 506 was formed faced downward. In Reference Example 3, by a vacuum evaporation method, the hole-injection layer 531, the hole-transport layer 532, the second light-emitting layer 512, the electron-transport layer 533(1), the electron-transport layer 533(2), the electron-injection layer 534, the upper electrode 514(1), and the upper electrode 514(2) were sequentially formed. That is, the optical adjustment layer 508 and the first light-emitting layer 510 are not formed, unlike the light-emitting elements 16 and 17. The fabrication method is described in detail below.

First, the pressure in the vacuum evaporation apparatus was reduced to $10^{-4}$ Pa. Then, on the transparent conductive layer 506, the hole-injection layer 531 was formed by co-evaporation of PCPPn and molybdenum oxide at a weight ratio of 2:1 (PcPPn:molybdenum oxide). Note that the thickness of the hole-injection layer 531 was 30 nm.

Then, the hole-transport layer 532 was formed on the hole-injection layer 531. As the hole-transport layer 532, PCPPn was evaporated. Note that the thickness of the hole-transport layer 532 was 15 nm.

Then, the second light-emitting layer 512 was formed on the hole-transport layer 532. The second light-emitting layer 512 was formed by co-evaporation of cgDBCzPA and 1,6BnfAPm-03 at a weight ratio of 1:0.02 (cgDBCzPA: 1,6BnfAPm-03). Note that the thickness of the second light-emitting layer 512 was 25 nm.

Then, on the second light-emitting layer 512, the electron-transport layer 533(1) was formed by evaporation of cgDB-CzPA to a thickness of 5 nm. Then, on the electron-transport layer 533(1), the electron-transport layer 533(2) was formed by evaporation of NBphen to a thickness of 15 nm. Then, on the electron-transport layer 533(2), the electron-injection layer 534 was formed by evaporation of LiF to a thickness of 1 nm.

Then, on the electron-injection layer 534, the upper electrode 514(1) was formed by co-evaporation of Ag and Mg at a volume ratio of 1:0.1. Note that the thickness of the upper electrode 514(1) was 15 nm. Then, on the upper electrode 514(1), ITO was deposited as the upper electrode 514(2) by a sputtering method to a thickness of 70 nm.

Note that as illustrated in FIG. 56D and shown in Table 11, the sealing substrate 550 of the light-emitting element 18 is provided with the coloring layer 556. In Reference Example 3, a blue (B) color filter was formed as the coloring layer 556 of the light-emitting element 18.

The light-emitting element over the substrate 502 fabricated as described above was sealed by being bonded to the sealing substrate 550 in a glove box in a nitrogen atmosphere so as not to be exposed to the air. Note that the sealing method was the same as that in Example 1.

Through the above process, the light-emitting element 18 was fabricated.

Note that in all the above evaporation steps for the light-emitting elements 16 to 18, a resistive heating method was used as an evaporation method.

<6-3. Characteristics of Light-Emitting Elements 16 to 18>

Figure 61A:
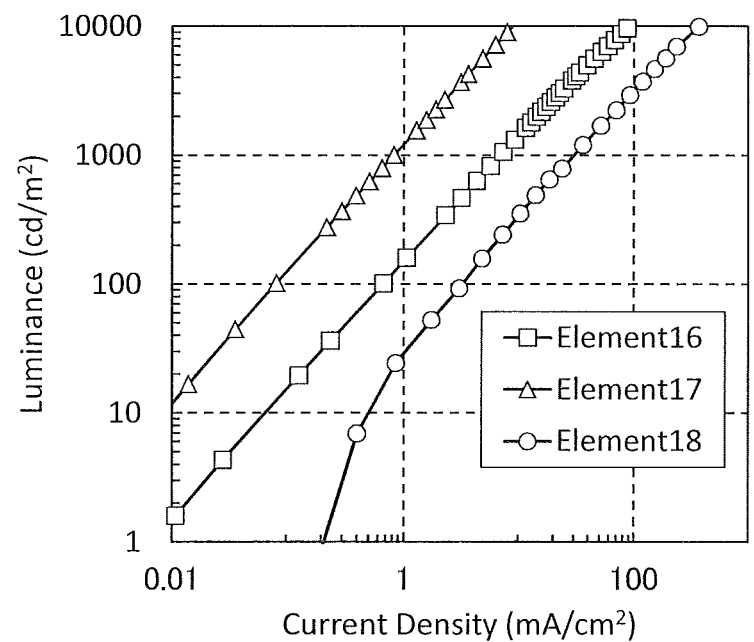
FIGS. 61A and 61B show luminance-current density characteristics and luminance-voltage characteristics, respectively, of light-emitting elements in Reference Example 3.
Figure 61B:
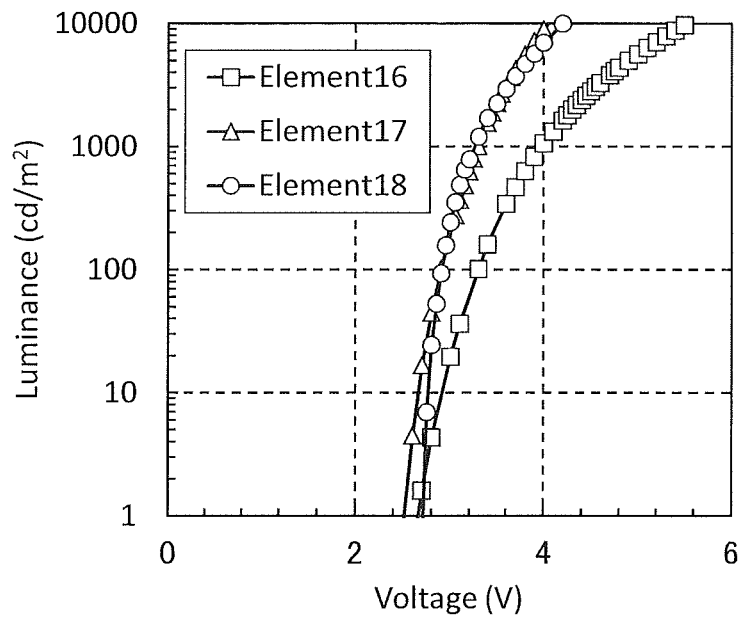
Figure 62A:
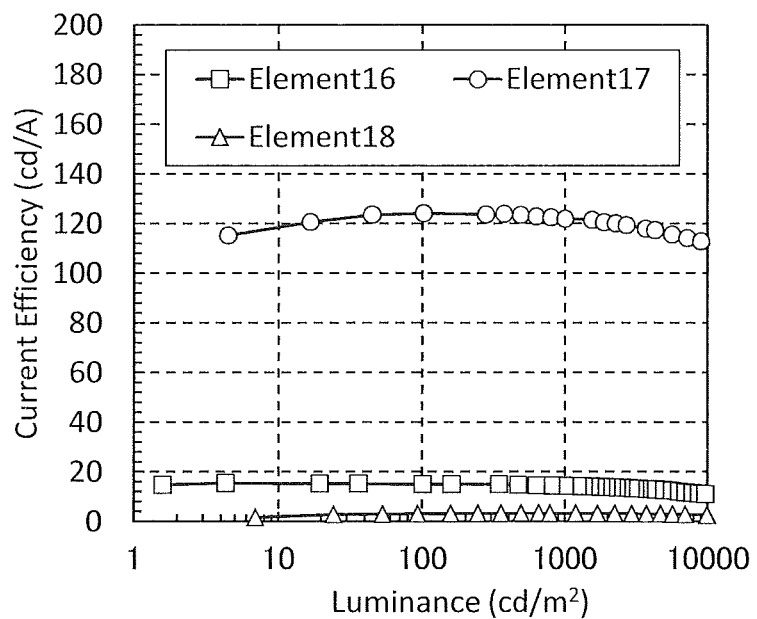
FIGS. 62A and 62B show current efficiency-luminance characteristics and emission spectra, respectively, of light-emitting elements in Reference Example 3.

FIGS. 61A, 61B, and 62A show luminance-current density characteristics, luminance-voltage characteristics, and current efficiency-luminance characteristics, respectively, of the light-emitting elements 16 to 18. Note that the measurements of the light-emitting elements were carried out at room temperature (in an atmosphere kept at 25° C.).

Table 12 shows element characteristics of the light-emitting elements 16 to 18 at around 1000 cd/m$^2$.

TABLE 12

|   | Voltage (V) | Current (mA) | Current density (mA/cm$^2$) | Chromaticity (x, y) | Luminance (cd/m$^2$) | Current efficiency (cd/A) |
|---|---|---|---|---|---|---|
| Light-emitting element 16 | 4.0 | 0.29 | 7.4 | (0.66, 0.34) | 1056 | 14.4 |
| Light-emitting element 17 | 3.3 | 0.03 | 0.8 | (0.30, 0.69) | 1005 | 122.0 |
| Light-emitting element 18 | 3.3 | 1.19 | 29.7 | (0.14, 0.05) | 953 | 3.2 |

Figure 62B:
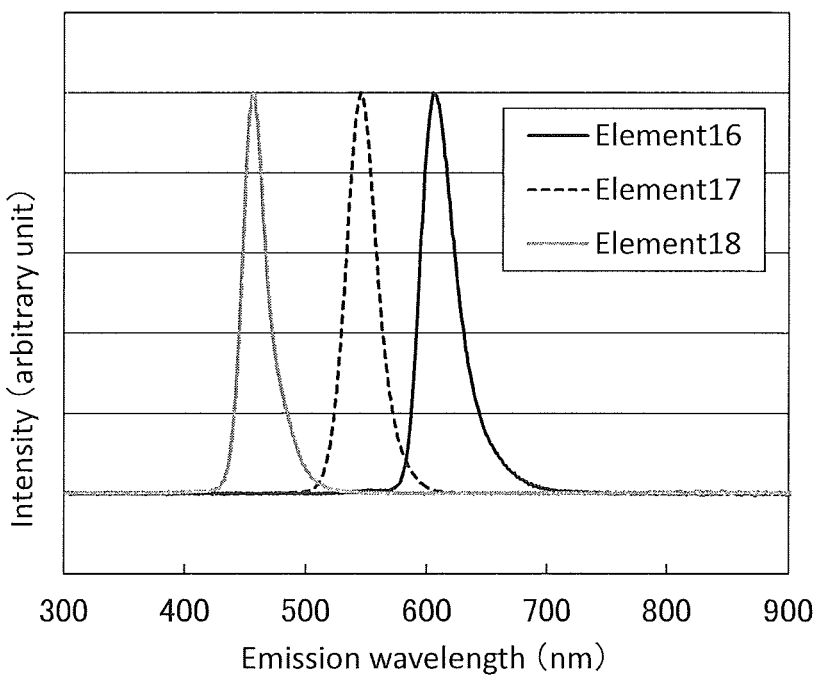

FIG. 62B shows emission spectra when a current at a current density of 2.5 mA/cm$^2$ was supplied to the light-emitting elements 16 to 18. As shown in FIG. 62B, an emission spectrum of the light-emitting element 16 has a peak in the red wavelength range, an emission spectrum of the light-emitting element 17 has a peak in the green wavelength range, and an emission spectrum of the light-emitting element 18 has a peak in the blue wavelength range.

As shown in Table 12, FIGS. 61A and 61B, and FIGS. 62A and 62B, the light-emitting elements 16 to 18 each have element characteristics having high efficiency and light emission in a desired wavelength range.

Figure 63:
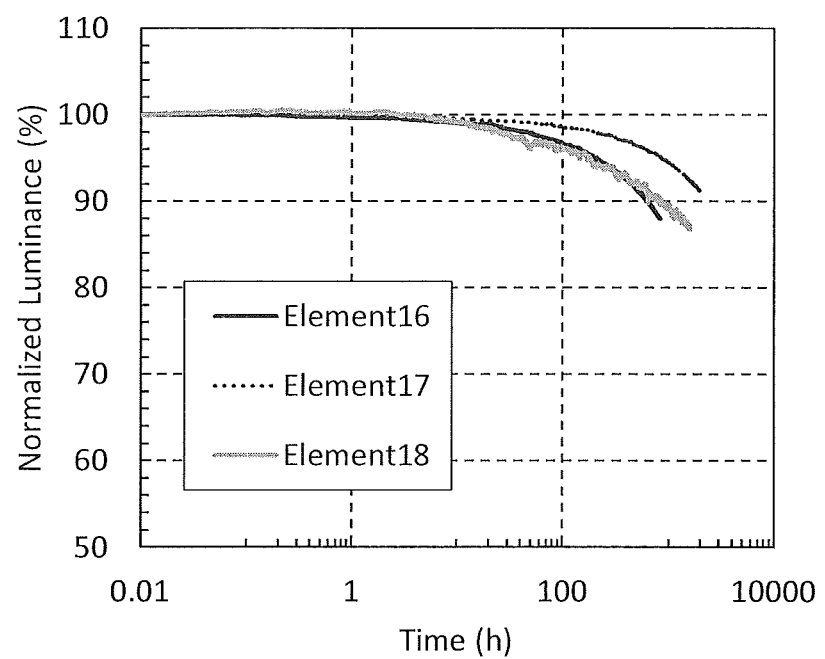
FIG. 63 shows normalized luminance-time characteristics of light-emitting elements in Reference Example 3.

Next, a reliability test was performed on each of the light-emitting elements 16 to 18. FIG. 63 shows results of the reliability tests.

In the reliability test, each of the light-emitting elements 16 to 18 was driven under the conditions where the initial luminance was 5000 cd/m$^2$ and the current density was constant. In FIG. 63, the vertical axis represents normalized luminance (%) with the initial luminance of 100%, and the horizontal axis represents driving time (h) of the element. The results in FIG. 63 indicate that the normalized luminance of the light-emitting element 16 after 831 hours was 88%, the normalized luminance of the light-emitting element 17 after 2013 hours was 91%, and the normalized luminance of the light-emitting element 18 after 1850 hours was 85%.

The results in FIGS. 61A and 61B, FIGS. 62A and 62B, and FIG. 63 indicate that the light-emitting elements 16 to 18, each of which is Reference Example 3, have excellent element characteristics (voltage-luminance characteristics, luminance-current efficiency characteristics, and voltage-current characteristics) and high reliability (normalized luminance-time characteristics). However, the light-emitting elements 16 to 18 leave room for improvement in reliability as compared with the light-emitting elements 7 to 9 of one embodiment of the present invention in Example 3.

Reference Example 4

A method for synthesizing 1,6BnfAPm-03 that is the organic compound used in any of the above examples and reference examples is described below. Note that the structure of 1,6BnfAPm-03 is shown below.

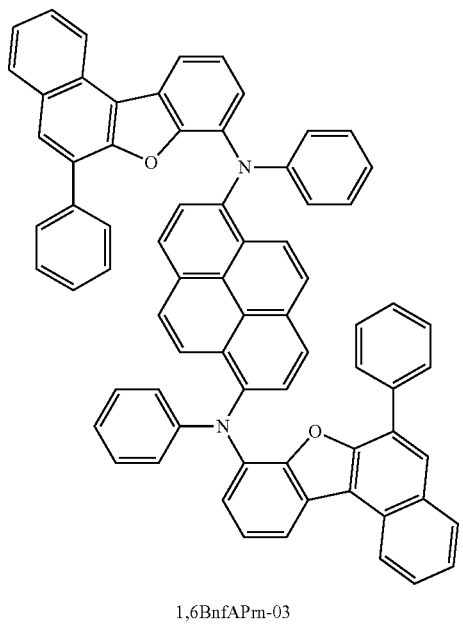 [SMILES: c1ccc(-c2cc3ccccc3c3c2oc2c(N(c4ccccc4)c4ccc5ccc6c(N(c7ccccc7)c7cccc8c7oc7c(-c9ccccc9)cc9ccccc9c78)ccc7ccc4c5c76)cccc23)cc1]

1,6BnfAPrn-03

Step 1: Synthesis of 6-iodobenzo[b]naphtho[1,2-d]furan

Into a 500 mL three-neck flask were put 8.5 g (39 mmol) of benzo[b]naphtho[1,2-d]furan, and the air in the flask was replaced with nitrogen. Then, 195 mL of tetrahydrofuran was added thereto. This solution was cooled to −75° C. Then, 25 mL (40 mmol) of n-butyllithium (a 1.59 mol/L n-hexane solution) was dropped into this solution. After the drop, the resulting solution was stirred at room temperature for one hour.

After a predetermined period of time, the resulting solution was cooled to −75° C. Then, a solution in which 10 g (40 mmol) of iodine had been dissolved in 40 mL of THF was dropped into this solution. After the drop, the resulting solution was stirred for 17 hours while the temperature of the solution was returned to room temperature. After a predetermined period of time, an aqueous solution of sodium thiosulfate was added to the mixture, and the resulting mixture was stirred for one hour. Then, an organic layer of the mixture was washed with water and dried with magnesium sulfate. After the drying, the mixture was gravity-filtered to give a solution. The resulting solution was suction-filtered through Celite (Catalog No. 531-16855 produced by Wako Pure Chemical Industries, Ltd.) and Florisil (Catalog No. 540-00135 produced by Wako Pure Chemical Industries, Ltd.) to give a filtrate. The resulting filtrate was concentrated to give a solid. The resulting solid was recrystallized from toluene to give 6.0 g (18 mmol) of a white powder of the target substance in 45% yield. A synthesis scheme of Step 1 is shown in (a-1).

(a-1)

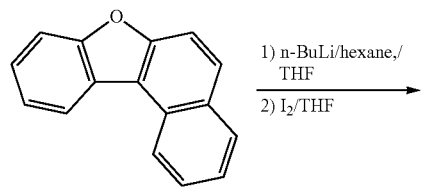

Step 2: Synthesis of 6-phenylbenzo[b]naphtho[1,2-d]furan

Into a 200 mL three-neck flask were put 6.0 g (18 mmol) of 6-iodobenzo[b]naphtho[1,2-d]furan, 2.4 g (19 mmol) of phenylboronic acid, 70 mL of toluene, 20 mL of ethanol, and 22 mL of an aqueous solution of potassium carbonate (2.0 mol/L). This mixture was degassed by being stirred while the pressure was reduced. After the degassing, the air in the flask was replaced with nitrogen, and then 480 mg (0.42 mmol) of tetrakis(triphenylphosphine)palladium(0) was added to the mixture. The resulting mixture was stirred at 90° C. under a nitrogen stream for 12 hours.

After a predetermined period of time, water was added to the mixture, and an aqueous layer was subjected to extraction with toluene. The extracted solution and an organic layer were combined, and the mixture was washed with water and then dried with magnesium sulfate. The mixture was gravity-filtered to give a filtrate. The resulting filtrate was concentrated to give a solid, and the resulting solid was dissolved in toluene. The resulting solution was suction-filtered through Celite (Catalog No. 531-16855 produced by Wako Pure Chemical Industries, Ltd.), Florisil (Catalog No. 540-00135 produced by Wako Pure Chemical Industries, Ltd.), and alumina to give a filtrate. The resulting filtrate was concentrated to give a solid. The resulting solid was recrystallized from toluene to give a 4.9 g (17 mmol) of a white solid of the target substance in 93% yield. A synthesis scheme of Step 2 is shown in (a-2).

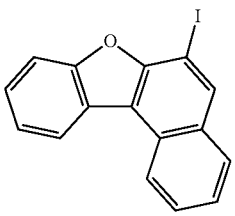

(a-2)

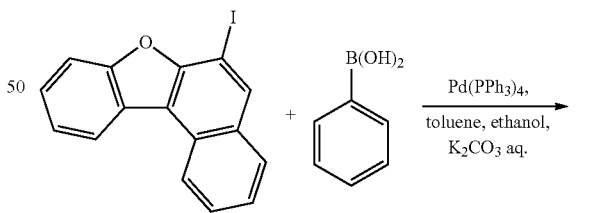

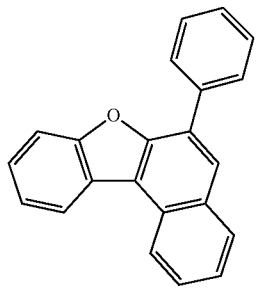

Step 3: Synthesis of
8-iodo-6-phenylbenzo[b]naphtho[1,2-d]furan

Into a 300 mL three-neck flask was put 4.9 g (17 mmol) of 6-phenylbenzo[b]naphtho[1,2-d]furan, and the air in the flask was replaced with nitrogen. Then, 87 mL of tetrahydrofuran (THF) was added thereto. The resulting solution was cooled to −75° C. Then, 11 mL (18 mmol) of n-butyllithium (a 1.59 mol/L n-hexane solution) was dropped into the solution. After the drop, the resulting solution was stirred at room temperature for one hour. Then, a solution in which 4.6 g (18 mmol) of iodine had been dissolved in 18 mL of THF was dropped into the resulting solution.

The resulting solution was stirred for 17 hours while the temperature of the solution was returned to room temperature. After a predetermined period of time, an aqueous solution of sodium thiosulfate was added to the mixture, and the resulting mixture was stirred for one hour. Then, an organic layer of the mixture was washed with water and dried with magnesium sulfate. The mixture was gravity-filtered to give a filtrate. The resulting filtrate was suction-filtered through Celite (Catalog No. 531-16855 produced by Wako Pure Chemical Industries, Ltd.), Florisil (Catalog No. 540-00135 produced by Wako Pure Chemical Industries, Ltd.), and alumina to give a filtrate. The resulting filtrate was concentrated to give a solid. The resulting solid was recrystallized from toluene to give 3.7 g (8.8 mmol) of a white solid of the target substance in 53% yield. A synthesis scheme of Step 3 is shown in (a-3).

After a predetermined period of time, to the resulting mixture were added 1.7 g (4.0 mmol) of 8-iodo-6-phenylbenzo[b]naphtho[1,2-d]furan, 180 mg (0.44 mmol) of 2-dicyclohexylphosphino-2',6'-dimethoxybiphenyl (abbreviation: S-Phos), and 50 mg (85 μmol) of bis(dibenzylideneacetone)palladium(0), and the resulting mixture was stirred at 100° C. for 15 hours. After a predetermined period of time, the resulting mixture was filtered through Celite (Catalog No. 531-16855 produced by Wako Pure Chemical Industries, Ltd.) to give a filtrate. The resulting filtrate was concentrated to give a solid. The resulting solid was washed with ethanol and recrystallized from toluene to give 1.38 g (1.4 mmol) of a yellow solid of the target substance in 71% yield.

By a train sublimation method, 1.37 g (1.4 mmol) of the resulting yellow solid was purified by sublimation. The purification by sublimation was conducted by heating the yellow solid at 370° C. at an argon flow rate of 10 mL/min under a pressure of under a pressure of 2.3 Pa. As a result of the purification by sublimation, 0.68 g (0.70 mmol) of the yellow solid was recovered at a collection rate of 50%. A synthesis scheme of Step 4 is shown in (a-4).

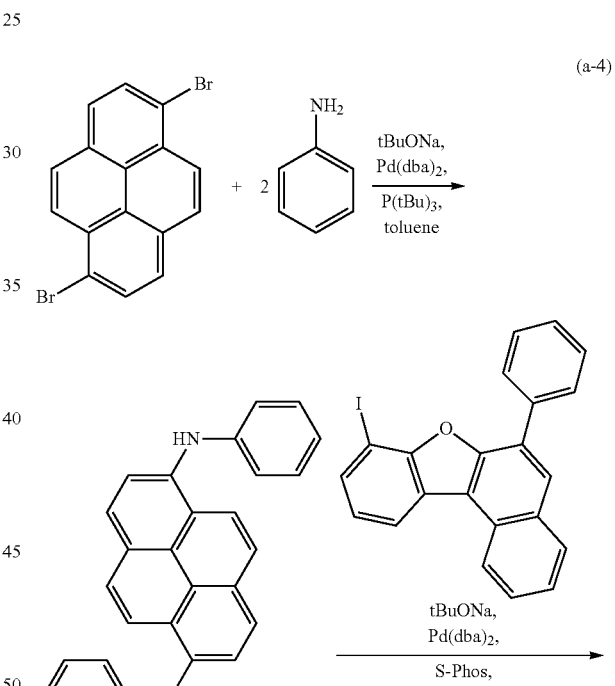

(a-4)

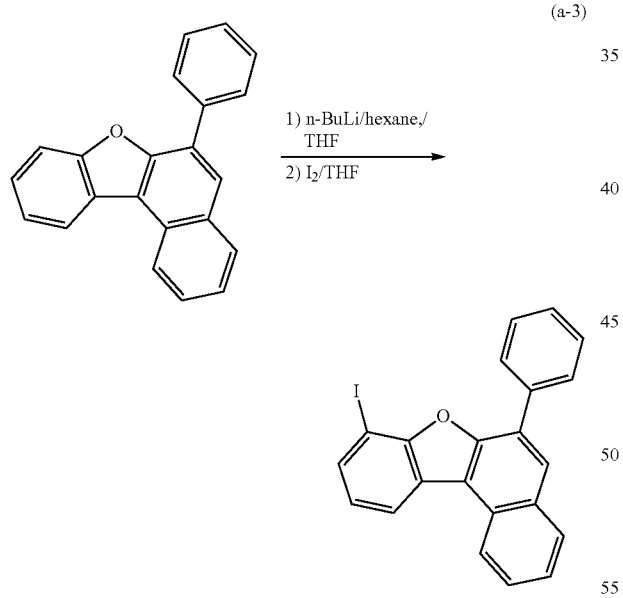

(a-3)

Step 4: Synthesis of 1,6BnfAPrn-03

Into a 100 mL three-neck flask were put 0.71 g (2.0 mmol) of 1,6-dibromopyrene, 1.0 g (10.4 mmol) of sodium-tert-butoxide, 10 mL of toluene, 0.36 mL (4.0 mmol) of aniline, and 0.3 mL of tri(tert-butyl)phosphine (a 10 wt % hexane solution), and the air in the flask was replaced with nitrogen. To this mixture was added 50 mg (85 μmol) of bis(dibenzylideneacetone)palladium(0), and the resulting mixture was stirred at 80° C. for 2 hours.

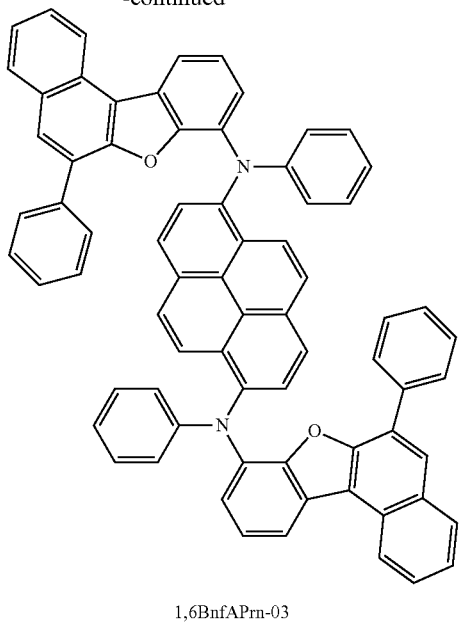

1,6BnfAPrn-03

Analysis results by nuclear magnetic resonance ($^1$H NMR) spectroscopy of the yellow solid obtained in Step 4 are described below.

$^1$H NMR (dichloromethane-d2, 500 MHz): δ=6.88 (t, J=7.7 Hz, 4H), 7.03-7.06 (m, 6H), 7.11 (t, J=7.5 Hz, 2H), 7.13 (d, J=8.0 Hz, 2H), 7.28-7.32 (m, 8H), 7.37 (t, J=8.0 Hz, 2H), 7.59 (t, J=7.2 Hz, 2H), 7.75 (t, J=7.7 Hz, 2H), 7.84 (d, J=9.0 Hz, 2H), 7.88 (d, J=8.0 Hz, 2H), 8.01 (s, 2H), 8.07 (d, J=8.0 Hz, 4H), 8.14 (d, J=9.0 Hz, 2H), 8.21 (d, J=8.0 Hz, 2H), 8.69 (d, J=8.5 Hz, 2H).

Reference Example 5

An example of a method for synthesizing Ir(iBu5bpm)$_2$(acac) that is the novel compound used in the above example is described below. The structure of Ir(iBu5bpm)$_2$(acac) is shown below.

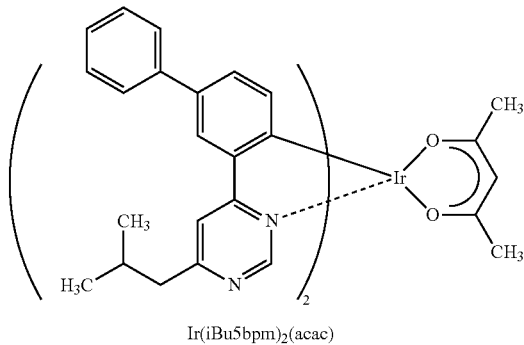

Ir(iBu5bpm)$_2$(acac)

Step 1: Synthesis of 4-chloro-6-(2-methylpropyl)pyrimidine

First, into a 200 mL three-neck flask were put 1.02 g of 4,6-dichloropyrimidine, 0.14 g of tris(2,4-pentanedionato)iron(III) (abbreviation: Fe(acac)$_3$), 67 mL of dry THF, and 5.6 mL of 1-methyl-2-pyrrolidone (abbreviation: NMP), and the air in the flask was replaced with nitrogen. The flask was cooled with ice, 6.7 mL of a 1M THF solution of isobutylmagnesium bromide (abbreviation: iBuMgBr) was added, and the mixture was stirred at room temperature for 20 hours. Then, 1 M hydrochloric acid was added, and an organic layer was subjected to extraction with ethyl acetate. The extracted solution was washed with a saturated aqueous solution of sodium hydrogen carbonate and a saturated aqueous solution of sodium chloride, and dried over magnesium sulfate. The solution obtained by the drying was filtered. The solvent of this solution was distilled off, and then the obtained residue was purified by flash column chromatography using a developing solvent in which the volume ratio of dichloromethane to ethyl acetate was 10:1 to give yellow oil of the target substance in 65% yield. A synthetic scheme of Step 1 is shown in (b-1) below.

(b-1)

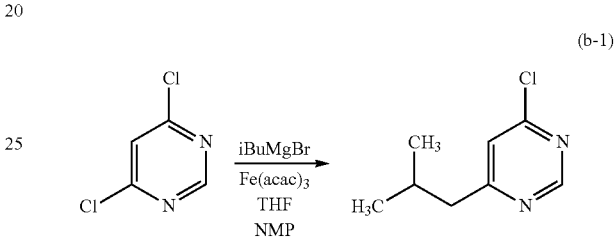

Step 2: Synthesis of 4-isobutyl-6-(biphenyl-3-yl)pyrimidine (abbreviation: HiBu5bpm)

Next, into a recovery flask equipped with a reflux pipe were put 1.50 g of 4-chloro-6-(2-methylpropyl)pyrimidine obtained in Step 1, 2.57 g of 3-biphenylboronic acid, 4.06 g of sodium carbonate, 0.077 g of bis(triphenylphosphine)palladium(II) dichloride (abbreviation: PdCl$_2$(PPh$_3$)$_2$), 20 mL of water, and 20 mL of DMF, and the air in the flask was replaced with argon. This reaction container was heated by irradiation with microwaves (2.45 GHz, 100 W) for 2 hours. Note that the irradiation with microwaves was performed using a microwave synthesis system (Discover, manufactured by CEM Corporation). Then, water was added to this solution and an organic layer was subjected to extraction with dichloromethane. The obtained organic layer was washed with water and saturated saline, and was dried with magnesium sulfate. The solution obtained by the drying was filtered. The solvent of this solution was distilled off, and then the obtained residue was purified by flash column chromatography using a developing solvent in which the volume ratio of hexane to ethyl acetate was 2:1 to give pale yellow oil of the target pyrimidine derivative HiBu5bpm (abbreviation) in 95% yield. A synthetic scheme of Step 2 is shown in (b-2) below.

Step 3: Synthesis of di-μ-chloro-tetrakis{4-phenyl-2-[6-(2-methylpropyl)-4-pyrimidinyl-κN3]phenyl-κC}diiridium(III) (abbreviation: [Ir(iBu5bpm)₂Cl]₂)

Next, into a recovery flask equipped with a reflux pipe were put 30 mL of 2-ethoxyethanol, 10 mL of water, 2.38 g of HiBu5bpm (abbreviation) obtained in Step 2, and 1.17 g of iridium chloride hydrate (IrCl₃·nH₂O) (manufactured by Furuya Metal Co., Ltd.), and the air in the flask was replaced with argon. After that, irradiation with microwaves (2.45 GHz, 100 W) was performed for one hour to cause a reaction. The solvent was distilled off, and then the obtained residue was suction-filtered and washed with methanol to give a green powder of [Ir(iBu5bpm)₂Cl]₂ (abbreviation) that is a dinuclear complex in 34% yield. A synthetic scheme of Step 3 is shown in (b-3) below.

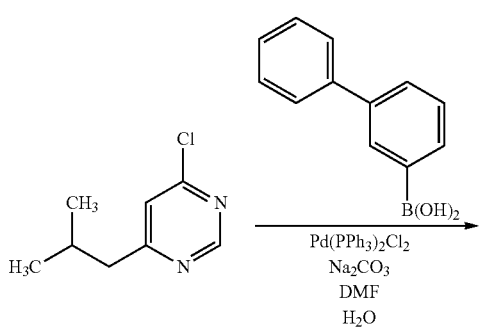

Step 4: Synthesis of bis {4-phenyl-2-[6-(2-methylpropyl)-4-pyrimidinyl-κN3]phenyl-κC}(2,4-pentanedionato-κ²O,O')iridium(III) (abbreviation: Ir(iBu5bpm)₂(acac))

Figure 65:
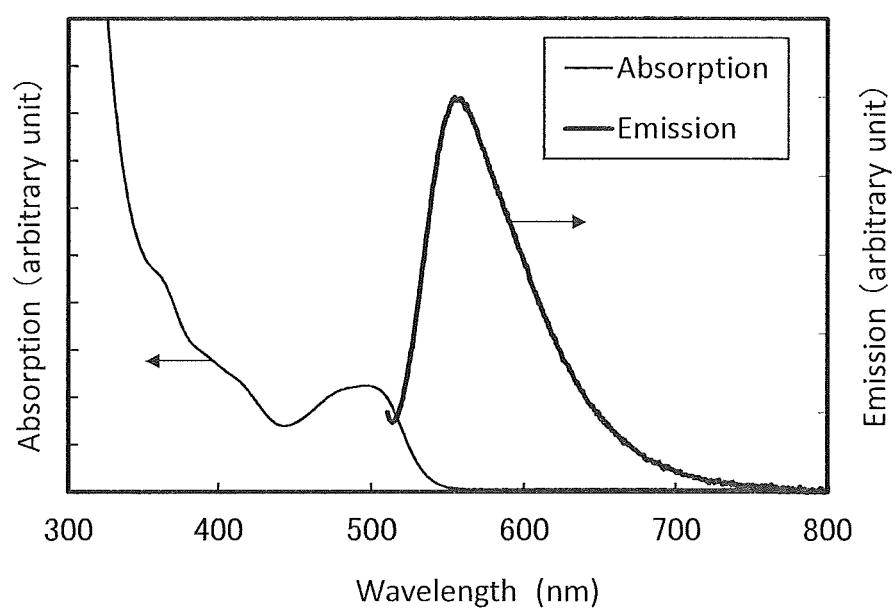
FIG. 65 shows an ultraviolet-visible absorption spectrum and an emission spectrum of Ir(iBu5bpm)$_2$(acac) in a dichloromethane solution.

Furthermore, into a recovery flask equipped with a reflux pipe were put 20 mL of 2-ethoxyethanol, 1.10 g of [Ir(iBu5bpm)₂Cl]₂ (abbreviation) that is the Binuclear complex obtained in Step 3, 0.21 g of acetylacetone (abbreviation: Hacac), and 0.73 g of sodium carbonate, and the air in the flask was replaced with argon. After that, the mixture was heated by irradiation with microwaves (2.45 GHz, 120 W) for 60 minutes. Furthermore, 0.21 g of Hacac (abbreviation) was added, and the reaction container was heated by being irradiated with microwaves (2.45 GHz, 120 W) for 60 minutes. The solvent was distilled off, and then the obtained residue was suction-filtered with methanol and washed with water and methanol. After the obtained solid was purified by flash column chromatography using a developing solvent in which the volume ratio of dichloromethane to ethyl acetate was 10:1, recrystallization was performed with a mixed solvent of dichloromethane and methanol to give a yellow orange powder of Ir(iBu5bpm)$_2$(acac) that is a novel compound in 27% yield. By a train sublimation method, 0.32 g of the obtained yellow orange powder solid was purified. In the purification by sublimation, the solid was heated at 285° C. under a pressure of 2.7 Pa with an argon flow rate of 5 mL/min. After the sublimation purification, a yellow orange solid of the target substance in 88% yield was obtained. A synthetic scheme of Step 4 is shown in (b-4) below.

box (LABstar M13 (1250/780)) manufactured by Bright Co., Ltd. Measurement results of the obtained absorption and emission spectra are shown in FIG. 65, in which the horizontal axis represents wavelength and the vertical axes represent absorption intensity and emission intensity. In FIG. 65 where there are two solid lines, the thin line represents the absorption spectrum and the thick line represents the emission spectrum. Note that the absorption spectrum in FIG. 65 is the results obtained in such a way that the absorption spectrum measured by putting only dichloromethane in a quartz cell was subtracted from the absorption spectrum measured by putting the dichloromethane solution (9.6 μmol/L) in a quartz cell.

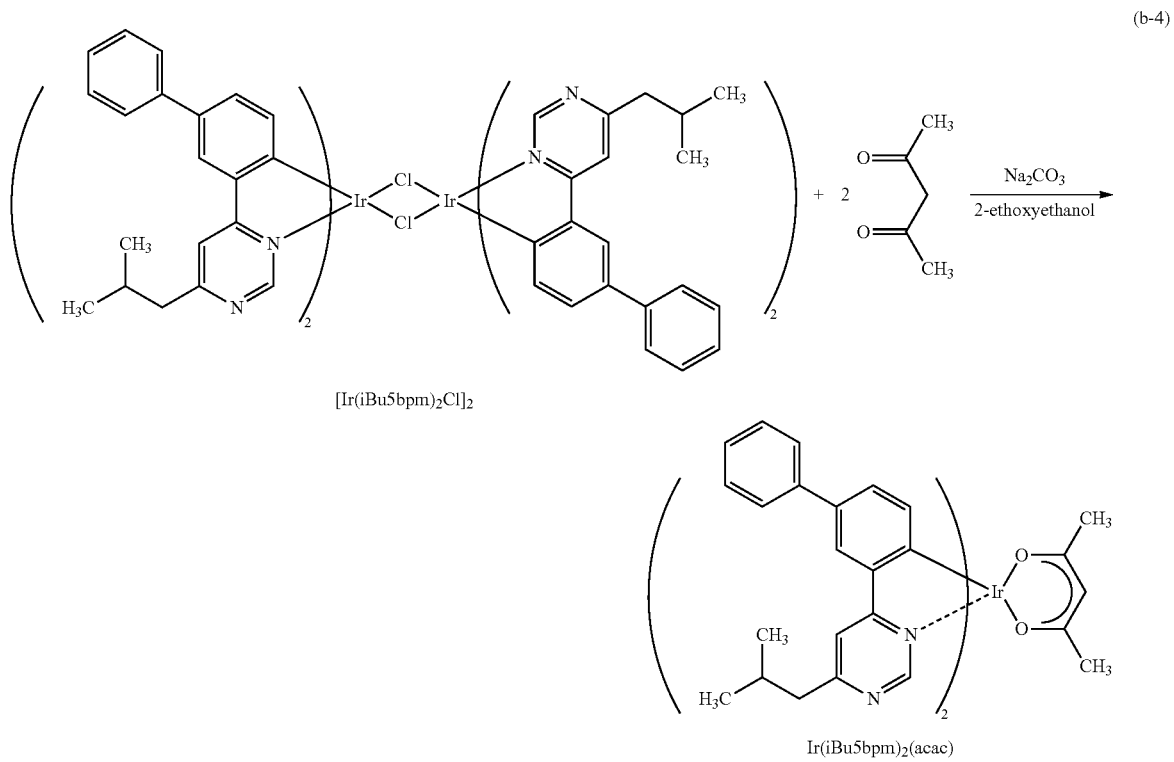

Figure 64:
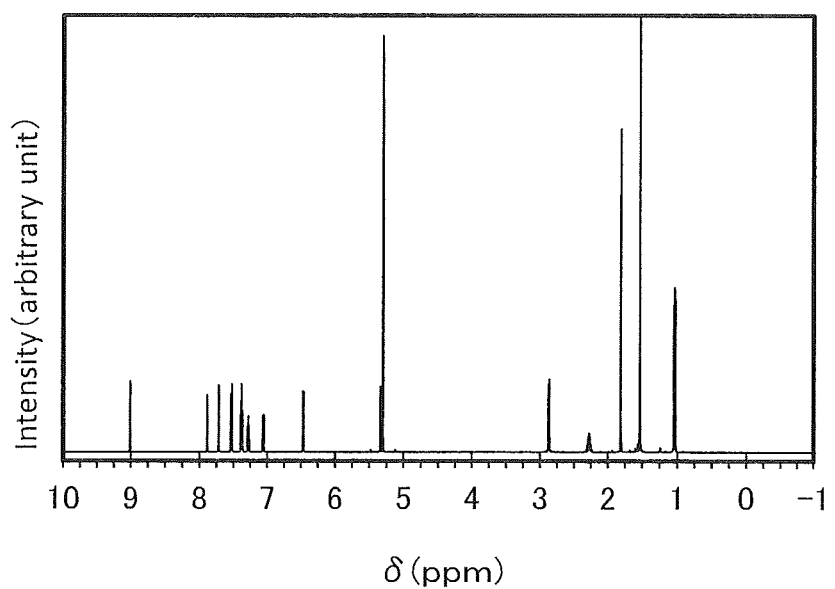
FIG. 64 is a $^1$H NMR chart of Ir(iBu5bpm)$_2$(acac).

Analysis results by nuclear magnetic resonance ($^1$H NMR) spectroscopy of the yellow powder obtained in Step 4 are described below. FIG. 64 shows the $^1$H NMR chart.

$^1$H NMR. δ (CD$_2$Cl$_2$): 1.06 (t, 12H), 1.83 (s, 6H), 2.27-2.32 (m, 2H), 2.89 (d, 4H), 5.36 (s, 1H), 6.49 (d, 2H), 7.08 (d, 2H), 7.30 (t, 2H), 7.40 (t, 4H), 7.55 (d, 4H), 7.74 (s, 2H), 7.91 (s, 2H), 9.03 (s, 2H).

Next, an ultraviolet-visible absorption spectrum (hereinafter simply referred to as an "absorption spectrum") and an emission spectrum of a dichloromethane solution of Ir(iBu5bpm)$_2$(acac) were measured. The measurement of the absorption spectrum was conducted at room temperature, for which an ultraviolet-visible light spectrophotometer (V550 type manufactured by JASCO Corporation) was used and the dichloromethane solution (9.6 μmol/L) was put in a quartz cell. In addition, the measurement of the emission spectrum was conducted at room temperature, for which an absolute PL quantum yield measurement system (C11347-01 manufactured by Hamamatsu Photonics K. K.) was used. The deoxidized dichloromethane solution (9.6 μmol/L) was sealed in a quartz cell under a nitrogen atmosphere in a glove As shown in FIG. 65, Ir(iBu5bpm)$_2$(acac) has an emission peak at 555 nm, and yellow light emission was observed from the dichloromethane solution.

Figure 66:
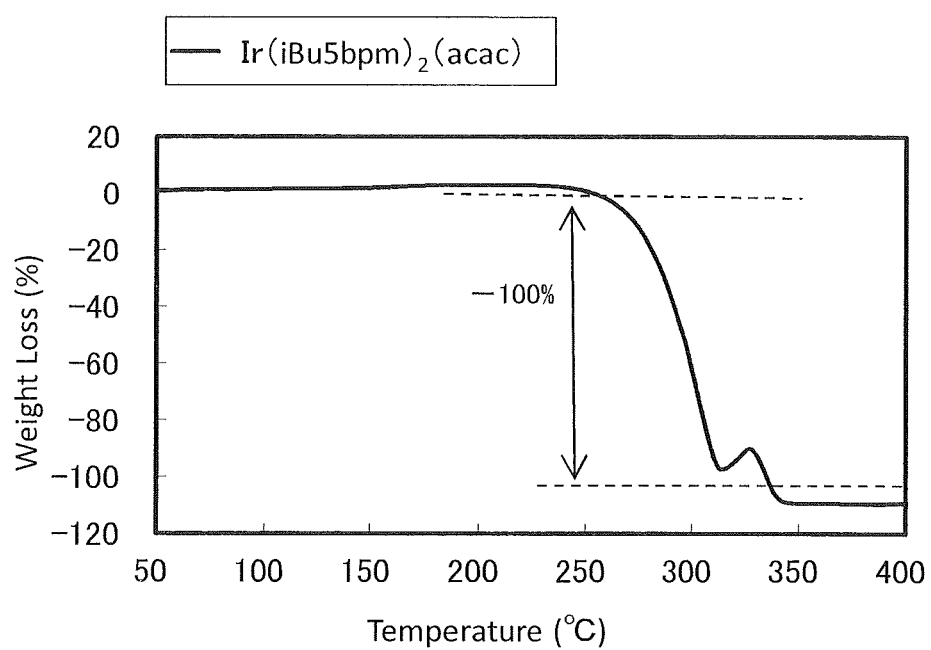
FIG. 66 shows weight loss percentage of Ir(iBu5bpm)$_2$(acac).

Furthermore, weight loss percentage of Ir(iBu5bpm)$_2$ (acac) was measured by a high vacuum differential type differential thermal balance (TG/DTA 2410SA, manufactured by Bruker AXS K.K.). The temperature was increased at a rate of 10° C./min under a degree of vacuum of 10 Pa. As a result, the weight loss percentage of Ir(iBu5bpm)$_2$ (acac) was found to be 100% at a temperature lower than 300° C. as shown in FIG. 66, which indicated a favorable sublimation property.

This application is based on Japanese Patent Application serial no. 2014-200297 filed with Japan Patent Office on Sep. 30, 2014 and Japanese Patent Application serial no. 2014-200298 filed with Japan Patent Office on Sep. 30, 2014, the entire contents of which are hereby incorporated by reference.

What is claimed is:
1. A light-emitting device comprising:
a first light-emitting element comprising:

a first lower electrode;
a first transparent conductive layer over the first lower electrode;
an optical adjustment layer over the first transparent conductive layer;
a first light-emitting layer over the optical adjustment layer;
a second light-emitting layer over the first light-emitting layer; and
an upper electrode over the second light-emitting layer;
a second light-emitting element comprising:
a second lower electrode;
a second transparent conductive layer over the second lower electrode;
the optical adjustment layer over the second transparent conductive layer;
the first light-emitting layer over the optical adjustment layer;
the second light-emitting layer over the first light-emitting layer; and
the upper electrode over the second light-emitting layer; and
a third light-emitting element comprising:
a third lower electrode;
a third transparent conductive layer over the third lower electrode;
the second light-emitting layer over the third transparent conductive layer; and
the upper electrode over the second light-emitting layer,
wherein a thickness of the first transparent conductive layer is greater than a thickness of the second transparent conductive layer, and
wherein the thickness of the second transparent conductive layer is substantially the same as a thickness of the third transparent conductive layer.

2. The light-emitting device according to claim 1,
wherein the first light-emitting element further comprises a hole-injection layer over the first transparent conductive layer, a hole-transport layer over the hole-injection layer, an electron-transport layer over the second light-emitting layer, and an electron-injection layer over the electron-transport layer,
wherein the second light-emitting element further comprises the hole-injection layer over the second transparent conductive layer, the hole-transport layer over the hole-injection layer, the electron-transport layer over the second light-emitting layer, and the electron-injection layer over the electron-transport layer, and
wherein the third light-emitting element further comprises the hole-injection layer over the third transparent conductive layer, the hole-transport layer over the hole-injection layer, the electron-transport layer over the second light-emitting layer, and the electron-injection layer over the electron-transport layer.

3. The light-emitting device according to claim 1,
wherein the first light-emitting element further comprises an electron-injection layer over the first transparent conductive layer, an electron-transport layer over the electron-injection layer, a hole-transport layer over the second light-emitting layer, and a hole-injection layer over the hole-transport layer,
wherein the second light-emitting element further comprises the electron-injection layer over the second transparent conductive layer, the electron-transport layer over the electron-injection layer, the hole-transport layer over the second light-emitting layer, and the hole-injection layer over the hole-transport layer, and
wherein the third light-emitting element further comprises the electron-injection layer over the third transparent conductive layer, the electron-transport layer over the electron-injection layer, the hole-transport layer over the second light-emitting layer, and the hole-injection layer over the hole-transport layer.

4. The light-emitting device according to claim 1,
wherein an emission spectrum of the first light-emitting element includes a peak in a wavelength range of longer than or equal to 600 nm and shorter than or equal to 740 nm,
wherein an emission spectrum of the second light-emitting element includes a peak in a wavelength range of longer than or equal to 480 nm and shorter than 600 nm, and
wherein an emission spectrum of the third light-emitting element includes a peak in a wavelength range of longer than or equal to 400 nm and shorter than 480 nm.

5. The light-emitting device according to claim 1,
wherein a distance between the first lower electrode and the first light-emitting layer is larger than a distance between the second lower electrode and the first light-emitting layer, and
wherein a distance between the second lower electrode and the second light-emitting layer is larger than a distance between the third lower electrode and the second light-emitting layer.

6. The light-emitting device according to claim 1,
wherein an optical path length between the first lower electrode and the first light-emitting layer is $3\lambda_R/4$ when $\lambda_R$ is a wavelength of red light,
wherein an optical path length between the second lower electrode and the first light-emitting layer is $3\lambda_G/4$ when $\lambda_G$ is a wavelength of green light, and
wherein an optical path length between the third lower electrode and the second light-emitting layer is $3\lambda_B/4$ when $\lambda_B$ is a wavelength of blue light.

7. The light-emitting device according to claim 1,
wherein the optical adjustment layer has a hole-transport property.

8. The light-emitting device according to claim 1,
wherein the first light-emitting layer includes a phosphorescent material, and
wherein the second light-emitting layer includes a fluorescent material.

9. A light-emitting device comprising:
a first light-emitting element comprising:
a first lower electrode;
a first transparent conductive layer over the first lower electrode;
an optical adjustment layer over the first transparent conductive layer;
a first light-emitting layer over the optical adjustment layer; and
a second light-emitting layer over the first light-emitting layer;
a second light-emitting element comprising:
a second lower electrode;
a second transparent conductive layer over the second lower electrode;
the optical adjustment layer over the second transparent conductive layer;
the first light-emitting layer over the optical adjustment layer; and the second light-emitting layer over the first light-emitting layer;

a third light-emitting element comprising:
  a third lower electrode;
  a third transparent conductive layer over the third lower electrode; and
  the second light-emitting layer over the third transparent conductive layer, wherein a thickness of the first transparent conductive layer is greater than a thickness of the second transparent conductive layer, and wherein the thickness of the second transparent conductive layer is substantially the same as a thickness of the third transparent conductive layer.

10. The light-emitting device according to claim 9,
wherein the first light-emitting element further comprises a hole-injection layer over the first transparent conductive layer, a hole-transport layer over the hole-injection layer, an electron-transport layer over the second light-emitting layer, and an electron-injection layer over the electron-transport layer, wherein the second light-emitting element further comprises the hole-injection layer over the second transparent conductive layer, the hole-transport layer over the hole-injection layer, the electron-transport layer over the second light-emitting layer, and the electron-injection layer over the electron-transport layer, and wherein the third light-emitting element further comprises the hole-injection layer over the third transparent conductive layer, the hole-transport layer over the hole-injection layer, the electron-transport layer over the second light-emitting layer, and the electron-injection layer over the electron-transport layer.

11. The light-emitting device according to claim 9,
wherein the first light-emitting element further comprises an electron-injection layer over the first transparent conductive layer, an electron-transport layer over the electron-injection layer, a hole-transport layer over the second light-emitting layer, and a hole-injection layer over the hole-transport layer, wherein the second light-emitting element further comprises the electron-injection layer over the second transparent conductive layer, the electron-transport layer over the electron-injection layer, the hole-transport layer over the second light-emitting layer, and the hole-injection layer over the hole-transport layer, and wherein the third light-emitting element further comprises the electron-injection layer over the third transparent conductive layer, the electron-transport layer over the electron-injection layer, the hole-transport layer over the second light-emitting layer, and the hole-injection layer over the hole-transport layer.

12. The light-emitting device according to claim 9,
wherein an emission spectrum of the first light-emitting element includes a peak in a wavelength range of longer than or equal to 600 nm and shorter than or equal to 740 nm, wherein an emission spectrum of the second light-emitting element includes a peak in a wavelength range of longer than or equal to 480 nm and shorter than 600 nm, and wherein an emission spectrum of the third light-emitting element includes a peak in a wavelength range of longer than or equal to 400 nm and shorter than 480 nm.

13. The light-emitting device according to claim 9,
wherein a distance between the first lower electrode and the first light-emitting layer is larger than a distance between the second lower electrode and the first light-emitting layer, and wherein a distance between the second lower electrode and the second light-emitting layer is larger than a distance between the third lower electrode and the second light-emitting layer.

14. The light-emitting device according to claim 9,
wherein an optical path length between the first lower electrode and the first light-emitting layer is $3\lambda_R/4$ when $\lambda_R$ is a wavelength of red light, wherein an optical path length between the second lower electrode and the first light-emitting layer is $3\lambda_G/4$ when $\lambda_G$ is a wavelength of green light, and wherein an optical path length between the third lower electrode and the second light-emitting layer is $3\lambda_B/4$ when $\lambda_B$ is a wavelength of blue light.

15. The light-emitting device according to claim 9,
wherein the optical adjustment layer has a hole-transport property.

16. The light-emitting device according to claim 9,
wherein the first light-emitting layer includes a phosphorescent material, and wherein the second light-emitting layer includes a fluorescent material.

* * * * *